(12) United States Patent
Widjaja

(10) Patent No.: US 10,074,653 B2
(45) Date of Patent: *Sep. 11, 2018

(54) ASYMMETRIC SEMICONDUCTOR MEMORY DEVICE HAVING ELECTRICALLY FLOATING BODY TRANSISTOR

(71) Applicant: Zeno Semiconductor, Inc., Sunnyvale, CA (US)

(72) Inventor: Yuniarto Widjaja, San Jose, CA (US)

(73) Assignee: Zeno Semiconductor, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/356,540

(22) Filed: Nov. 19, 2016

(65) Prior Publication Data

US 2017/0092648 A1    Mar. 30, 2017

Related U.S. Application Data

(63) Continuation of application No. 14/591,454, filed on Jan. 7, 2015, now Pat. No. 9,524,970, which is a
(Continued)

(51) Int. Cl.
*H01L 27/118* (2006.01)
*H01L 27/108* (2006.01)
(Continued)

(52) U.S. Cl.
CPC ...... *H01L 27/10802* (2013.01); *G11C 11/404* (2013.01); *H01L 29/7308* (2013.01)

(58) Field of Classification Search
CPC ............ G11C 11/404; H01L 27/10802; H01L 29/7308
(Continued)

(56) References Cited

U.S. PATENT DOCUMENTS

| 4,300,212 A | 11/1981 | Simko |
| 4,959,812 A | 9/1990 | Momodomi et al. |

(Continued)

OTHER PUBLICATIONS

Almeida et al., "Comparison between low and high read bias in FB-RAM on UTBOX FDSOI devices", Ultimate Integration on Silicon (ULIS), 2012 13th International Conference on, Mar. 6, 2012, pp. 61-64.
(Continued)

*Primary Examiner* — Duy T Nguyen
(74) *Attorney, Agent, or Firm* — Alan W Cannon

(57) ABSTRACT

Asymmetric, semiconductor memory cells, arrays, devices and methods are described. Among these, an asymmetric, bi-stable semiconductor memory cell is described that includes: a floating body region configured to be charged to a level indicative of a state of the memory cell; a first region in electrical contact with the floating body region; a second region in electrical contact with the floating body region and spaced apart from the first region; and a gate positioned between the first and second regions, such that the first region is on a first side of the memory cell relative to the gate and the second region is on a second side of the memory cell relative to the gate; wherein performance characteristics of the first side are different from performance characteristics of the second side.

19 Claims, 115 Drawing Sheets

Related U.S. Application Data continuation of application No. 13/244,899, filed on Sep. 26, 2011, now Pat. No. 8,957,458.

(60) Provisional application No. 61/466,940, filed on Mar. 24, 2011, provisional application No. 61/471,712, filed on Apr. 5, 2011, provisional application No. 61/485,081, filed on May 11, 2011.

(51) Int. Cl.
  *H01L 29/73* (2006.01)
  *G11C 11/404* (2006.01)

(58) Field of Classification Search
  USPC .................................................. 257/204, 205
  See application file for complete search history.

(56) References Cited

U.S. PATENT DOCUMENTS

| | | |
|---|---|---|
| 5,448,513 A | 9/1995 | Hu et al. |
| 5,519,831 A | 5/1996 | Holzhammer |
| 5,581,504 A | 12/1996 | Chang et al. |
| 5,767,549 A | 6/1998 | Chen et al. |
| 5,999,444 A | 12/1999 | Fujiwara et al. |
| 6,005,818 A | 12/1999 | Ferrant et al. |
| 6,141,248 A | 10/2000 | Forbes et al. |
| 6,163,048 A | 12/2000 | Hirose et al. |
| 6,166,407 A | 12/2000 | Ohta |
| 6,229,161 B1 | 5/2001 | Nemati et al. |
| 6,341,087 B1 | 1/2002 | Kunikiyo et al. |
| 6,356,485 B1 | 3/2002 | Proebsting et al. |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,653,175 B1 | 11/2003 | Nemati et al. |
| 6,661,042 B2 | 12/2003 | Hsu |
| 6,686,624 B2 | 2/2004 | Hsu |
| 6,724,657 B2 | 4/2004 | Shukuri et al. |
| 6,791,882 B2 | 9/2004 | Seki et al. |
| 6,801,452 B2 | 10/2004 | Miwa et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,937,516 B2 | 8/2005 | Fazan et al. |
| 6,954,377 B2 | 10/2005 | Choi et al. |
| 6,969,662 B2 | 11/2005 | Fazan et al. |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Matthew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,903,472 B2 | 3/2011 | Chen et al. |
| 7,924,630 B2 | 4/2011 | Carman |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja |
| 8,130,547 B2 | 3/2012 | Widjaja et al. |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 | 6/2012 | Widjaja et al. |
| 8,243,499 B2 | 8/2012 | Widjaja |
| 8,264,875 B2 | 9/2012 | Widjaja et al. |
| 8,294,193 B2 | 10/2012 | Widjaja |
| 8,391,066 B2 | 3/2013 | Widjaja |
| 8,472,249 B2 | 6/2013 | Widjaja |
| 8,514,622 B2 | 8/2013 | Widjaja |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,582,359 B2 | 11/2013 | Widjaja |
| 8,654,583 B2 | 2/2014 | Widjaja |
| 8,711,622 B2 | 4/2014 | Widjaja |
| 8,767,458 B2 | 7/2014 | Widjaja |
| 8,787,085 B2 | 7/2014 | Widjaja |
| 8,837,247 B2 | 9/2014 | Widjaja |
| 8,923,052 B2 | 12/2014 | Widjaja |
| 8,934,296 B2 | 1/2015 | Widjaja |
| 8,937,834 B2 | 1/2015 | Widjaja et al. |
| 8,957,458 B2 | 2/2015 | Widjaja |
| 8,995,186 B2 | 3/2015 | Widjaja |
| 9,001,581 B2 | 4/2015 | Widjaja |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,208,840 B2 | 12/2015 | Widjaja et al. |
| 9,209,188 B2 | 12/2015 | Widjaja |
| 9,230,965 B2 | 1/2016 | Widjaja |
| 9,236,382 B2 | 1/2016 | Widjaja et al. |
| 9,257,179 B2 | 2/2016 | Widjaja |
| 9,391,079 B2 | 7/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,514,803 B2 | 12/2016 | Widjaja et al. |
| 9,524,970 B2 | 12/2016 | Widjaja |
| 2002/0018366 A1 | 2/2002 | Von Schwerin et al. |
| 2005/0024968 A1 | 2/2005 | Lee et al. |
| 2005/0032313 A1 | 2/2005 | Forbes |
| 2005/0063224 A1 | 3/2005 | Fazan et al. |
| 2005/0124120 A1 | 6/2005 | Du et al. |
| 2006/0044915 A1 | 3/2006 | Park et al. |
| 2006/0081941 A1 | 4/2006 | Iwata et al. |
| 2006/0125010 A1 | 6/2006 | Bhattacharyya |
| 2006/0157679 A1 | 7/2006 | Scheuerlein |
| 2006/0227601 A1 | 10/2006 | Bhattacharyya |
| 2006/0237770 A1 | 10/2006 | Huang et al. |
| 2006/0244007 A1 | 11/2006 | Bhattacharyya |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0210338 A1 | 9/2007 | Orlowski |
| 2007/0215954 A1 | 9/2007 | Mouli |
| 2007/0284648 A1 | 12/2007 | Park et al. |
| 2008/0048239 A1 | 2/2008 | Huo et al. |
| 2008/0080248 A1 | 4/2008 | Lue et al. |
| 2008/0123418 A1 | 5/2008 | Widjaja et al. |
| 2008/0224202 A1 | 9/2008 | Young et al. |
| 2008/0259665 A1 | 10/2008 | Brederlow et al. |
| 2008/0265305 A1 | 10/2008 | He et al. |
| 2008/0303079 A1 | 12/2008 | Cho et al. |
| 2009/0016101 A1 | 1/2009 | Okhonin et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |

(56) References Cited

U.S. PATENT DOCUMENTS

| | | |
|---|---|---|
| 2009/0109750 A1 | 4/2009 | Widjaja |
| 2009/0173983 A1 | 7/2009 | Kusinoki et al. |
| 2009/0173985 A1 | 7/2009 | Lee et al. |
| 2009/0190402 A1 | 7/2009 | Hsu et al. |
| 2009/0242996 A1 | 10/2009 | van Bentum et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0246277 A1 | 9/2010 | Widjaja |
| 2010/0246284 A1 | 9/2010 | Widjaja |
| 2011/0002167 A1 | 1/2011 | McCollum |
| 2011/0032756 A1 | 2/2011 | Widjaja |
| 2011/0042736 A1 | 2/2011 | Widjaja |
| 2011/0044110 A1 | 2/2011 | Widjaja |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0148422 A1 | 6/2013 | Widjaja |
| 2013/0250685 A1 | 9/2013 | Widjaja |
| 2013/0292635 A1 | 11/2013 | Widjaja |
| 2013/0301349 A1 | 11/2013 | Widjaja |
| 2014/0021549 A1 | 1/2014 | Widjaja |
| 2014/0159156 A1 | 6/2014 | Widjaja |
| 2014/0160868 A1 | 6/2014 | Widjaja et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0092486 A1 | 4/2015 | Widjaja |
| 2015/0109860 A1 | 4/2015 | Widjaja |
| 2015/0155284 A1 | 6/2015 | Widjaja |
| 2015/0170743 A1 | 6/2015 | Widjaja |
| 2015/0187776 A1 | 7/2015 | Widjaja |
| 2015/0221650 A1 | 8/2015 | Widjaja et al. |
| 2015/0310917 A1 | 10/2015 | Widjaja |
| 2015/0371707 A1 | 12/2015 | Widjaja |
| 2016/0005741 A1 | 1/2016 | Widjaja |
| 2016/0005750 A1 | 1/2016 | Widjaja |
| 2016/0078921 A1 | 3/2016 | Widjaja et al. |
| 2016/0086655 A1 | 3/2016 | Widjaja |
| 2016/0111158 A1 | 4/2016 | Widjaja |
| 2016/0300841 A1 | 10/2016 | Widjaja |

OTHER PUBLICATIONS

Andrade et al., "The Impact of Back Bias on the Floating Body Effect in UTBOX SOI Devices for 1T-FBRAM memory Applications", Devices, Circuits and Systems (ICCDCS), 2012 8th International Caribbean Conference on, IEEE, 2012, pp. 1-4.

Aoulaiche et al., "Junction Field Effect on the Retention Time for One-Transistor Floating-Body RAM." Electron Devices, IEEE Transactions on, vol. 59, No. 8, 2012, pp. 2167-2172.

Aoulaiche et al., "Hot hole induced damage in 1T-FBRAM on bulk FinFET." Reliability Physics Symposium (IRPS), 2011 IEEE International. IEEE, pp. 99-104.

Avci et al., "Floating-Body Diode—A Novel DRAM Device." Electron Device Letters, IEEE, vol. 33, No. 2, 2012, pp. 161-163.

Bawedin et al., "Floating-Body SOI Memory: Concepts, Physics and Challenges", ECS Transactions 19.4 (2009), pp. 243-256.

Ban et al., "Integration of Back-Gate Doping for 15-nm Node Floating Body Cell (FBC) Memory." VLSI Technology (VLSIT), 2010 Symposium on, IEEE, 2010, pp. 159-160.

Cho et al., "Variation-aware study of BJT-based capacitorless DRAM cell scaling limit." Silicon Nanoelectronics Workshop (SNW), 2012 IEEE. IEEE, 2012, pp. 1-2.

Cho et al., "Variation Study and Implications for BJT-Based Thin-Body Capacitorless DRAM." Electron Device Letters, IEEE, vol. 33, No. 3, pp. 312-314.

Chiu et al., "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.

Chiu et al., "A simple process of thin-film transistor using the trench-oxide layer for improving 1T-DRAM performance." Next-Generation Electronics (ISNE), 2010 International Symposium on. IEEE, 2010, pp. 254-257.

Chun et al., "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.

Chun et al., "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.

Cao et al., "A Novel 1T-1D DRAM Cell for Embedded Application." Electron Devices, IEEE Transactions on, vol. 59, No. 5, 2012, pp. 1304-1310.

Collaert et al., "Substrate bias dependency of sense margin and retention in bulk FinFET 1T-DRAM cells." Solid-State Electronics 65 2011, pp. 205-210.

Collaert et al., "A low-voltage biasing scheme for aggressively scaled bulk FinFET 1T-DRAM featuring 10s retention at 85C." VLSI Technology (VLSIT), 2010 Symposium on. IEEE, 2010, pp. 161-162.

Chatterjee et al., "Taper isolated dynamic gain RAM cell." Electron Devices Meeting, 1978 International. vol. 24, IEEE, 1978, pp. 698-699.

Chatterjee et al., Circuit Optimization of the Taper Isolated Dynamic Gain RAM Cell for VLSI Memories, 1979 IEEE International Solid-State Circuits Conference, 1979, pp. 22-23.

Chatterjee et al., "A survey of high-density dynamic RAM cell concepts." Electron Devices, IEEE Transactions on, 26.6 (1979), 827-839.

Erb, "Stratified charge memory." Solid-State Circuits Conference. Digest of Technical Papers. 1978 IEEE International, vol. 21, IEEE, 1978, pp. 24-25.

Galeti et al., "BJT effect analysis in p- and-SOI MuGFETs with high-k gate dielectrics and TiN metal gate electrode for a 1T-DRAM application." SOI Conference (SOI), 2011 IEEE International. IEEE, 2011, pp. 1-2.

Gamiz et al., "3D Trigate 1T-DRAM memory Cell for 2x nm Nodes." Memory Workshop (IMW), 2012 4th IEEE International. IEEE, 2012, pp. 1-4.

Gamiz et al., "A 20nm low-power triple-gate multibody 1T-DRAM cell." VLSI Technology, Systems and Applications (VLSI-TSA), 2012 International Symposium on. IEEE, 2012, pp. 1-2.

Giusi et al., "Bipolar mode operation and scalability of double-gate capacitorless 1T-DRAM cells." Electron Devices, IEEE Transactions on, vol. 57, No. 8 (2010), pp. 1743-1750.

Gupta et al., "32nm high-density high-speed T-RAM embedded memory technology." Electron Devices Meeting (IEDM), 2010 IEEE International. IEEE, 2010, p. 12.1.1.

Han et al., "Bistable resistor (biristor)-gateless silicon nanowire memory." VLSI Technology (VLSIT), 2010 Symposium on. IEEE, 2010, pp. 171-172.

Han et al., "Biristor-Bistable resistor based on a silicon nanowire." Electron Device Letters, IEEE 31.8 (2010): 797-799.

Hubert et al., "Experimental comparison of programming mechanism in 1T-DRAM cells with variable channel length", Solid-State Device Research Conference (ESSDEERC), 2010 Proceedings of the European, pp. 150-153, Sep. 14-16, 2010.

Hwang et al., "Offset buried metal gate vertical floating body memory technology with excellent retention time for DRAM application." VLSI Technology (VLSIT), 2011 Symposium on. IEEE, 2011, pp. 172-173.

(56) References Cited

OTHER PUBLICATIONS

Kim et al., "Vertical double gate Z-RAM technology with remarkable low voltage operation for DRAM application." VLSI Technology (VLSIT), 2010 Symposium on, 2010, pp. 163-164.

Kim et al., "Silicon on replacement insulator (SRI) floating body cell (FBC) memory." VLSI Technology (VLSIT), 2010 Symposium on. IEEE, 2010, pp. 165-166.

Kim et al., "Optical charge-pumping: A universal trap characterization technique for nanoscale floating body devices." VLSI Technology (VLSIT), 2011 Symposium on. IEEE, 2011, pp. 190-191.

Kim et al., "Investigation of 1T DRAM cell with non-overlap structure and recessed channel." Silicon Nanoelectronics Workshop (SNW), 2010. IEEE, 2010, pp. 1-2.

Liu et al., "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.

Lu et al., "A Floating-Body/Gate DRAM Cell Upgraded for Long Retention Time", IEEE Elec. Dev. Letters, vol. 32, No. 6, Jun. 2011, pp. 731-733.

Lu et al., "A Simplified Superior Floating-Body/Gate DRAM Cell", IEEE Elec. Dev. Letters, vol. 30, No. 3, Mar. 2009, pp. 282-284.

Lee et al., "A Novel Capacitorless 1T DRAM Cell for Data Retention Time Improvement." Nanotechnology, IEEE Transactions on, vol. 10, No. 3, 2011, pp. 462-466.

Leiss et al., "dRAM Design Using the Taper-Isolated Dynamic RAM Cell." Solid-State Circuits, IEEE Journal of. 17.2 (1982): 337-344.

Mahatme et al., "Total ionizing dose effects on ultra thin buried oxide floating body memories." Reliability Physics Symposium (RPS), 2012 IEEE International, 2012, pp. 1-5.

Moon et al., "Ultimately scaled 20nm unified-RAM." Electron Devices Meeting (IEDM), 2010 IEEE International. IEEE, 2010, p, 12.2.1.

Moon et al., "An optically assisted program method for capacitorless 1T-DRAM." Electron Devices, IEEE Transactions on, vol. 57, No. 7, 2010, pp. 1714-1718.

Moon et al., "Multi-functional universal device using a band-engineered vertical structure." Electron Devices Meeting (IEDM), 2011 IEEE International. IEEE, 2011, p. 24.6.1.

Moon et al., "Fin-width dependence of BJT-based 1T-DRAM implemented on FinFET." Electron Device Letters, vol. 31, No. 9 (2010): 909.

Nicoletti et al., "The Dependence of Retention Time on Gate Length in UTBOX FBRAM With Different Source/Drain Junction Engineering." Electron Device Letters, vol. 33, No. 7, 2012, pp. 940-942.

Pulicani et al., "Simulation of intrinsic bipolar transistor mechanisms for future capacitor-less eDRAM on bulk substrate." Electronics, Circuits and Systems (ICECS), 2010 17th IEEE International Conference on. IEEE, 2010, pp. 366-969.

Ranica et al., "A one transistor cell on bulk substrate (1T-Bulk) for low-cost and high density eDRAM." VLSI Technology, 2004. Digest of Technical Papers. 2004 Symposium on. IEEE, 2004, pp. 128-129.

Reisch, "On bistable behavior and open-base breakdown of bipolar transistors in the avalanche regime-modeling and applications." Electron Devices, IEEE Transactions on. 39.6 (1992): 1398-1409.

Han et al., "Programming/Erasing Characteristics of 45 nm NOR-Type Flash Memory Based on SOI FinFET Structure." J. Korean Physical Society, vol. 47, Nov. 2005, pp. S564-S567.

Lanyon et al., "Bandgap Narrowing in Moderately to Heavily Doped Silicon", IEEE Transactions on Electron Devices, vol. ED-26, No. 7, Jul. 1979, pp. 1014-1018.

Lin et al., A new 1T DRAM Cell with Enhanced Floating Body Effect, Proceedings of 2006 IEEE International Workshop on Memory Technology, Design and Testing, 2006 IEEE, pp. 1-5.

Ohsawa et al., A Novel, Capacitor-less DRAM Cell: Floating Body Cell:, CRC Press, Taylor & Francis Group, 2012, pp. 1-7.

Ohsawa et al., "Autonomous refresh of floating-body cell due to current anomaly of impact ionization", IEEE Transactions on Electron Devices, vol. 56, No. 10, Oct. 2009, pp. 2302-2311.

Oh et al., "A 4-Bit Double SONOS Memory (DSM) with 4 Storage Nodes Per Cell for Ultimate Multi-Bit Operation", 2006 Symposium on VLSI Technology Digest of Technical Papers, 2006, IEEE, pp. 1-2.

Rodriguez et al., "A-RAM memory cell: concept and operation." Electron Device Letters, IEEE, vol. 31, No. 9 (2010), pp. 972-974.

Rodriguez et al., "Novel capacitorless 1T-DRAM cell for 22-nm node compatible with bulk and SOI substrates." Electron Devices, IEEE Transactions on, vol. 58, No. 8 (2011), pp. 2371-2377.

Rodriguez et al., "A-RAM: Novel capacitor-less DRAM memory." Intl SOI Conference, 2009 IEEE International, IEEE, 2009, pp. 1-2.

Romanjek et al., "Compact (WG/LG=80/85nm) FDSOI 1T-DRAM programmed by Meta Stable Dip", Ultimate Integration on Silicon (ULIS), 2012 13th International Conference on, Mar. 6, 2012, pp. 199-202.

Rothemund et al., "The importance of being modular", Nature, vol. 485, May 31, 2012, pp. 584-585.

Sakui et al., "A new static memory cell based on reverse base current (RBC) effect of bipolar transistor." Electron Devices, IEEE Transactions on. 36.6 (1989): 1215-1217.

Sakui et al., "A new static memory cell based on reverse base current (RBC) effect of bipolar transistor." Electron Devices Meeting, 1988. IEDM'88. Technical Digest, International IEEE, 1988, pp. 44-47.

Shim et al., "A BJT-Based Heterostructure 1T-DRAM for Low-Voltage Operation." Electron Device Letters, vol. 33, No. 1, 2012, pp. 14-16.

Ohsawa et al., Autonomous refresh of floating body cell (FBC), IEEE, 2008, pp. 801-804.

Shin et al., "Vertical-Gate Si/SiGe Doube-HBT-Based Capacitorless 1T DRAM Cell for Extended Retention Time at Low Latch Voltage." Electron Device Letters, vol. 33, No. 2, 2012, pp. 134-136.

Shin et al., "A novel double HBT-based capacitorless 1T DRAM cell with Si/SiGE heterojunctions." Electron Device Letters, vol. 32, No. 7, 2011, pp. 850-852.

Sze et al., Physics of Semiconductor Devices, Wiley-Interscience, 2007, pp. 1-4.

Terada et al., "A new VLSI memory cell using capacitance coupling (CC) cell." Electron Devices, IEEE Transactions on. 31.9 (1984): pp. 1319-1324.

Ventrice et al., "Analytical model of deeply-scaled thyristors for memory applications." Microelectronics and Electron Devices (WMED), 2012 IEEE Workshop on. IEEE, 2012, pp. 1-4.

Villaret et al., "Further insight into the physics and modeling of floating-body capacitorless DRAMs." Electron Devices, IEEE Transactions on. 52.11 (2005): pp. 2447-2454.

Wu et al., "Experimental Demonstration of the High-Performance Floating-Body/Gate dRAM Cell for Embedded Memories", IEEE Elec. Dev. Letter, vol. 33, No. 6, Jun. 2012, pp. 743-745.

Zhang et al., "Total Ionizing Dose Effects on FinFET-Based Capacitor-Less 1T-DRAMs." Nuclear Science, IEEE Transactions on, vol. 57, No. 6, 2010, pp. 3298-3304.

Song et al., "55 nm Capacitor-less 1T DRAM Cell Transistor with Non-Overlap Structure", IEEE, 2008, pp. 797-800.

Villaret et al., Mechanisms of charge modulation in the floating body of triple-well nMOSFET capacitor-less DRAMs, Microelectronics Engineering 72(2004) 434-439.

Ban et al., "A Scaled Floating Body Cell (FBC) Memory with High-k+Metal Gate on Thin-Silicon and Thin-Box fro 16-nm Technology Node and Beyond", Symposium on VLSI Technology, 2008, pp. 92-93.

Campardo et al., "VLSI Design of Non-Volatile Memories", Springer Berlin Heidelberg New York, 2005, pp. 94-95.

Frontiers of Silicon-on-insulator, vol. 93, No. 9, May 2003, pp. 4955-4978.

Cho et al., A novel capacitor-less DRAM cell using Thin Capacitively-Coupled Thyristor (TCCT), IEEE, 2005, pp. 1-4.

Headland, "Hot electron injection", Feb. 19, 2004, pp. 1-2.

Langholz et al., "Foundations of Digital Logic Design", World Scientific Publishing Company, 1998, pp. 339-344.

(56) References Cited

OTHER PUBLICATIONS

Montaanaro et al., "A 160-MHz, 32-b, 05-W CMOS RISC Microprocessor", IEEE J. Solid State Circuits, vol. 31, No. 11, Nov. 1996, pp. 1703-1714.

Okhonin et al., "Principles of Transient Charge Pumping on Partially Depleted SOI MOSFETs", IEEE Electron Device Letters, col. 23, No. 5, May 2001, pp. 279-281.

Okhonin et al., "A SOI Capacitor-less 1T-DRAM Concept", 2001 IEEE International SOI Conference, 2001, pp. 153-154.

Ohsawa et al., "Memory Design Using One-Transistor Gain Cell on SOI", Tech. Digest, IEEE International Solid-State circuits, vol. 37, No. 11, 2002, pp. 1510-1522.

Ohsawa et al., "An 18.5ns 128Mb SOI DRAM with a Floating Body Cell", IEEE International Solid-State Circuits conference, 2005, pp. 458-459, 609.

Okhonin et al., "A Capacitor-less 1T-DRAM Cell", IEEE Electron Device Letters, vol. 23, No. 2, Feb. 2002, pp. 85-87.

Pellizzer et al., "A 90nm Phase Change Memory Technology for Stand-Alone Non-Volatile Memory Applications", 2006 Symposium on VLSI Technology Digest of Technical Papers, 2006, pp. 1-2.

Ranica et al., "Scaled 1T-Bulk devices built with CMOS 90nm technology for low-cost eDRAM applications", 2005 Symposium on VLSI Technology Digest of Technical Papers, 2005, pp. 38-39.

Pierret, "Semiconductor Device Fundamentals", ISBN: 0-201-54393-1, Addison-Wesley Publishing Company, Inc., PNPN Devices, 1996, pp. 463-476.

Sugizaki et al., "Ultra-high-speed Novel Bulk Thyristor-SRAM (BT-RAM) Cell with Selective Epitaxy Anode (SEA)", IEEE, 2006, pp. 1-4.

Tack et al., "The Multistable Charge-Controlled Memory Effect in SOI Transistors at Low Temperatures", IEEE Transactions on Electron Devices, vol. 37, May 1990, pp. 1373-1382.

Yoshida et al., "A Design of a Capacitorless 1T-DRAM Cell Using Gate-Induced Drain Leakage (GIDL) Current for Low-power and High-speed Embedded Memory", International Electron Devices Meeting, 2003, pp. 1-4.

Floating Body 24 is positively charged and V(BL 16) = 0.0V

FB is neutrally charged: and V(BL 16) = V(FB 24) = 0V

Floating Body 24 is positively charged and V(BL 16) = +0.4V

Floating Body 24 is neutrally charged: and V(BL 16) = +0.4V

ASYMMETRIC SEMICONDUCTOR MEMORY DEVICE HAVING ELECTRICALLY FLOATING BODY TRANSISTOR

CROSS-REFERENCE

This application is a continuation application of co-pending application Ser. No. 14/591,454, filed on Jan. 7, 2015, which is a continuation application of application Ser. No. 13/244,899, filed on Sep. 26, 2011, now U.S. Pat. No. 8,957,458, both of which applications and patent are hereby incorporated herein by reference in their entireties and to which applications we claim priority under 35 USC § 120. Application Ser. No. 13/244,899 claims the benefit of U.S. Provisional Application No. 61/466,940, filed on Mar. 24, 2011 and titled "An Asymmetric Memory Device Comprising of Electrically Floating Body Transistor", which provisional application is hereby incorporated herein, in its entirety, by reference thereto, and to which provisional application we claim priority under 35 USC § 119.

Application Ser. No. 13/244,899 claims the benefit of U.S. Provisional Application No. 61/471,712, filed on Apr. 5, 2011 and titled "An Asymmetric Memory Device Comprising of Electrically Floating Body Transistor", which provisional application is hereby incorporated herein, in its entirety, by reference thereto and to which provisional application we claim priority under 35 USC § 119.

Application Ser. No. 13/244,899 claims the benefit of U.S. Provisional Application No. 61/485,081, filed on May 11, 2011 and titled "Asymmetric Semiconductor Device Having Electrically Floating Body Transistor", which provisional application is hereby incorporated herein, in its entirety, by reference thereto and to which provisional application we claim priority under 35 USC § 119.

FIELD OF THE INVENTION

The present invention relates to semiconductor memory technology. More specifically, the present invention relates to an asymmetric semiconductor memory device having an electrically floating body transistor.

BACKGROUND OF THE INVENTION

Semiconductor memory devices are used extensively to store data. Volatile memory such as Static and Dynamic Random Access Memory (SRAM and DRAM, respectively) are widely used in many applications. However, volatile memory loses its data when power is not continuously supplied.

DRAM based on the electrically floating body effect has been proposed (see, for example "A Capacitor-less 1T-DRAM Cell", S. Okhonin et al., pp. 85-87, IEEE Electron Device Letters, vol. 23, no. 2, February 2002 ("Okhonin-1"), which is incorporated by reference herein in its entirety and "Memory Design Using One-Transistor Gain Cell on SOI", T. Ohsawa et al., pp. 152-153, Tech. Digest, 2002 IEEE International Solid-State Circuits Conference, February 2002) ("Ohsawa-1"), which is incorporated by reference herein in its entirety). Such a memory eliminates the capacitor used in conventional one transistor, one capacitor (1T/1C) memory cell, and thus is easier to scale to smaller feature size. In addition, such memory allows for a smaller cell size compared to the conventional 1T/1C memory cell. Both Okhonin-1 and Ohsawa-1 describe a DRAM memory cell comprising a single standard metal-oxide-semiconductor field effect transistor (MOSFET) having a gate terminal, two source/drain terminals, and a floating body fabricated using silicon-on-insulator (SOI) complimentary metal-oxide-semiconductor (CMOS) technology. Ohsawa-1 further describes a current mirror sense amplifier which compares the current of a sensed cell to the average of two reference cells, one written to logic-0 and the other written to logic-1.

It would be desirable to provide memory devices having improved read operations to what is currently known.

It would further be desirable to provide such memory devices having a size that is not prohibitively larger than comparable volatile memory devices.

The present invention meets all of the above desires and more.

SUMMARY OF THE INVENTION

In one aspect of the present invention, an asymmetric, bi-stable semiconductor memory cell is provided that includes: a floating body region configured to be charged to a level indicative of a state of the memory cell; a first region in electrical contact with the floating body region; a second region in electrical contact with said floating body region and spaced apart from the first region; and a gate positioned between the first and second regions, such that the first region is on a first side of the memory cell relative to the gate and the second region is on a second side of the memory cell relative to the gate; wherein performance characteristics of the first side are different from performance characteristics of the second side.

In at least one embodiment, the memory cell includes a gap region on a surface of the floating body region, the gap region located between the first region and the gate.

In at least one embodiment, the memory cell includes a substrate and a buried layer in the substrate, wherein the substrate is separated from the floating body region by the buried layer.

In at least one embodiment, the memory cell includes a word line terminal electrically connected to the gate; a bit line terminal electrically connected to the first region; a source line terminal electrically connected to the second region; a buried well terminal electrically connected to the buried layer; and a substrate terminal electrically connected to the substrate.

In at least one embodiment, the first region has a first conductivity type selected from a p-type conductivity type and an n-type conductivity type; the floating body region has a second conductivity type selected from the p-type and n-type conductivity types, the second conductivity type being different from the first conductivity type; and the second region has the first conductivity type.

In at least one embodiment, the memory cell includes a substrate having the first conductivity type; and a buried layer in the substrate, the buried layer having the second conductivity type, wherein the substrate is separated from the floating body region by the buried layer.

In at least one embodiment, the memory cell includes an insulating layer insulating the gate from the floating body region.

In at least one embodiment, the floating body region has a first conductivity type selected from a p-type conductivity type and an n-type conductivity type; the first region has a second conductivity type selected from the p-type and n-type conductivity types, the second conductivity type being different from the first conductivity type; and the second region had the first conductivity type.

In at least one embodiment, the memory cell includes the second region has a first conductivity type selected from a p-type conductivity type and an n-type conductivity type; and the first region has a second conductivity type selected from the p-type and n-type conductivity types, the second conductivity type being different from the first conductivity type.

In at least one embodiment, the memory cell includes a silicon-on-insulator substrate; and a buried insulator layer, wherein the buried insulator layer insulates the silicon-on-insulator substrate from the floating body region.

In at least one embodiment, the memory cell is configured for use as a reference cell, wherein the asymmetric semiconductor memory cell further comprises a third region in electrical contact with the floating body region, the third region having the second conductivity type.

In at least one embodiment, the third region is located between the gate and the second region.

In at least one embodiment, the second region is electrically connected to a gate of a switching transistor to configure connectivity of gates in a field programmable logic array (FPGA).

In at least one embodiment, the memory cell is configured to function as a configuration memory, wherein the second region is electrically connected to a gate of a switching transistor that is connected to interconnect lines connected to a field programmable logic array (FPGA); and an inverter and a p-channel metal-oxide-semiconductor (PMOS) transistor are connected to one of the interconnect lines to restore values of signals passed between the interconnect lines.

In at least one embodiment, the memory cell is configured for use as a reference cell, wherein the asymmetric semiconductor memory cell further comprises a third region in electrical contact with the floating body region, the third region having the second conductivity type.

In at least one embodiment, the third region is located between the gate and the second region.

In at least one embodiment, the memory cell is useable as a reference cell by applying an intermediate potential between a first potential indicative of a logic-0 state and second potential indicative of a logic-1 state to the floating body region through the second region.

In at least one embodiment, the memory cell includes a substrate; and a buried layer in the substrate, wherein the substrate is separated from the floating body region by the buried layer; wherein the second region is electrically connected to an operational amplifier and the operational amplifier is further electrically connected to the buried layer, forming a feedback loop to the cell.

In at least one embodiment, the memory cell includes a substrate; and a buried layer in the substrate, wherein the substrate is separated from the floating body region by the buried layer; wherein the second region is electrically connected to an input terminal of a CMOS inverter, and an output terminal of the CMOS inverter is electrically connected to the buried layer.

In at least one embodiment, the memory cell includes a substrate; and a buried layer in the substrate, wherein the substrate is separated from the floating body region by the buried layer; wherein the cell is connected in a mixed-signal feedback loop.

In at least one embodiment, the mixed-signal feedback loop comprises the second region being electrically connected to an analog-to-digital converter a digital controller and a digital to analog converter, the digital to analog converter being electrically connect to the buried layer.

In at least one embodiment, the mixed-signal feedback loop comprises a 1-bit comparator block used to quantize a potential of the floating body region.

In at least one embodiment, the memory cell includes a substrate; wherein the cell comprises a three-dimensional memory structure having a fin that extends substantially perpendicular to, and above a top surface of the substrate.

In at least one embodiment, the floating body region, the first region the second region and the gate are formed in the fin.

In at least one embodiment, the gate comprises two gates, the gates being formed on opposite sides of the floating body region.

In at least one embodiment, the gate wraps around three sides of the floating body region.

In another aspect of the present invention, a semiconductor memory array is provided, including: a plurality of asymmetric semiconductor memory cells as described above, arranged in a matrix of rows and columns.

In another aspect of the present invention, an asymmetric semiconductor memory cell is provided that includes: a floating body region configured to be charged to a level indicative of a state of the memory cell; a first region in electrical contact with the floating body region; an electrode electrically connected to the floating body region, wherein the electrode forms a Schottky contact with the floating body region; and a gate positioned between the first region and the electrode.

In at least one embodiment, the memory cell includes a substrate; and a buried layer in the substrate, wherein the substrate is separated from the floating body region by the buried layer.

In at least one embodiment, the memory cell includes a word line terminal electrically connected to the gate; a bit line terminal electrically connected to the electrode; a source line terminal electrically connected to the first region; a buried well terminal electrically connected to the buried layer; and a substrate terminal electrically connected to the substrate.

In at least one embodiment, the first region has a first conductivity type selected from a p-type conductivity type and an n-type conductivity type; and the floating body region has a second conductivity type selected from the p-type and n-type conductivity types, the second conductivity type being different from the first conductivity type.

In at least one embodiment, the memory cell includes a substrate having the second conductivity type; and a buried layer in the substrate, the buried layer having the first conductivity type, wherein the substrate is separated from the floating body region by the buried layer.

In at least one embodiment, the memory cell includes an insulating layer insulating the gate from the floating body region.

In at least one embodiment, the memory cell includes a gap region on a surface of the floating body region, the gap region located between the electrode and the gate.

In at least one embodiment, the memory cell includes a substrate; wherein the cell comprises a three-dimensional memory structure having a fin that extends substantially perpendicular to, and above a top surface of the substrate.

In at least one embodiment, the floating body region, the first region, the electrode and the gate are formed in the fin.

In at least one embodiment, the gate comprises two gates, the gates being formed on opposite sides of the floating body region.

In at least one embodiment, the gate wraps around three sides of the floating body region.

In another aspect of the present invention, a semiconductor memory array, is provided, including: a plurality of asymmetric semiconductor memory cells as described above, arranged in a matrix of rows and columns.

In another aspect of the present invention, a method of operating a memory array having rows and columns of memory cells assembled into an array of the memory cells, wherein at least one of the memory cells is an asymmetric memory cell having first and second sides, wherein performance characteristics of the first side are different from performance characteristics of the second side, each memory cell having a floating body region; is provided, wherein the method includes: accessing at least one of the asymmetric cells; and performing an operation on the at least one asymmetric cell.

In at least one embodiment, the array comprises a plurality of the asymmetric cells, each asymmetric cell comprising a gate; a word line terminal electrically connected to the gate; a bit line terminal; a source line terminal; a floating body region; a buried layer; a buried well terminal electrically connected to the buried layer; a substrate; and a substrate terminal electrically connected to the substrate, the method further comprising performing a holding operation on the memory cells of the array.

In at least one embodiment, the performance of a holding operation comprises: applying a positive back bias to the buried well terminal; applying zero bias to the word line terminal; applying zero bias to the bit line terminal; applying zero bias to the source line terminal; and applying zero bias to the substrate terminal.

In at least one embodiment, the method includes monitoring cell current in at least one of the cells; and modulating an amount of potential applied to the buried well terminal connected to the at least one of the cells by an amount functionally related to the cell current monitored in the at least one of the cells.

In at least one embodiment, the array comprises a plurality of the asymmetric cells, each asymmetric cell comprising a gate; a word line terminal electrically connected to the gate; a bit line terminal; a source line terminal; a floating body region; a buried layer; a buried well terminal electrically connected to the buried layer; a substrate; and a substrate terminal electrically connected to the substrate, the method further comprising performing a read operation on a selected memory cell of the array.

In at least one embodiment, the performance of a read operation comprises: applying zero bias to the word line terminal electrically connected to the selected cell; applying a positive bias to the bit line terminal electrically connected to the selected cell; applying zero bias to the source line terminal electrically connected to the selected cell; applying a zero or positive bias to the buried well terminal electrically connected to the selected cell; and applying zero bias to the substrate terminal electrically connected to the selected cell.

In at least one embodiment, the method includes applying zero volts to all word line terminals not electrically connect to the selected cell; applying zero volts to all bit line terminals not electrically connect to the selected cell; and applying zero volts to all source terminals not electrically connect to the selected cell.

In at least one embodiment, the method includes providing a sensing circuit connected to the array; and determining a state of the selected memory cell by sensing through the bit line terminal electrically connected to the selected cell, using the sensing circuit.

In at least one embodiment, the array comprises a plurality of the asymmetric cells, each asymmetric cell comprising a gate; a word line terminal electrically connected to the gate; a bit line terminal; a source line terminal; a floating body region; a buried layer; a buried well terminal electrically connected to the buried layer; a substrate; and a substrate terminal electrically connected to the substrate, the method further comprising performing a write logic-1 operation on a selected memory cell of the array.

In at least one embodiment, the performance of a write logic-1 operation comprises: applying a positive voltage to the word line terminal electrically connected to the selected cell; applying a positive voltage to the bit line terminal electrically connected to the selected cell; applying zero voltage to the source line terminal electrically connected to the selected cell; applying a zero or positive bias to the buried well terminal electrically connected to the selected cell; and applying zero bias to the substrate terminal electrically connected to the selected cell.

In at least one embodiment, the array comprises a plurality of the asymmetric cells, each asymmetric cell comprising a gate; a word line terminal electrically connected to the gate; a bit line terminal; a source line terminal; a buried layer; a buried well terminal electrically connected to the buried layer; a substrate; and a substrate terminal electrically connected to the substrate, the method further comprising performing a write logic-1 operation on a selected memory cell of the array, via a band-to-band tunneling mechanism.

In at least one embodiment, the performance of a write logic-1 operation comprises: applying a negative voltage to the word line terminal electrically connected to the selected cell; applying a positive voltage to the bit line terminal electrically connected to the selected cell; applying zero voltage to the source line terminal electrically connected to the selected cell; applying a zero or positive bias to the buried well terminal electrically connected to the selected cell; and applying zero bias to the substrate terminal electrically connected to the selected cell.

In at least one embodiment, the array comprises a plurality of the asymmetric cells, each asymmetric cell comprising a gate; a word line terminal electrically connected to the gate; a bit line terminal; a source line terminal; a buried layer; a buried well terminal electrically connected to the buried layer; a substrate; and a substrate terminal electrically connected to the substrate, the method further comprising performing a write logic-0 operation on the array.

In at least one embodiment, the performance of a write logic-0 operation comprises: applying zero voltage to the word line terminal electrically connected to the selected cell; applying zero voltage to the bit line terminal electrically connected to the selected cell; applying a negative voltage to the source line terminal electrically connected to the selected cell; applying a zero or positive bias to the buried well terminal electrically connected to the selected cell; and applying zero bias to the substrate terminal electrically connected to the selected cell.

In at least one embodiment, the memory cell includes: applying zero volts to all word line terminals not electrically connected to the selected cell; applying zero or positive volts to all buried well terminals not electrically connected to the selected cell; and applying zero volts to all substrate terminals not electrically connected to the selected cell.

In at least one embodiment, the array comprises a plurality of the asymmetric cells, each asymmetric cell comprising a gate; a word line terminal electrically connected to the gate; a bit line terminal; a source line terminal; a buried layer; a buried well terminal electrically connected to the buried layer; a substrate; and a substrate terminal electrically connected to the substrate, the method further comprising performing a bit-selective write logic-0 operation on the array.

In at least one embodiment, the performance of a bit-selective write logic-0 operation comprises: applying a positive voltage to the word line terminal electrically connected to the selected cell; applying a negative voltage to the bit line terminal electrically connected to the selected cell; applying zero voltage to the source line terminal electrically connected to the selected cell; applying a zero or positive bias to the buried well terminal electrically connected to the selected cell; and applying zero bias to the substrate terminal electrically connected to the selected cell.

In at least one embodiment, the method includes: applying zero volts to all word line terminals not electrically connected to the selected cell; applying zero volts to all source line terminals not electrically connected to the selected cell; applying zero or positive volts to all buried well terminals not electrically connected to the selected cell; and applying zero volts to all substrate terminals not electrically connected to the selected cell.

In at least one embodiment, the bit line terminal is connected to the floating body region via a Schottky contact.

In at least one embodiment, the bit line terminal is connected to the floating body region via a Schottky contact, and wherein the performing a read operation comprises: applying a positive bias to the word line terminal electrically connected to the selected cell; applying a positive bias to the bit line terminal electrically connected to the selected cell; applying zero bias to the source line terminal electrically connected to the selected cell; applying a positive bias to the buried well terminal electrically connected to the selected cell; and applying zero bias to the substrate terminal electrically connected to the selected cell.

In at least one embodiment, the performance of a holding operation comprises: applying a positive back bias to the buried well terminal; applying zero bias to the word line terminal; applying zero bias to the bit line terminal; leaving the source line terminal floating; and applying zero bias to the substrate terminal.

In at least one embodiment, the source lines are each connected to only a single one of the memory cells in the array.

In at least one embodiment, the performance of a write logic-1 operation comprises: applying a negative voltage to the word line terminal electrically connected to the selected cell; applying a positive voltage to the bit line terminal electrically connected to the selected cell; leaving floating the source line terminal connected to the selected cell; applying a zero or positive bias to the buried well terminal electrically connected to the selected cell; and applying zero bias to the substrate terminal electrically connected to the selected cell.

In at least one embodiment, the performance of a write logic-0 operation comprises: applying zero voltage to the word line terminal electrically connected to the selected cell; applying a negative voltage to the bit line terminal electrically connected to the selected cell; leaving floating the source line terminal electrically connected to the selected cell; applying a zero or positive bias to the buried well terminal electrically connected to the selected cell; and applying zero bias to the substrate terminal electrically connected to the selected cell.

In at least one embodiment, the performance of a bit-selective write logic-0 operation comprises: applying a positive voltage to the word line terminal electrically connected to the selected cell; applying a negative voltage to the bit line terminal electrically connected to the selected cell; leaving floating the source line terminal electrically connected to the selected cell; applying a zero or positive bias to the buried well terminal electrically connected to the selected cell; and applying zero bias to the substrate terminal electrically connected to the selected cell.

In at least one embodiment, the potential in the floating body of the memory cell designated state logic-1 is designated as $V_{FB1}$, the method further comprising: reducing write logic-0 disturb to unselected memory cells by applying the positive voltage to the word line terminal electrically connected to the selected cell in an amount configured to increase the floating body potential of the selected cell by $V_{FB1}/2$; applying the negative voltage to the bit line terminal electrically connected to the selected cell in an amount of about $-V_{FB1}/2$; applying either ground or a slightly positive voltage to the bit line terminals of the array not connected to the selected cell; and applying a negative voltage to the word line terminals not electrically connected to the selected cell.

In another aspect of the present invention, a method of manufacturing a memory cell is provided including: growing a thin silicon oxide layer on a surface of a substrate; depositing a silicon nitride layer on the silicon oxide layer; depositing a polysilicon layer over the silicon nitride layer; applying a pattern opening areas of the silicon oxide layer, the silicon nitride layer and the polysilicon layer to be opened to form a trench; patterning the silicon oxide, silicon nitride and polysilicon layers by lithography and then etching to create the trench; growing silicon oxide films in the trench to form an insulating layer of the memory cell; removing the silicon nitride layer and the polysilicon layer; forming a buried layer region by ion implantation; forming a silicon oxide or high-dielectric material gate insulation layer on the surface of the silicon oxide layer; depositing a polysilicon or metal gate layer on the gate insulation layer; forming a spacer region on both sides of the gate 60; forming a source line region and a bit line region in the silicon oxide layer by ion implantation, wherein gap regions between the gate and the source line region, and between the gate and the bit line region result from the forming a spacer region on both sides.

In at least one embodiment, the method includes performing another lithography step to cover an area above a region between the bit line region, thereby maintaining one of the gap regions while eliminating the other of the gap regions; and forming an extension of the source line region where the gap was eliminated, using an ion implantation step.

In another aspect of the present invention, a method of manufacturing a memory cell is provided, including: growing a thin silicon oxide layer on a surface of a substrate; depositing a silicon nitride layer on the silicon oxide layer; depositing a polysilicon layer over the silicon nitride layer; applying a pattern opening areas of the silicon oxide layer, the silicon nitride layer and the polysilicon layer to be opened to form a trench; patterning the silicon oxide, silicon nitride and polysilicon layers by lithography and then etching to create the trench; growing silicon oxide films in the trench to form an insulating layer of the memory cell; removing the silicon nitride layer and the polysilicon layer; forming a buried layer region by ion implantation; forming a silicon oxide or high-dielectric material gate insulation layer on the surface of the silicon oxide layer; depositing a polysilicon or metal gate layer on the gate insulation layer; forming a source line region and a bit line region in the silicon oxide layer by ion implantation; performing a lithography step to block an area above the source line region, while leaving exposed an area above the bit line region to be transformed to a gap region between the gate and the bit line region, while blocking a remainder of the area above the bit line region; and changing, by ion implantation, a conductivity type of the surface region of the bit line region having been left exposed, thereby forming the gap region.

In another aspect of the present invention, a method of manufacturing a floating body memory cell to improve a read signal thereof, is provided, including: providing a substrate; forming a buried well region in the substrate by ion implantation; growing a silicon oxide layer on a surface of the substrate; depositing a polysilicon layer on the silicon oxide layer; depositing a silicon nitride layer on the polysilicon layer; opening an area to form a trench, using a lithography process; creating the trench by etching; forming a region at the bottom of the trench by ion implantation; growing or depositing silicon oxide in the trench to from an insulating layer of the memory cell; removing the silicon nitride layer and the polysilicon layer; forming a gate insulator on a surface of the silicon oxide; forming a gate over the gate insulator; and forming, by ion implantation, a source line region of a first conductivity type and a bit line region of a second conductivity type.

According to another aspect of the present invention, a semiconductor memory device having an electrically floating body with improved read operation is provided. Methods of operation and manufacturing of the semiconductor device are also provided. Applications of the memory cell, for example as configuration memory in a field programmable logic array (FPGA) or as a reference cell that can be used in comparing the state of a floating body memory device are also provided.

These and other features of the invention will become apparent to those persons skilled in the art upon reading the details of the cells, arrays, devices and methods as more fully described below.

DETAILED DESCRIPTION OF THE INVENTION

Figure 1A:
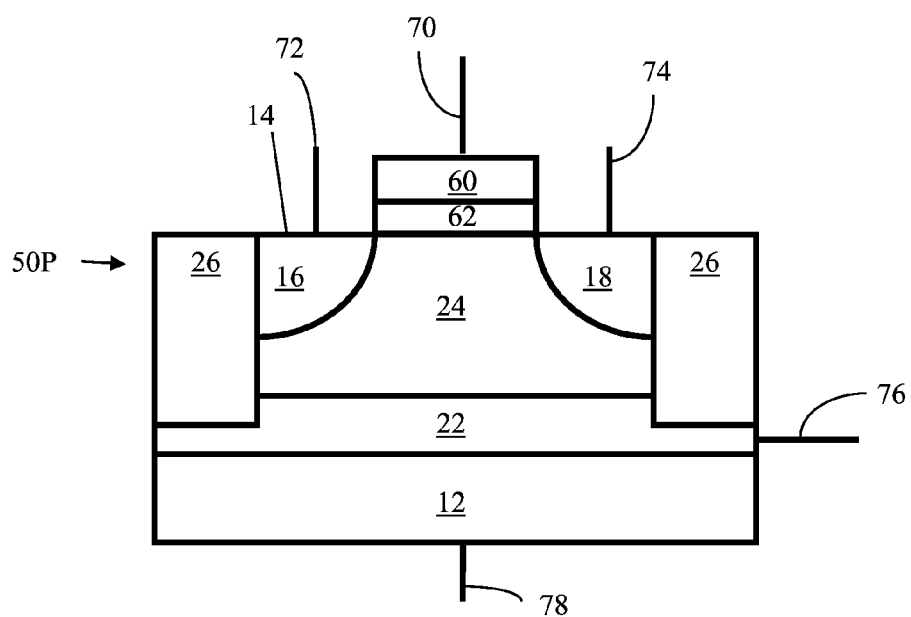
FIGS. 1A and 1B illustrate prior art floating body memory cells.

Before the present devices, cells and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the terminal" includes reference to one or more terminals and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Drawing figures in this specification, particularly diagrams illustrating semiconductor structures, are drawn to facilitate understanding through clarity of presentation and are not drawn to scale. In the semiconductor structures illustrated, there are two different conductivity types: p-type where the majority charge carriers are positively charged holes that typically migrate along the semiconductor valence band in the presence of an electric field, and n-type where the majority charge carriers are negatively charged electrons that typically migrate along the conduction band in the presence of an electric field. Dopants may be introduced into an intrinsic semiconductor (where the quantity of holes and electrons are equal and the ability to conduct electric current is low: much better than in an insulator, but far worse than in a region doped to be conductive hence the "semi-" in "semiconductor") to create one of the conductivity types.

When dopant atoms capable of accepting another electron (known as "acceptors") are introduced into the semiconductor lattice, the "hole" where an electron can be accepted becomes a positive charge carrier. When many such atoms are introduced, the conductivity type becomes p-type and the holes resulting from the electrons being "accepted" are the majority charge carriers. Similarly, when dopant atoms capable of donating another electron (known as "donors") are introduced into the semiconductor lattice, the donated electron becomes a negative charge carrier. When many such atoms are introduced, the conductivity type becomes n-type and the "donated" electrons are the majority charge carriers.

The quantities of dopant atoms used may vary widely over orders of magnitude of final concentration as a matter of design choice. However it is the nature of the majority carriers and not their quantity that determines if the material is p-type or n type. Sometimes in the art, heavily, medium, and lightly doped p-type material is designated p+, p and p− respectively while heavily, medium, and lightly doped n-type material is designated n+, n and n− respectively. Unfortunately, there are no precise definitions of when a "+" or a "−" is an appropriate qualifier, so to avoid overcomplicating the disclosure the simple designations p type and n-type abbreviated "p" or "n" respectively are used without qualifiers throughout this disclosure. Persons of ordinary skill in the art will appreciate that there are many considerations that contribute to the choice of doping levels in any particular embodiment as a matter of design choice.

Numerous different exemplary embodiments are presented. In many of them there are common characteristics, features, modes of operation, etc. When like reference numbers are used in different drawing figures, they are used to indicate analogous, similar or identical structures to enhance the understanding of the present invention by clarifying the relationships between the structures and embodiments presented in the various diagrams—particularly in relating analogous, similar or identical functionality to different physical structures.

Definitions

The phrase "conductivity type" as used herein, refers to the type the type of majority carriers present in a semiconductor region. In the semiconductor structures illustrated, there are two different conductivity types: p-type where the majority charge carriers are positively charged holes that typically migrate along the semiconductor valence band in the presence of an electric field, and n-type where the majority charge carriers are negatively charged electrons that typically migrate along the conduction band in the presence of an electric field.

The phrase "bi-stable memory cell" as used herein, refers to a memory cell having two stable states, which are separated by an energy barrier.

DETAILED DESCRIPTION

Figure 1B:
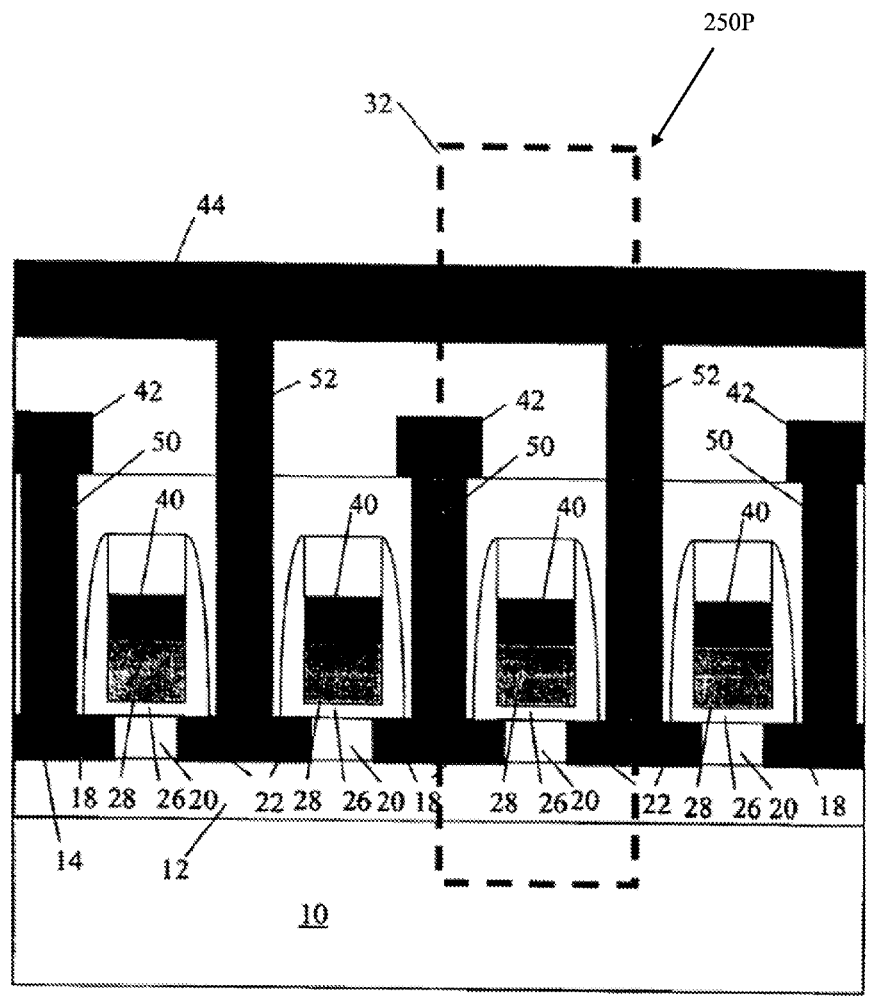

FIGS. 1A and 1B illustrate floating body memory cells 50P and 250P, respectively, for example, as described in U.S. Patent Application Publication No. 2010/00246284 to Widjaja et al., titled "Semiconductor Memory Having Floating Body Transistor and Method of Operating", "Scaled 1T-Bulk Devices Built with CMOS 90 nm Technology for Low-Cost eDRAM Applications", Ranica et al., 2005 Symposium on VLSI Technology, Digest of Technical Papers ("Ranica") and U.S. Pat. No. 6,937,516 "Semiconductor Device", Fazan and Okhonin ("Fazan"), each of which are hereby incorporated herein, in their entireties, by reference thereto. FIGS. 1A and 1B illustrate floating body memory cells fabricated in a bulk silicon substrate and on a silicon-on-insulator (SOI) substrate, respectively. In a floating body memory, the different memory states are represented by different levels of charge in the floating body 24.

In memory design in general, sensing and amplifying the state of a memory cell is an important aspect of the design. This is true as well of floating body DRAM memories. Different aspects and approaches to performing a read operation are known in the art, such as those disclosed in "A Design of a Capacitor-less 1T-DRAM Cell Using Gate-Induced Drain Leakage (GIDL) Current for Low-power and High-speed Embedded Memory", Yoshida et al., pp. 913-918, International Electron Devices Meeting, 2003 ("Yoshida") which is incorporated by reference herein in its entirety; in U.S. Pat. No. 7,301,803 "Bipolar reading technique for a memory cell having an electrically floating body transistor" ("Okhonin-2") which is incorporated by reference herein in its entirety; in "Memory Design Using One-Transistor Gain Cell on SOI", T. Ohsawa et al., pp. 152-153, Tech. Digest, 2002 IEEE International Solid-State Circuits Conference, February 2002) ("Ohsawa-1"); in "An 18.5 ns 128 Mb SOI DRAM with a Floating Body Cell", Ohsawa et al., pp. 458-459, 609, IEEE International Solid-State Circuits Conference, 2005 ("Ohsawa-2"); and in U.S. Patent Application Publication No. 2009/0016101 titled "Reading technique for memory cell with electrically floating body transistor" (hereafter referred to as "Okhonin-3"), all of which documents are hereby incorporated herein, in their entireties, by reference thereto. Both Yoshida and Okhonin-2 disclose a method of generating a read current from a standard MOSFET floating body memory cell manufactured in SOI-CMOS processes. Okhonin-2 describes using the intrinsic BJT transistor inherent in the standard MOSFET structure to generate the read current, while Okhonin-3 describes a spike reading technique applicable to a DRAM cell. Ohsawa-1 and Ohsawa-2 disclose a detailed sensing scheme for use with standard MOSFET floating body memory cells implemented in both SOI and standard bulk silicon which compares the current of a sensed cell to the average of two reference cells, one written to logic-0 state and the other written to logic-1 state.

One method to sense the state of a floating body memory cell is through monitoring the cell current of the floating body memory cell. If the memory cell is in a logic-1 state having holes in the floating body region 24, then the memory cell will have a lower threshold voltage (gate voltage where the transistor is turned on), and consequently a higher cell current, compared to the floating body memory cell 50 is in logic-0 state having no holes in the floating body region 24. However, the difference between the threshold voltage of memory cells in logic-0 and logic-1 state decreases as the floating body memory cell 50 is being scaled to smaller geometry due to the lower floating body capacitance and/or higher gate oxide capacitance.

According to at least one embodiment of the present invention, a semiconductor memory device is provided with an electrically floating body with improved read operation. Methods of operation and manufacturing of the semiconductor device are also provided. Applications of the memory cell, for example as configuration memory in a field programmable logic array (FPGA) or as a reference cell that can be used in comparing the state of a floating body memory device, for example, as described in Widjaja and Ranica, are also provided.

Figure 2A:
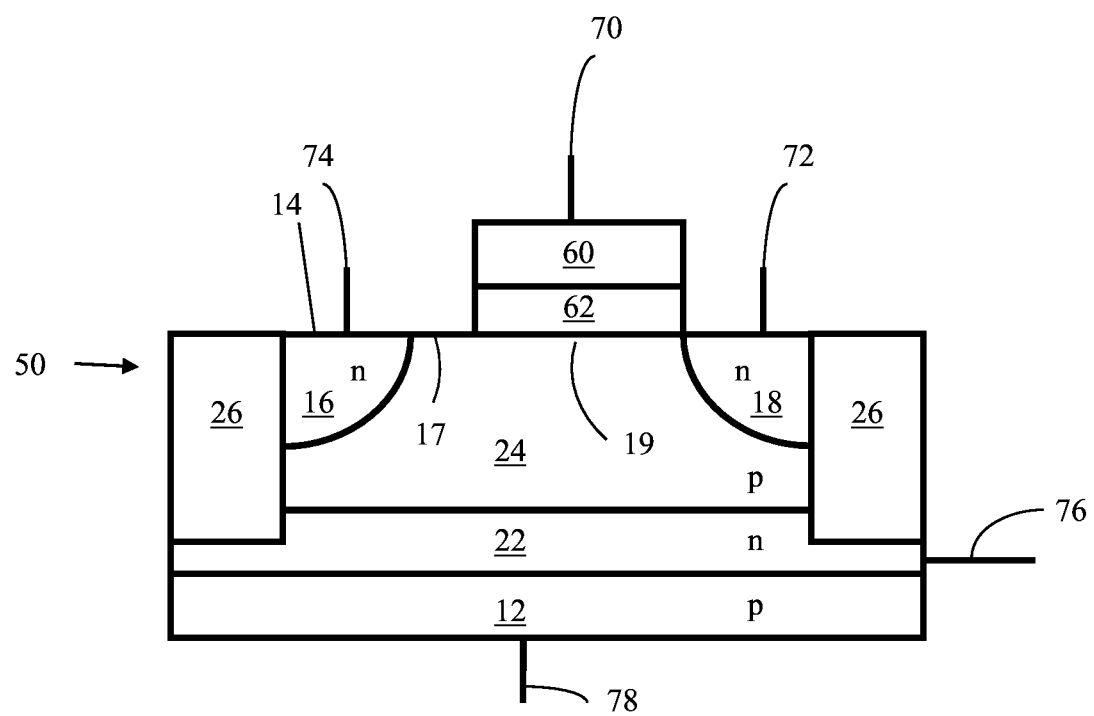
FIGS. 2A and 2B are schematic, cross-sectional illustrations of memory cells according to embodiments of the present invention.

FIG. 2A illustrates a schematic cross-sectional view of a memory cell 50 according to an embodiment of the present invention. Memory cell 50 includes a substrate 12 of a first conductivity type such as p-type, for example. Substrate 12 is typically made of silicon, but may also (or alternatively) comprise, for example, germanium, silicon germanium, gallium arsenide, carbon nanotubes, or other semiconductor materials. In some embodiments of the invention, substrate 12 may be the bulk material of the semiconductor wafer. In other embodiments, substrate 12 may be a well of the first conductivity type embedded in either a well of the second conductivity type or, alternatively, in the bulk of the semiconductor wafer of the second conductivity type, such as n-type, for example, (not shown in the figures). To simplify the description, the substrate 12 will usually be drawn as the semiconductor bulk material as it is in FIG. 2A.

A buried layer 22 of a second conductivity type such as n-type, for example, is provided in the substrate 12. Buried layer 22 may be formed by an ion implantation process on the material of substrate 12. Alternatively, buried layer 22 can also be grown epitaxially on top of substrate 12.

A floating body region 24 of the first conductivity type, such as p-type, for example, is bounded on top by bit line region 16, source line region 18, gap region 17 and insulating layer 62, on the sides by insulating layers 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

Figure 2B:
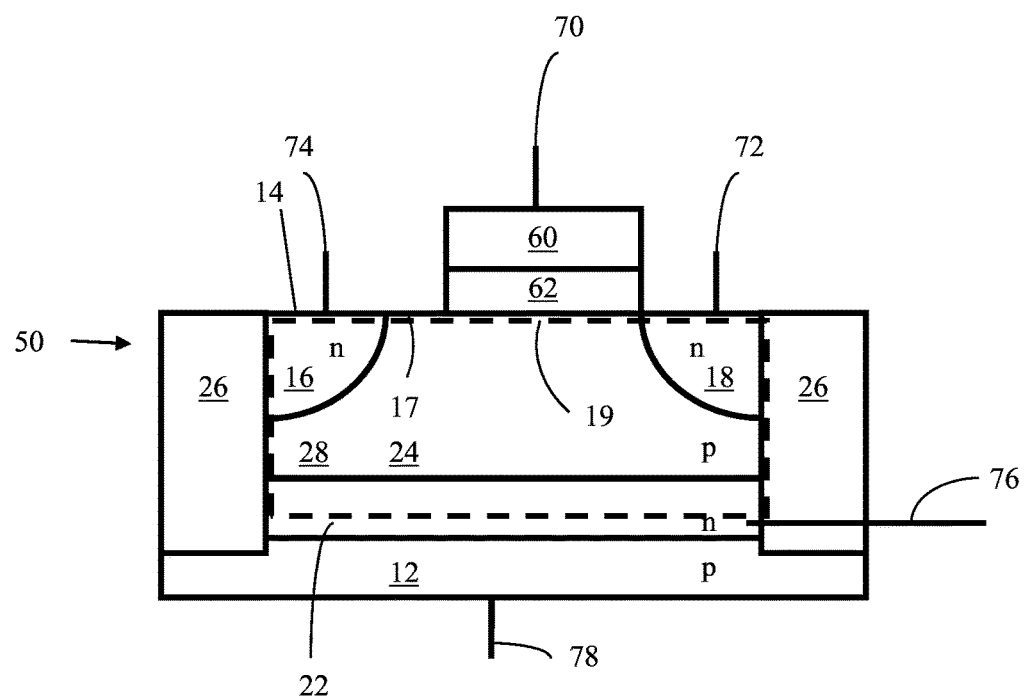

Insulating layers 26 (like, for example, shallow trench isolation (STI)), may be made of silicon oxide, for example, though other insulating materials may be used. Insulating layers 26 insulate cell 50 from neighboring cells 50 when multiple cells 50 are joined in an array 80 (e.g., FIG. 2E) to make a memory device. The bottom of insulating layer 26 may reside inside the buried region 22 allowing buried region 22 to be continuous as shown in FIG. 2A. Alternatively, the bottom of insulating layer 26 may reside below the buried region 22 as shown in the cross-sectional view of another embodiment of memory cell 50 in FIG. 2B. This requires a shallower insulating layer 28 (shown in dashed lines in FIG. 2B), which insulates the floating body region 24, but allows the buried layer 22 to be continuous in the perpendicular direction of the cross-sectional view shown in FIG. 2B. For simplicity, only memory cell 50 with continuous buried region 22 in all directions will be shown from hereon.

A bit line region 16 having a second conductivity type, such as n-type, for example, is provided in floating body region 24, so as to bound a portion of the top of the floating body region in a manner discussed above, and is exposed at surface 14. Bit line region 16 may be formed by an implantation process on the material making up substrate 12, according to any implantation process known and typically used in the art. Alternatively, a solid state diffusion process could be used to form bit line region 16.

A source line region 18 having a second conductivity type, such as n-type, for example, is also provided in floating body region 24, so as to bound a portion of the top of the floating body region in a manner discussed above, and is exposed at cell surface 14. Source line region 18 may be formed by an implantation process on the material making up substrate 12, according to any implantation process known and typically used in the art. Alternatively, a solid state diffusion process could be used to form source line region 18.

A gate 60 is positioned in between the bit line region 16 and source line region 18 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Memory cell 50 is asymmetric in that there is a gap region 17 formed near the area of the bit line region 16. As a result, there is no overlap between the area underneath the gate region 60, often referred to as the channel region 19, and the bit line region 16.

Cell 50 includes several terminals: word line (WL) terminal 70 electrically connected to gate 60, bit line (BL) terminal 74 electrically connected to bit line region 16, source line (SL) terminal 72 electrically connected to source line region 18, buried well (BW) terminal 76 electrically connected to buried layer 22, and substrate terminal 78 electrically connected to the substrate 12.

Figure 2C:
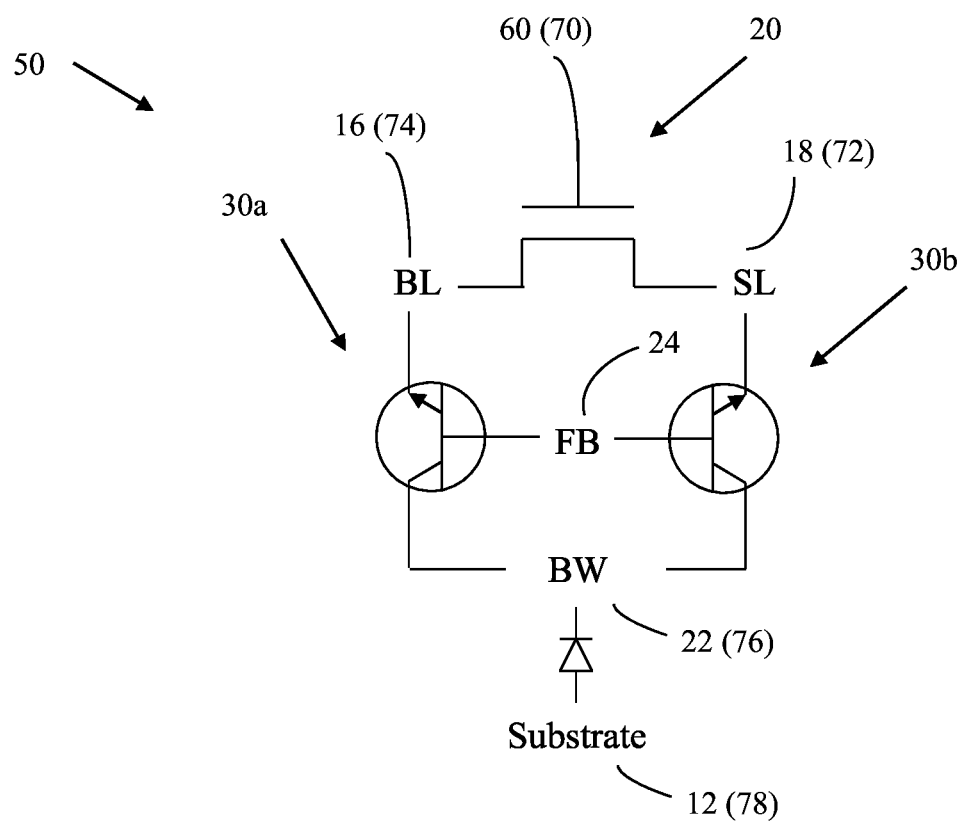
FIG. 2C schematically illustrates an equivalent circuit representation of the memory cells shown in FIGS. 2A and 2B.

FIG. 2C illustrates an equivalent circuit representation of memory cell 50. Inherent in memory cell 50 are metal-oxide-semiconductor (MOS) transistor 20, formed by bit line region 16, gate 60, source line region 18, and floating body region 24, and bipolar devices 30a and 30b, formed by buried well region 22, floating body region 24, and bit line region 16 or source line region 18, respectively.

Figure 2D:
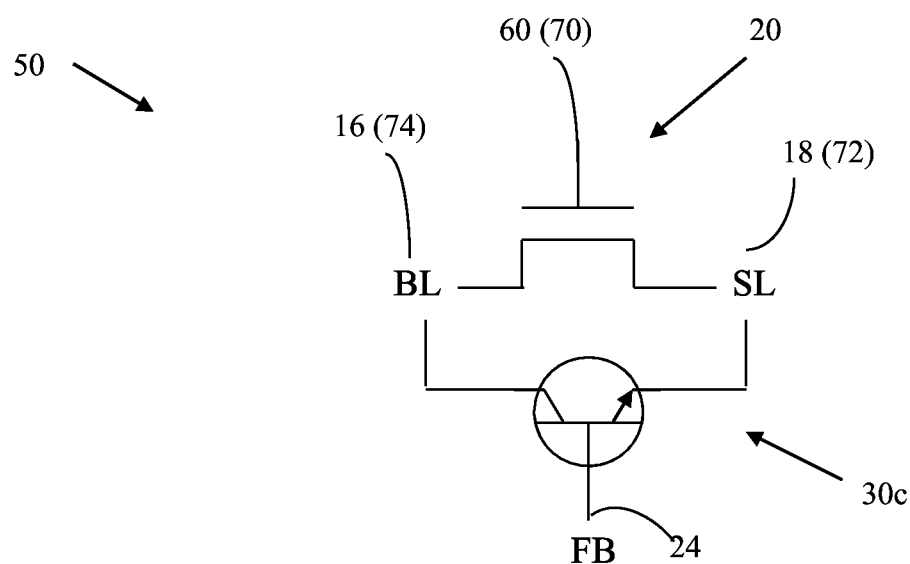
FIG. 2D schematically illustrates a bipolar device inherent in memory devices of FIGS. 2A-2B.

Also inherent in memory device 50 is bipolar device 30c, formed by bit line region 16, floating body 24, and source line region 18. For drawings clarity, bipolar device 30c is shown separately in FIG. 2D.

Figure 2E:
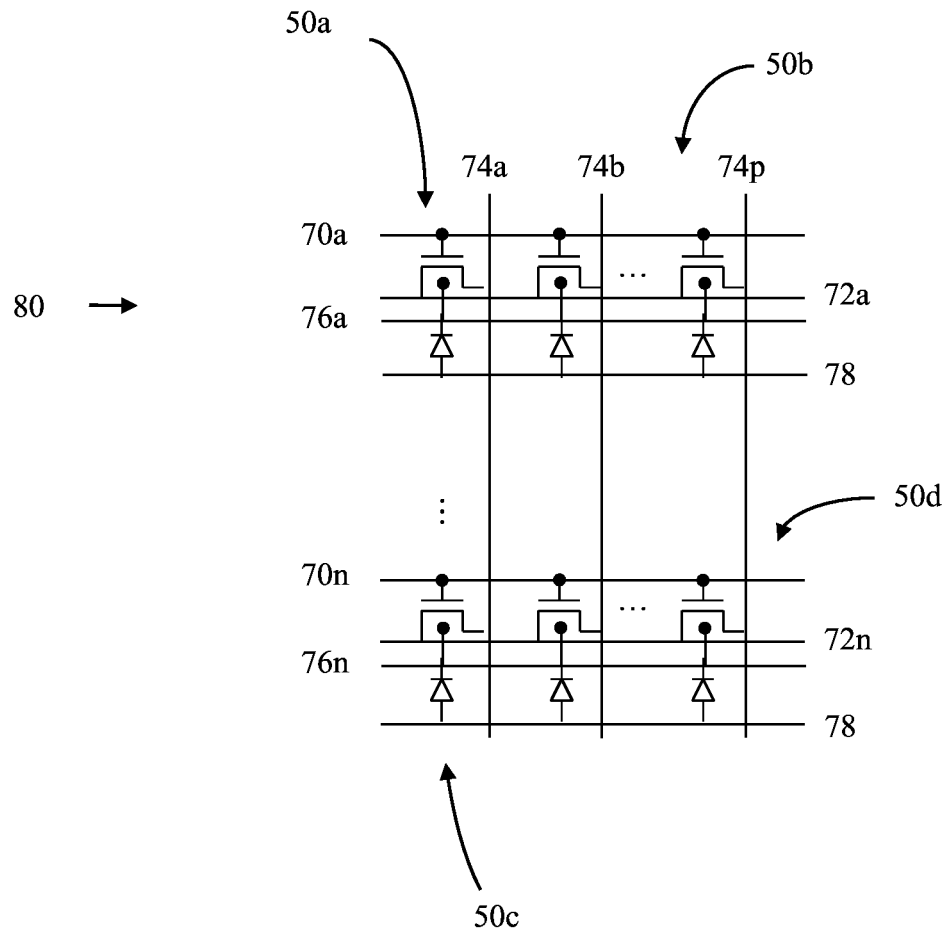
FIG. 2E schematically illustrates multiple cells of the type in FIG. 2A and/or FIG. 2B joined in an array to make a memory device.

FIG. 2E schematically illustrates an exemplary embodiment of a memory array 80 of memory cells 50 (four exemplary instances of memory cell 50 being labeled as 50a, 50b, 50c and 50d) arranged in rows and columns. In many, but not all, of the figures where array 80 appears, representative memory cell 50a will be representative of a "selected" memory cell 50 when the operation being described has one (or more in some embodiments) selected memory cells 50.

In such figures, representative memory cell 50*b* will be representative of an unselected memory cell 50 sharing the same row as selected representative memory cell 50*a*, representative memory cell 50*c* will be representative of an unselected memory cell 50 sharing the same column as selected representative memory cell 50*a*, and representative memory cell 50*d* will be representative of a memory cell 50 sharing neither a row or a column with selected representative memory cell 50*a*.

Present in FIG. 2E are word lines 70*a* through 70*n*, source lines 72*a* through 72*n*, bit lines 74*a* through 74*p*, buried well terminals 76*a* through 76*n*, and substrate terminal 78. Representation of the lines/terminal with letters a-n or a through p, includes not only embodiments which include literally twelve lines/terminals (i.e., a,b,c,d,e,f,g,h,i,j,k,l,m,n,o,p) or fourteen lines/terminals (i.e., a,b,c,d,e,f,g,h,i,j,k,l,m,n,o,p), but is meant to more generically represent a plurality of such line terminals, which can be less than twelve (i.e., as low as one or greater than twelve, thirteen or fourteen (much greater than fourteen up to any positive integer practical).

Each of the source lines 72*a* through 72*n* is associated with a single row of memory cells 50 and is coupled to the source line region 18 of each memory cell 50 in that row. Each of the bit lines 74*a* through 74*p* is associated with a single column of memory cells 50 and is coupled to the bit line region 16 of each memory cell 50 in that column.

Substrate 12 is present at all locations under array 80. Persons of ordinary skill in the art will appreciate that one or more substrate terminals 78 may be present in one or more locations. Such skilled persons will also appreciate that although array 80 is shown in FIG. 2E as a single continuous array, many other organizations and layouts are possible. For example, word lines may be segmented or buffered, bit lines may be segmented or buffered, source lines may be segmented or buffered, the array 80 may be broken into two or more sub-arrays, control circuits such as word decoders, column decoders, segmentation devices, sense amplifiers, write amplifiers may be arrayed around array 80 or inserted between sub-arrays of array 80. Thus the present invention is not limited to the exemplary embodiments, features, design options, etc., shown and described.

Several operations can be performed by memory cell 50 such as holding, read, write logic-1 and write logic-0 operations.

Figure 3A:
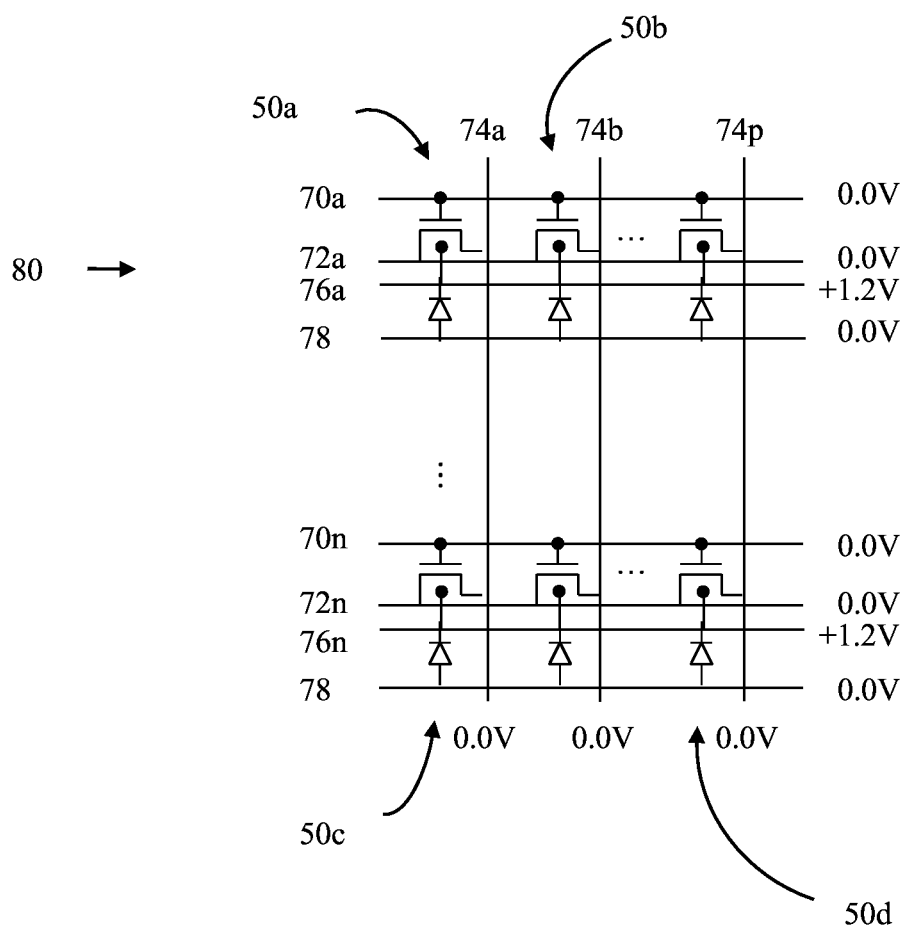
FIG. 3A schematically illustrates performance of a holding operation on a memory array according to an embodiment of the present invention.
Figure 3B:
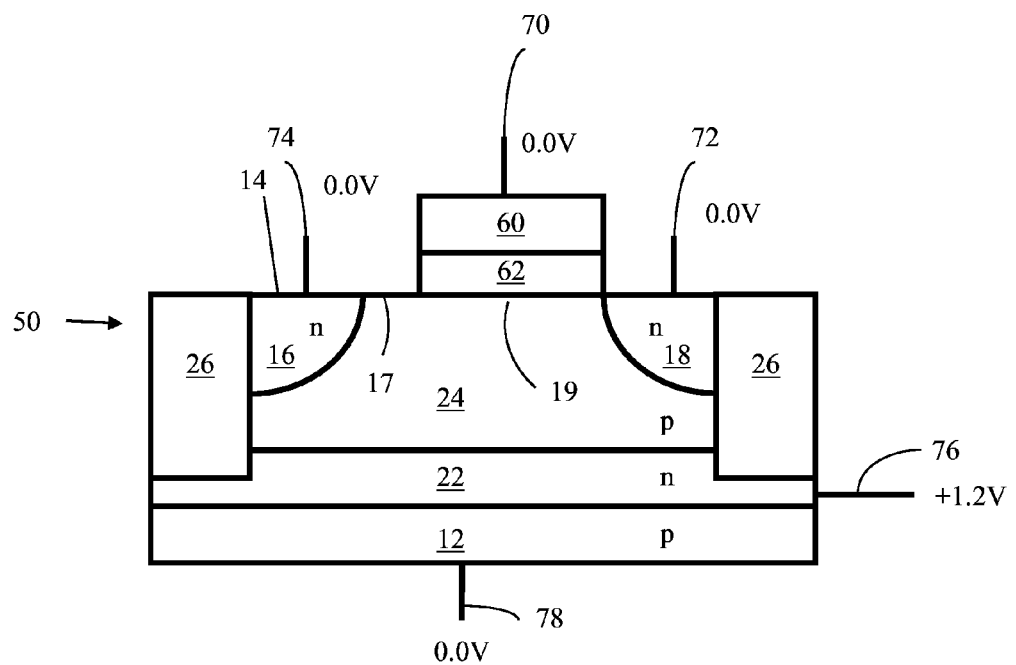
FIG. 3B illustrates bias conditions applied on the terminals of a memory cell of the array of FIG. 3A.

FIG. 3A schematically illustrates performance of a holding operation on memory array 80, while FIG. 3B shows the bias applied on the terminals of a memory cell 50 during the holding operation. The holding operation is performed by applying a positive back bias to the BW terminal 76, zero bias on the WL terminal 70, BL terminal 74, SL terminal 72, and substrate terminal 78. The positive back bias applied to the buried layer region 22 connected to the BW terminal 76 will maintain the state of the memory cell 50 that it is connected to. The positive bias applied to the BW terminal 76 needs to generate sufficient electric field to trigger impact ionization mechanism as will be described through the band diagram shown in FIGS. 4A and 4B. The impact ionization rate as a function of the electric field is for example described in "Physics of Semiconductor Devices", Sze S. M. and Ng K. K., which is hereby incorporated herein, in its entirety, by reference thereto.

In one embodiment the bias conditions for the holding operation on memory cell 50 is: 0 volts is applied to WL terminal 70, 0 volts is applied to BL terminal 74, 0 volts is applied to SL terminal 72, a positive voltage, for example, +1.2 volts is applied to BW terminal 76, and 0 volts is applied to the substrate terminal 78. In other embodiments, different voltages may be applied to the various terminals of memory cell 50 and the exemplary voltages described are not limiting.

Figure 4A:
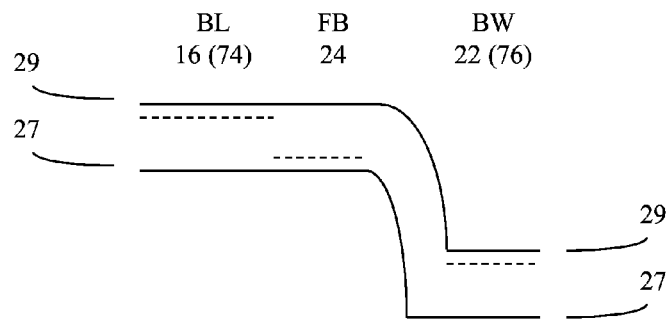
FIG. 4A shows an energy band diagram characterizing an intrinsic n-p-n bipolar device when a floating body region is positively charged and a positive bias voltage is applied to a buried well region of a memory cell according to an embodiment of the present invention.

FIG. 4A shows an energy band diagram characterizing the intrinsic n-p-n bipolar device 30*a* when the floating body region 24 is positively charged and a positive bias voltage is applied to the buried well region 22. The energy band diagram of the intrinsic n-p-n bipolar device 30*b* can be constructed in a similar manner, with the source line region 18 (connected to the SL terminal 72) in place of the bit line region 16 (connected to the BL terminal 74). The dashed lines indicate the Fermi levels in the various regions of the n-p-n transistor 30*a*. The Fermi level is located in the band gap between the solid line 27 indicating the top of the valence band (the bottom of the band gap) and the solid line 29 indicating the bottom of the conduction band (the top of the band gap) as is well known in the art. If floating body 24 is positively charged, a state corresponding to logic-1, the bipolar transistors 30*a* and 30*b* will be turned on as the positive charge in the floating body region lowers the energy barrier of electron flow into the base region. Once injected into the floating body region 24, the electrons will be swept into the buried well region 22 (connected to BW terminal 76) due to the positive bias applied to the buried well region 22. As a result of the positive bias, the electrons are accelerated and create additional hot carriers (hot hole and hot electron pairs) through an impact ionization mechanism. The resulting hot electrons flow into the BW terminal 76 while the resulting hot holes will subsequently flow into the floating body region 24. This process restores the charge on floating body 24 and will maintain the charge stored in the floating body region 24 which will keep the n-p-n bipolar transistors 30*a* and 30*b* on for as long as a positive bias is applied to the buried well region 22 through BW terminal 76.

If floating body 24 is neutrally charged (the voltage on floating body 24 being equal to the voltage on grounded bit line region 16), a state corresponding to logic-0, no current will flow through the n-p-n bipolar devices 30*a* and 30*b*. The bipolar devices 30*a* and 30*b* will remain off and no impact ionization occurs. Consequently memory cells in the logic-0 state will remain in the logic-0 state.

Figure 4B:
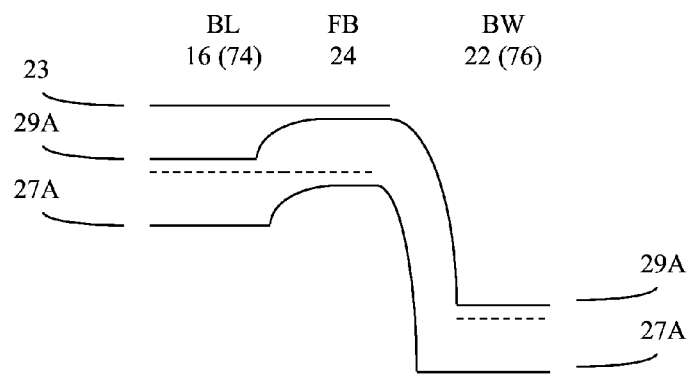
FIG. 4B shows an energy band diagram of an intrinsic n-p-n bipolar device when a floating body region is neutrally charged and a bias voltage is applied to a buried well region of a memory cell according to an embodiment of the present invention.

FIG. 4B shows an energy band diagram of the intrinsic bipolar device 30*a* when the floating body region 24 is neutrally charged and a bias voltage is applied to the buried well region 22. In this state the energy level of the band gap bounded by solid lines 27A and 29A is different in the various regions of n-p-n bipolar device 30*a*. Because the potential of the floating body region 24 and the bit line region 16 is equal, the Fermi levels are constant, resulting in an energy barrier between the bit line region 16 and the floating body region 24. Solid line 23 indicates, for reference purposes, the energy barrier between the bit line region 16 and the floating body region 24. The energy barrier prevents electron flow from the bit line region 16 (connected to BL terminal 74) to the floating body region 24. Thus the n-p-n bipolar device 30*a* and 30*b* will remain off.

In the holding operation described with regard to FIG. 3A, there is no individually selected memory cell. Rather the holding operation will be performed at all cells connected to the same buried well terminal 76.

Figure 5A:
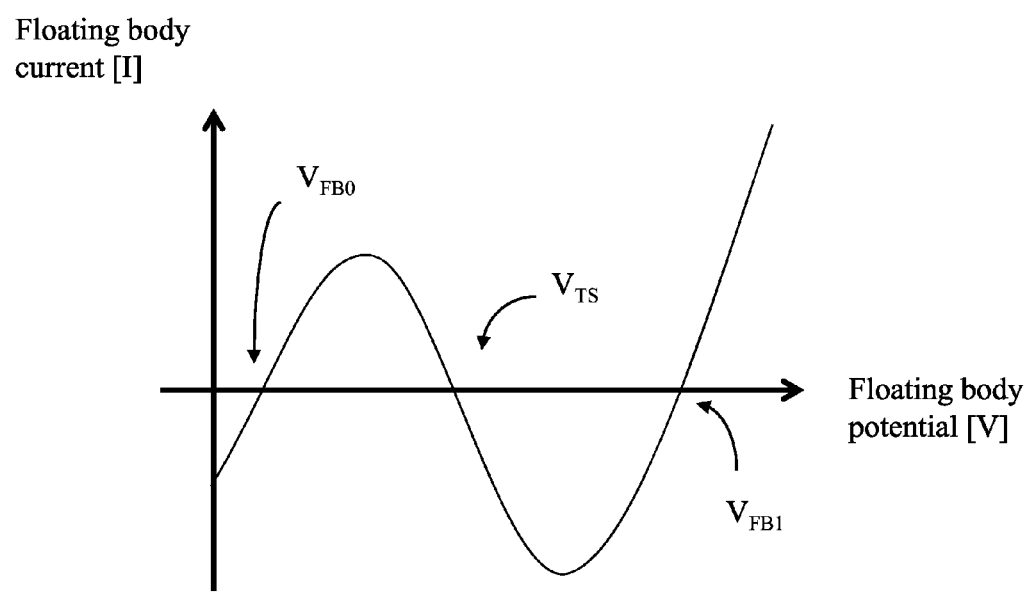
FIG. 5A shows a graph of the net current I flowing into or out of a floating body region as a function of the potential V of the floating body, according to an embodiment of the present invention.

FIG. 5A shows a graph of the net current I flowing into or out of the floating body region 24 as a function of the potential V of the floating body 24 (not drawn to scale). A negative current indicates a net current flowing into the floating body region 24, while a positive current indicates a net current flowing out of the floating body region 24. At low floating body 24 potential, between 0V and $V_{FB0}$ indicated in FIG. 5A, the net current is flowing into the floating body region 24 as a result of the p-n diode formed by the floating body region 24 and the buried well region 22 being reverse biased. If the value of the floating body 24 potential is between $V_{FB0}$ and $V_{TS}$, the current will switch direction, resulting in a net current flowing out of the floating body region 24. This is because of the p-n diode, formed by the floating body region 24 and the buried well region 22, being forward biased as the floating body region 24 becomes increasingly more positive. As a result, if the potential of the floating body region 24 is less than $V_{TS}$, then at steady state the floating body region 24 will reach $V_{FB0}$. If the potential of the floating body region 24 is higher than $V_{TS}$, the current will switch direction, resulting in a net current flowing into the floating body region 24. This is as a result of the base current flowing into the floating body region 24 being greater than the p-n diode leakage current. When the floating body 24 potential is higher than $V_{FB1}$, the net current will be out of the floating body region 24. This is because the p-n diode leakage current is once again greater than the base current of the bipolar devices 30a and 30b.

Figure 5B:
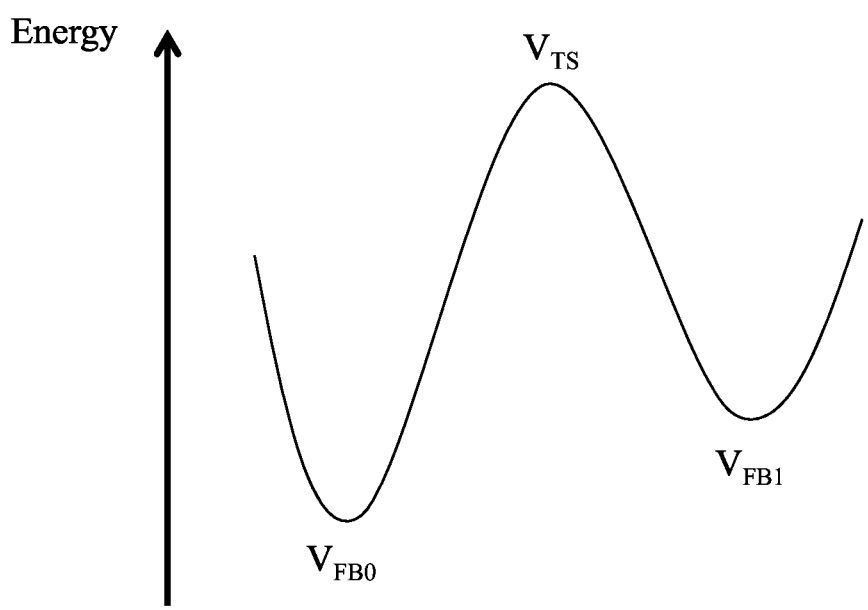
FIG. 5B shows a schematic curve of a potential energy surface (PES) of a memory cell according to an embodiment of the present invention.

The holding operation results in the floating body memory cell having two stable states: the logic-0 state and the logic-1 state separated by an energy barrier, which are represented by $V_{FB0}$, $V_{FB1}$, and $V_{TS}$, respectively. FIG. 5B shows a schematic curve of a potential energy surface (PES) of the memory cell 50, which shows another representation of the two stable states resulting from applying a back bias to the BW terminal 76 (connected to the buried well region 22).

The values of the floating body 24 potential where the current changes direction, i.e. $V_{FB0}$, $V_{FB1}$, and $V_{TS}$, can be modulated by the potential applied to the BW terminal 76. These values are also temperature dependent.

Figure 5C:
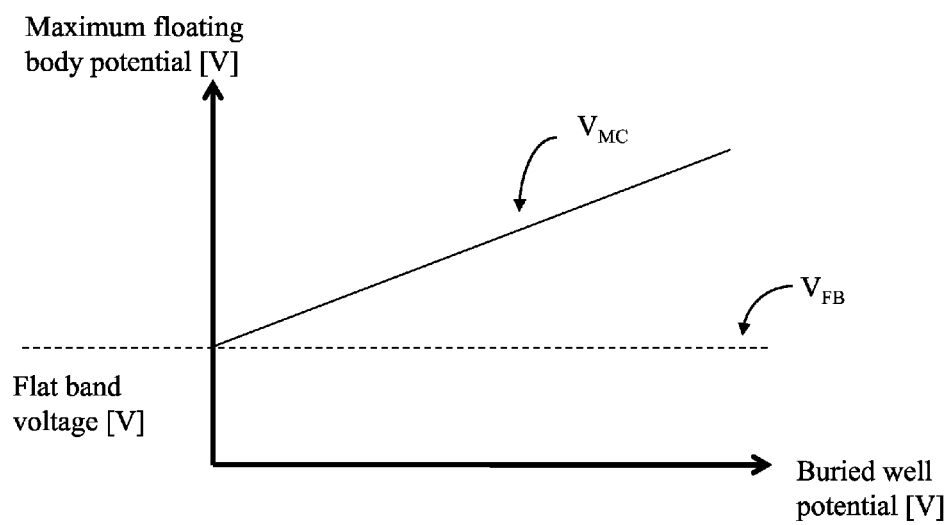
FIG. 5C illustrates a charge stored in a floating body region of a memory cell as a function of a potential applied to a buried well region, connected to a BW terminal, according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to substrate terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the substrate terminal 78 as shown in FIG. 5C. The increase in the maximum charge stored in the floating body 24 results in a larger memory window.

Figure 5D:
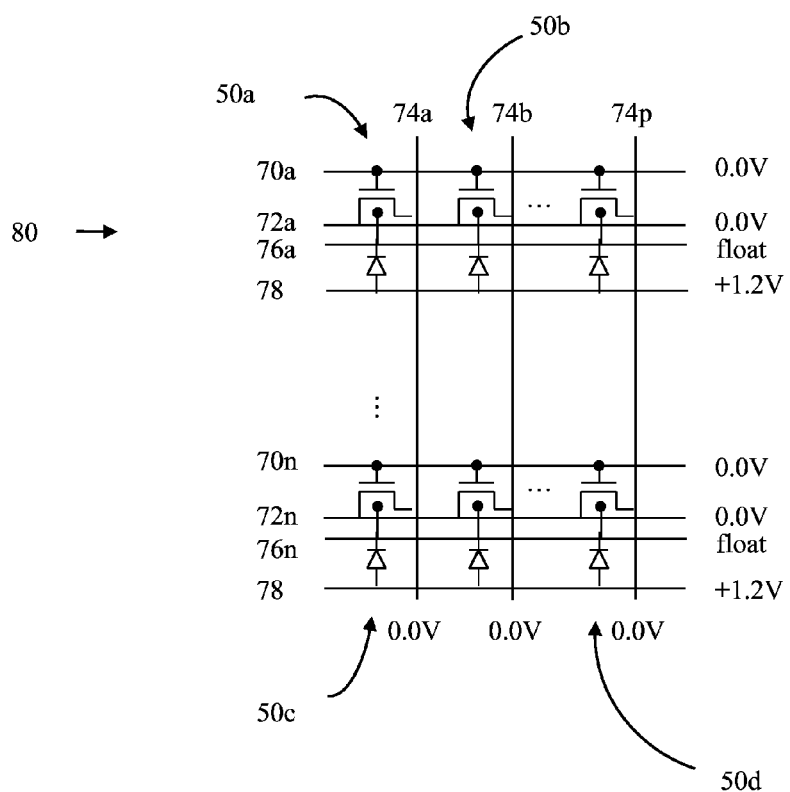
FIG. 5D schematically illustrates performance of an alternative holding operation on a memory array employing an intrinsic silicon controlled rectifier principle according to an embodiment of the present invention.
Figure 5E:
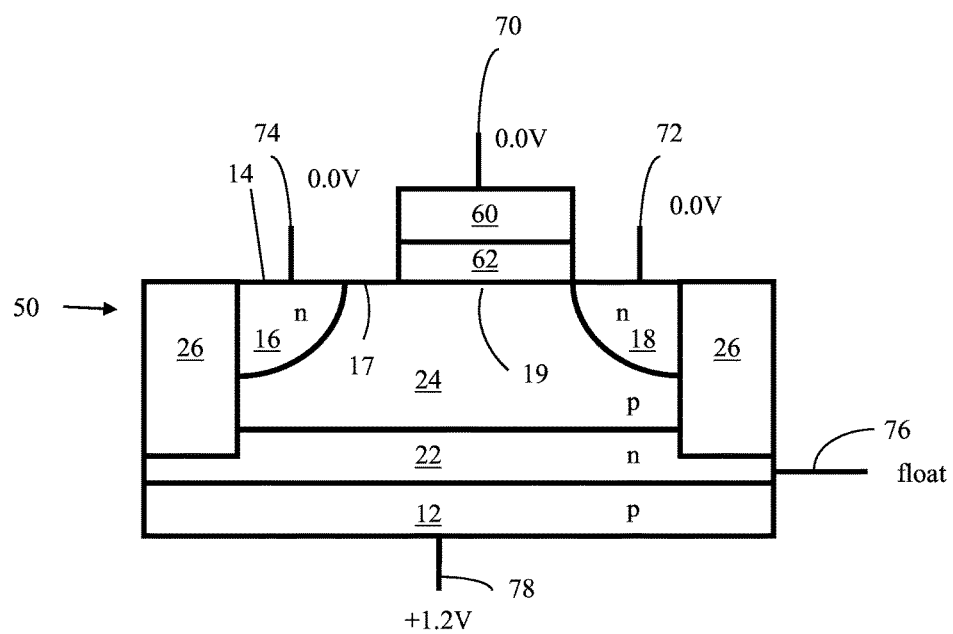
FIG. 5E illustrates bias conditions applied on the terminals of a memory cell of the array of FIG. 5D.

FIGS. 5D and 5E illustrate bias condition for an alternative holding operation applied on memory array 80 and on a selected memory cell 50a, as described for example in US 2010/0034041, "Method of Operating Semiconductor Memory Device with Floating Body Transistor Using Silicon Controlled Rectifier Principle" ("Widjaja-2"), which is incorporated by reference herein in its entirety. The holding operation may also be performed by applying the following bias conditions: zero voltage is applied to WL terminal 70, SL terminal 72, and BL terminal 74, a positive voltage is applied to the substrate terminal 78, while the BW terminal 76 is left floating. Under these conditions, if memory cell 50 is in memory/data state "1" with positive voltage in floating body 24, the intrinsic silicon controlled rectifier (SCR) device of memory cell 50, formed by the substrate 12, the buried well region 22, the floating body region 24, and the bit line region 16 or the source line region 18, is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 50 may be refreshed by periodically applying a positive voltage pulse through substrate terminal 78. Those memory cells 50 that are commonly connected to substrate terminal 78 and which have a positive voltage in body region 24 will be refreshed with a "1" data state, while those memory cells 50 that are commonly connected to the substrate terminal 78 and which do not have a positive voltage in body region 24 will remain in blocking mode, since their SCR device will not be turned on, and therefore memory state "0" will be maintained in those cells. In this way, all memory cells 50 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to BL terminal 74, a voltage of about 0.0 volts is applied to WL terminal 70, about 0.0 volts is applied to SL terminal 72, and about +1.2 volts is applied to terminal 78, while the BW terminal 76 is left floating. However, these voltage levels may vary, while maintaining the relative relationships therebetween.

The amount of charge stored in the floating body 24 can be sensed by monitoring the cell current of the memory cell 50. If the memory cell is in a logic-1 state having holes in the floating body region 24, then the memory cell will have a lower threshold voltage (gate voltage where the transistor is turned on), and consequently a higher cell current, compared to when the floating body memory cell 50 is in logic-0 state having no holes in the floating body region 24.

Figure 6A:
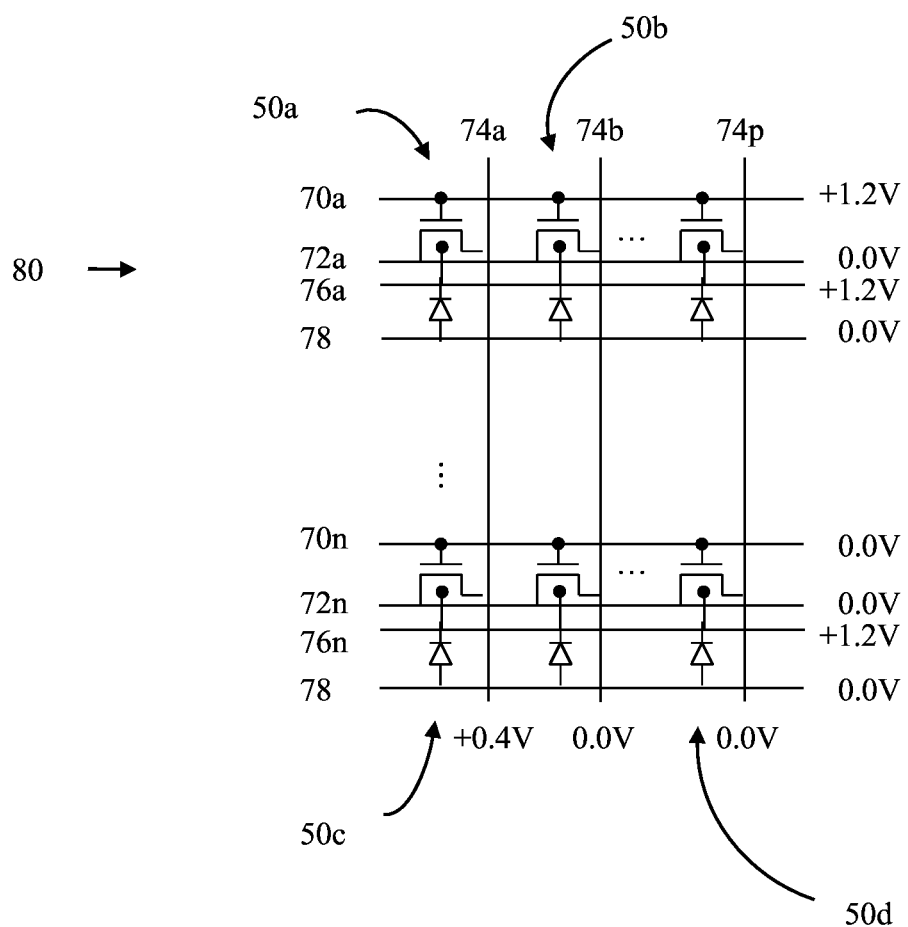
FIG. 6A is a schematic view of a memory array showing exemplary bias conditions for performing a read operation on the memory array, according to an embodiment of the present invention.
Figure 6B:
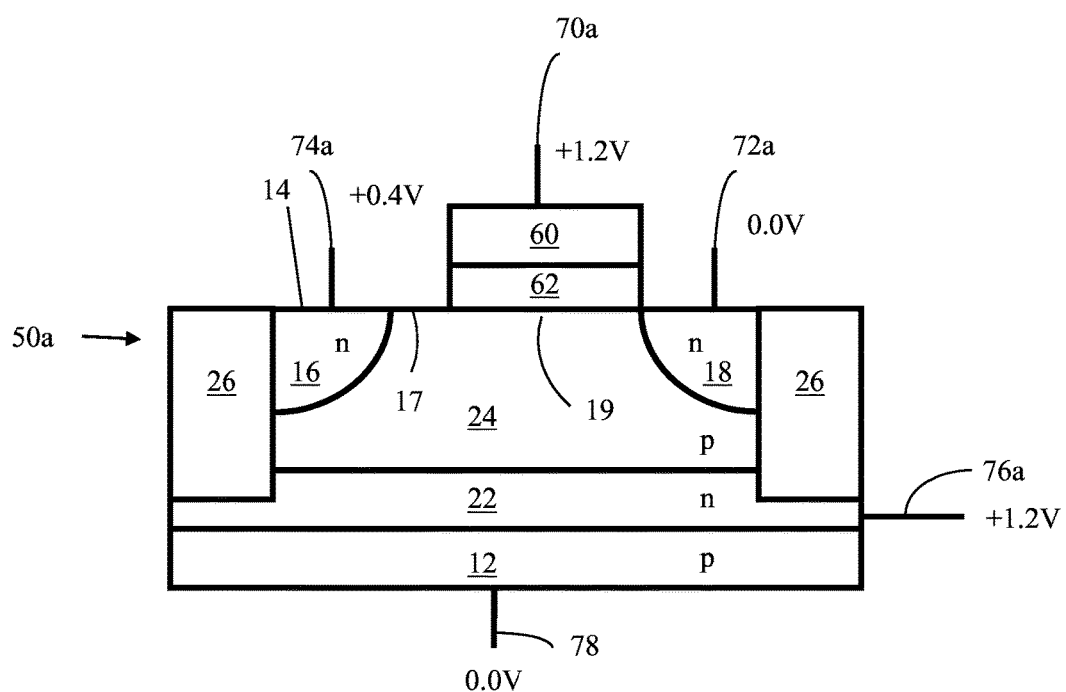
FIG. 6B shows exemplary bias conditions applied to a selected memory cell during the read operation noted with regard to the array in FIG. 6A.

FIG. 6A is a schematic view of a memory array 80 showing exemplary bias conditions for performing a read operation on the memory array 80, according to an embodiment of the present invention. FIG. 6B shows exemplary bias conditions applied to a selected memory cell 50a during the read operation noted with regard to array 80 in FIG. 6A. The read operation is performed by applying the following bias conditions: a positive bias to the WL terminal 70a, a positive bias to the BL terminal 74a, zero bias to the SL terminal 72a, zero or positive bias to the BW terminal 76a, and zero bias to the substrate terminal 78a. All unselected WL terminals 70b (not shown) to 70n have zero volts applied, all unselected BL terminals 74b through 74p have zero volts applied, all unselected SL terminals 72b (not shown) through 72n have zero volts applied.

In one embodiment the bias conditions for the read operation for memory cell 50 are: +1.2 volts is applied to WL terminal 70, +0.4 volts is applied to BL terminal 74, 0.0 volts is applied to SL terminal 72, +1.2 volts is applied to BW terminal 76, and 0.0 volts is applied to the substrate terminal 78. In other embodiments, different voltages may be applied to the various terminals of memory cell 50 and the exemplary voltages described are not limiting. The positive voltage applied to BL terminal 74 may be less than the positive voltage applied to WL terminal 70, in which the difference in the threshold voltage of the memory cell 50 is employed to represent the state of the memory cell 50. The positive voltage applied to BL terminal 74 may also be greater than or equal to the positive voltage applied to WL terminal 70 and may generate sufficiently high electric field to trigger the bipolar read mechanism.

A sensing circuit typically connected to BL terminal 74 can be used to determine the data state of the memory cell 50. Any sensing scheme known in the art can be used in conjunction with memory cell 50. For example, the sensing schemes disclosed in Ohsawa-1 and Ohsawa-2 are incorporated by reference herein in its entirety.

Figure 6C:
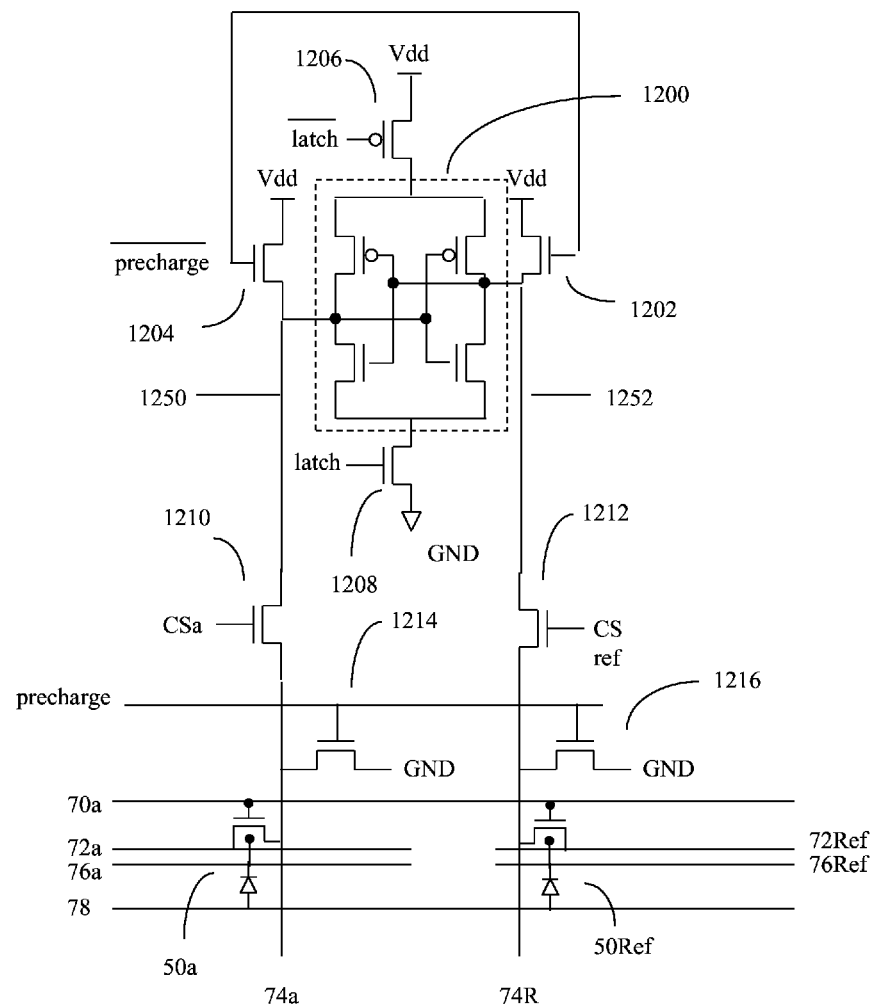
FIG. 6C shows an exemplary sensing circuit connected to a selected memory cell during a read operation according to an embodiment of the present invention.

FIG. 6C shows an example of a sensing circuit connected to the BL terminal 74a, which senses the state of the selected memory cell 50a. The cell current of the memory cell 50a is compared with that of the reference cell 50Ref, which will be described subsequently. The difference between the cell current of the memory cell 50a and the reference cell 50Ref is amplified by the latch 1200. The results of the sensing circuit will be reflected in nodes 1250 and 1252, where node 1252 will be at Vdd if the memory cell 50a is in logic-1 state and will be at GND if the memory cell 50a is in logic-0 state.

When no reading operation is performed, the precharge signal is high, which will turn off transistors 1202 and 1204 and turn on transistors 1214 and 1216, bringing the BL terminals 74a and 74Ref to GND. The latch 1200 is also turned off when no reading operation is performed by turning off transistors 1206 and 1208. During read operation, the precharge signal switches to low, enabling transistors 1202 and 1204, while turning off the transistors 1214 and 1216. Subsequently, the selected WL terminal 70a and BL terminal 74a (through column select CS transistors 1210 and 1212) are enabled. If memory cell 50a is in logic-1 state, it will pull node 1250 to a lower voltage than node 1252 and vice versa. The latch signal is subsequently turned on, amplifying the difference between nodes 1250 and 1252 to Vdd and GND through latch 1200.

The difference between the threshold voltage of a memory cells in the logic-0 state and a memory cell in the logic-1 state decreases as the floating body memory cell 50 is being scaled to smaller geometry due to the lower floating body capacitance and/or higher gate oxide capacitance. Consequently, it is becoming increasingly difficult to distinguish the memory cell current between memory cells in logic-0 and logic-1 state.

The presence of the gap region 17 in the memory cell 50 increases the cell current ratio between memory cells in logic-0 state versus logic-1 state. The cell current flowing through the memory cell from the BL terminal 74 to SL terminal 72 is now governed by both the amount of carriers in the channel region 19 underneath the gate 60, and the potential barrier in the gap region 17 between the channel region 19 and the bit line region 16. Both the carrier density in the channel region 19 and the potential barrier in the gap region 17 are a function of the floating body potential 24.

The surface region of the memory cell 50 can be represented as two devices in series: a metal-oxide-semiconductor (MOS) capacitor (formed by the gate electrode 60, the gate dielectrics 62, and the channel region 19) and a bipolar transistor (formed by the channel region 19, the gap region 17, and the bit line region 16).

When a positive voltage is applied to the gate 60, holes will be forced away from the silicon surface, creating a depletion region in the region under the gate 60. When the gate voltage reaches the threshold voltage (voltage at which a switch from p-type to n-type occurs), an inversion region is formed where the surface region appears to change in character from p-type to n-type and the electron concentration at surface 19 exceeds that of holes at surface 19. The threshold voltage is affected by the potential of the floating body region 24, where a positively charged floating body 24 (e.g. for a memory cell 50 in logic-1 state) will result in a lower threshold voltage than a neutral floating body 24 (e.g. for a memory cell 50 in logic-0 state). Because the threshold voltage depends on the floating body 24 potential, the number of carriers in the channel region 19 available for conduction consequently also depends on the floating body 24 potential. Since the threshold voltage is lower when the floating body 24 is positively charged, the number of carriers at a given voltage applied to the gate 60 will also be higher compared to when the floating body region 24 is neutrally charged.

Figure 7A:
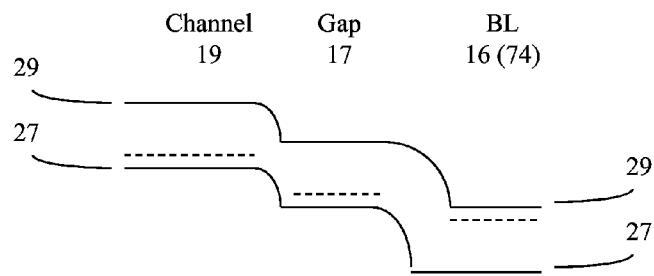
FIG. 7A shows an energy band diagram of an intrinsic bipolar device, according to an embodiment of the present invention, with a positive bias applied to the BL terminal and where the floating body region is positively charged.

Once an inversion region is formed in the region 19 under the gate 60, the electrons will need to travel across the gap region 17. FIG. 7A shows an energy band diagram of the intrinsic bipolar device (formed by the channel region 19, the gap region 17, and the bit line region 16), according to an embodiment of the present invention, with a positive bias applied to the BL terminal 74 (connected to the bit line region 16). If floating body 24 is positively charged, a state corresponding to logic-1, the bipolar transistor will be turned on as the positive charge in the floating body region lowers the energy barrier of electron flow into the base region. This will result in electron flow from the channel region 19 to the gap region 17 and subsequently to the bit line region 16.

Figure 7B:
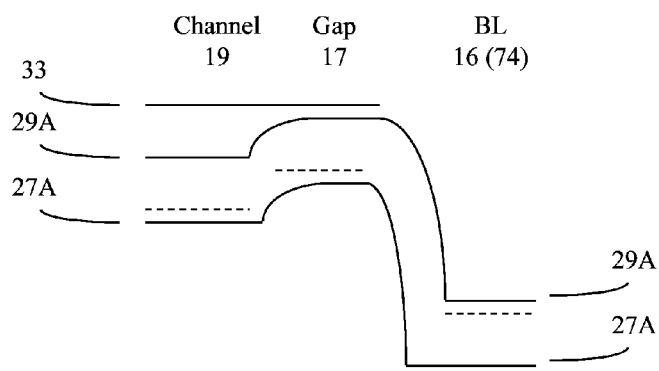
FIG. 7B shows an energy band diagram of the intrinsic bipolar device, according to an embodiment of the present invention, when the floating body region is neutrally charged.

FIG. 7B shows an energy band diagram of the intrinsic bipolar device, according to an embodiment of the present invention, when the floating body region 24 is neutrally charged. In this state, an energy barrier between the channel region 19 and the gap region 17 exists, which is represented by the solid line 33. The energy barrier prevents electron flow from the channel region 19 to the gap region 17 and subsequently to the bit line region 16. Thus the intrinsic n-p-n bipolar device will be turned off.

Both devices in series, i.e. the MOS capacitor (formed by the gate 60, gate dielectrics 62, and the channel region 19) and the intrinsic bipolar device (formed by the channel region 19, the gap region 17, and the bit line region 16), are affected by the floating body 24 potential in the same direction. A positively charged floating body 24 will result in a lower threshold voltage of the MOS capacitor and a lower potential barrier between the channel region 19 and the drain junction 16 of the intrinsic bipolar device. Conversely, a neutrally charged floating body 24 will result in both higher threshold voltage and higher potential barrier in the gap region 17. Consequently, the conductivity of the logic-1 state of the memory cell 50 (i.e. positively charged floating body 24) is expected to be significantly higher than that of the logic-0 state (i.e. neutrally charged floating body 24).

The read mechanism may also be described by having the gap region 17 being controlled by the fringing electric field from the gate 60, hence being only weakly controlled by the gate 60. As a result, the carrier flow through the gap region 17 is governed more dominantly by the energy barrier in the gap region 17, which is a function of the potential of the floating body 24.

Figure 8A:
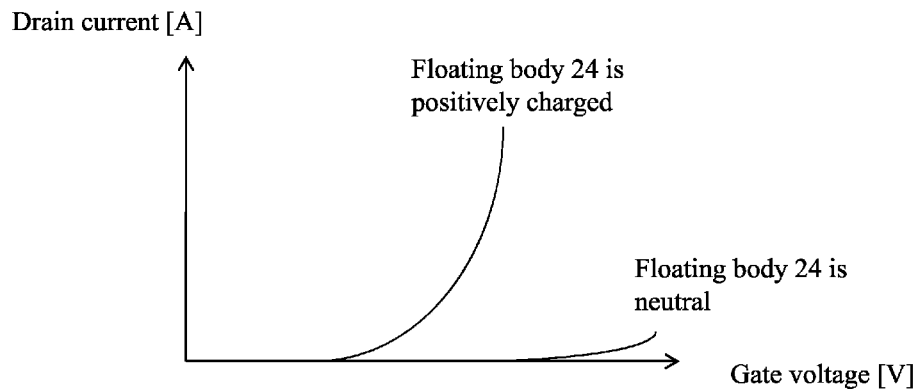
FIG. 8A shows a drain current-gate voltage relationship of a memory cell when the floating body is positively charged and when the floating body is neutral, according to an embodiment of the present invention.
Figure 8B:
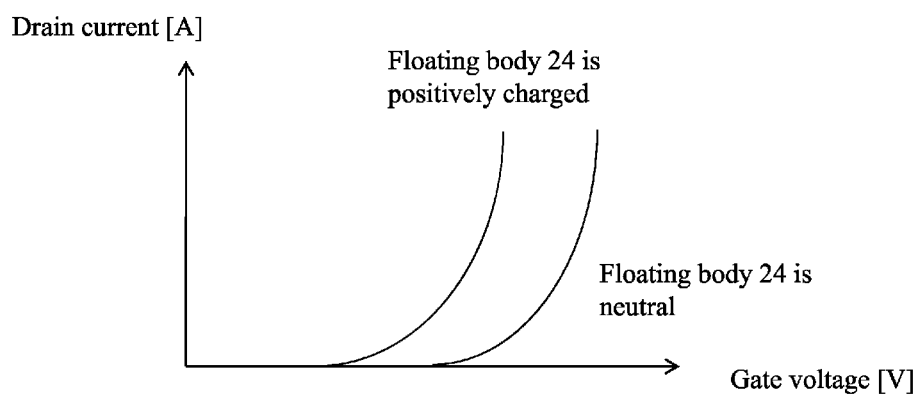
FIG. 8B shows a representative drain current-gate voltage relationship when the current flow is fully controlled by the channel region (i.e. in the absence of the gap region) of the memory cell, according to an embodiment of the present invention.

FIG. 8A shows a drain current-gate voltage relationship of memory cell 50 when the floating body 24 is positively charged and when the floating body 24 is neutral, according to an embodiment of the present invention. A combination of both high carrier density in the channel region 19 and low potential barrier in the gap region 17 when the floating body 24 is positively charged will result in significantly higher current flow (drain current from the BL terminal 74 to the SL terminal 72) compared to when the floating body 24 is neutral. FIG. 8B shows a representative drain current-gate voltage relationship when the current flow is fully controlled by the channel region (i.e. in the absence of the gap region 17). With only one mechanism governing the current flow, the ratio of the cell current (i.e., drain current between states '1' and '0' is smaller, resulting in higher read error rate.

Figure 9A:
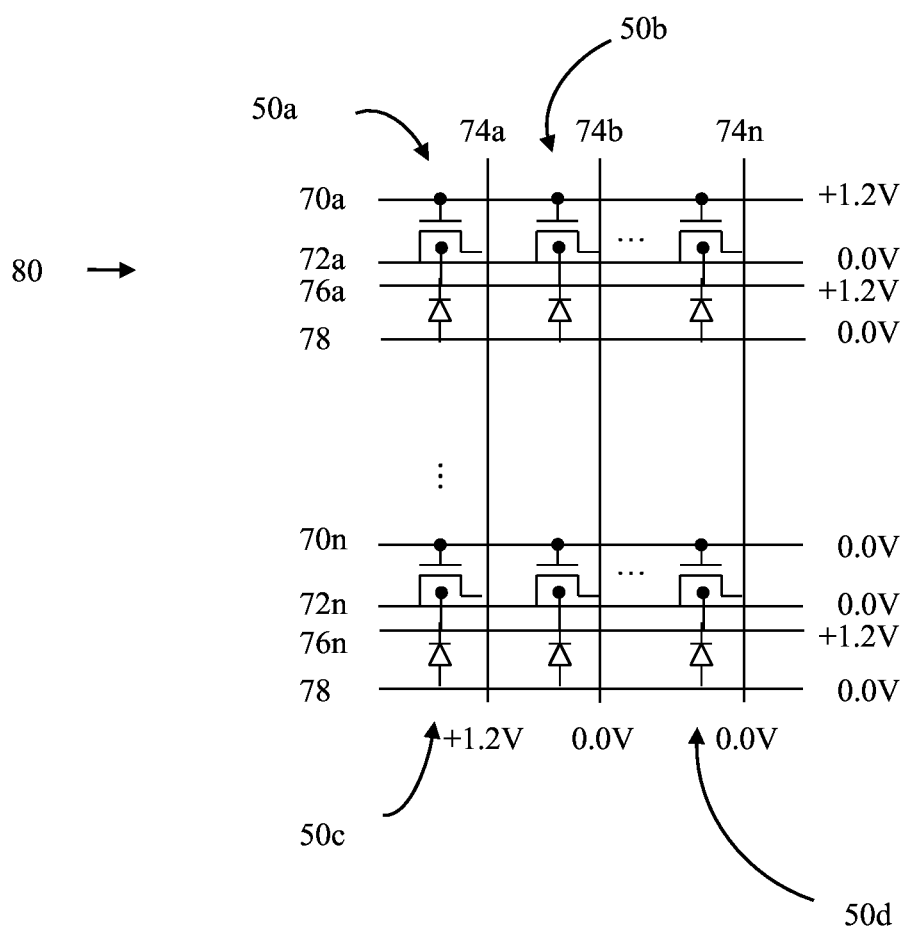
FIG. 9A is a schematic illustration of a memory cell array showing exemplary bias conditions for a write logic-1 operation on the memory array through an impact ionization mechanism, according to an embodiment of the present invention.
Figure 9B:
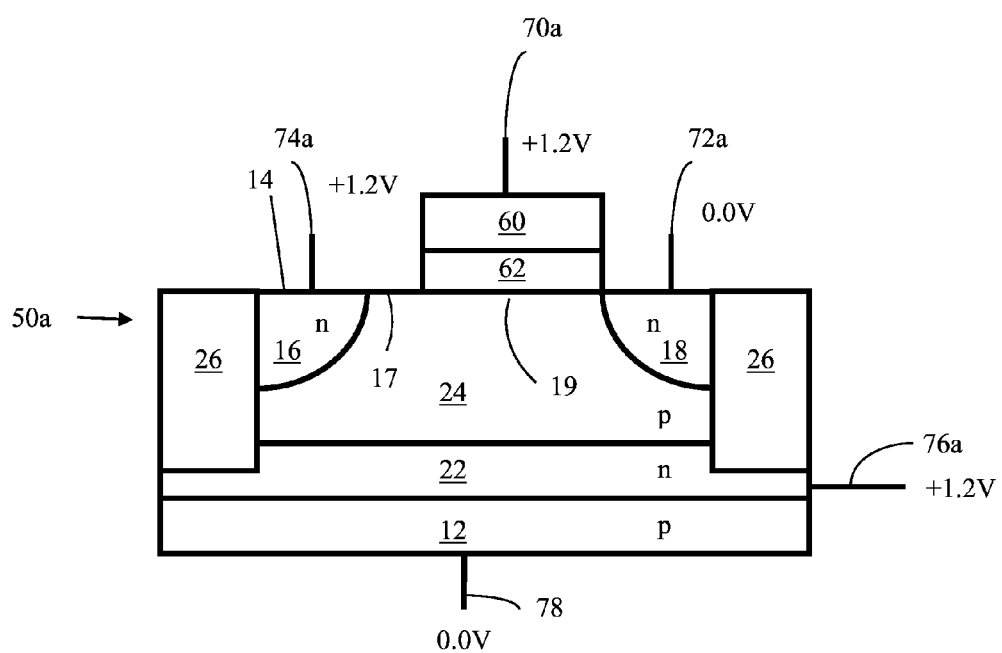
FIG. 9B illustrates bias conditions on an exemplary selected memory cell from the array of FIG. 9A.

FIG. 9A is a schematic illustration of a memory cell array showing exemplary bias conditions for a write logic-1 operation on the memory array 80 through an impact ionization mechanism, according to an embodiment of the present invention. FIG. 9B illustrates the bias conditions on an exemplary selected memory cell 50a, according to the embodiment of FIG. 9A, where the following bias conditions are applied: a positive voltage is applied to the selected WL terminal 70, a positive voltage is applied to the selected BL terminal 74, zero voltage is applied to the selected SL terminal 72, zero or positive voltage is applied to the selected BW terminal 76, and zero voltage is applied to the substrate terminal 78. This positive voltage applied to the selected BL terminal 74a is greater than or equal to the positive voltage applied to the selected WL terminal 70a and may generate sufficiently high enough electric field to trigger impact ionization mechanism.

In one particular non-limiting embodiment, about +1.2 volts is applied to the selected WL terminal 70, about +1.2 volts is applied to the selected BL terminal 74, about 0.0 volts is applied to SL terminal 72, about 0.0 volts or +1.2 volts is applied to BW terminal 76, and about 0.0 volts is applied to substrate terminal 78; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only and may vary from embodiment to embodiment. Thus the exemplary embodiments, features, bias levels, etc., described are not limiting.

The positive bias applied to the selected BL terminal 74 will result in a depletion region formed around the bit line region 16, thereby lowering the potential barrier in the gap region 17. This effect is sometimes referred to as drain induced barrier lowering (DIBL). As a result, carriers (e.g. electrons) will flow through the selected memory cell 50a from the SL terminal 72a to the BL terminal 74a. Electrons will be accelerated in the pinch-off region (defined as the region near the surface 14 where the channel concentration is equal to the bulk doping concentration) of the MOS device 20, creating hot carriers (electron and hole pairs) in the vicinity of the bit line region 16. The generated holes will then flow into the floating body 24, putting the cell 50a to the logic-1 state.

Alternatively, a higher bias may be applied to the gate 60 (higher bias relative to the bias applied to the gate 60 during the read operation described above), to ensure that the channel region 19 underneath the gate 60 will be inverted regardless of the charge stored in the floating body region 24.

Figure 10A:
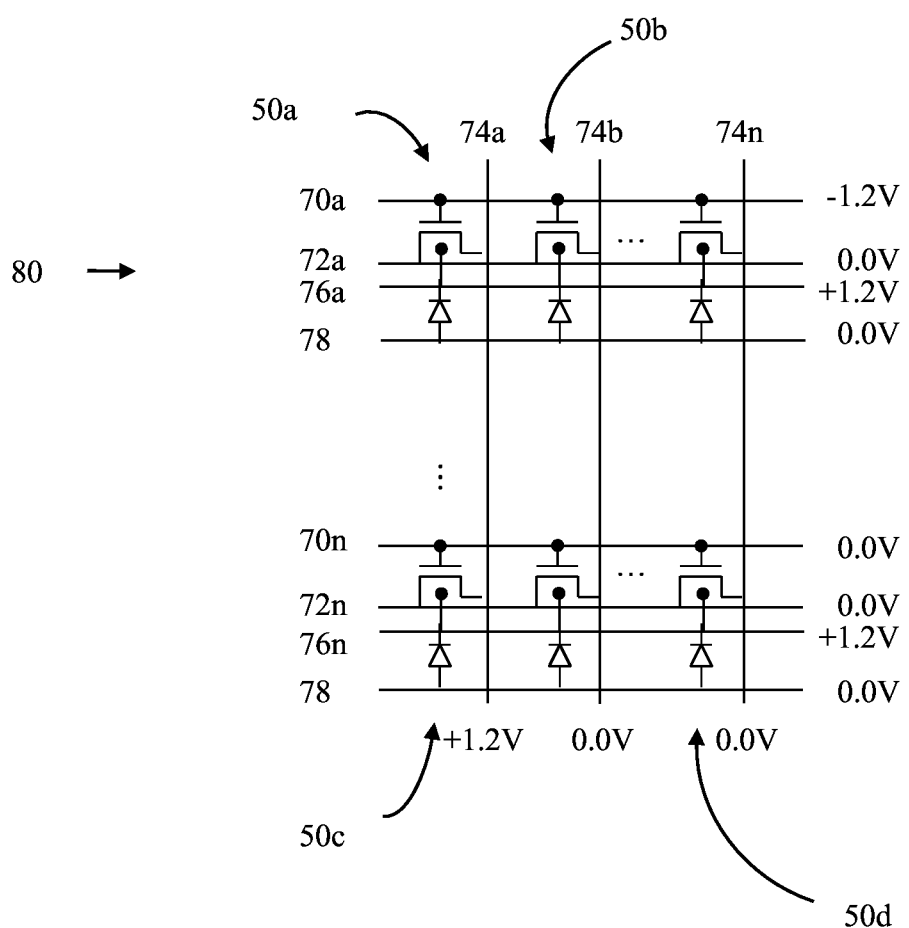
FIG. 10A is a schematic illustration showing bias conditions for a write logic-1 operation using band-to-band tunneling mechanism performed on a memory array according to an embodiment of the present invention.
Figure 10B:
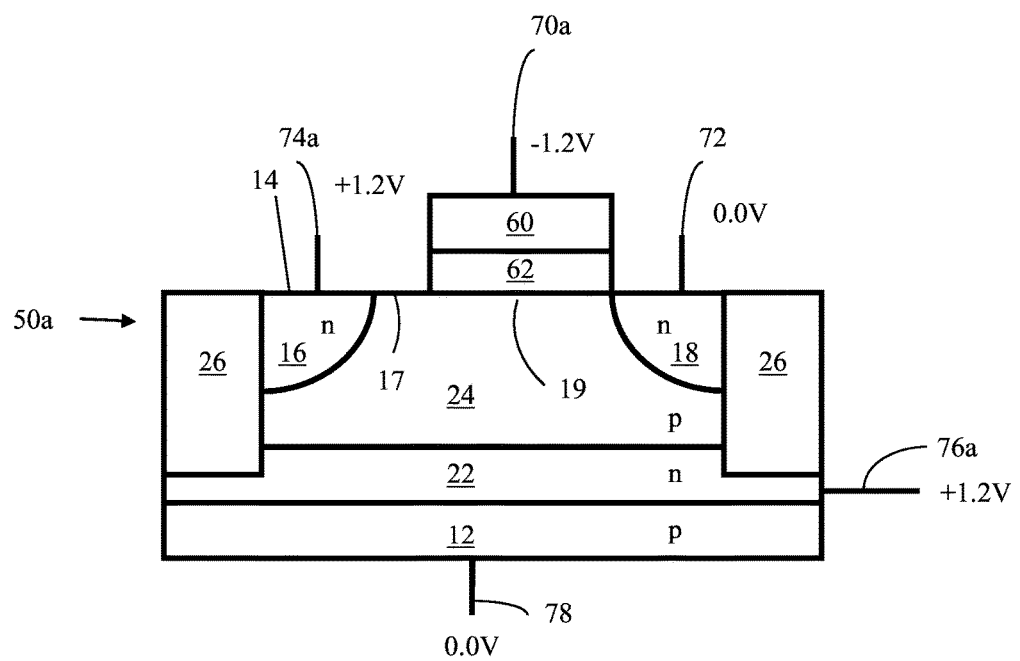
FIG. 10B is a schematic view showing bias condition on an exemplary selected memory cell in the embodiment of array shown in FIG. 10A.

FIG. 10A is a schematic illustration showing bias conditions for a write logic-1 operation using band-to-band tunneling mechanism performed on memory array 80 according to an embodiment of the present invention. FIG. 10B is a schematic view showing the bias condition on an exemplary selected memory cell 50a in the embodiment of array 80 shown in FIG. 10A. A write logic-1 operation using band-to-band tunneling mechanism can be performed by applying the following bias conditions: a negative voltage is applied to the selected WL terminal 70a, a positive voltage is applied to the selected BL terminal 74a, zero voltage is applied to the selected SL terminal 72a, zero or positive voltage is applied to the selected BW terminal 76a, and zero voltage is applied to the substrate terminal 78a.

In one particular non-limiting embodiment, about −1.2 volts is applied to the selected WL terminal 70a, about +1.2 volts is applied to the selected BL terminal 74a, about 0.0 volts is applied to SL terminal 72a, about 0.0 volts or +1.2 volts is applied to BW terminal 76a, and about 0.0 volts is applied to substrate terminal 78a; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only may vary from embodiment to embodiment. Thus the exemplary embodiments, features, bias levels, etc., described are not limiting.

The negative charge on the gate 60 (connected to WL terminal 70) and the positive voltage on bit line region 16 (connected to BL terminal 74) create a strong electric field (for example, about $10^6$ V/cm in silicon, as described in Sze, p. 104) between the bit line region 16 and the floating body region 24 in the proximity of gate 60. This bends the energy band sharply upward near the gate and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

Figure 11A:
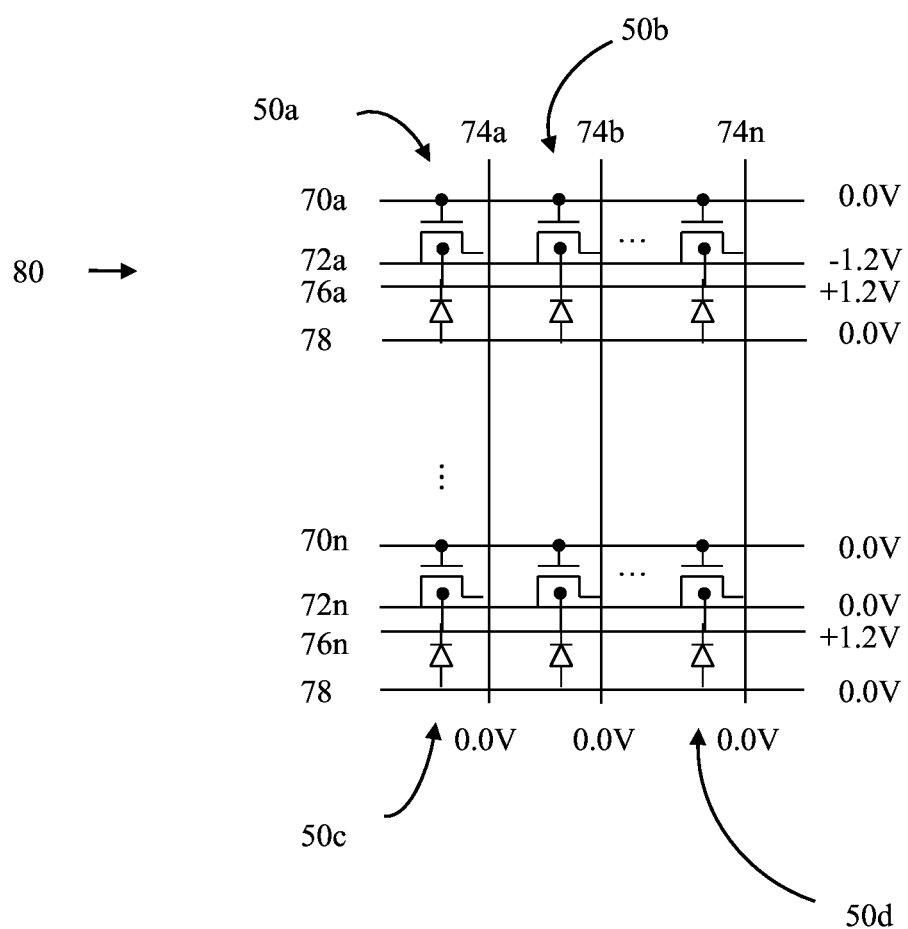
FIG. 11A is a schematic illustration showing bias conditions for a write logic-0 operation performed on a memory array according to an embodiment of the present invention.
Figure 11B:
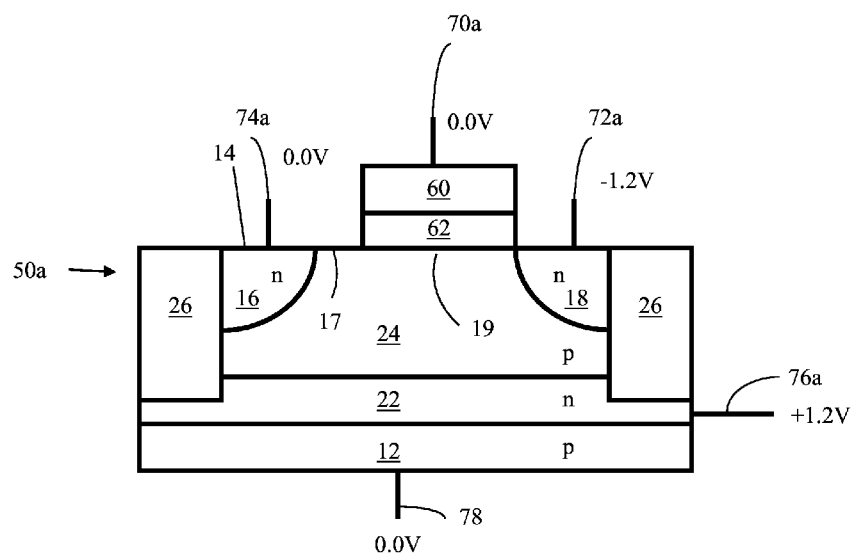
FIG. 11B is a schematic illustration of bias conditions applied to an exemplary selected memory cell from the memory array of FIG. 11A.

FIG. 11A is a schematic illustration showing bias conditions for a write logic-0 operation performed on memory array 80 according to an embodiment of the present invention. FIG. 11B is a schematic illustration of bias conditions applied to an exemplary selected memory cell 50a from the memory array 80 of FIG. 11A. A write logic-0 operation can be performed by applying a negative voltage bias to the selected SL terminal 72a, a zero voltage bias to the WL terminal 70a, zero voltage bias to the BL terminal 74a, zero or positive voltage bias to the BW terminal 76a, and zero voltage bias to the substrate terminal 78a; while zero voltage is applied to the unselected SL terminals 72, zero voltage bias applied to the unselected WL terminals 70, zero or positive bias applied to the BW terminal 76, and zero voltage bias applied to the substrate 78. Under these conditions, the p-n junction between floating body 24 and source line region 18 of the selected cell 50 is forward-biased, evacuating holes from the floating body 24. All memory cells 50 sharing the same selected SL terminal 72a will be written to simultaneously. To write arbitrary binary data to different memory cells 50, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72a, about 0.0 volts is applied to WL terminal 70a, about 0.0 volts is applied to BL terminal 74a, about 0.0 volts or +1.2 volts is applied to BW terminal 76a, and about 0.0 volts is applied to substrate terminal 78a, while zero voltage is applied to the unselected SL terminals 72, zero voltage bias applied to the unselected WL terminals 70, zero or positive bias applied to the BW terminal 76, and zero voltage bias applied to the substrate 78. These voltage levels are exemplary only may vary from embodiment to embodiment. Thus the exemplary embodiments, features, bias levels, etc., described are not limiting.

Figure 12A:
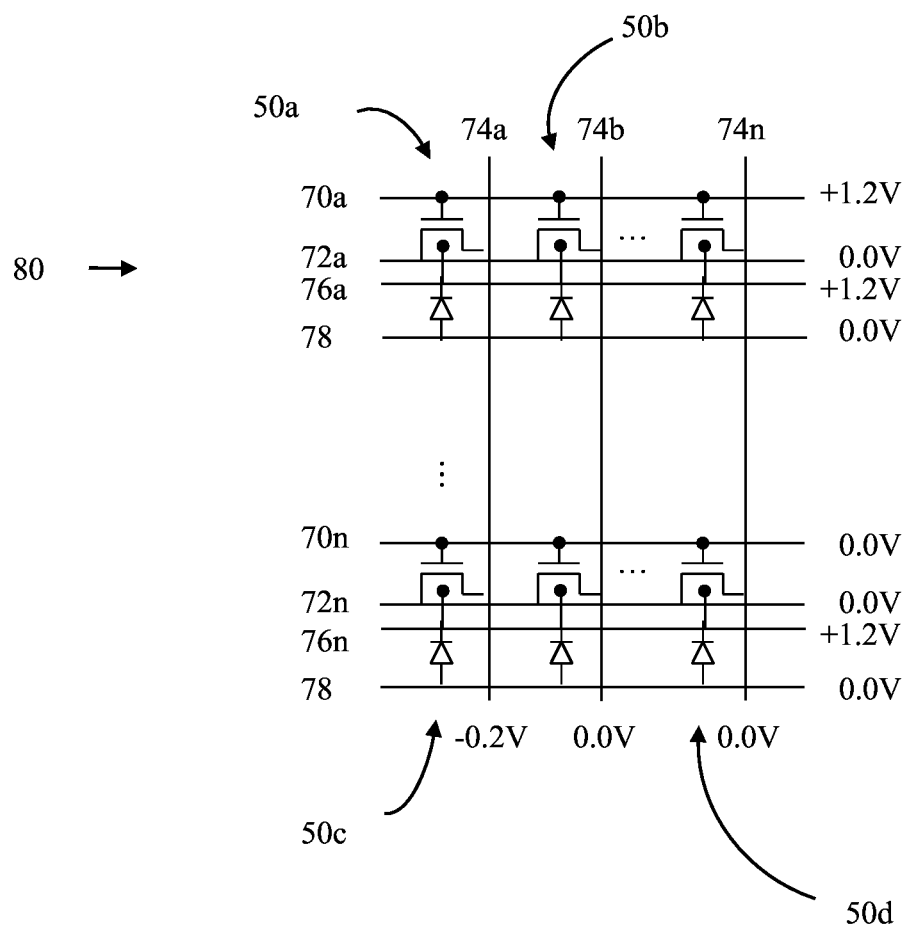
FIG. 12A is a schematic illustration showing bias conditions applied for a bit-selective write logic-0 operation performed on a memory array according to an embodiment of the present invention.
Figure 12B:
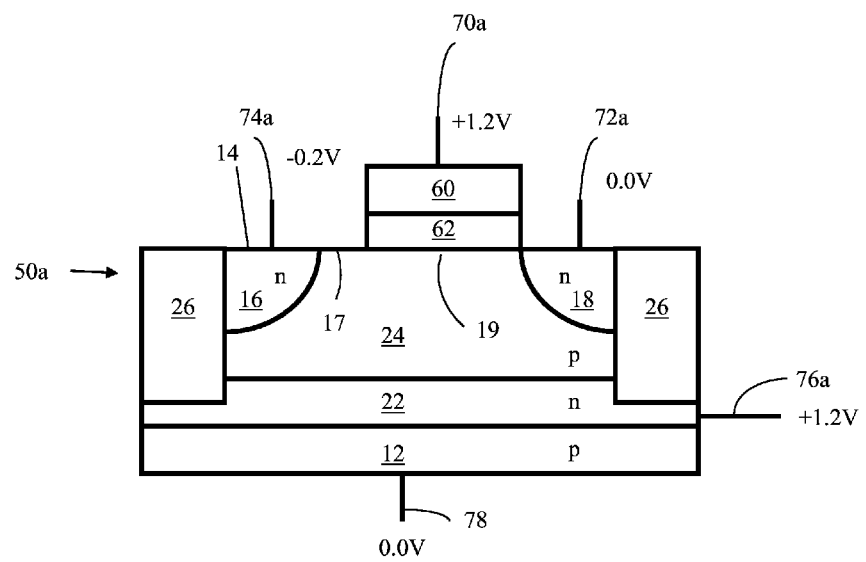
FIG. 12B illustrates bias conditions applied to the terminals of an exemplary selected memory cell from the array of FIG. 12A.

FIG. 12A is a schematic illustration showing bias conditions applied for a bit-selective write logic-0 operation performed on memory array 80 according to an embodiment of the present invention. FIG. 12B illustrates bias conditions applied to the terminals of an exemplary selected memory cell 50a from the array 80 of FIG. 12A, which may be performed by applying a positive voltage to the selected WL terminal 70a, a negative voltage to the selected BL terminal 74a, zero voltage bias to the selected SL terminal 72a, zero or positive voltage bias to the BW terminal 76a, and zero voltage to the substrate terminal 78; while zero voltage is applied to the unselected WL terminals 70, zero voltage is applied to the unselected BL terminals 74, zero voltage bias is applied to the unselected SL terminals 72, zero or positive voltage is applied to the BW terminal 76, and zero voltage is applied to the substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between floating body region 24 and bit line region 16 is forward-biased, evacuating holes from the floating body 24.

To reduce undesired write logic-0 disturb to other memory cells 50 in a memory array, the applied potential can be optimized as follows: if the floating body 24 potential of state logic-1 is referred to as $V_{FB}$, then the voltage applied to the WL terminal 70a is configured to increase the floating body 24 potential by $V_{FB1}/2$ while $-V_{FB1}/2$ is applied to BL terminal 74a. Additionally, either ground or a slightly positive voltage may also be applied to the BL terminals 74 of unselected memory cells 50 that do not share the same BL terminal 74a as the selected memory cell 50a, while a negative voltage may also be applied to the WL terminals 70 of unselected memory cells 50 that do not share the same WL terminal 70a as the selected memory cell 50a.

As illustrated in FIGS. 12A and 12B, the following exemplary bias conditions may be applied to the selected memory cell 50a to perform a bit-selective write logic-0 operation: a potential of about −0.2 volts to the selected BL terminal 74a, a potential of about +1.2 volts to the selected WL terminal 70a, about 0.0 volts is applied to the selected SL terminal 72a, a potential of about +1.2 volts to the BW terminal 76a, about 0.0 volts to the substrate terminal 78a.

Figure 12C:
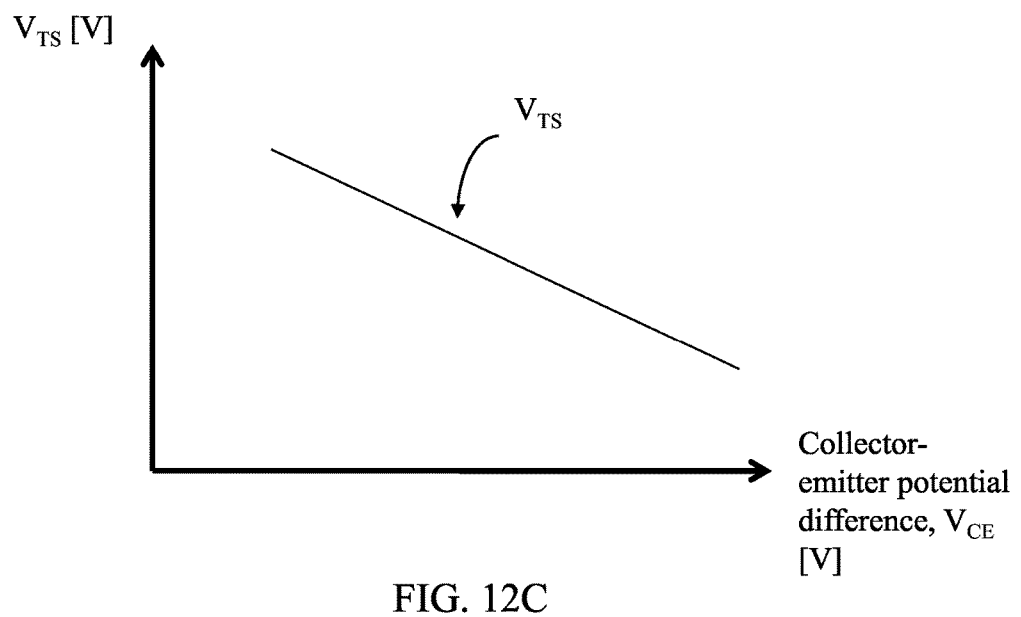
FIG. 12C is a graph illustrating that $V_{TS}$ is inversely dependent on the potential difference between emitter and collector terminals ($V_{CE}$).

The transition between logic-0 state and logic-1 state is defined by $V_{TS}$ in FIGS. 5A and 5B. $V_{TS}$ can be modulated by the potential difference across the emitter and collector terminals of the intrinsic n-p-n bipolar devices 30a and 30b, that is between the BW terminal 76 and the BL terminal 74 and between the BW terminal 76 and SL terminal 72, respectively. $V_{TS}$ is inversely dependent on the potential difference between emitter and collector terminals ($V_{CE}$), as shown in FIG. 12C. The dependence of $V_{TS}$ on $V_{CE}$ may be utilized for the write logic-0 operation. For example, the potential applied to the BW terminal 76 can be reduced during write logic-0 operation, hence resulting in higher $V_{TS}$, higher than the potential of the floating body region 24 $V_{FB}$ of the selected memory cell 50 during write logic-0 operation. Because the $V_{FB}$ is now less than $V_{TS}$, a net current flowing out of the floating body region 24 will be observed.

Figure 13A:
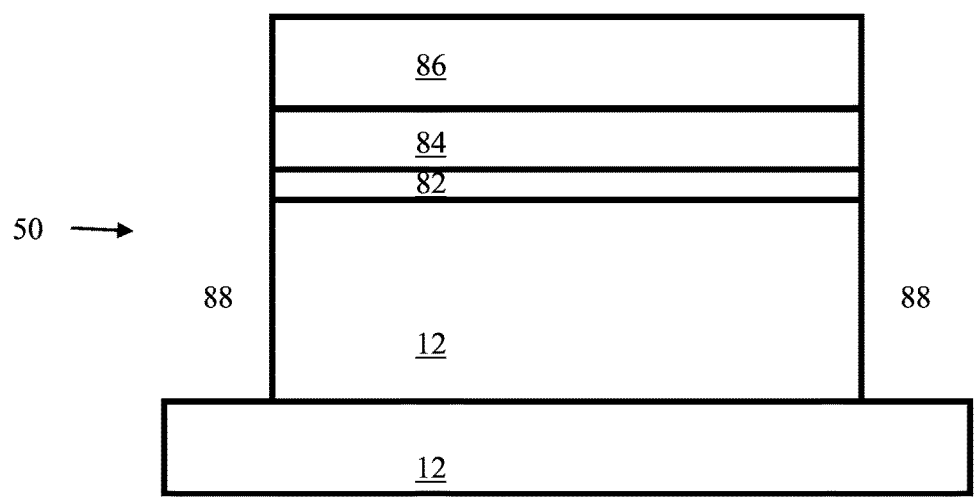
FIGS. 13A through 13G provide schematic illustrations at various stages of an example of a manufacturing process to obtain a memory cell according to an embodiment of the present invention.

FIGS. 13A through 13G provide schematic illustrations at various stages of an example of a manufacturing process to obtain memory cell 50 according to an embodiment of the present invention. FIG. 13A is referred to regarding early steps in the process. In an exemplary 130 nanometer (nm) process, a thin silicon oxide layer 82 with a thickness of about 100 A may be grown on the surface of substrate 12. This may be followed by a deposition of about 200 A of polysilicon layer 84. This in turn may be followed by deposition of about 1200 A silicon nitride layer 86. Other process geometries including, but not limited to: 250 nm, 180 nm, 90 nm, 65 nm, etc., may be used. Similarly, other numbers of, thicknesses of, and combinations of protective layers 82, 84 and 86 may be used. A pattern opening the areas to become trench 88 may be formed using a lithography process. Then the silicon oxide 82, polysilicon 84, silicon nitride 86 layers may be subsequently patterned using the lithography process and then may be etched, followed by a silicon etch process, creating trench 88.

Figure 13B:
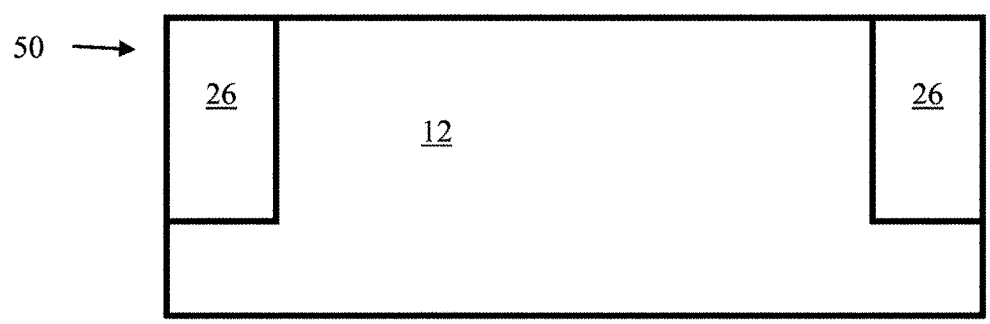

As shown in FIG. 13B, this may be followed by a silicon oxidation step, which will grow silicon oxide films in trench 88 which will become insulating layer 26. In an exemplary 130 nm process, about 4000 A silicon oxide may be grown. A chemical mechanical polishing step may then be performed to polish the resulting silicon oxide films so that the silicon oxide layer 26 is flat relative to the silicon surface of substrate 12. In other embodiments the top of insulating layer 26 may have different height relative to the silicon surface of substrate 12. The silicon nitride layer 86 and the polysilicon layer 84 may then be removed which may then be followed by a wet etch process to remove silicon oxide layer 82 (and a portion of the silicon oxide films formed in the area of former trench 88). Other process geometries which may include, but are not limited to 250 nm, 180 nm, 90 nm, 65 nm, etc., may be used. Similarly, other insulating layer materials, heights, and thicknesses as well as alternate sequences of processing steps may be used.

Figure 13C:
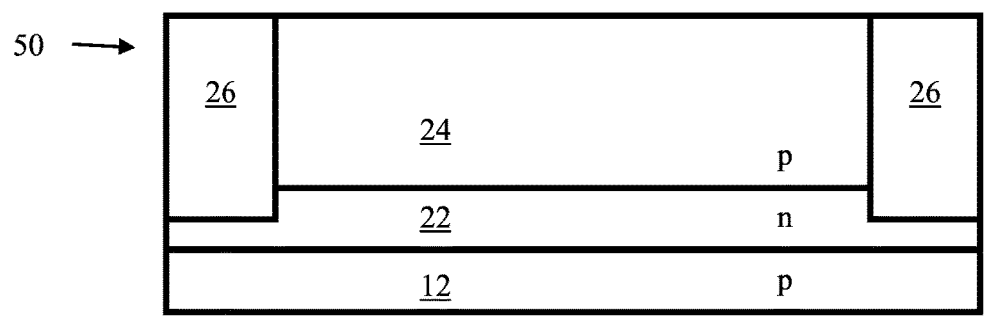

As shown in FIG. 13C, an ion implantation step may then be performed to form the buried layer region 22 of a second conductivity (e.g. n-type conductivity). The ion implantation energy may be optimized such that the bottom of the buried layer region 22 is formed deeper than the bottom of the insulating layer 26. Buried layer 22 isolates the eventual floating body region 24 of the first conductivity type (e.g., p-type) from the substrate 12.

Figure 13D:
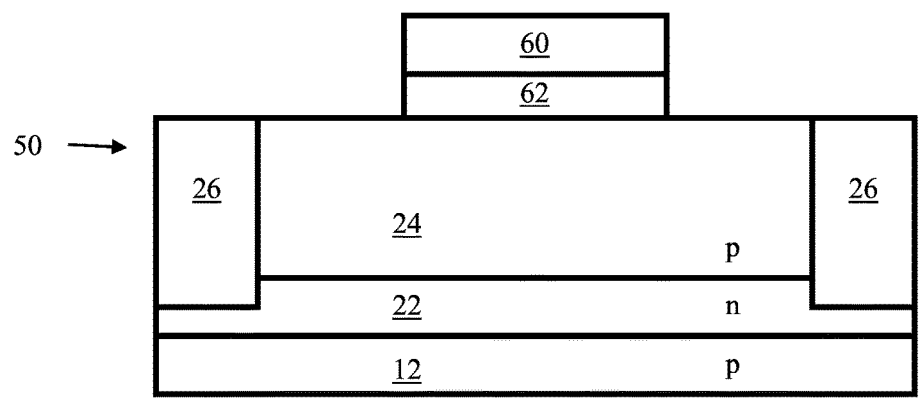

As shown in FIG. 13D, a silicon oxide or high-dielectric material gate insulation layer 62 may then be formed on the silicon surface (e.g. about 100 A in an exemplary 130 nm process), which may then be followed by a polysilicon or metal gate 60 deposition (e.g. about 500 A in an exemplary 130 nm process). This is then followed by a lithography step to define the gate, which is subsequently followed by an etching step.

The process sequence shown in FIGS. 13A through 13D describes the process flow typically employed in a standard complementary metal oxide semiconductor (CMOS) process up to the gate formation step (with the exception of the ion implantation step performed to form the buried layer region 22 shown in FIG. 13C).

Figure 13E:
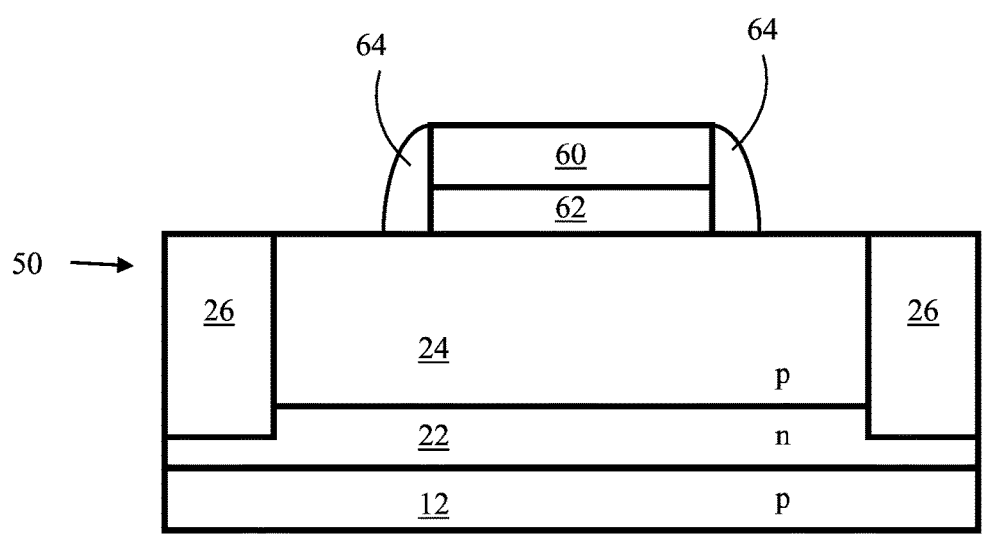

Subsequent to the gate formation step, a spacer region 64 may be formed on both sides of the gate 60, as shown in FIG. 13E. The spacer region 64 is typically formed by a dielectric material deposition, such as silicon oxide, followed by a dry etching step.

Figure 13F:
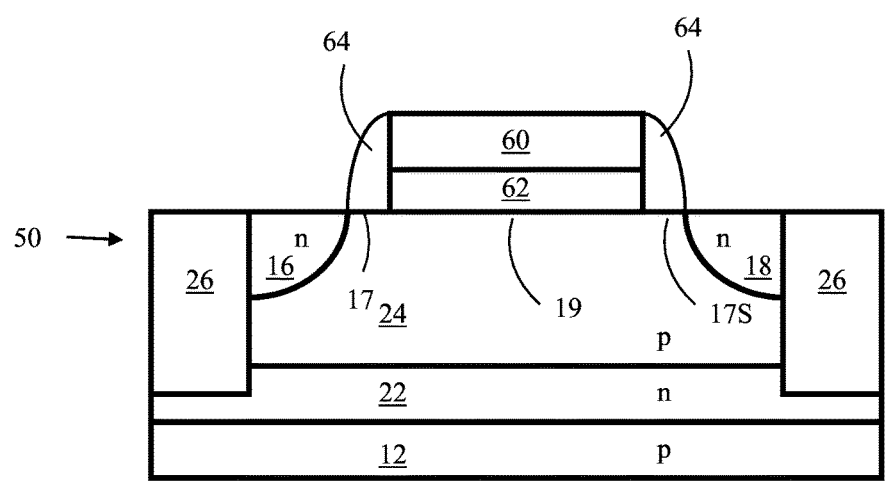

FIG. 13F shows a subsequent ion implantation step of a second conductivity (e.g. n-type implant) to form both the source line region 18 and the bit line region 16. Because of the spacer region 64, there is a gap region 17S formed between the source line region and the channel region 19, and a gap region 17 formed between the bit line region 16 and the channel region 19.

Figure 13G:
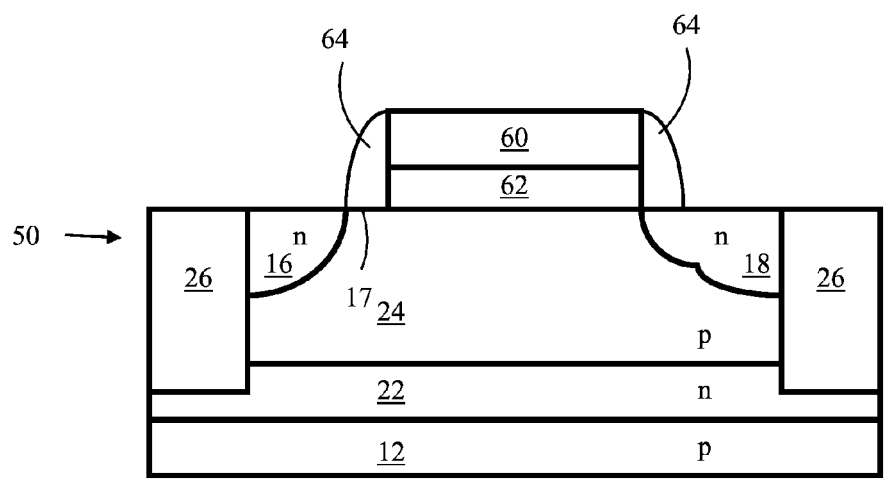

FIG. 13G shows another lithography step which may be performed to cover the area above the bit line region 16, but not the source line region 18. An ion implantation of a second conductivity type (e.g. n-type implant) may then be performed to form an extension of the source line region 18 to the channel region 19, underneath the region previously defined by gap region 17S, thereby eliminating gap region 17S.

Figure 14A:
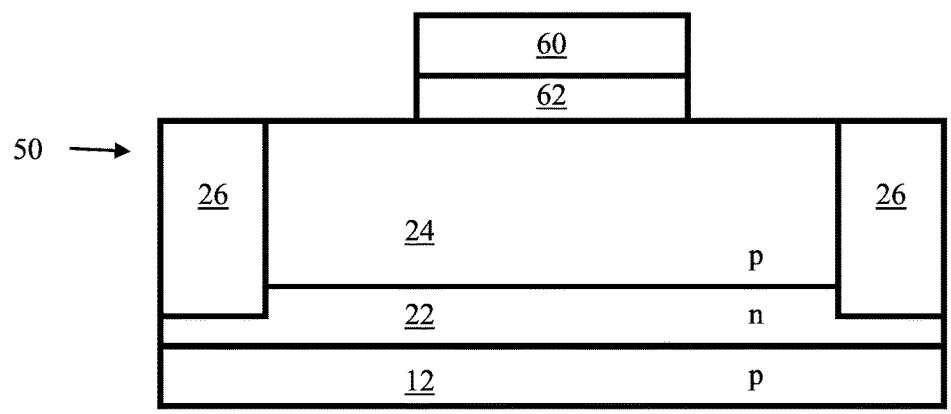
FIGS. 14A-14C schematically illustrate an alternative embodiment of some of the steps of the manufacturing process of FIGS. 13A-13G.
Figure 14B:
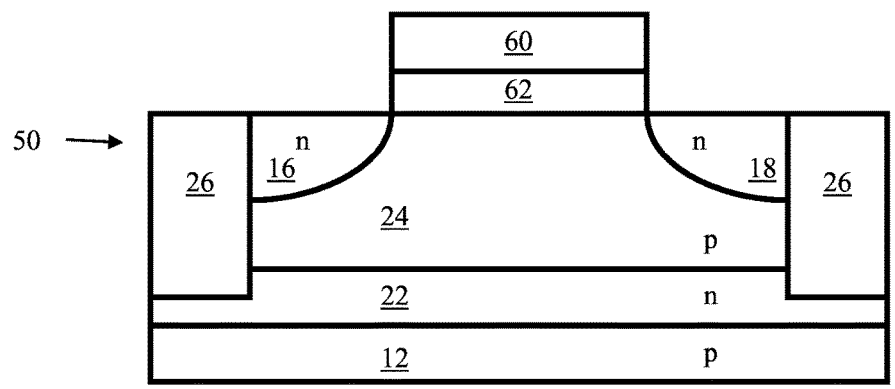
Figure 14C:
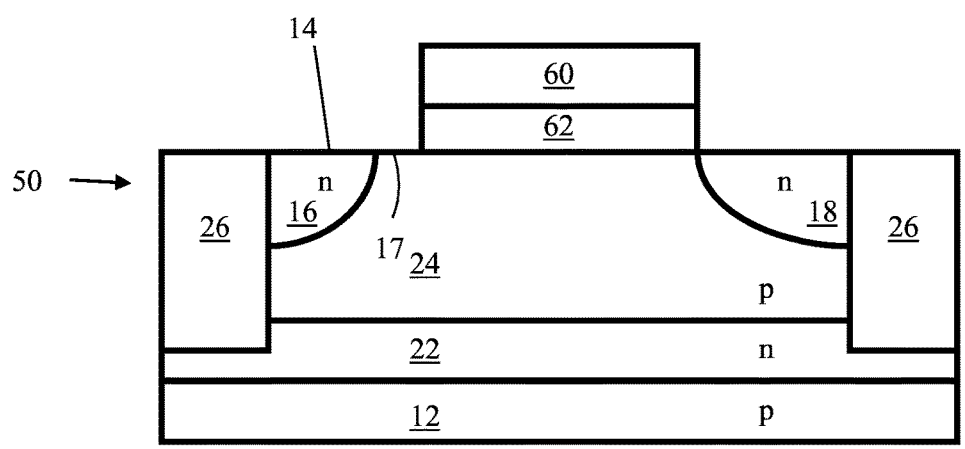

An alternative process is shown in FIGS. 14A through 14C, according to another embodiment of the present invention. The cross-sectional view of the memory cell 50 shown in FIG. 14A follows the same process sequence up to the gate formation step as shown in FIGS. 13A through 13D.

FIG. 14B shows a subsequent ion implantation step of a second conductivity type (e.g. n-type implant) to form both the source line region 18 and the bit line region 16.

FIG. 14C shows the results of a subsequent lithography step which blocks the area above the source line region 18, but leaves the area above the bit line region 16. A tilted ion implantation step of a first conductivity type (e.g. p-type implant) is applied at an angle to the normal direction of the surface 14 to change the conductivity type of the surface region of the bit line region 16 near the gate 60. As a result, a gap region 17 is formed near the bit line region 16, as shown in FIG. 14C.

Figure 15A:
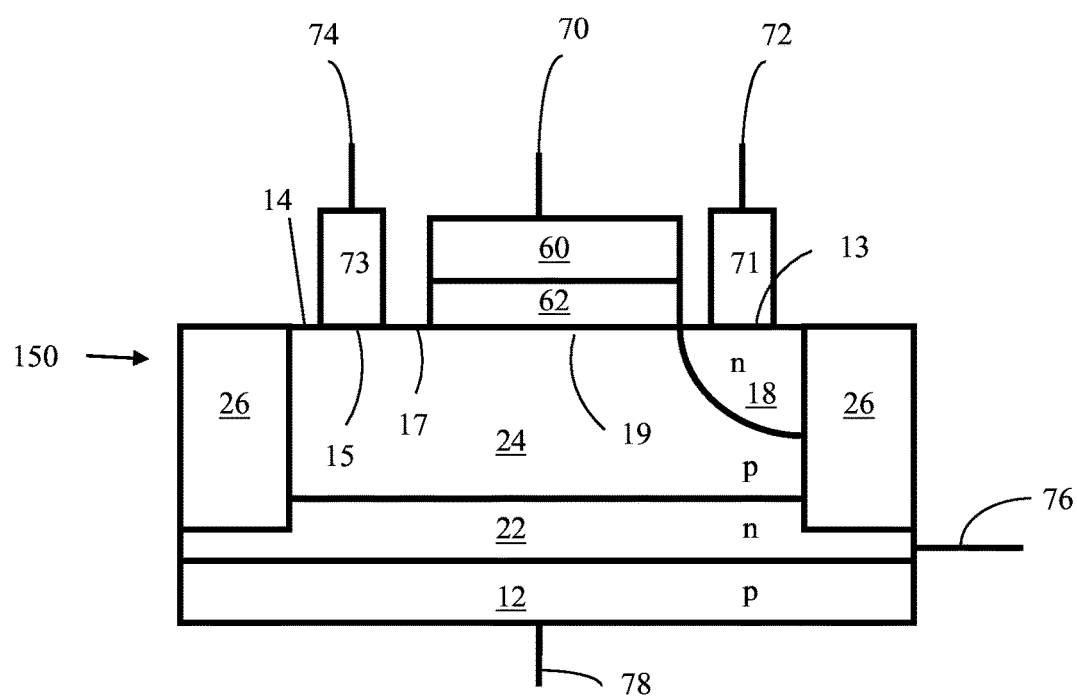
FIGS. 15A and 15B show cross sectional views of memory cell according to another embodiment of the present invention, which incorporate Schottky contact.
Figure 15B:
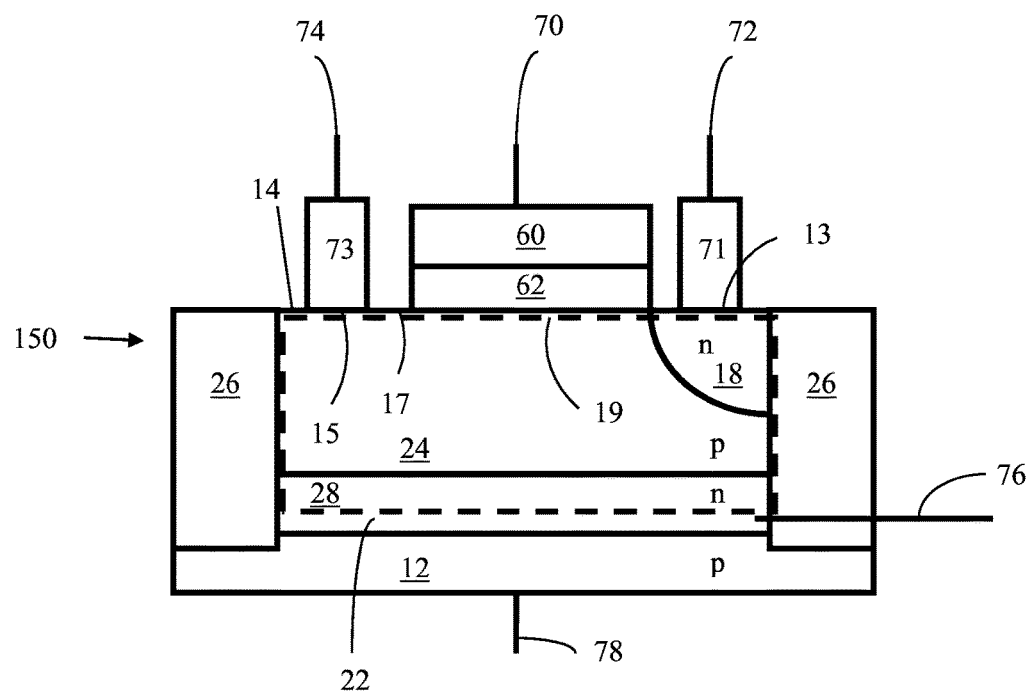

FIGS. 15A and 15B show cross sectional views of memory cell 150 according to another embodiment of the present invention, which incorporate Schottky contact. Memory cell 150 includes a substrate 12 of a first conductivity type such as p-type, for example. Substrate 12 may be typically made of silicon, but may also (or alternatively) comprise, for example, germanium, silicon germanium, gallium arsenide, carbon nanotubes, or other semiconductor materials. In some embodiments of the invention, substrate 12 may be the bulk material of the semiconductor wafer. In other embodiments, substrate 12 may be a well of the first conductivity type embedded in either a well of the second conductivity type or, alternatively, in the bulk of the semiconductor wafer of the second conductivity type, such as n-type, for example, (not shown in the figures). To simplify the description, the substrate 12 will usually be drawn as the semiconductor bulk material as it is in FIG. 15A.

A buried layer 22 of a second conductivity type such as n-type, for example, is provided in the substrate 12. Buried layer 22 may be formed by an ion implantation process on the material of substrate 12. Alternatively, buried layer 22 may be grown epitaxially on top of substrate 12.

A floating body region 24 of the first conductivity type, such as p-type, for example, is bounded on top by surface 14, source line region 18, and insulating layer 62 and gap region 17, on the sides by insulating layers 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

Insulating layers 26 (which may comprise, for example, shallow trench isolation (STI)), may be made of silicon oxide, for example, though other insulating materials may be used. Insulating layers 26 insulate cell 150 from neighboring cells 150 when multiple cells 150 are joined in an array 180 to make a memory device. The bottom of insulating layer 26 may reside inside the buried region 22 allowing buried region 22 to be continuous as shown in FIG. 15A. Alternatively, the bottom of insulating layer 26 may reside below the buried region 22 as shown in the embodiment of FIG. 15B. This requires a shallower insulating layer 28, which insulates the floating body region 24, but allows the buried layer 22 to be continuous in the perpendicular direction of the cross-sectional view shown in FIG. 15B. For simplicity, only memory cell 150 with continuous buried region 22 in all directions will be shown from hereon.

A source line region 18 having a second conductivity type, such as n-type, for example, is also provided in floating body region 24 and is exposed at surface 14. Source line region 18 may be formed by an implantation process formed on the material making up substrate 12, according to any implantation process known and typically used in the art. Alternatively, a solid state diffusion process could be used to form source line region 18.

The source line region 18 is electrically connected to source line (SL) terminal 72 through a conductive material 71. The conductive material 71 may be made of, for example, polysilicon material, or metal electrode, such as tungsten, aluminum, and/or copper. The conductive material 71 forms an ohmic contact 13 with the source line region 18.

The conductive material 73 forms a contact with the floating body region 24. The conductive material 73 may be made of, for example, metal electrode, such as tungsten or aluminum, or metal silicides, such as nickel silicide or platinum silicide. In contrast to the ohmic contact between conductive material 71 and source line region 18, conductive material 73 forms a Schottky contact 15 with the floating body region 24.

A gate 60 is positioned in between the source line region 18 and the conductive material 73, and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and/or their nitrides.

Cell 150 includes several terminals: word line (WL) terminal 70 electrically connected to gate 60, bit line (BL) terminal 74 electrically connected to conductive material 73, source line (SL) terminal 72 electrically connected to source line region 18 (through the conductive material 71), buried well (BW) terminal 76 electrically connected to buried layer 22, and substrate terminal 78 electrically connected to substrate 12.

Figure 15C:
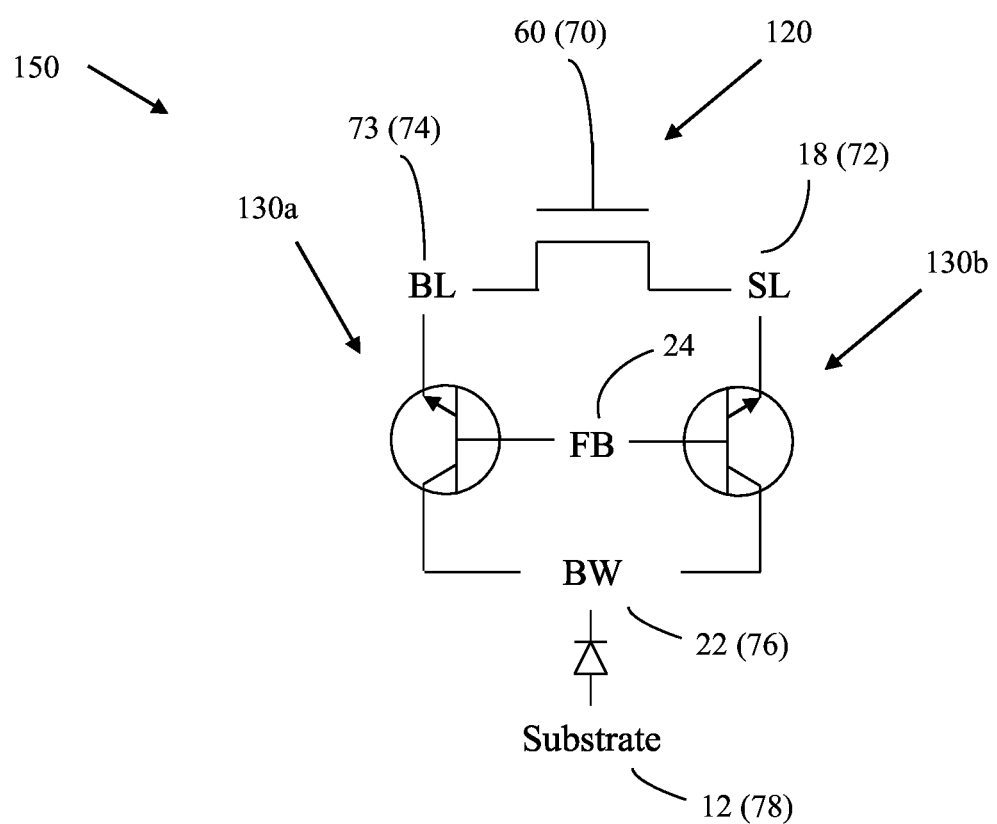
FIG. 15C schematically illustrates an equivalent circuit representation of a memory cell of an embodiment such as shown in FIG. 15A or 15B.

FIG. 15C illustrates an equivalent circuit representation of memory cell 150. Inherent in memory cell 150 are metal-oxide-semiconductor (MOS) transistor 120, formed by conductive material 73, gate 60, source line region 18, and floating body region 24; n-p-n bipolar device 130a, formed by buried well region 22, floating body region 24, and conductive material 73, and n-p-n bipolar device 130b, formed by buried well region 22, floating body region 24, and source line region 18, respectively.

Figure 15D:
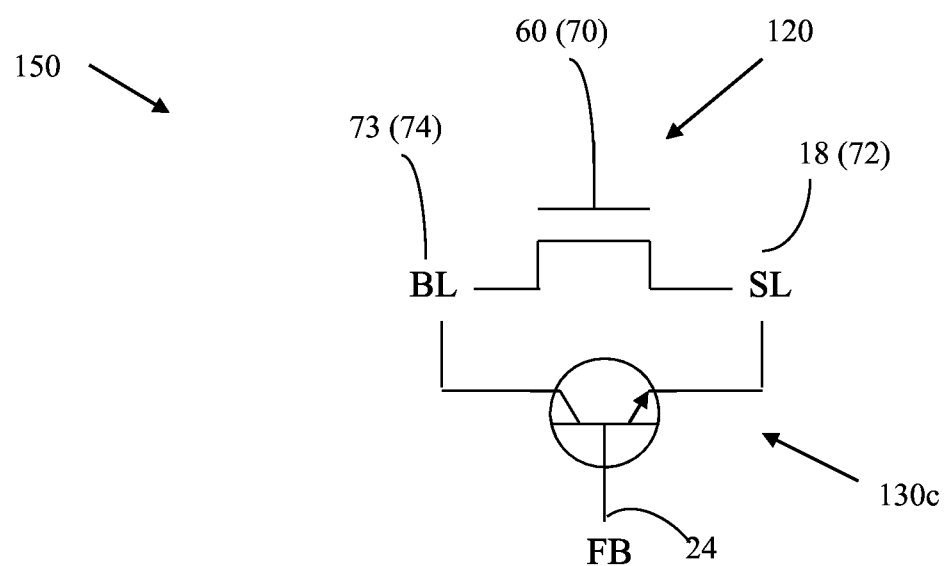
FIG. 15D schematically illustrates a bipolar device inherent in the embodiments of FIGS. 15A-15B.

Also inherent in memory device 150 is bipolar device 130c, formed by conductive region 73, floating body 24, and source line region 18. For drawings clarity, bipolar device 130c is shown separately in FIG. 15D.

Figure 15E:
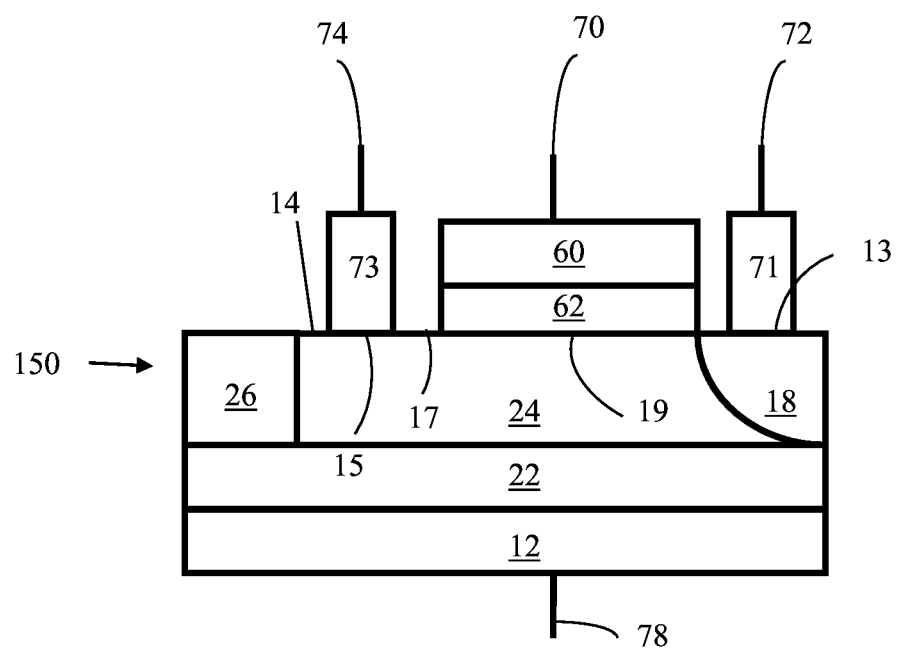
FIG. 15E shows a cross-sectional view of memory cell according to another embodiment of the present invention incorporating Schottky contact, comprising a silicon-on-insulator (SOI) substrate.

Memory cell 150 may alternatively be fabricated on a silicon-on-insulator (SOI) substrate as illustrated in FIG. 15E, where a buried insulator layer 22, such as a buried oxide layer, bounds the floating body region 24 at the bottom.

Figure 16A:
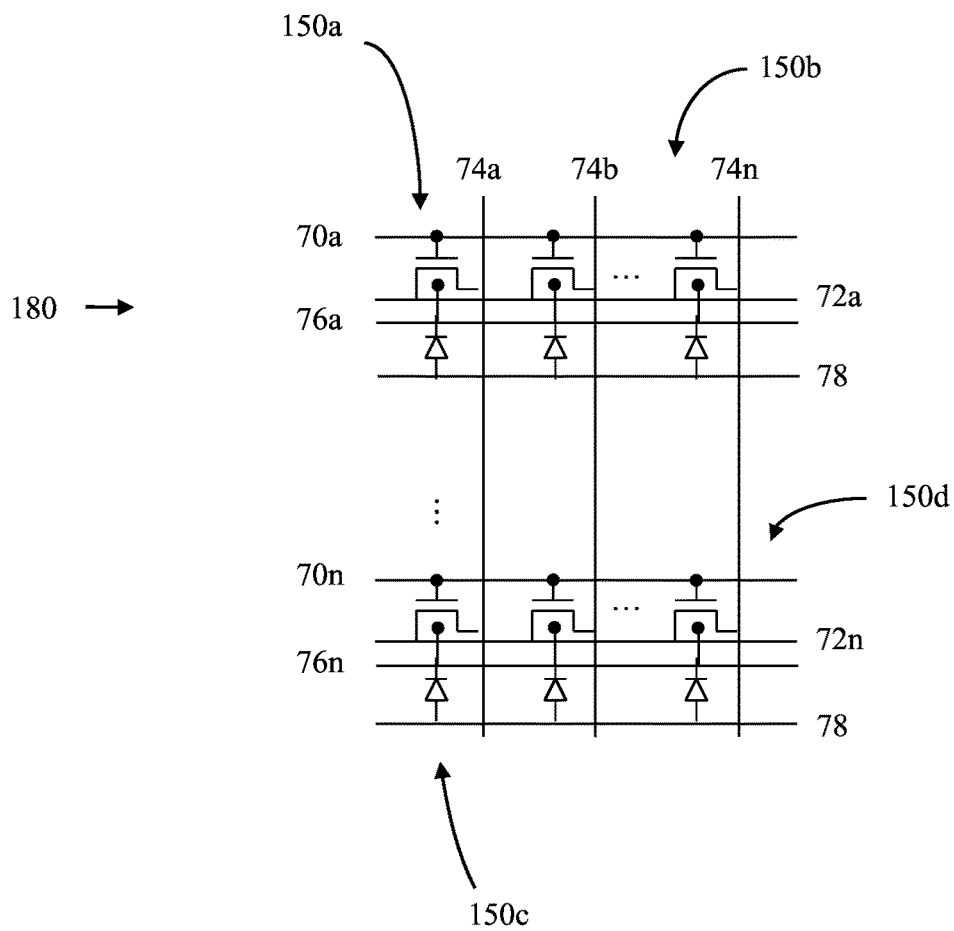
FIG. 16A is a schematic illustration showing an exemplary memory array of memory cells arranged in rows and columns, according to an embodiment of the present invention.

FIG. 16A is a schematic illustration showing an exemplary memory array 180 of memory cells 150 (four exemplary instances of memory cell 150 being labeled as 150a, 150b, 150c and 150d) arranged in rows and columns, according to an embodiment of the present invention. In many, but not all, of the figures where exemplary array 180 appears, representative memory cell 150a will be representative of a "selected" memory cell 150 when the operation being described has one (or more in some embodiments) selected memory cells 150. In such figures, representative memory cell 150b will be representative of an unselected memory cell 150 sharing the same row as selected representative memory cell 150a, representative memory cell 150c will be representative of an unselected memory cell 150 sharing the same column as selected representative memory cell 150a, and representative memory cell 150d will be representative of a memory cell 150 sharing neither a row or a column with selected representative memory cell 150a.

Present in FIG. 16A are word lines 70a through 70n, source lines 72a through 72n, bit lines 74a through 74p, buried well terminals 76a through 76n, and substrate terminal 78. Each of the source lines 72a through 72n is associated with a single row of memory cells 150 and is coupled to the source line region 18 (via conductive material 71) of each memory cell 150 in that row. Each of the bit lines 74a through 74p is associated with a single column of memory cells 150 and is coupled to the conductive material 73 of each memory cell 150 in that column.

Substrate 12 is present at all locations under array 180. Persons of ordinary skill in the art will appreciate that one or more substrate terminals 78 may be present in one or more locations. Such skilled persons will also appreciate that while exemplary array 180 is shown as a single continuous array in FIG. 16A, that many other organizations and layouts are possible such as, but not limited to: word lines may be segmented or buffered, bit lines may be segmented or buffered, source lines may be segmented or buffered, the array 180 may be broken into two or more sub-arrays, control circuits such as word decoders, column decoders, segmentation devices, sense amplifiers, write amplifiers may be arrayed around exemplary array 180 or inserted between sub-arrays of array 180, etc. Thus the exemplary embodiments, features, design options, etc., described are not limiting.

Figure 16B:
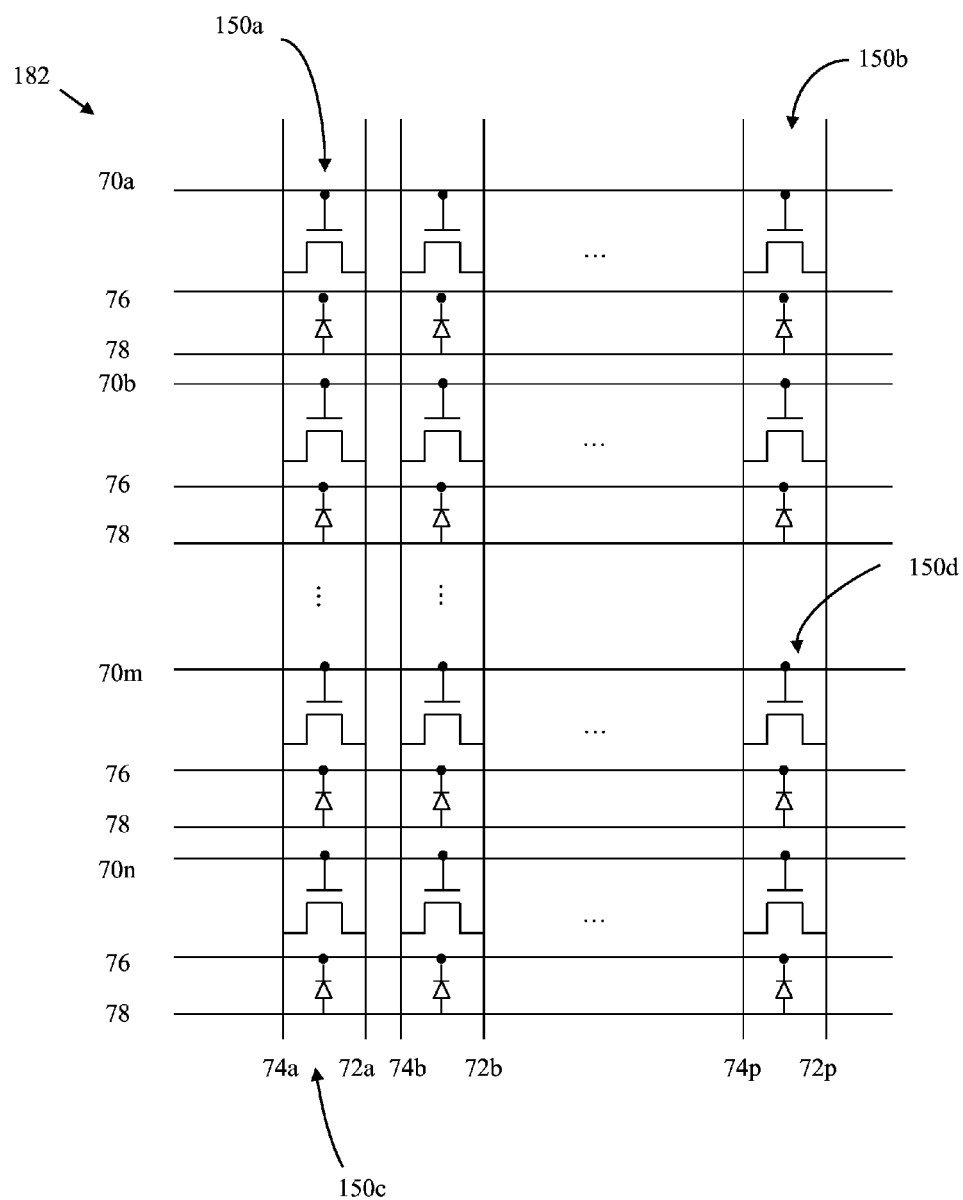
FIG. 16B is a schematic illustration of another exemplary memory array constructed from memory cells according to another embodiment of the present invention.

FIG. 16B is a schematic illustration of another exemplary memory array 182 constructed from memory cells 150, according to another embodiment of the present invention. In the memory array 182, the source lines 72a through 72p (connected to the source line region 18 (via conductive material 71) are now each associated with a single column of memory cells 150, respectively. Each of the bit lines 74a through 74p is also associated with a single column of memory cells 150 and is coupled to the conductive material 73 of each memory cell 150 in that column.

Several operations can be performed on memory cell 150, including holding, read, write logic-1 and write logic-0 operations.

Figure 17A:
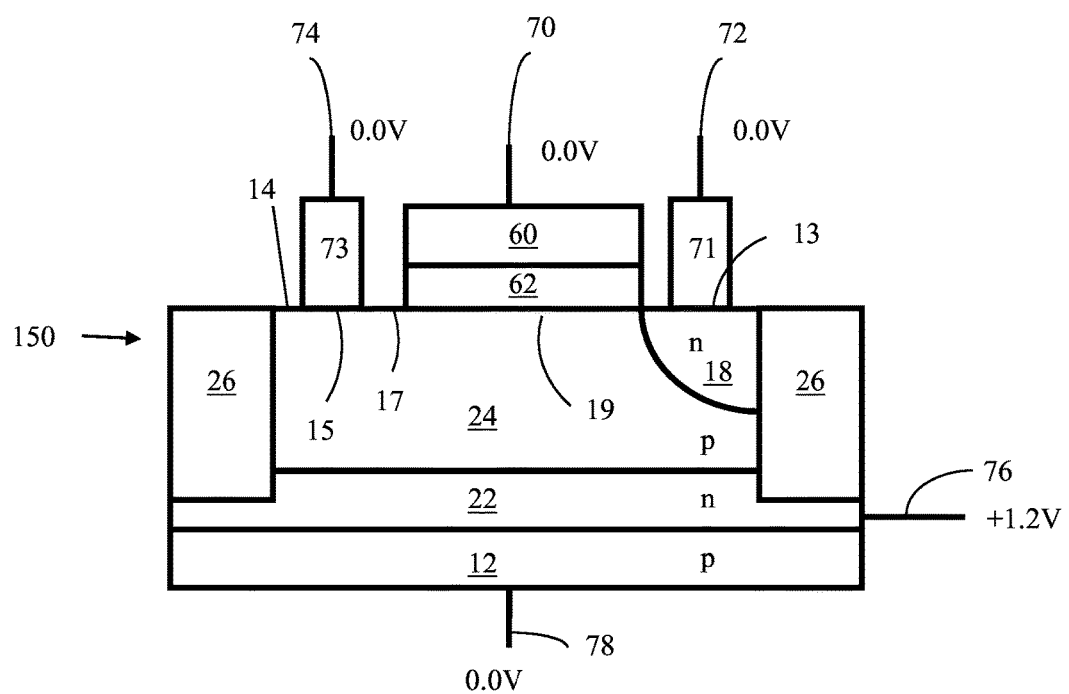
FIG. 17A is a schematic, cross-sectional illustration of a memory cell showing bias conditions applied to perform a holding operation thereon, according to an embodiment of the present invention.

FIG. 17A is a schematic, cross-section illustration of cell 150 showing bias conditions applied to perform a holding operation on memory cell 150. The holding operation on memory cell 150 follows the same principle as the holding cell operation on memory cell 50 and is performed by applying a positive back bias to the BW terminal 76, zero bias to the WL terminal 70, BL terminal 74, SL terminal 72, and substrate terminal 78. The positive back bias applied to the buried layer region 22 connected to the BW terminal 76 will maintain the state of the memory cell 150 that it is connected to. The holding operation can be performed in the same manner when memory cells 150 are connected in memory array configuration 180 or 182. In the holding operation described in FIG. 17, there is no individually selected memory cell. Rather the holding operation will be performed on all cells connected to the same buried well terminal 76. The positive bias applied to the BW terminal 76 needs to generate a sufficient electric field to trigger an impact ionization mechanism as will be described with reference to the band diagram shown in FIGS. 4A and 4B. The impact ionization rate as a function of the electric field is for example described in Sze on pp. 37-41.

In one non-limiting embodiment, the bias conditions for the holding operation on memory cell 150 are: about 0.0 volts are applied to WL terminal 70, SL terminal 72, BL terminal 74, and substrate terminal 78, while about +1.2 volts are applied to the BW terminal 76. In other embodiments, different voltages may be applied to various terminals of memory cells 150.

Figure 17B:
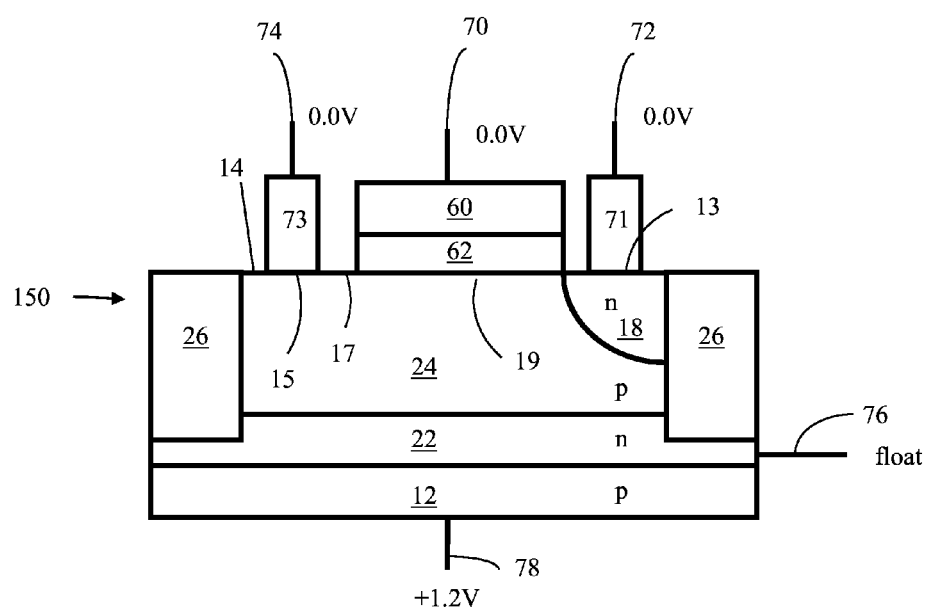
FIG. 17B is a schematic, cross-sectional illustration of a memory cell showing bias conditions applied to perform an alternative holding operation thereon, according to an embodiment of the present invention.

FIG. 17B illustrates bias conditions for an alternative holding operation applied on a memory cell 150, as described in Widjaja-2. The holding operation may alternatively be performed by applying the following bias conditions: zero voltage is applied to WL terminal 70, SL terminal 72, and BL terminal 74, a positive voltage is applied to the substrate terminal 78, while the BW terminal 76 is left floating. Under these conditions, if memory cell 150 is in memory/data state "1" with positive voltage in floating body 24, the intrinsic silicon controlled rectifier (SCR) device of memory cell 150, formed by the substrate 12, the buried well region 22, the floating body region 24, and the source line region 18 or the conductive material 73 forming Schottky contact 15 with the floating body region 24, is turned on, thereby maintaining the state "1" data. Memory cells in state "0" will remain in blocking mode, since the voltage in floating body 24 is not substantially positive and therefore floating body 24 does not turn on the SCR device. Accordingly, current does not flow through the SCR device and these cells maintain the state "0" data. In this way, an array of memory cells 150 may be refreshed by periodically applying a positive voltage pulse through substrate terminal 78. Those memory cells 150 that are commonly connected to substrate terminal 78 and which have a positive voltage in body region 24 will be refreshed with a "1" data state, while those memory cells 150 that are commonly connected to the substrate terminal 78 and which do not have a positive voltage in body region 24 will remain in blocking mode, since their SCR device will not be turned on, and therefore memory state "0" will be maintained in those cells. In this way, all memory cells 150 commonly connected to the substrate terminal will be maintained/refreshed to accurately hold their data states. This process occurs automatically, upon application of voltage to the substrate terminal 78, in a parallel, non-algorithmic, efficient process. In one particular non-limiting embodiment, a voltage of about 0.0 volts is applied to BL terminal 74, a voltage of about 0.0 volts is applied to WL terminal 70, about 0.0 volts is applied to SL terminal 72, and about +1.2 volts is applied to terminal 78, while the BW terminal 76 is left floating. However, these voltage levels may vary, while maintaining the relative relationships therebetween.

Figure 18A:
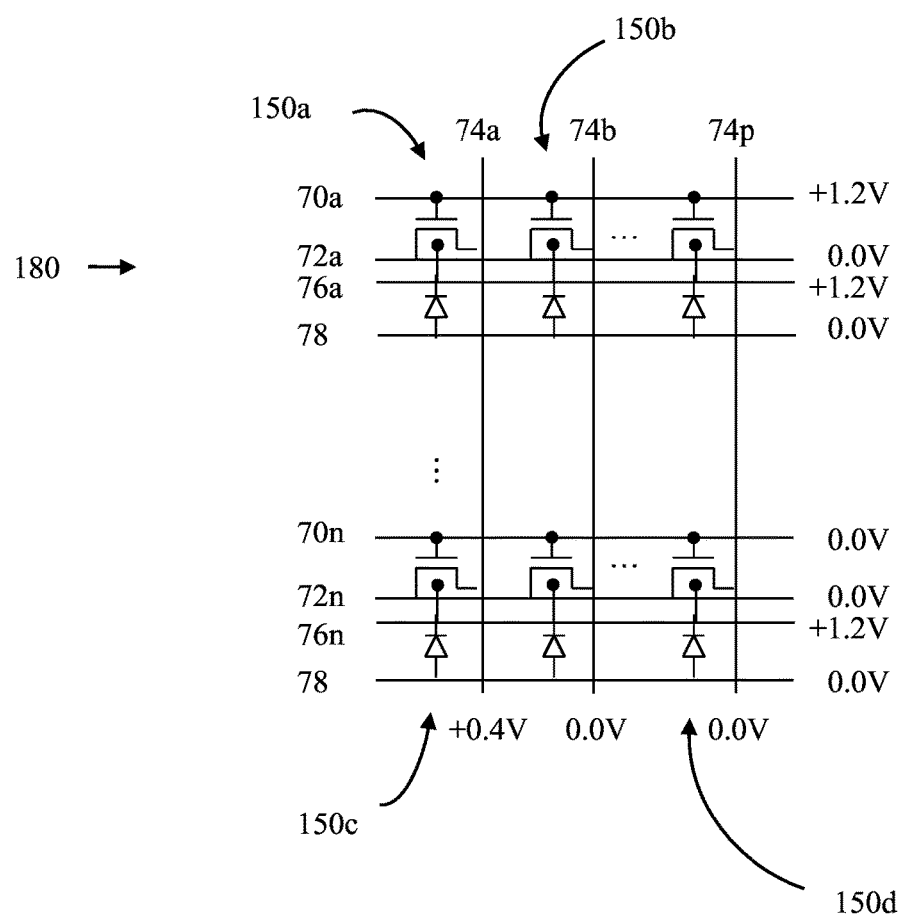
FIGS. 18A and 18B schematically illustrate bias conditions applied to memory arrays according to two different embodiments of the present invention, respectively, to perform a read operation on each.
Figure 18B:
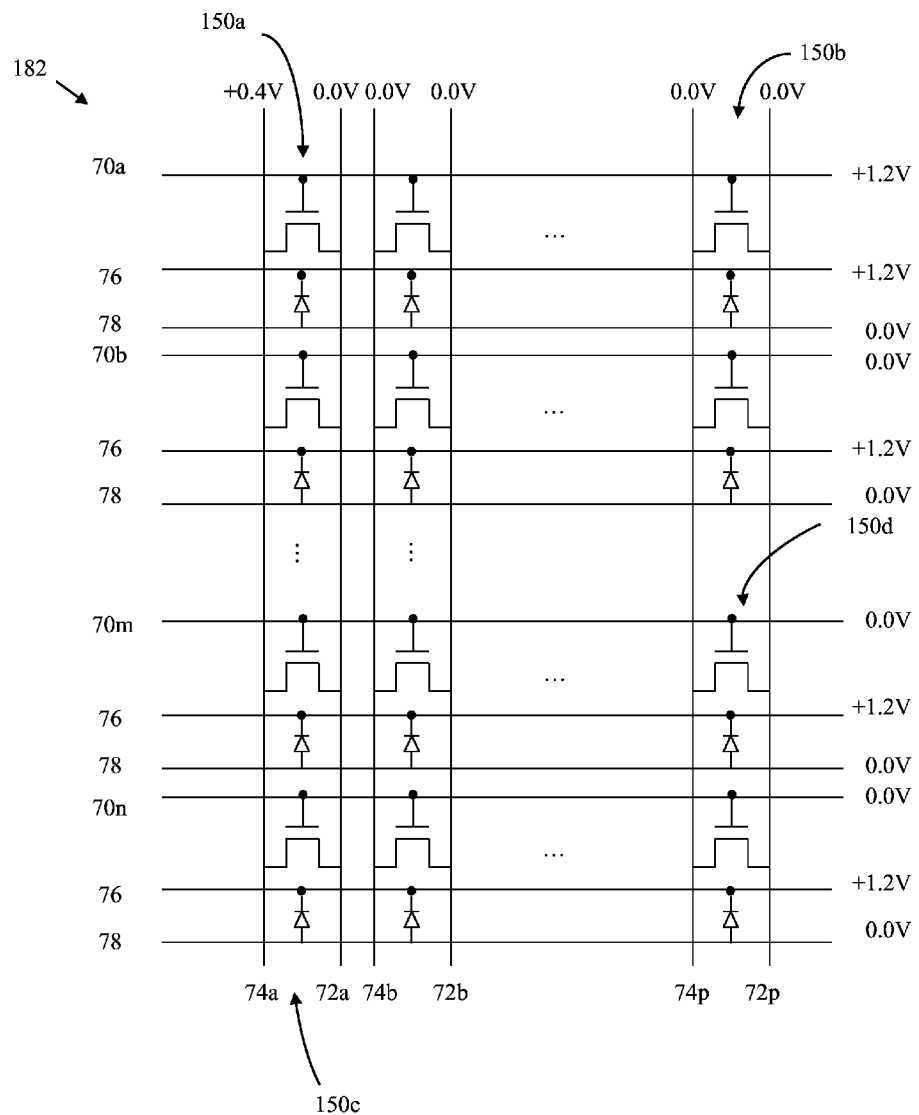
Figure 18C:
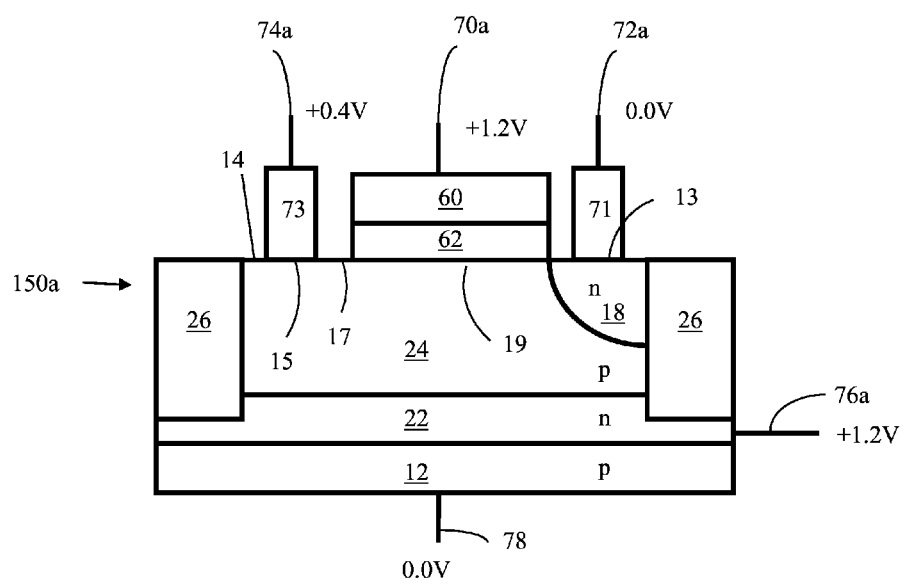
FIG. 18C schematically illustrates bias conditions applied on an exemplary selected memory cell from the array in FIG. 18A as well as from the array in FIG. 18B.

FIGS. 18A and 18B schematically illustrate bias conditions applied to the memory array 180 and 182, respectively, to perform a read operation on each. FIG. 18C schematically illustrates bias conditions applied on an exemplary selected memory cell 150a from array 180 in FIG. 18A as well as from array 182 in FIG. 18B. Any sensing scheme known in the art can be used with memory cell 150, including, for example, the sensing schemes disclosed by Ohsawa-1 and Ohsawa-2, which are each incorporated by reference herein in their entireties.

Similar to the gap region 17 in the memory cell 50, the gap region 17 in memory cell 150 (formed between the channel region 19 underneath the gate electrode 60 and the Schottky contact 15) increases the cell current ratio between memory cells in logic-0 and logic-1 state. The cell current flowing through the memory cell from the BL terminal 74 to SL terminal 72 is governed by both the amount of carriers in the channel region 19 underneath the gate 60, and the potential barrier in the gap region 17 between the channel region 19 and the bit line region 16. Both the carrier density in the channel region 19 and the potential barrier in the gap region 17 are a function of the floating body potential 24.

The surface region of the memory cell 150 may be represented as two devices in series: a metal-oxide-semiconductor (MOS) capacitor (formed by the gate electrode 60, the gate dielectrics 62, and the channel region 19) and a bipolar transistor (formed by the channel region 19, the gap region 17, and the Schottky contact 15).

When a positive voltage is applied to the gate 60, holes will be forced away from the silicon surface, creating a depletion region in the region in the region 19 under the gate 60. When the gate voltage reaches the threshold voltage, an inversion region is formed where the surface region appears to change in character from p-type to n-type and the electron concentration at the surface exceeds that of holes. The threshold voltage is affected by the potential of the floating body region 24, where a positively charged floating body 24 (e.g. for a memory cell 150 in logic-1 state) will result in a lower threshold voltage than a neutral floating body 24 (e.g. for a memory cell 150 in logic-0 state). Because the threshold voltage depends on the floating body 24 potential, the number of carriers in the channel region 19 available for conduction consequently also depends on the floating body 24 potential. Since the threshold voltage is lower when the floating body 24 is positively charged, the number of carriers at a given voltage applied to the gate 60 will also be higher compared to when the floating body region 24 is neutrally charged.

Once an inversion region is formed in the region 19 under the gate 60, the electrons will need to travel across the gap region 17. If floating body 24 is positively charged, a state corresponding to logic-1, the bipolar transistor will be turned on as the positive charge in the floating body region lowers the energy barrier of electron flow into the base region. This will result in electron flow from the channel region 19 to the gap region 17 and subsequently to the conductive electrode 73. If the floating body 24 is neutrally charged, an energy barrier between the channel region 19 and the gap region 17 exists. Thus, electron flow from the channel region 19 to the conductive electrode 73 through the gap region 17 will be prevented.

Both devices in series, i.e. the MOS capacitor (formed by the gate 60, gate dielectrics 62, and the channel region 19) and the intrinsic bipolar device (formed by the channel region 19, the gap region 17, and the Schottky contact 15), are affected by the floating body 24 potential in the same direction. A positively charged floating body 24 will result in a lower threshold voltage of the MOS capacitor and a lower potential barrier between the channel region 19 and the Schottky contact 15 of the intrinsic bipolar device. Conversely, a neutrally charged floating body 24 will result in both higher threshold voltage and higher potential barrier in the gap region 17. Consequently, the conductivity of the logic-1 state of the memory cell 150 (i.e. positively charged floating body 24) is expected to be significantly higher than that of the logic-0 state (i.e. neutrally charged floating body 24).

The read mechanism may also be described by having the gap region 17 being controlled by the fringing electric field from the gate 60, hence being only weakly controlled by the gate 60. As a result, the carrier flow through the gap region 17 is governed more dominantly by the energy barrier in the gap region 17, which is a function of the potential of the floating body 24.

In one embodiment the bias conditions for a read operation on memory cell 150 is: +1.2 volts is applied to WL terminal 70, +0.4 volts is applied to BL terminal 74, 0 volts is applied to SL terminal 72, +1.2 volts is applied to BW terminal 76, and 0 volts is applied to the substrate terminal 78. In other embodiments, different voltages may be applied to the various terminals of memory cell 150. For example, because of the high resistivity of the Schottky contact 15 (compared to Ohmic contact 13), a higher bias may be applied to the BL terminal 74 to increase the current flow through the memory cell 150. The positive voltage applied to BL terminal 74 may be less than the positive voltage applied to WL terminal 70, in which the difference in the threshold voltage of the memory cell 50 is employed to represent the state of the memory cell 50. The positive voltage applied to BL terminal 74 may also be greater than or equal to the positive voltage applied to WL terminal 70 and may generate sufficiently high electric field to trigger the bipolar read mechanism.

Figure 19A:
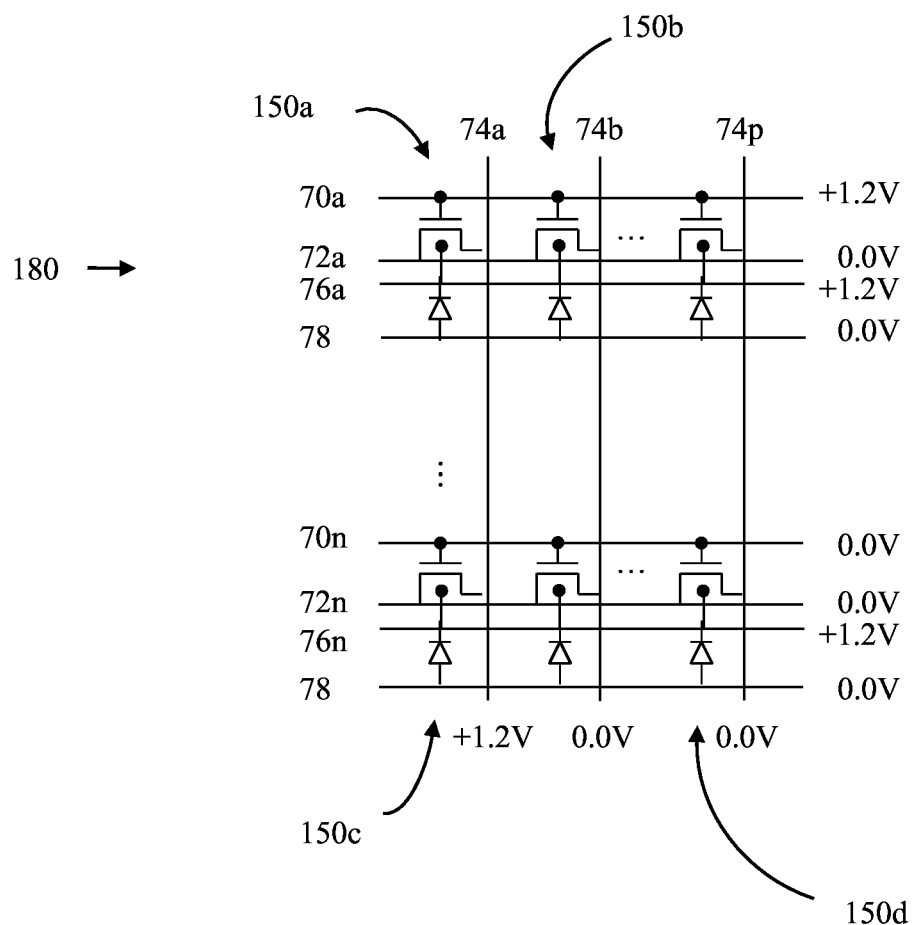
FIGS. 19A and 19B schematically illustrate arrays according to two embodiments of the present invention, and show bias conditions applied thereto to perform a write logic-1 operation through an impact ionization mechanism.
Figure 19B:
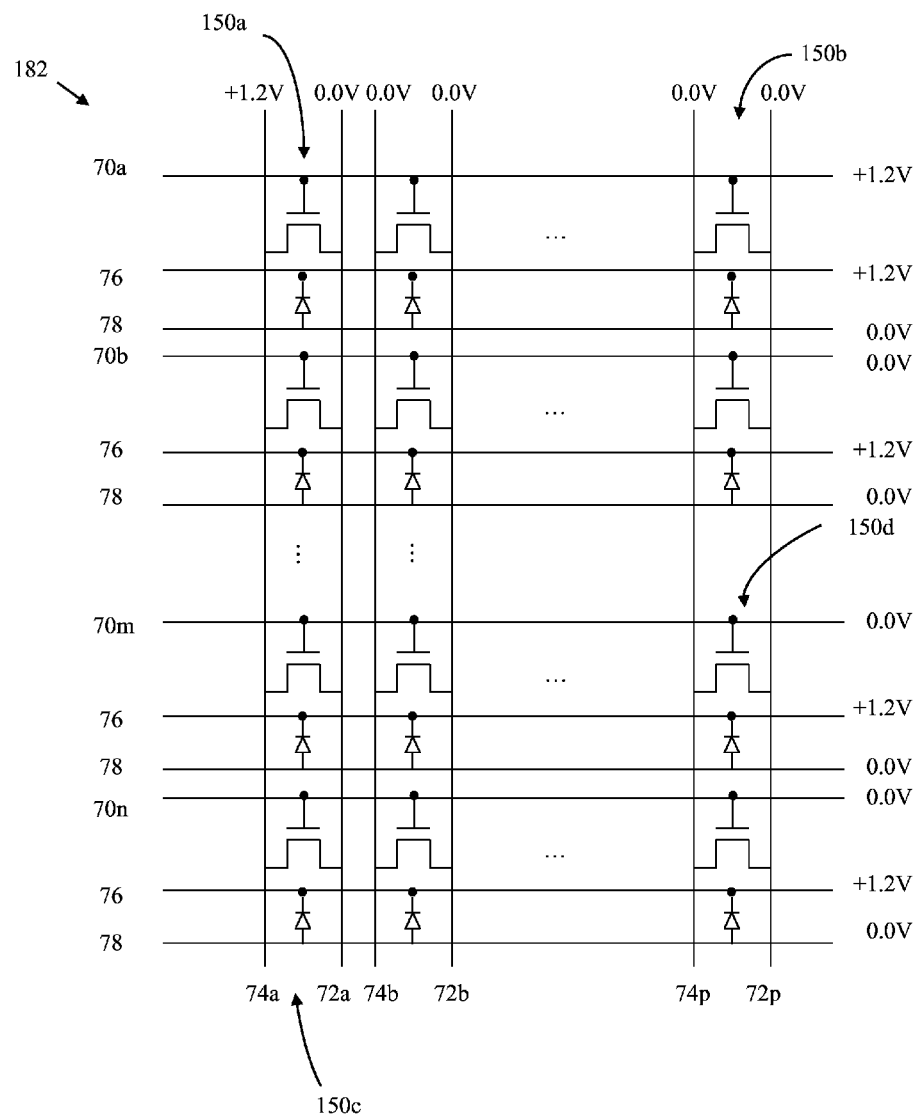
Figure 19C:
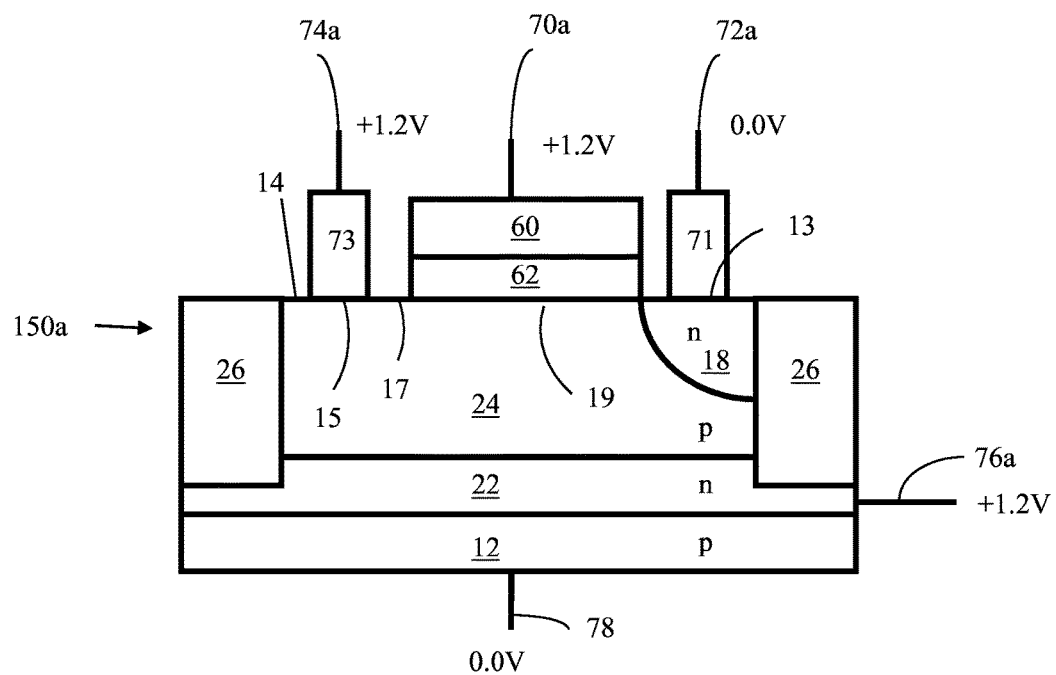
FIG. 19C schematically illustrates a cross-sectional view of a selected cell and the bias conditions applied thereto for performing the write logic-1 operation thereon in the memory array of FIG. 19A or FIG. 19B.

FIGS. 19A and 19B schematically illustrate arrays 180 and 182, respectively and show bias conditions applied thereto to perform a write logic-1 operation through impact ionization mechanism. FIG. 19C schematically illustrates a cross-sectional view of a selected cell 150a and the bias conditions applied thereto for performing the write logic-1 operation thereon in memory array 180 or 182 from FIGS. 19A and 19B, respectively. The following bias conditions are applied: a positive voltage is applied to the selected WL terminal 70a, a positive voltage is applied to the selected BL terminal 74a, zero voltage is applied to the selected SL terminal 72a, zero or positive voltage is applied to the selected BW terminal 76a, and zero voltage is applied to the substrate terminal 78a. The positive voltage applied to the selected BL terminal 74a is greater than or equal to the positive voltage applied to the selected WL terminal 70a and may generate sufficiently high enough electric field to trigger impact ionization mechanism.

In one particular non-limiting embodiment, about +1.2 volts is applied to the selected WL terminal 70a, about +1.2 volts is applied to the selected BL terminal 74a, about 0.0 volts is applied to SL terminal 72a, about 0.0 volts or +1.2 volts is applied to BW terminal 76a, and about 0.0 volts is applied to substrate terminal 78a; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only and may vary from embodiment to embodiment.

The positive bias applied to the selected BL terminal 74a will result in a depletion region formed around the Schottky contact 15, thereby lowering the potential barrier in the gap region 17. This effect is sometimes referred to as drain induced barrier lowering (DIBL). As a result, carriers (e.g. electrons) will flow through the selected memory cell 150a from the SL terminal 72a to the BL terminal 74a. Electrons will be accelerated in the pinch-off region of the MOS device 120, creating hot carriers (electron and hole pairs) in the vicinity of the Schottky contact 15. The generated holes will then flow into the floating body 24, putting the cell 150a to the logic-1 state.

Alternatively, a higher bias may be applied to the gate 60 (higher bias relative to the bias applied to the gate 60 during the read operation described above), to ensure that the channel region 19 underneath the gate 60 will be inverted regardless of the charge stored in the floating body region 24.

Figure 20A:
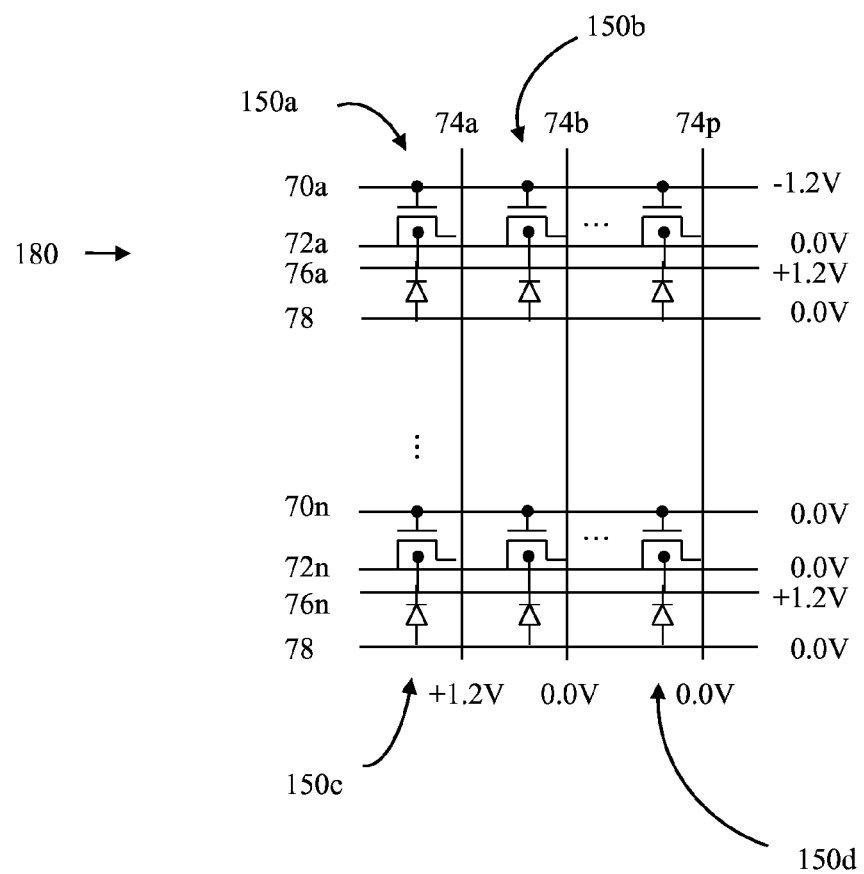
FIGS. 20A and 20B schematically illustrate arrays according to two embodiments of the present invention, and show bias conditions applied thereto to perform a write logic-1 operation using a band-to-band tunneling mechanism.
Figure 20B:
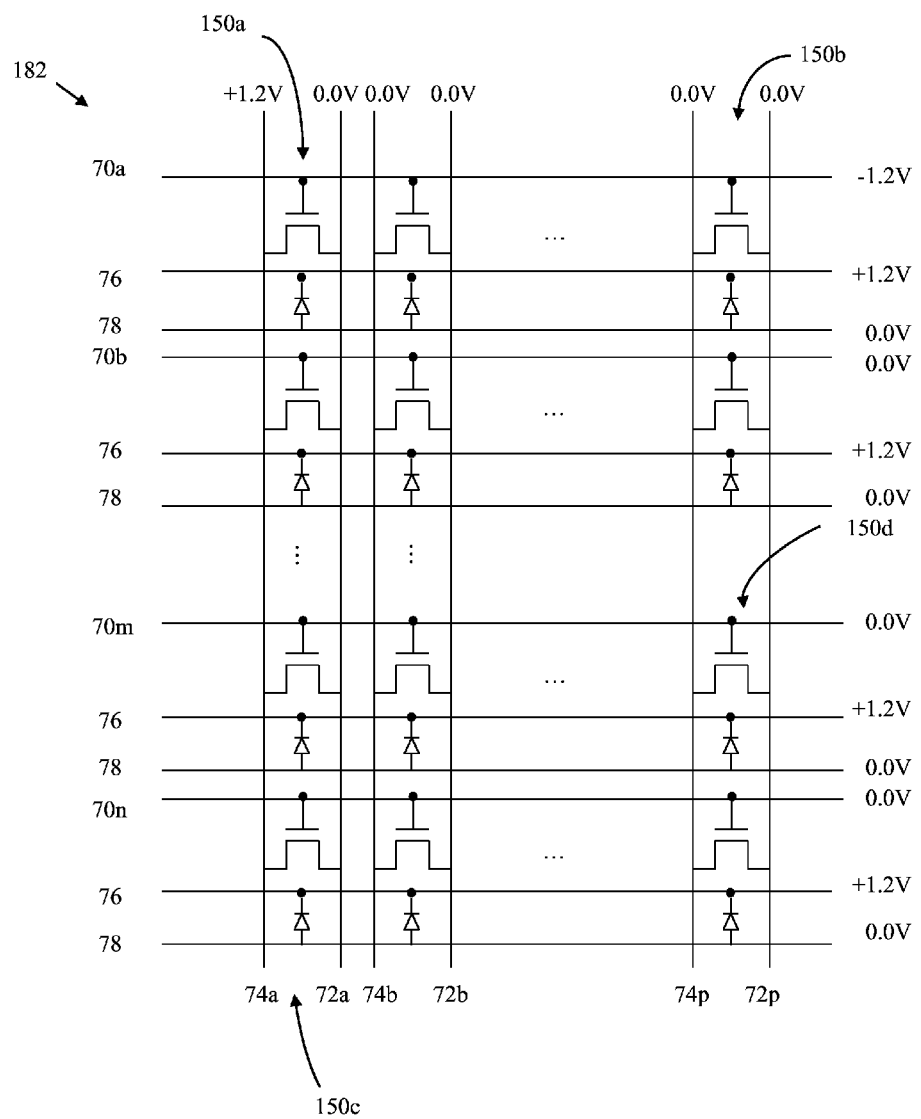
Figure 20C:
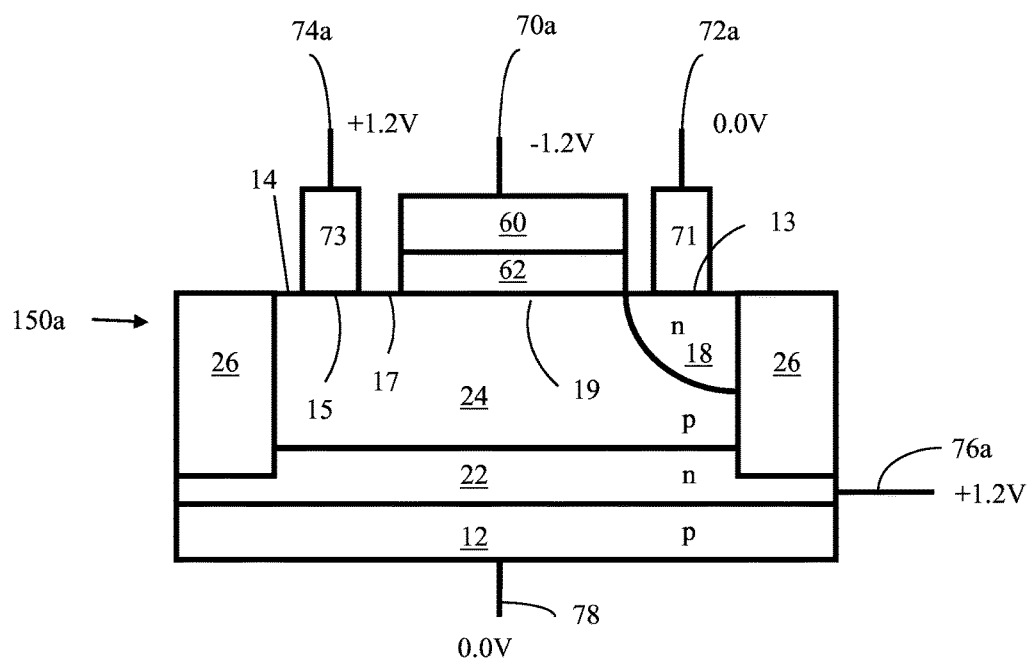
FIG. 20C schematically illustrates a cross-sectional view of a selected cell and the bias conditions applied thereto for performing the write logic-1 operation thereon in the memory array of FIG. 20A or FIG. 20B.

FIGS. 20A and 20B schematically illustrate memory arrays 180 and 182, respectively, and show bias conditions applied thereto to perform a write logic-1 operation using band-to-band tunneling mechanism, respectively. FIG. 20C schematically illustrates a cross-sectional view of a selected cell 150a and the bias conditions applied thereto to perform the write logic-1 operation using band-to-band tunneling mechanism thereon in memory array 180 or 182 from FIGS. 20A and 20B, respectively. The bias conditions applied in this example are: a negative voltage is applied to the selected WL terminal 70a, a positive voltage is applied to the selected BL terminal 74a, zero voltage is applied to the selected SL terminal 72a, zero or positive voltage is applied to the selected BW terminal 76a, and zero voltage is applied to the substrate terminal 78a.

In one particular non-limiting embodiment, about −1.2 volts is applied to the selected WL terminal 70a, about +1.2 volts is applied to the selected BL terminal 74a, about 0.0 volts is applied to SL terminal 72a, about 0.0 volts or +1.2 volts is applied to BW terminal 76a, and about 0.0 volts is applied to substrate terminal 78a; while about 0.0 volts is applied to the unselected WL terminals 70, unselected BL terminals 74, unselected SL terminals, and substrate terminal 78, and 0.0 volts or +1.2 volts is applied to BW terminal 76. These voltage levels are exemplary only and may vary from embodiment to embodiment.

The negative charge on the gate 60 (connected to WL terminal 70a) and the positive voltage on Schottky contact 15 (connected to BL terminal 74a) create a strong electric field between the Schottky contact 15 and the floating body region 24 in the proximity of gate 60 (in the vicinity of the gap region 17). This bends the energy band sharply upward in the surface area near the gate 60 and the Schottky contact 15 (in the vicinity of gap region 17), causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

Figure 20D:
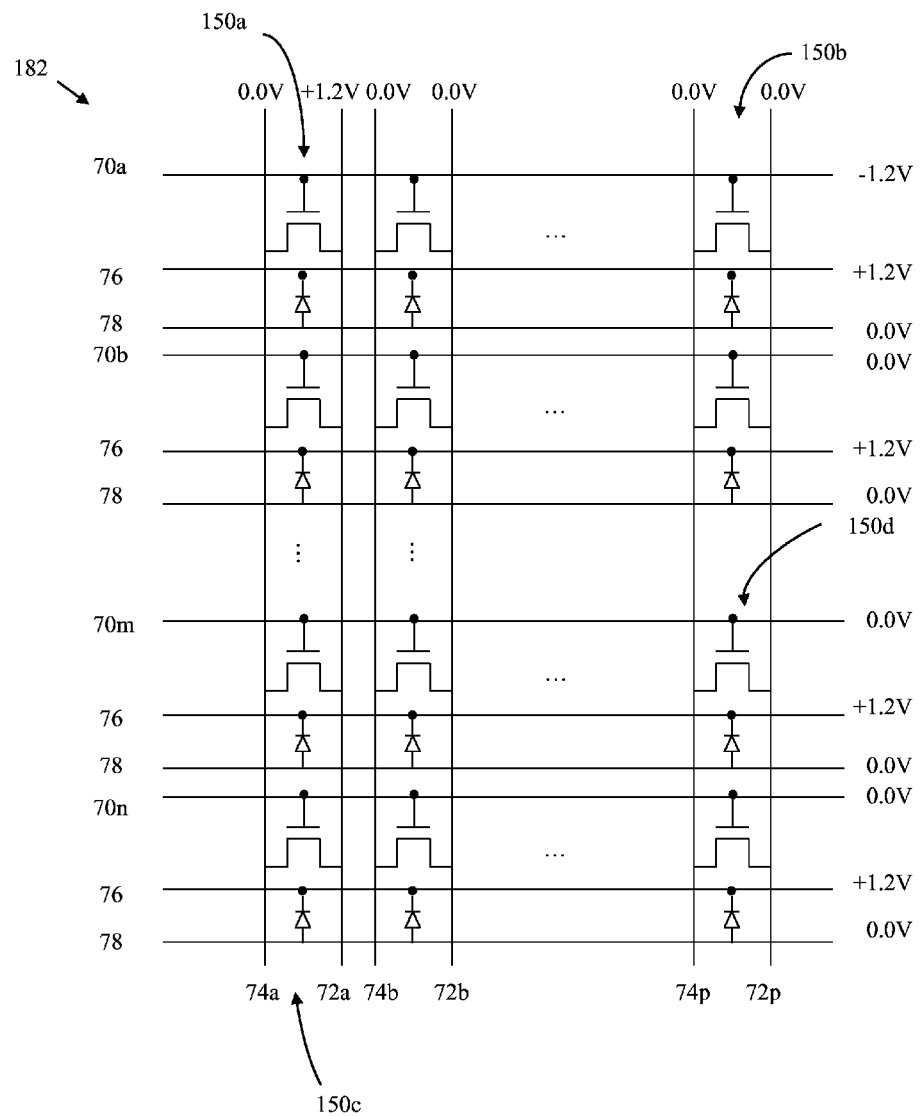
FIG. 20D schematically illustrates an alternative set of bias conditions for performing a band-to-band tunneling write logic-1 operation according to an embodiment of the present invention.

The presence of the gap region 17 may reduce the effectiveness of the band-to-band tunneling mechanism since it decreases the overlap of the surface area near the gate 60 and the Schottky contact 15. Alternatively, in memory array 182, the band-to-band tunneling write logic-1 operation can be performed by applying a positive bias to the SL terminal 72a, zero voltage to the BL terminal 74a, negative voltage to the WL terminal 70a, zero or positive bias to the BW terminal 76, and zero bias to the substrate terminal 78. This is illustrated in FIG. 20D.

Figure 21A:
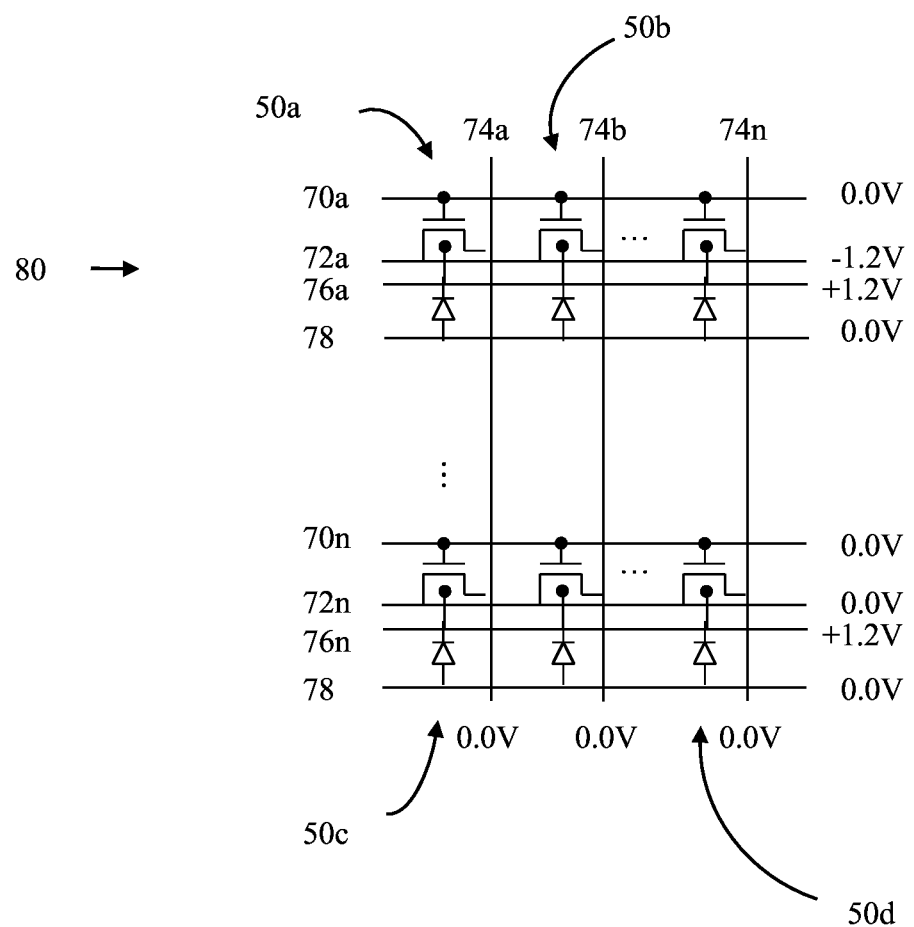
FIGS. 21A-21B schematically illustrate arrays according to two embodiments of the present invention, and show bias conditions applied thereto to perform a write logic-0 operation.
Figure 21B:
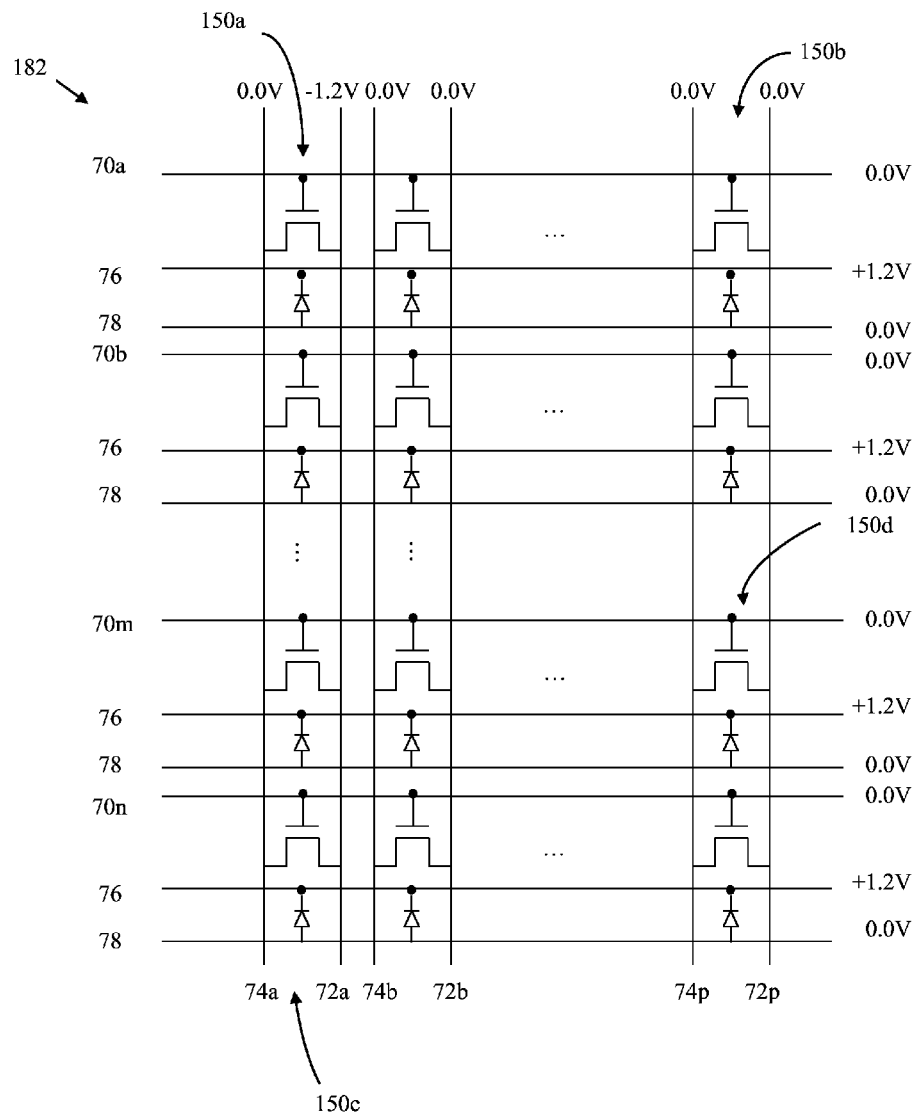
Figure 21C:
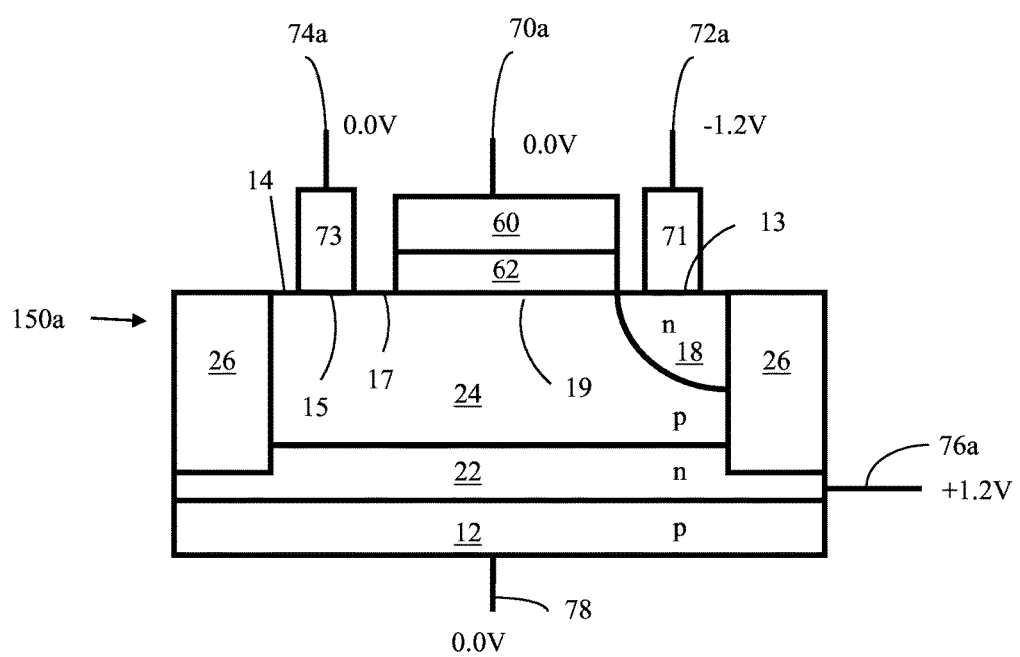
FIG. 21C schematically illustrates a cross-sectional view of a selected cell and the bias conditions applied thereto for performing the write logic-0 operation thereon in the memory array of FIG. 21A or FIG. 21B.

FIGS. 21A and 21B schematically illustrate memory arrays 180 and 182, respectively, and show bias conditions applied thereto to perform a write logic-0 operation thereon. FIG. 21C schematically illustrates a cross-sectional view of a selected cell 150a and the bias conditions applied thereto to perform the write logic-0 operation thereon for either of arrays 180, 182. The write logic-0 operation can be performed by applying a negative voltage bias to the selected SL terminal 72a, a zero voltage bias to the WL terminal 70, zero voltage bias to the BL terminal 74, zero or positive voltage bias to the BW terminal 76 (or 76a), and zero voltage bias to the substrate terminal 78 (or 78a); while zero voltage is applied to the unselected SL terminals 72, zero voltage bias applied to the unselected WL terminals 70, zero or positive bias applied to the BW terminal 76, and zero voltage bias applied to the substrate terminal 78. Under these conditions, the p-n junction between floating body 24 and source line region 18 of the selected cell 150 is forward-biased, evacuating holes from the floating body 24. All memory cells 150 sharing the same SL terminal 72a will be written to simultaneously. To write arbitrary binary data to different memory cells 150, a write logic-0 operation is first performed on all the memory cells to be written, followed by one or more write logic-1 operations on the memory cells that must be written to logic-1.

In one particular non-limiting embodiment, about −1.2 volts is applied to selected SL terminal 72a, about 0.0 volts is applied to WL terminal 70a, about 0.0 volts or +1.2 volts is applied to BW terminal 76 or 76a, and about 0.0 volts is applied to substrate terminal 78 or 78a. These voltage levels are exemplary only may vary from embodiment to embodiment.

Figure 22A:
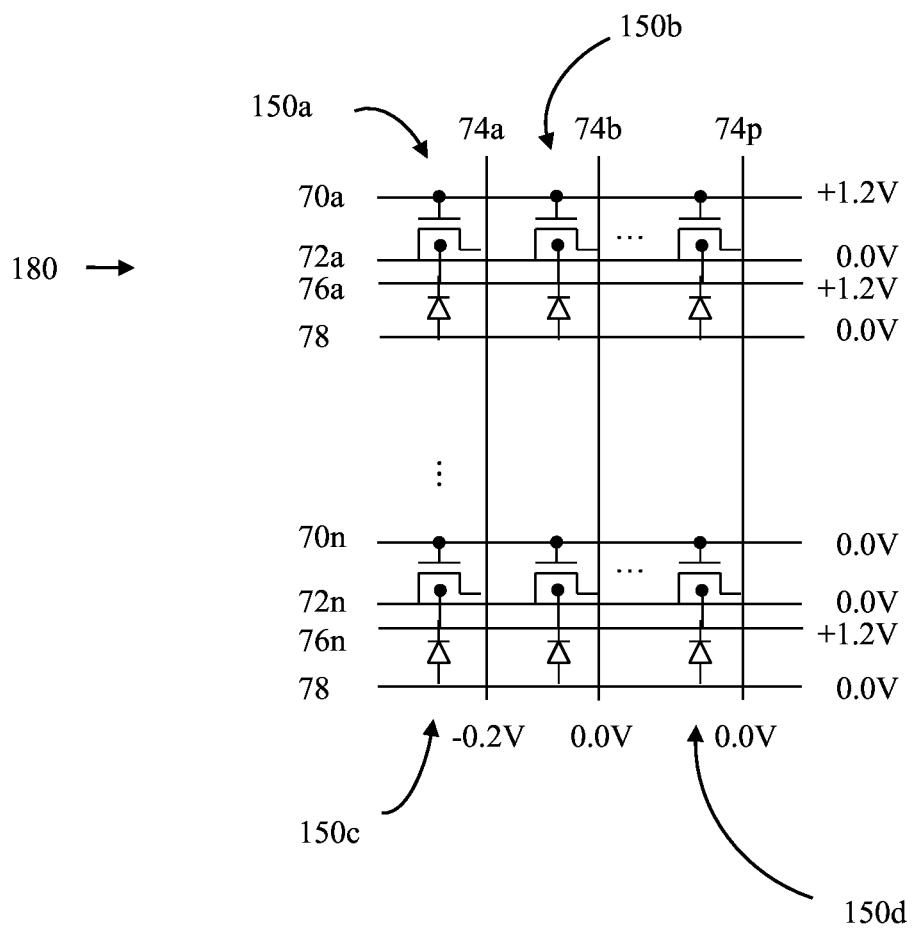
FIGS. 22A-22B schematically illustrate arrays according to two embodiments of the present invention, and show bias conditions applied thereto to perform a bit-selective write logic-0 operation.
Figure 22B:
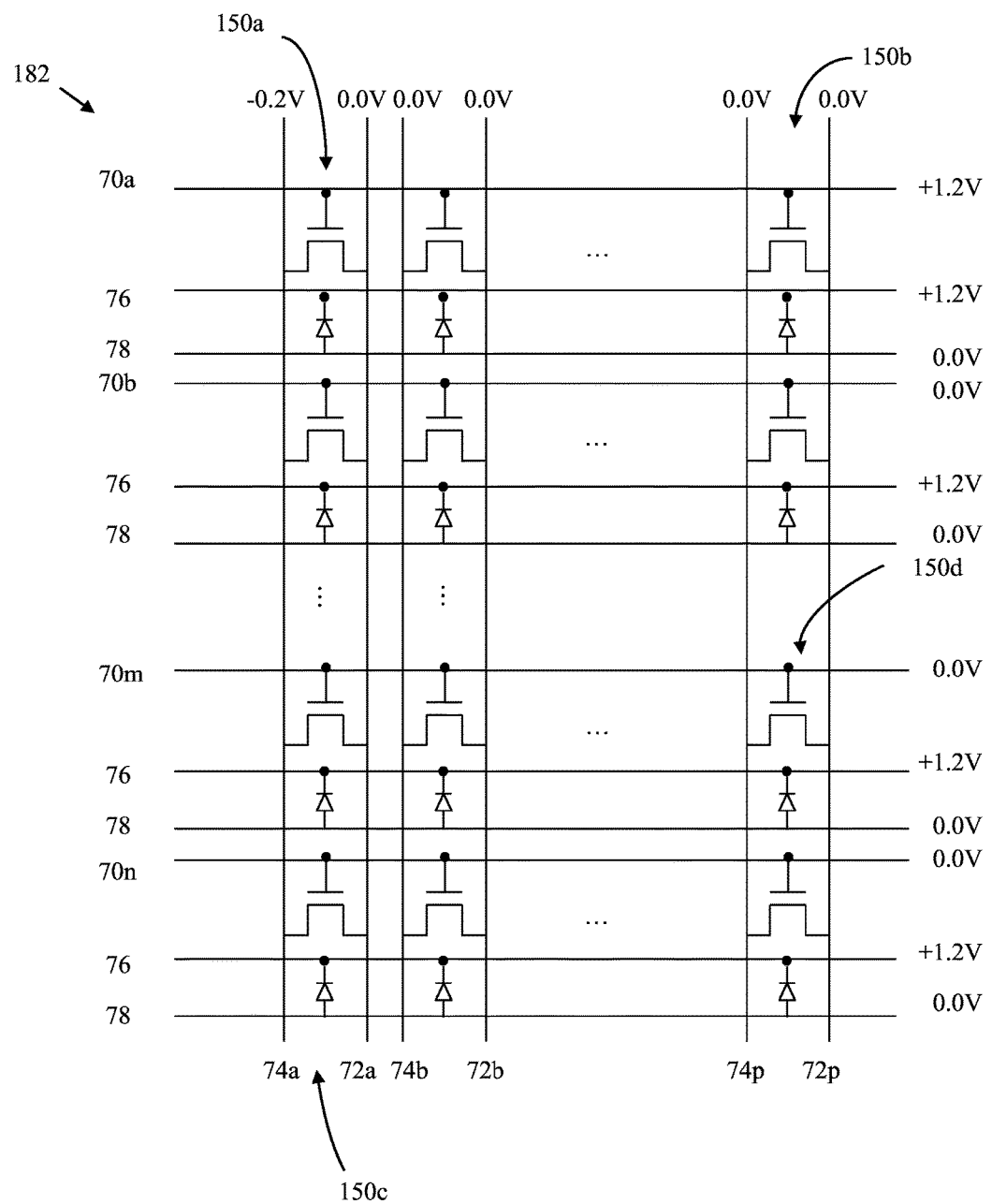
Figure 22C:
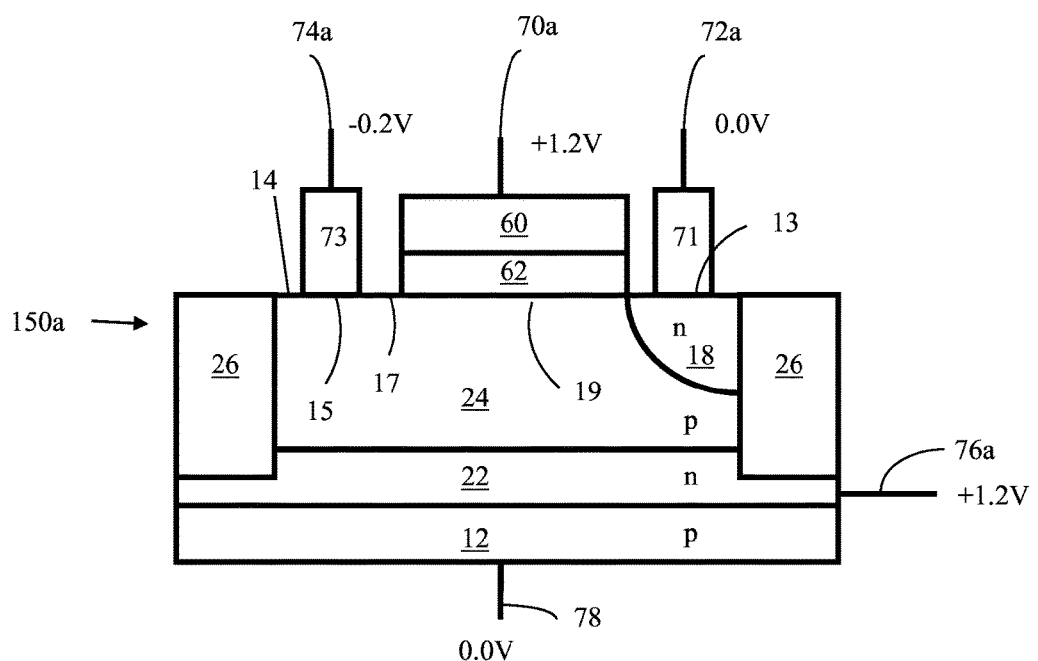
FIG. 22C schematically illustrates a cross-sectional view of a selected cell and the bias conditions applied thereto for performing the bit-selective write logic-0 operation thereon in the memory array of FIG. 22A or FIG. 22B.

FIGS. 22A and 22B schematically illustrate memory arrays 180 and 182, respectively, and show bias conditions applied thereto to perform a bit-selective write logic-0 operation thereon. FIG. 22C schematically illustrates a cross-sectional view of a selected cell 150a and the bias conditions applied thereto to perform the bit-selective write logic-0 operation thereon for either of arrays 180, 182. The bias conditions include applying a positive voltage to the selected WL terminal 70a, a negative voltage to the selected BL terminal 74a, zero voltage bias to the selected SL terminal 72a, zero or positive voltage bias to the BW terminal 76 or 76a, and zero voltage to the substrate terminal 78 or 78a; while zero voltage is applied to the unselected WL terminals 70, zero voltage is applied to the unselected BL terminals 74, zero voltage bias is applied to the unselected SL terminals 72, zero or positive voltage is applied to the BW terminal 76, and zero voltage is applied to the substrate terminal 78. Under these conditions, the floating body 24 potential will increase through capacitive coupling from the positive voltage applied to the WL terminal 70a. As a result of the floating body 24 potential increase and the negative voltage applied to the BL terminal 74a, the p-n junction between floating body region 24 and bit line region 16 is forward-biased, evacuating any holes from the floating body 24.

To reduce undesired write logic-0 disturb to other memory cells 150 in a memory array, the applied potential can be optimized as follows: if the floating body 24 potential of state logic-1 is referred to as $V_{FB1}$, then the voltage applied to the WL terminal 70a is configured to increase the floating body 24 potential by $V_{FB1}/2$ while $-V_{FB1}/2$ is applied to BL terminal 74a. Additionally, either ground or a slightly positive voltage may also be applied to the BL terminals 74 of unselected memory cells 150 that do not share the same BL terminal 74a as the selected memory cell 150a, while a negative voltage may also be applied to the WL terminals 70 of unselected memory cells 150 that do not share the same WL terminal 70a as the selected memory cell 150a.

As illustrated in FIGS. 22A through 22C, the following exemplary bias conditions may be applied to the selected memory cell 150a to perform a bit-selective write logic-0 operation: a potential of about −0.2 volts to the selected BL terminal 74a, a potential of about +1.2 volts to the selected WL terminal 70a, about 0.0 volts is applied to the selected SL terminal 72a, a potential of about +1.2 volts to the BW terminal 76 or 76a, about 0.0 volts to the substrate terminal 78 or 78a.

Figure 23A:
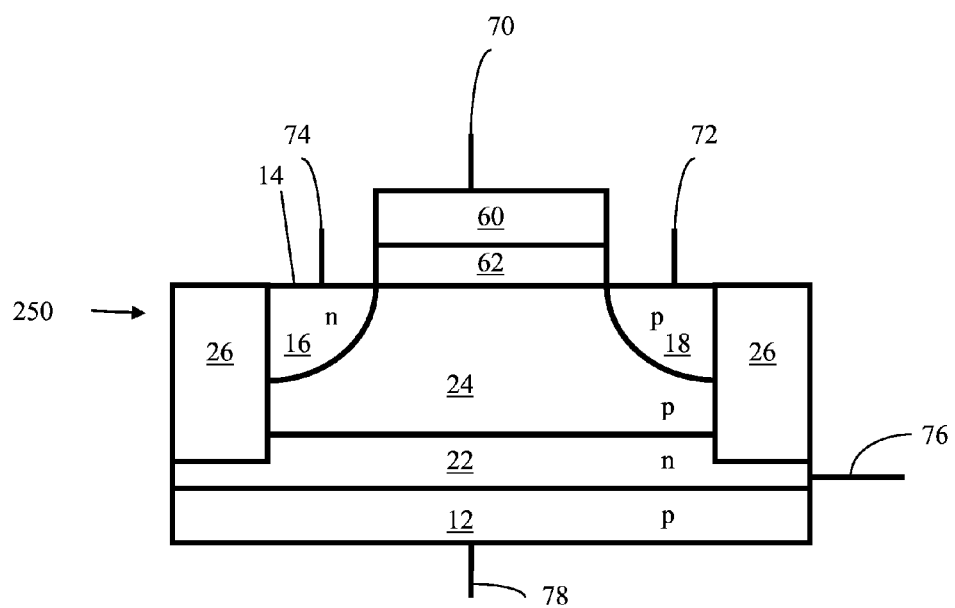
FIG. 23A illustrates a schematic cross-sectional view of a memory cell according to another embodiment of the present invention.

FIG. 23A illustrates a schematic cross-sectional view of memory cell 250 according to another embodiment of the present invention. Memory cell 250 includes a substrate 12 of a first conductivity type such as p-type, for example. Substrate 12 is typically made of silicon, but may also (or alternatively) comprise, for example, germanium, silicon germanium, gallium arsenide, carbon nanotubes, or other semiconductor materials. In some embodiments of the invention, substrate 12 may be the bulk material of the semiconductor wafer. In other embodiments, substrate 12 may be a well of the first conductivity type embedded in either a well of the second conductivity type or, alternatively, in the bulk of the semiconductor wafer of the second conductivity type, such as n-type, for example, (not shown in the figures). To simplify the description, the substrate 12 will usually be drawn as the semiconductor bulk material as it is in FIG. 23A.

A buried layer 22 of a second conductivity type such as n-type, for example, is provided in the substrate 12. Buried layer 22 may be formed by an ion implantation process on the material of substrate 12. Alternatively, buried layer 22 may be grown epitaxially on top of substrate 12.

A floating body region 24 of the first conductivity type, such as p-type, for example, is bounded on top by bit line region 16, source line region 18, and insulating layer 62, on the sides by insulating layers 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

Figure 23B:
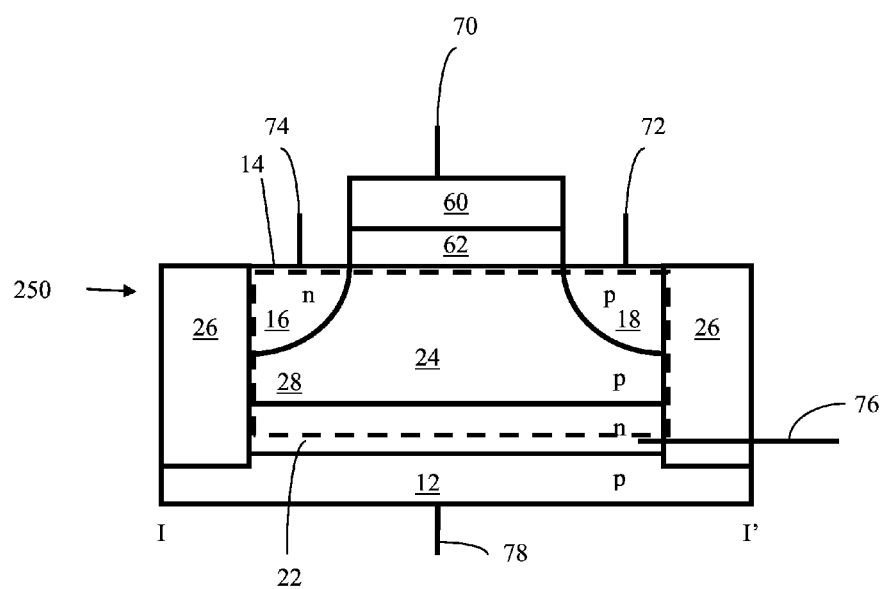
FIG. 23B illustrates a schematic cross-sectional view of a memory cell according to another embodiment of the present invention.

Insulating layers 26 (for example, shallow trench isolation (STI)), may be made of silicon oxide, for example, though other insulating materials may be used. Insulating layers 26 insulate cell 250 from neighboring cells 250 when multiple cells 250 are joined in an array 280 to make a memory device. The bottom of insulating layer 26 may reside inside the buried region 22 allowing buried region 22 to be continuous as shown in FIG. 23A. Alternatively, the bottom of insulating layer 26 may reside below the buried region 22 as shown in the cross-sectional view of another embodiment of memory cell 250 in FIG. 23B. This requires a shallower insulating layer 28, which insulates the floating body region 24, but allows the buried layer 22 to be continuous in the perpendicular direction of the cross-sectional view shown in FIG. 23B. For simplicity, only memory cell 250 with continuous buried region 22 in all directions will be shown from hereon.

A bit line region 16 having a second conductivity type, such as n-type, for example, is provided in floating body region 24 and is exposed at surface 14. Bit line region 16 may be formed by an implantation process performed on the material making up substrate 12, according to any implantation process known and typically used in the art. Alternatively, a solid state diffusion process could be used to form bit line region 16.

A source line region 18 having a first conductivity type, such as p-type, for example, is also provided in floating body region 24 and is exposed at surface 14. Source line region 18 may be formed by an implantation process performed on the material making up substrate 12, according to any implantation process known and typically used in the art. Alternatively, a solid state diffusion process could be used to form source line region 18. The source line region 18 has the same conductivity type as the floating body region 24, with the source line region 18 typically being more heavily doped than the floating body region 24.

A gate 60 is positioned in between the bit line region 16 and source line region 18 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and/or one of their nitrides.

Memory cell 250 is asymmetric in that the conductivity type between the bit line region 16 and the source line region 18 is different. The conductivity type of the source line region 18 is the same as that of the floating body 24, and as a result, the source line region 18 may be used to sense the potential of the floating body 24.

Cell 250 includes several terminals: word line (WL) terminal 70 electrically connected to gate 60, bit line (BL) terminal 74 electrically connected to bit line region 16, source line (SL) terminal 72 electrically connected to source line region 18, buried well (BW) terminal 76 electrically connected to buried layer 22, and substrate terminal 78 is electrically connected to substrate 12. The SL terminal 72 may not be shared across different cells 250 as it will electrically short floating body 24 region in multiple cells 250, hence precluding floating body 24 to be used as charge storage region. As a result, arrays comprising memory cells 250 are typically limited to one or two rows only.

Figure 23C:
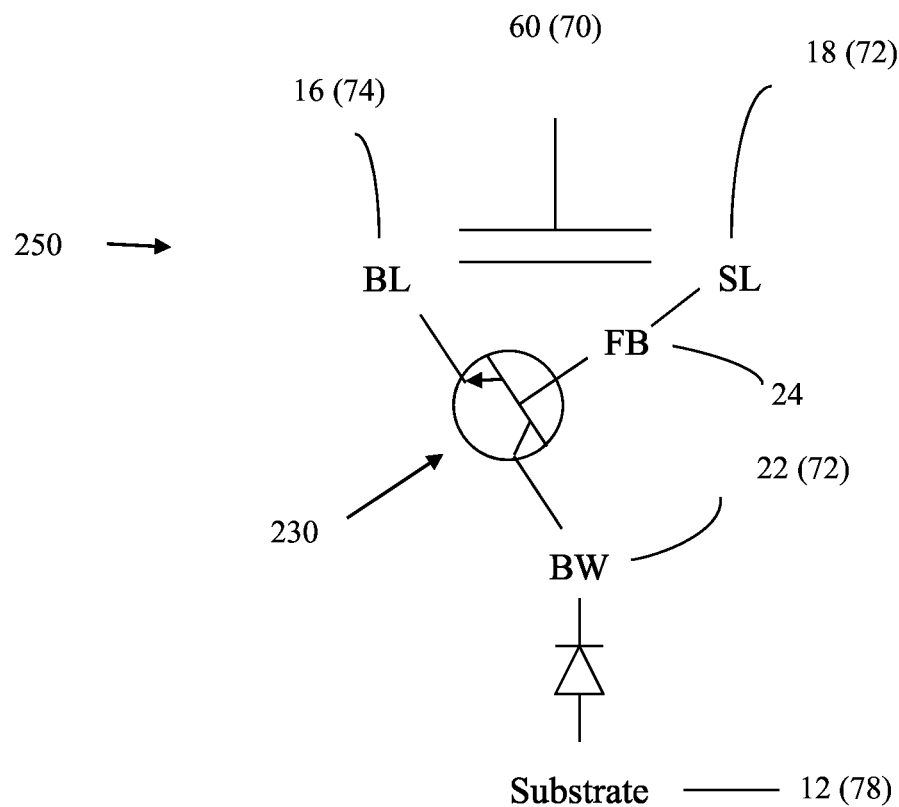
FIG. 23C schematically illustrates an equivalent circuit representation of the memory cell of FIG. 23A or 23B.

FIG. 23C illustrates an equivalent circuit representation of memory cell 250, showing an intrinsic n-p-n bipolar device 230, formed by buried well region 22, floating body region 24, and bit line region 16, and gate 60 which is capacitively coupled to the floating body region 24. Source line region 18 is shown to be connected to the floating body region 24.

Figure 23D:
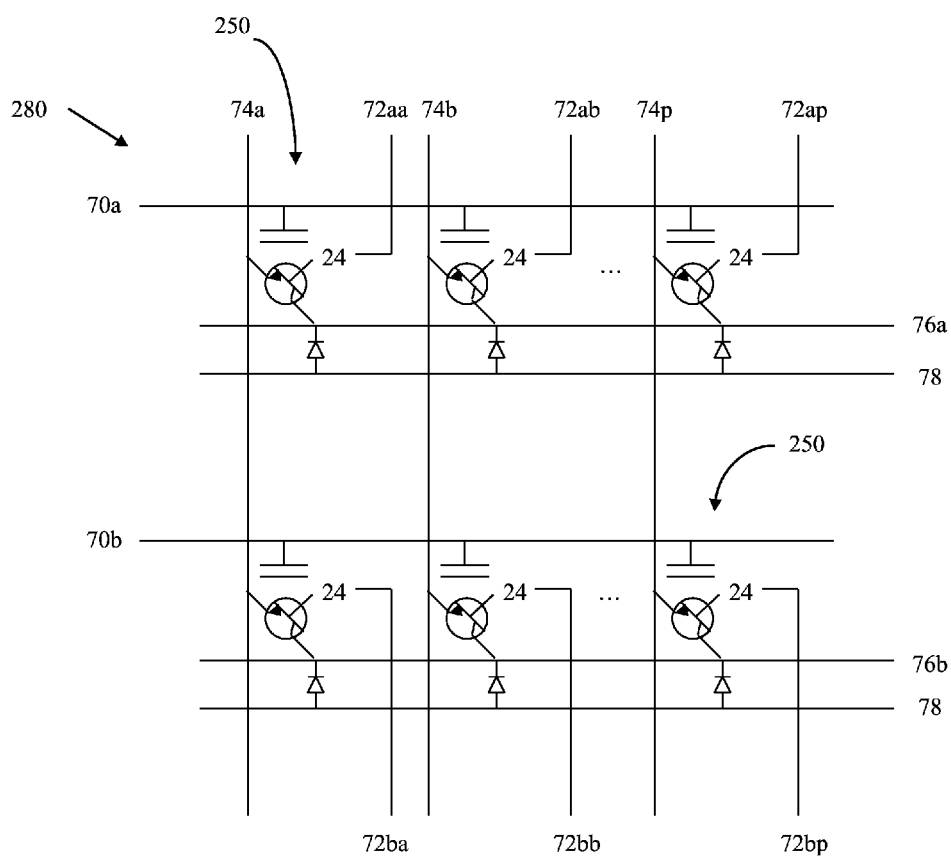
FIG. 23D schematically illustrates a memory array comprising two rows of memory cells according to an embodiment of the present invention.

FIG. 23D schematically illustrates a memory array 280 comprising 2 rows of memory cells 250 according to an embodiment of the present invention. Present in FIG. 23D are word lines 70a and 70b, bit lines 74a through 74p, buried well terminals 76a and 76b, substrate terminal 78, and source line terminals 72aa through 72bp (the first and second indices refer to the row and column designation, respectively). Each of the word lines 70a and 70b is associated with a single row of memory cells 250 and is coupled to the gate 60 of each memory cell 250 in that row. Each of the bit lines 74a through 74p is associated with a single column of memory cells 250 and is coupled to the bit line region 16 of each memory cell 250 in that column. The buried well terminals 76a and 76b may be associated with a single row of memory cells 250 or may be common through the memory array 280. Each of the source lines 72aa through 72bp is associated with a single memory cell 250 in the memory array 280.

Several operations can be performed on memory cells 250 including: holding, read, write logic-1 and write logic-0 operations.

Figure 24A:
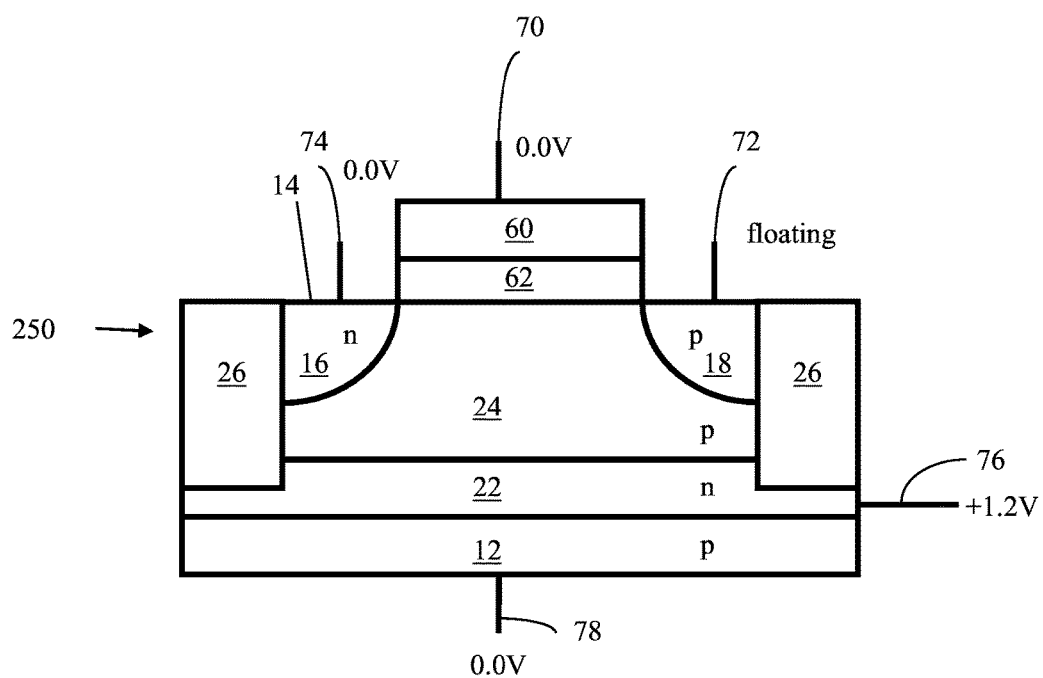
FIG. 24A schematically illustrates a cross-sectional view of a memory cell and shows exemplary bias conditions applied thereto for performing a holding operation thereon, according to an embodiment of present invention.

FIG. 24A schematically illustrates a cross-sectional view of memory cell 250 and shows exemplary bias conditions applied thereto for performing a holding operation thereon. The holding operation follows the same principle as that of memory cells 50 and 150 and may performed by applying a positive back bias to the BW terminal 76, zero bias on the WL terminal 70, and BL terminal 74, while SL terminal 72 is left floating. The positive back bias applied to the buried layer region 22 connected to the BW terminal 76 will maintain the state of the memory cell 250 that it is connected to. The positive bias applied to the BW terminal 76 needs to generate a sufficient electric field to trigger an impact ionization mechanism as described with reference to the band diagram shown in FIGS. 4A and 4B. The impact ionization rate as a function of the electric field is for example described in Sze on pp. 37-41.

In one embodiment the bias conditions for the holding operation on memory cell 250 are: 0.0 volts are applied to WL terminal 70, 0.0 volts are applied to BL terminal 74, a positive voltage of about +1.2 volts is applied to BW terminal 76, and 0.0 volts are applied to the substrate terminal 78, while the SL terminal 72 is left floating. In other embodiments, different voltages may be applied to the various terminals of memory cell 250.

In the holding operation described in FIG. 24, as well as in the array of FIG. 23D, there is no individually selected memory cell 250. Rather the holding operation is performed on all cells 250 connected to the same buried well terminal 76.

Figure 24B:
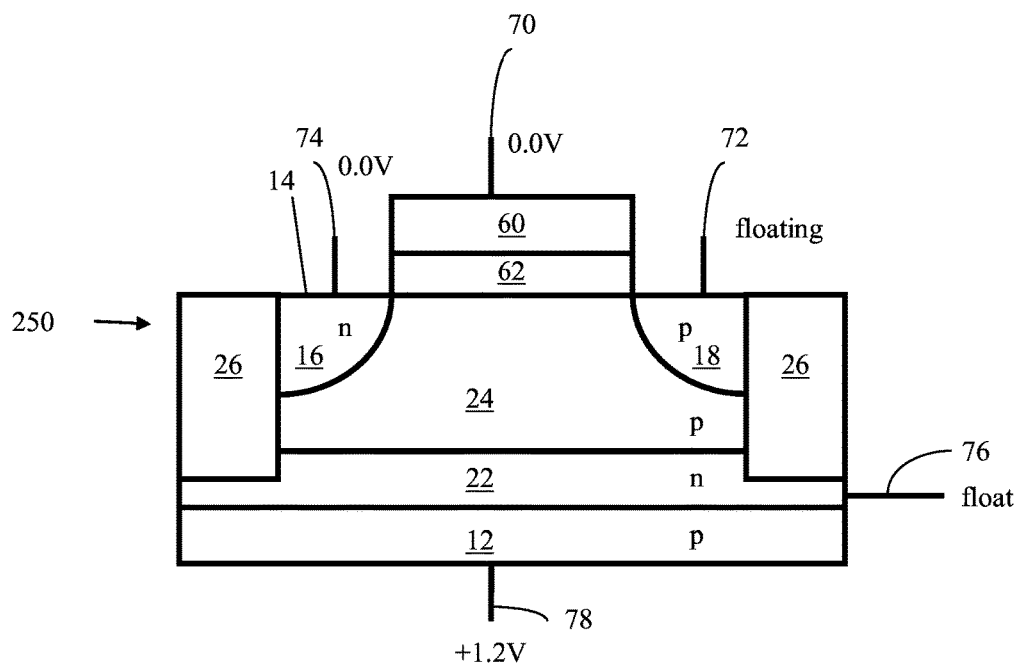
FIG. 24B schematically illustrates a cross-sectional view of a memory cell and shows exemplary bias conditions applied thereto for performing an alternative holding operation thereon, according to an embodiment of present invention.

FIG. 24B illustrates bias conditions for an alternative holding operation applied on a memory cell 250, as described in Widjaja-2. The holding operation employs the principle of intrinsic SCR device formed by the substrate 12, the buried well region 22, the floating body region 24, and the bit line region 16, as described in FIGS. 5D, 5E, and 17B. The holding operation may alternatively be performed by applying the following bias conditions: zero voltage is applied to WL terminal 70 and BL terminal 74, a positive voltage is applied to the substrate terminal 78, while the SL terminal 72 and BW terminal 76 are left floating. In one particular non-limiting embodiment, a voltage of about 0.0 volts is applied to BL terminal 74, a voltage of about 0.0 volts is applied to WL terminal 70, and about +1.2 volts is applied to terminal 78, while the SL terminal 72 and BW terminal 76 are left floating. However, these voltage levels may vary, while maintaining the relative relationships therebetween.

A read operation can be performed by directly sensing the potential of the floating body 24 through the SL terminal 72 connected to the source line region 18. If memory cell 250 is in logic-1 state, a positive potential, for example +0.6V-+0.8V, is stored in the floating body 24, while if memory cell 250 is in logic-0 state, zero potential or low positive potential, for example 0-+0.2V, is stored in the floating body 24. The maximum potential stored in the floating body 24 can be modulated through the positive bias applied to the BW terminal 76. FIG. 5C illustrates the charge stored in the floating body region 24 as a function of the potential applied to the buried well region 22, connected to the BW terminal 76.

Figure 25:
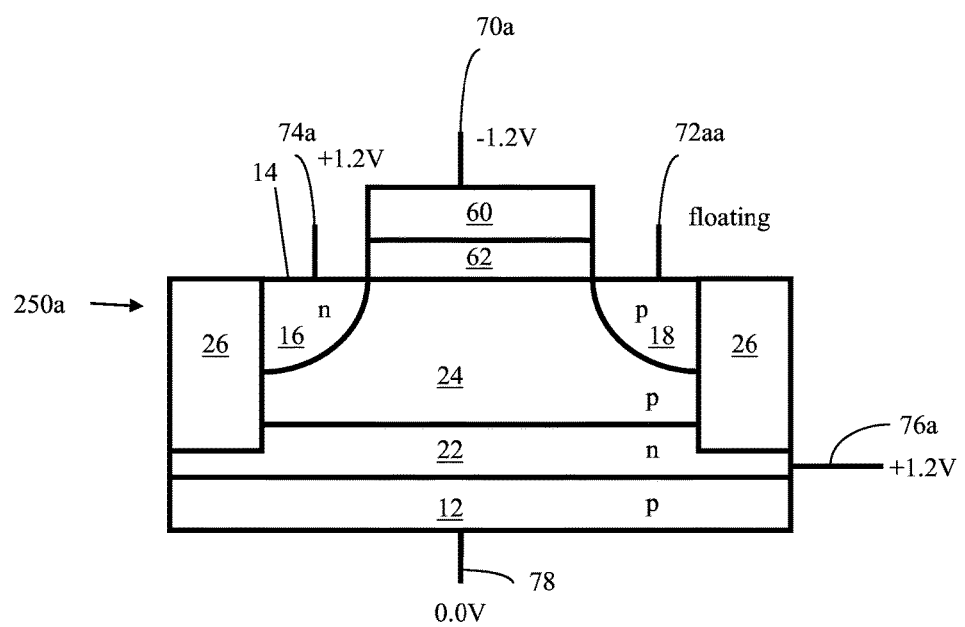
FIG. 25 is a schematic, cross-sectional illustration of a selected memory cell showing exemplary bias conditions that may be applied to the selected memory cell to perform a write logic-1 operation thereon, according to an embodiment of the present invention.

FIG. 25 is a schematic, cross-sectional illustration of a selected memory cell 250a showing exemplary bias conditions that may be applied to the selected memory cell 250a to perform a write logic-1 operation thereon. The write logic-1 operation can be performed using a band-to-band tunneling mechanism, where the following bias conditions are applied: a negative voltage is applied to the selected WL terminal 70a, a positive voltage is applied to the selected BL terminal 74a, zero or positive voltage is applied to the selected BW terminal 76a, and zero voltage is applied to the substrate terminal 78, while SL terminal 72aa is left floating. The negative charge on the gate 60 and the positive voltage on BL terminal 74a create a strong electric field (for example, around $10^6$ V/cm in silicon, as described in Sze, p. 104) between the bit line region 16 and the floating body region 24 in the proximity of gate 60. This bends the energy band sharply upward near the gate 60 and bit line junction overlap region, causing electrons to tunnel from the valence band to the conduction band, leaving holes in the valence band. The electrons which tunnel across the energy band become the drain leakage current, while the holes are injected into floating body region 24 and become the hole charge that creates the logic-1 state.

In one particular non-limiting embodiment, about −1.2 volts is applied to the selected word line terminal 70a, about +1.2 volts is applied to the selected bit line terminal 74a, about 0.0 volts or +1.2 volts is applied to selected BW terminal 76a, and about 0.0 volts is applied to substrate terminal 78, while SL terminal 72aa is left floating. These voltage levels are exemplary only may vary from embodiment to embodiment.

Figure 26A:
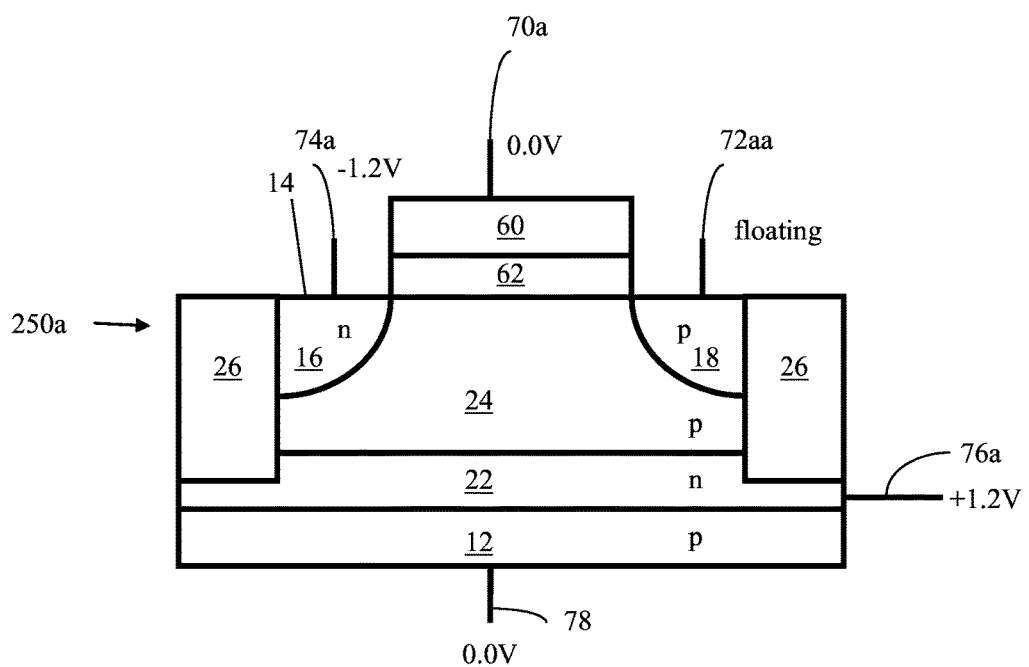
FIG. 26A is a schematic, cross-sectional illustration of a selected memory cell and exemplary bias conditions applied thereto to perform a write logic-0 operation thereon, according to an embodiment of the present invention.

FIG. 26A is a schematic, cross-sectional illustration of a selected memory cell 250a and exemplary bias conditions applied thereto to perform a write logic-0 operation thereon. The write logic-0 operation may be performed by applying a negative voltage bias to the BL terminal 74a, a zero voltage bias to the WL terminal 70a, zero or positive voltage bias to the BW terminal 76a, and zero voltage bias to the substrate terminal 78, while the SL terminal 72aa is left floating. Under these conditions, the p-n junction between floating body 24 and bit line region 16 of the selected cell 250 is forward-biased, evacuating holes from the floating body 24. All memory cells 250 sharing the same BL terminal 74a will be written to simultaneously. To write arbitrary binary data to different memory cells 250, a write logic-0 operation is first performed on all the memory cells to be written, followed by one or more write logic-1 operations on the memory cells that must be written to logic-1.

In one particular non-limiting embodiment, about −1.2 volts is applied to bit line terminal 74a, about 0.0 volts is applied to WL terminal 70a, about 0.0 volts or +1.2 volts is applied to BW terminal 76a, and about 0.0 volts is applied to substrate terminal 78, while source line terminal 72aa is left floating. These voltage levels are exemplary only and may vary from embodiment to embodiment.

Figure 26B:
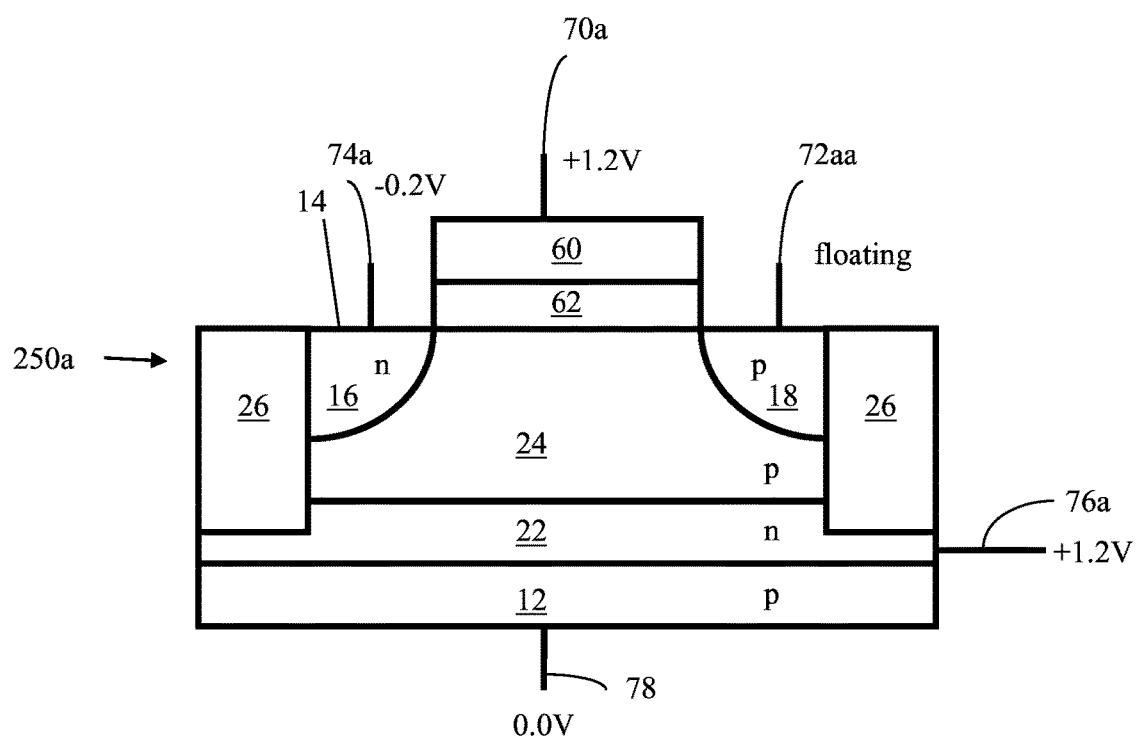
FIG. 26B is a schematic, cross-sectional illustration of a selected memory cell showing exemplary bias conditions that can be applied thereto to perform a bit-selective write logic-0 operation thereon, according to an embodiment of the present invention.

FIG. 26B is a schematic, cross-sectional illustration of a selected memory cell 250a showing exemplary bias conditions that may be applied thereto to perform a bit-selective write logic-0 operation thereon. The bit-selective write logic-0 operation can be performed on memory cell 250a by applying a positive voltage to WL terminal 70a, a negative voltage to BL terminal 74a, zero or positive voltage bias to the BW terminal 76a, and zero voltage to the substrate terminal 78, while the SL terminal 72aa is left floating. Under these conditions, the floating body 24 potential will increase through capacitive coupling from the positive voltage applied to the WL terminal 70a. As a result of the floating body 24 potential increase combined with the negative voltage applied to the BL terminal 74, the p-n junction between floating body region 24 and bit line region 16 is forward-biased, evacuating holes from the floating body 24, thereby resulting in the logic-0 state in the memory cell 250a.

To reduce undesired write logic-0 disturb to other memory cells 250 in a memory array, the applied potential can be optimized as follows: if the floating body 24 potential of state logic-1 is referred to as $V_{FB1}$, then the voltage applied to the WL terminal 70a is configured to increase the floating body 24 potential by $V_{FB1}/2$ while $-V_{FB1}/2$ is applied to BL terminal 74a. Additionally, either ground or a slightly positive voltage may also be applied to the BL terminals 74 of unselected memory cells 250 that do not share the same BL terminal 74a as the selected memory cell 250a, while a negative voltage may also be applied to the WL terminals 70 of unselected memory cells 250 that do not share the same WL terminal 70a as the selected memory cell 250a.

As illustrated in FIG. 26B, the following exemplary bias conditions may be applied to the selected memory cell 250a to perform a bit-selective write logic-0 operation: a potential of about −0.2 volts to BL terminal 74a, a potential of about +1.2 volts to the WL terminal 70a, a potential of about +1.2 volts to the BW terminal 76a, about 0.0 volts to the substrate terminal 78, while the SL terminal 72aa is left floating.

The transition between logic-0 and logic-1 states is defined by $V_{TS}$ in FIGS. 5A and 5B. $V_{TS}$ can be modulated by the potential difference across the emitter and collector terminals of the intrinsic n-p-n bipolar device 230 (see FIG. 23C); that is, between the BW terminal 76a and the BL terminal 74a. $V_{TS}$ is inversely dependent on the potential difference between emitter and collector terminals ($V_{CE}$), as shown in FIG. 12C. The dependence of $V_{TS}$ on $V_{CE}$ can be utilized for the write logic-0 operation. For example, the potential applied to the BW terminal 76a can be reduced during the write logic-0 operation, hence resulting in higher $V_{TS}$, higher than the potential of the floating body region 24 $V_{FB}$ of the selected memory cell 250a during write logic-0 operation. Because the $V_{FB}$ is now less than $V_{TS}$, a net current flowing out of the floating body region 24 will be observed.

Figure 27:
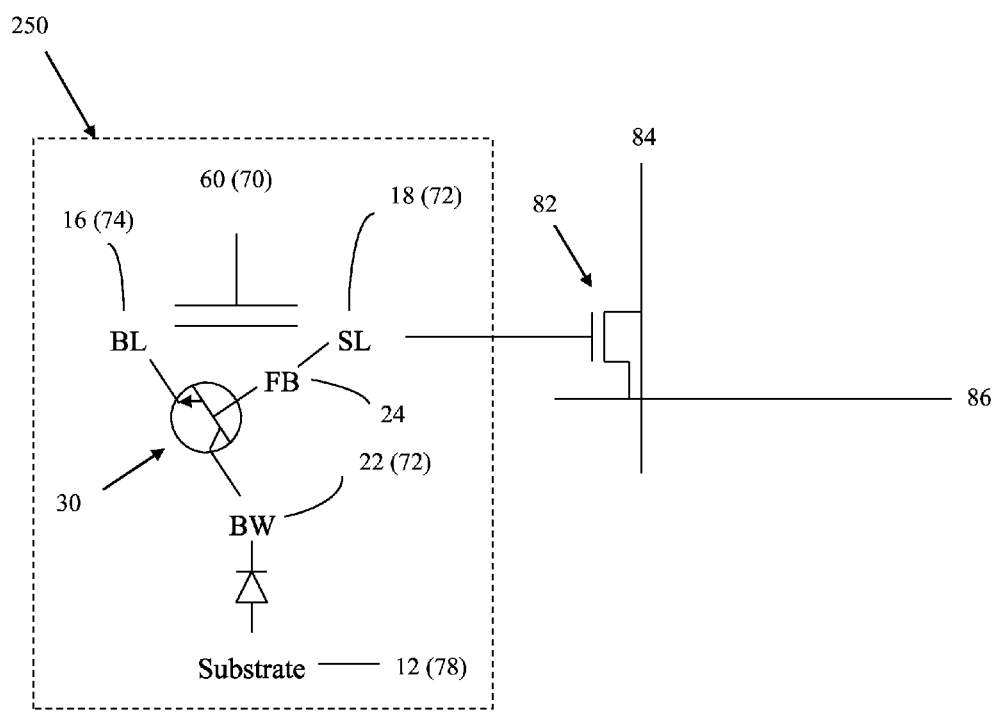
FIG. 27 schematically illustrates use of a memory cell as a latch, according to an embodiment of the present invention.

Memory cell 250 may be used as a latch, where the SL terminal 72 can be connected to the gate of another transistor, for example, to configure connectivity of gates in a field programmable logic array (FPGA), as described in FIG. 27. The SL terminal 72 of memory cell 250 is connected to the gate of a switching transistor 82, which in turn connects interconnect lines 84 and 86. If the memory cell 250 is in logic-1 state, the floating body 24 will be positively charged, and the gate of the switching transistor 82 will be positively biased. If n-channel metal-oxide-semiconductor (NMOS) transistor is used as the switching transistor 82 (as shown in FIG. 27), this will turn on the switching transistor 82 and connect the lines 84 and 86. If the memory cell 250 is in logic-0 state, the floating body 24 will be neutrally charged, and the switching transistor 82 will be turned off. As a result, no connection between lines 84 and 86 is formed.

Figure 28:
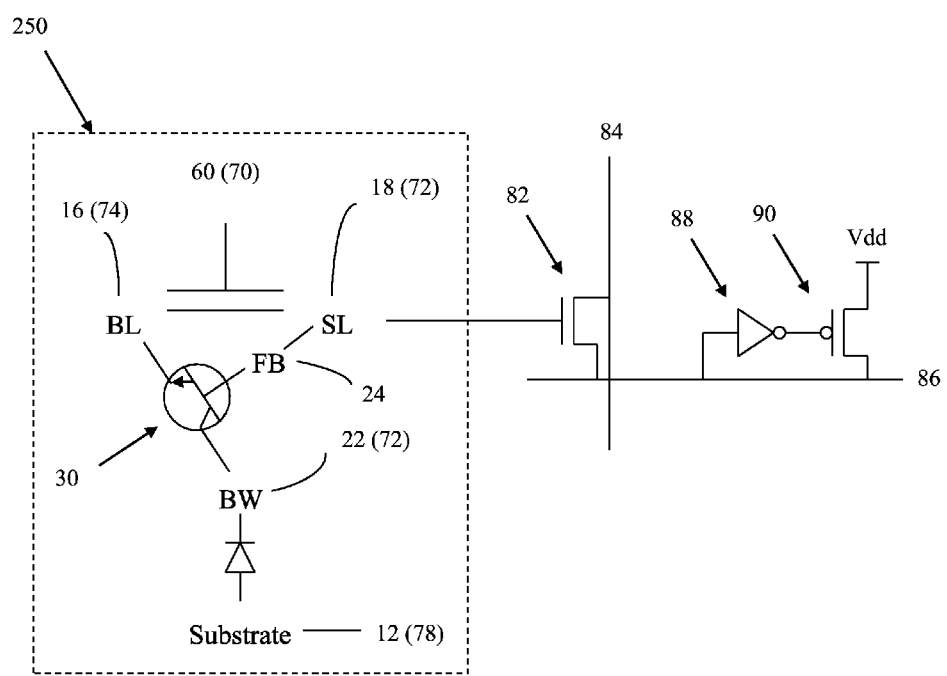
FIG. 28 schematically illustrates an alternative arrangement of the use of a memory cell as a configuration memory to configure connectivity in an FPGA, according to an embodiment of the present invention.

FIG. 28 illustrates an alternative arrangement of the use of memory cell 250 as a configuration memory to configure connectivity in an FPGA, where an inverter 88 and a p-channel metal-oxide-semiconductor (PMOS) transistor 90 are used to restore the value of the signals passed between lines 84 and 86. This is because an NMOS switching transistor 82 will only pass a maximum potential of about ($V_{gs}-V_{th}$), where $V_{gs}$ is the potential difference between the gate and the source terminals, and $V_{th}$ is the threshold voltage of the NMOS transistor, respectively.

An electrical connection to the floating body region, such as that between the SL terminal 72 to the floating body region 24 (through the source line region 18) described in cell 250, can be used as a reference cell for reading a floating body memory cell, for example, as described in Widjaja and Ranica, or the memory cells 50 and 150 according to the present invention.

Figure 29A:
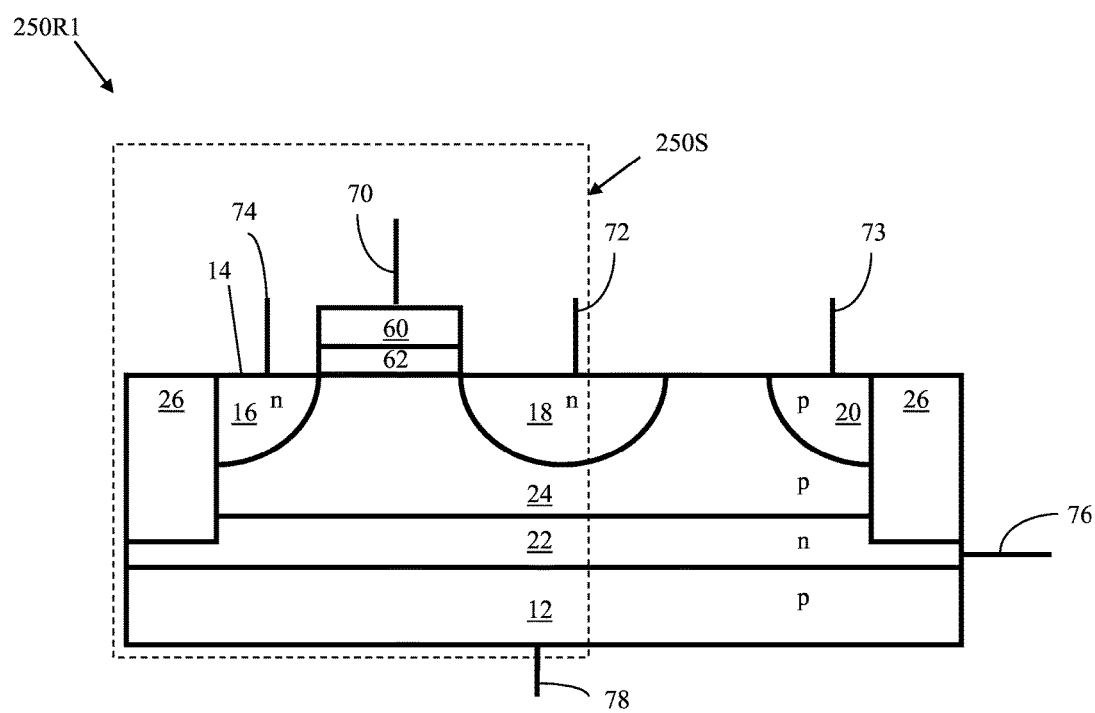
FIG. 29A is a schematic, cross-sectional illustration of a memory cell which can be used as a reference cell in sensing the state of a floating body memory cell according to an embodiment of the present invention.

FIG. 29A is a schematic, cross-sectional illustration of a memory cell 250R1, which can be used as a reference cell in sensing the state of a floating body memory cell described in Widjaja and Ranica. Cell 250R1 includes a substrate 12 of a first conductivity type such as p-type, for example. Substrate 12 is typically made of silicon, but may also (or alternatively) comprise, for example, germanium, silicon germanium, gallium arsenide, carbon nanotubes, or other semiconductor materials. In some embodiments of the invention, substrate 12 may be the bulk material of the semiconductor wafer. In other embodiments, substrate 12 may be a well of the first conductivity type embedded in either a well of the second conductivity type or, alternatively, in the bulk of the semiconductor wafer of the second conductivity type, such as n-type, for example, (not shown in the figures). To simplify the description, the substrate 12 will usually be drawn as the semiconductor bulk material as it is in FIG. 29A.

A buried layer 22 of a second conductivity type such as n-type, for example, is provided in the substrate 12. Buried layer 22 may be formed by an ion implantation process on the material of substrate 12. Alternatively, buried layer 22 may be grown epitaxially on top of substrate 12.

A floating body region 24 of the first conductivity type, such as p-type, for example, is bounded on top by the surface 14, bit line region 16, source line region 18, sense line region 20, and insulating layer 62, on the sides by insulating layers 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

Figure 29B:
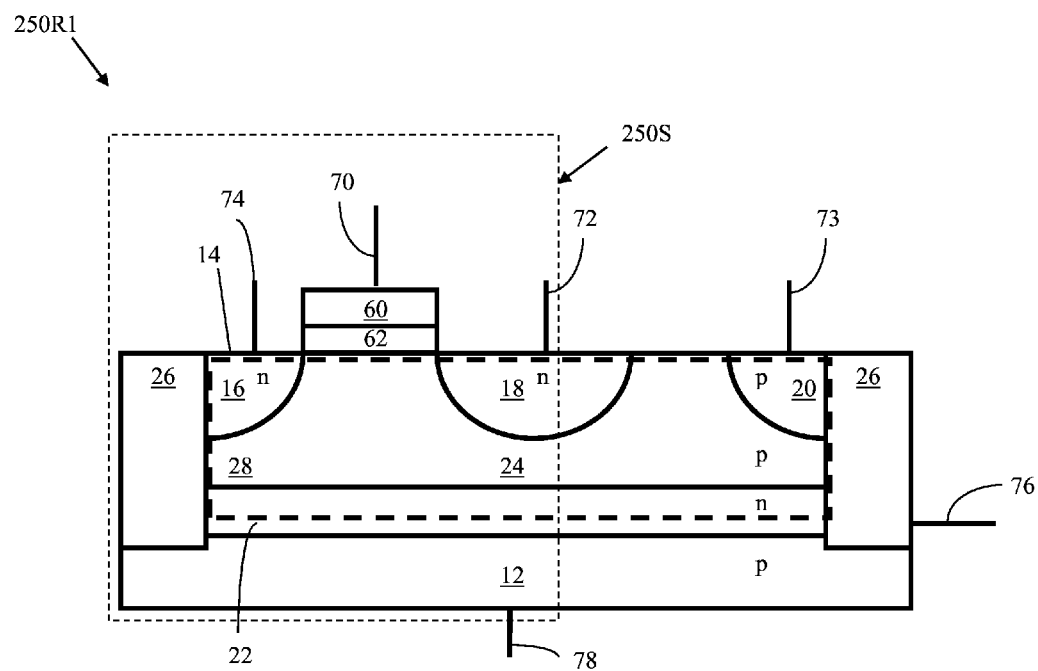
FIG. 29B is a schematic, cross-sectional illustration of a memory cell which can be used as a reference cell in sensing the state of a floating body memory cell according to another embodiment of the present invention.

Insulating layers 26 (for example, shallow trench isolation (STI)), may be made of silicon oxide, for example, though other insulating materials may be used. Insulating layers 26 insulate cell 250R1 from neighboring memory cells, which include floating body memory cells described by Widjaja and Ranica or memory cells 50, 150 and 250 according to the present invention, or to neighboring reference cells 250R1 The bottom of insulating layer 26 may reside inside the buried region 22 allowing buried region 22 to be continuous as shown in FIG. 29A. Alternatively, the bottom of insulating layer 26 may reside below the buried region 22 as shown in the cross-sectional view of another embodiment of memory cell 250R1 in FIG. 29B. This requires a shallower insulating layer 28 (shown in dashed lines), which insulates the floating body region 24, but allows the buried layer 22 to be continuous in the perpendicular direction of the cross-sectional view shown in FIG. 29B. For simplicity, only memory cell 250R1 with continuous buried region 22 in all directions will be shown from hereon.

A bit line region 16 having a second conductivity type, such as n-type, for example, is provided in floating body region 24 and is exposed at surface 14. Bit line region 16 may be formed by an implantation process performed on the material making up substrate 12, according to any implantation process known and typically used in the art. Alternatively, a solid state diffusion process can be used to form bit line region 16.

A source line region 18 having a second conductivity type, such as n-type, for example, is provided in floating body region 24 and is exposed at surface 14. Source line region 18 may be formed by an implantation process performed on the material making up substrate 12, according to any implantation process known and typically used in the art. Alternatively, a solid state diffusion process can be used to form source line region 18.

A sense line region 20 having a first conductivity type, such as p-type, for example, is also provided in floating body region 24 and is exposed at surface 14. Sense line region 20 may be formed by an implantation process performed on the material making up substrate 12, according to any implantation process known and typically used in the art. Alternatively, a solid state diffusion process can be used to form sense line region 20. The sense line region 20 has the some conductivity type as the floating body region 24, with the sense line region 20 typically being more heavily doped than the floating body region 24.

A gate 60 is positioned in between the bit line region 16 and source line region 18 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and/or their nitrides.

Memory cell 250R1 can be subdivided to include a region comprising a floating body memory cell 250S described in Widjaja and Ranica, where the floating body region 24 is used to store the states of the memory cell described by Widjaja and Ranica, or the memory cells 50, 150 and 250 according to the present invention. This region 250S of the reference cell 250R1 is enclosed by dashed lines in FIGS. 29A and 29B. The sense line region 20 allows for an electrical connection to the floating body region 24. The sense line region 20 is shown connected to a sense line terminal 73 in FIGS. 29A and 29B.

Floating body memory cells, including memory cells 50, 150 and 250 according to the present invention, are typically read using a sense amplifier by comparing its property, for example, the current flowing from the BL terminal to the SL terminal of memory cells 50 or 150 to that of a reference cell. Different reference cell schemes have been disclosed, for example by averaging the cell currents of 128 logic-1 and 128 logic-0 dummy cells as described in Ohsawa-2. Rather than averaging cell currents of multiple dummy cells with logic-1 and logic-0, memory cell 250R1 can be used as a reference cell by applying an intermediate potential (between the logic-0 and logic-1 states) to the floating body region 24 through the sense region 20. For example, a positive voltage bias of +0.3V may be applied to the floating body region 24 (through the sense region 20). The resulting current flowing from the bit line region 16 to the source line region 18 of the cell 250R1 will be in between the cell current of memory cell 50 or 150 in logic-1 and logic-0 states, similar to what is obtained by averaging logic-1 and logic-0 dummy cells.

Figure 30A:
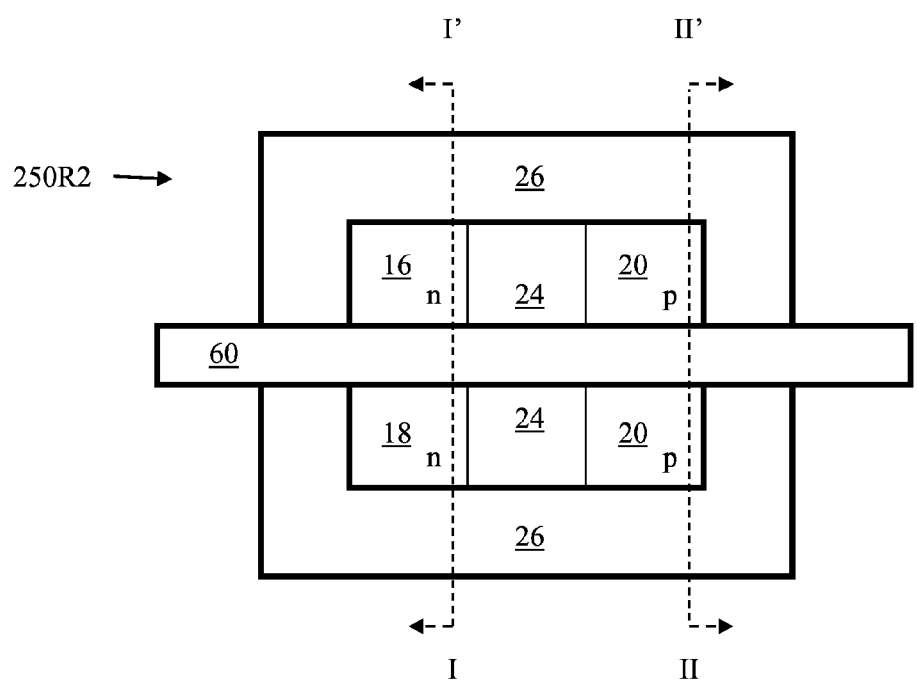
FIG. 30A is a schematic illustration of a top view of a memory cell according to another embodiment of the present invention.
Figure 30B:
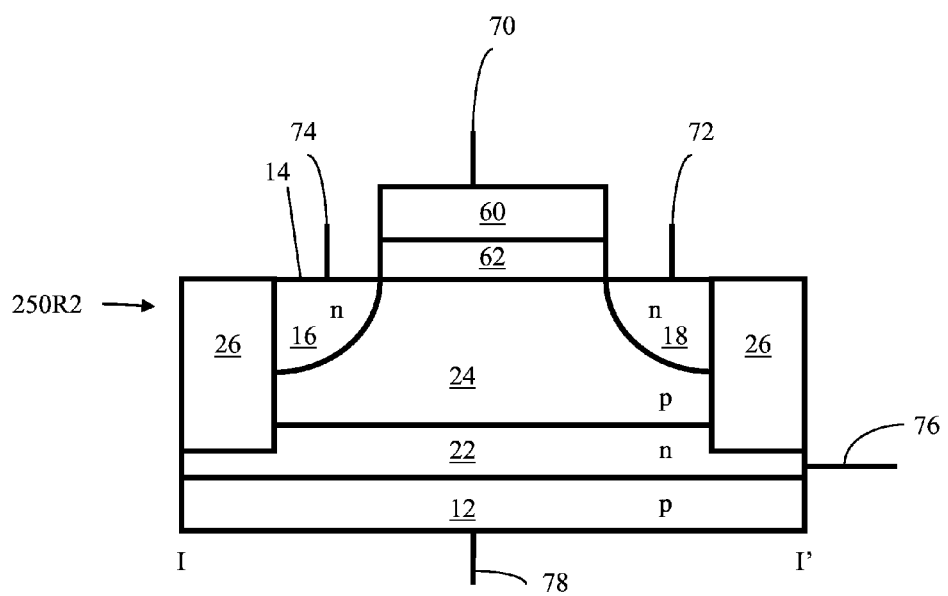
FIGS. 30B and 30C are schematic, cross-sectional illustrations of the cell of FIG. 30A taken along the I-I' and II-II' cut lines of FIG. 30A, respectively.
Figure 30C:
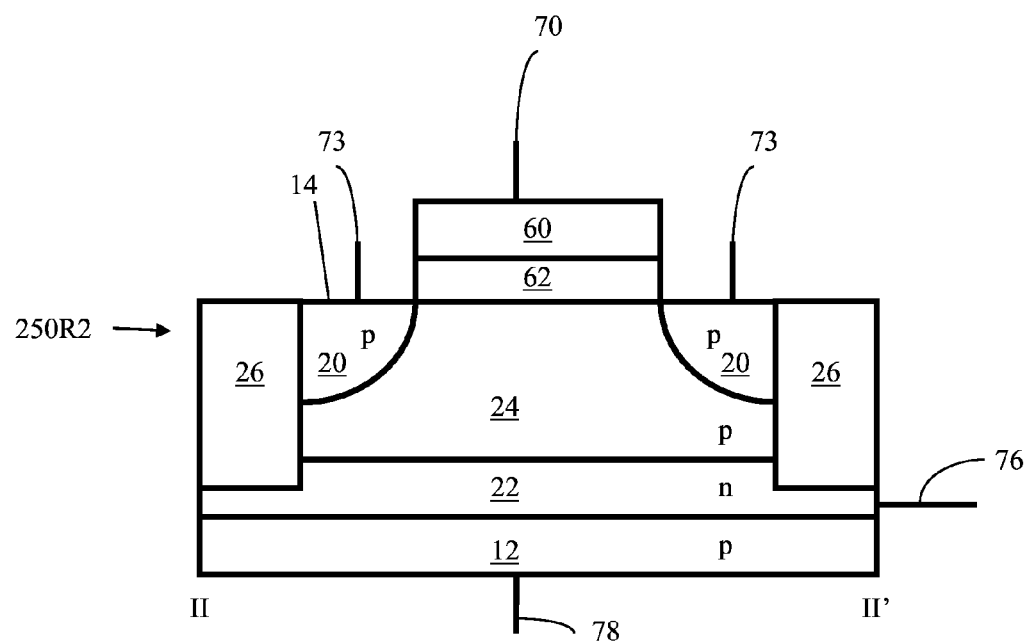

FIG. 30A illustrates a schematic, top view of a memory cell 250R2 according to another embodiment of the present invention. Memory cell 250R2 also provides an electrical connection to the floating body region 24 through the sense region 20. The sense region 20 in this embodiment is located adjacent to the region similar to the floating body memory cells, for example, as described by Widjaja and Ranica, or memory cells 50, 150 and 250 according to the present invention. FIGS. 30B and 30C are schematic, cross-section illustrations of cell 250R2 along the I-I' and II-II' cut lines of FIG. 30A, respectively.

Cells 250R1 and 250R2 can also be used as reference cells during the holding operation of floating body memory cells, including memory cells 50, 150 and 250 according to the present invention. Widjaja describes a holding or refresh method through the application of periodic pulses of positive voltage to the back bias terminal, for example, the BW terminal 76.

Figure 31:
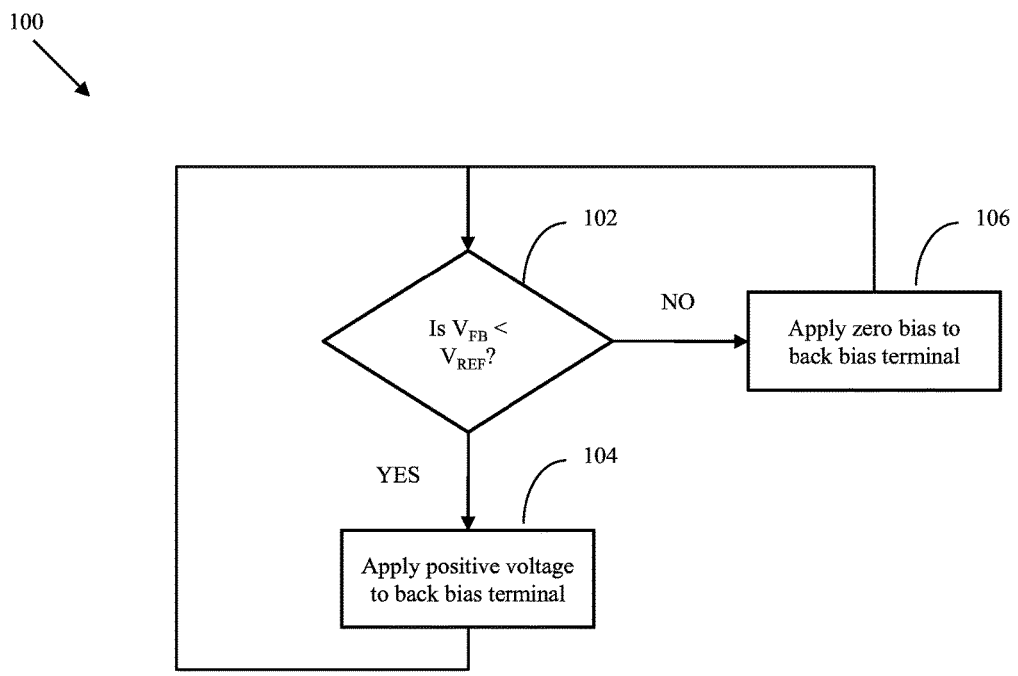
FIG. 31 illustrates an algorithm that can be employed to refresh the data stored in floating body memory cells in parallel, according to an embodiment of the present invention.

FIG. 31 illustrates an algorithm 100 that may be employed to refresh the data stored in floating body memory cells in parallel. At event 102, the state of a reference cell, for example cell 250R1 or 250R2, is sensed and compared with a reference value. If the state of the reference cell is below the reference value, then a positive bias is applied to the back bias terminal to refresh the state of floating memory cells (for example, memory cells 50, 150 or 250) at event 104. Since the refresh operation is performed in parallel to all cells connected to the buried well terminal, the refresh operation can be performed in a fast manner. The refresh operation is self-select, with floating body memory cells 50, 150 or 250 in logic-0 state will remain in logic-0 state, while floating body memory cells 50, 150 or 250 in logic-1 state will remain in logic-1 state. If the state of the reference cell is above the reference value, zero voltage is applied to the back bias terminal at event 106. Following event 104 or 196, the state of the reference cell is compared again with the reference value, returning to event 102 and continuing to loop.

Figure 32A:
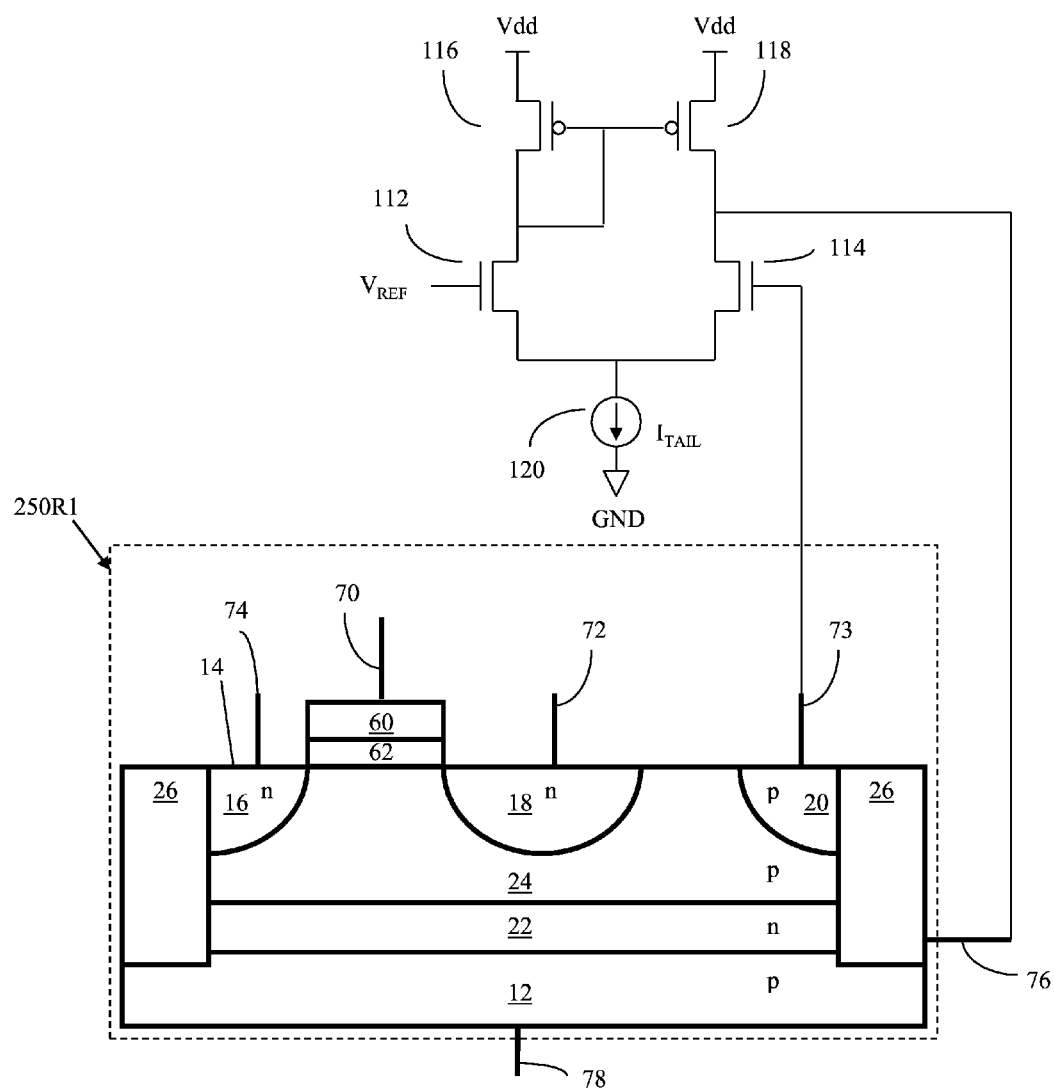
FIG. 32A shows an implementation of the algorithm of FIG. 31 using feedback loop based on a single-stage operational amplifier (op-amp) according to an embodiment of the present invention.

FIGS. 32A through 32E illustrate several implementations of the algorithm 100. FIG. 32A shows a feedback loop based on a single-stage operational amplifier (op-amp). The state of memory cell 250R1 is sensed through the sense region 20 connected to the sense terminal 73. If the potential of floating body region 24 of memory cell 250R1 $V_{FB}$ is higher than the reference value $V_{REF}$, then NMOS transistor 114 will conduct more current than NMOS transistor 112. Because only a fixed amount of current $I_{TAIL}$ (determined by current source 120) is available, the current flowing through transistor 114, $I_{114}$, increases, and the current flowing through transistor 112, $I_{112}$, decreases. $I_{112}$ is mirrored by the current mirror constructed by PMOS transistors 116 and 118, and acts to increase the back bias applied to the BW terminal 76, $V_{DNWL}$, while $I_{114}$ acts to decrease $V_{DNWL}$. Consequently, if $V_{FB}$ is higher than $V_{REF}$, this will decrease $V_{DNWL}$, and conversely, if $V_{FB}$ is lower than $V_{REF}$, $V_{DNWL}$ will increase.

Figure 32B:
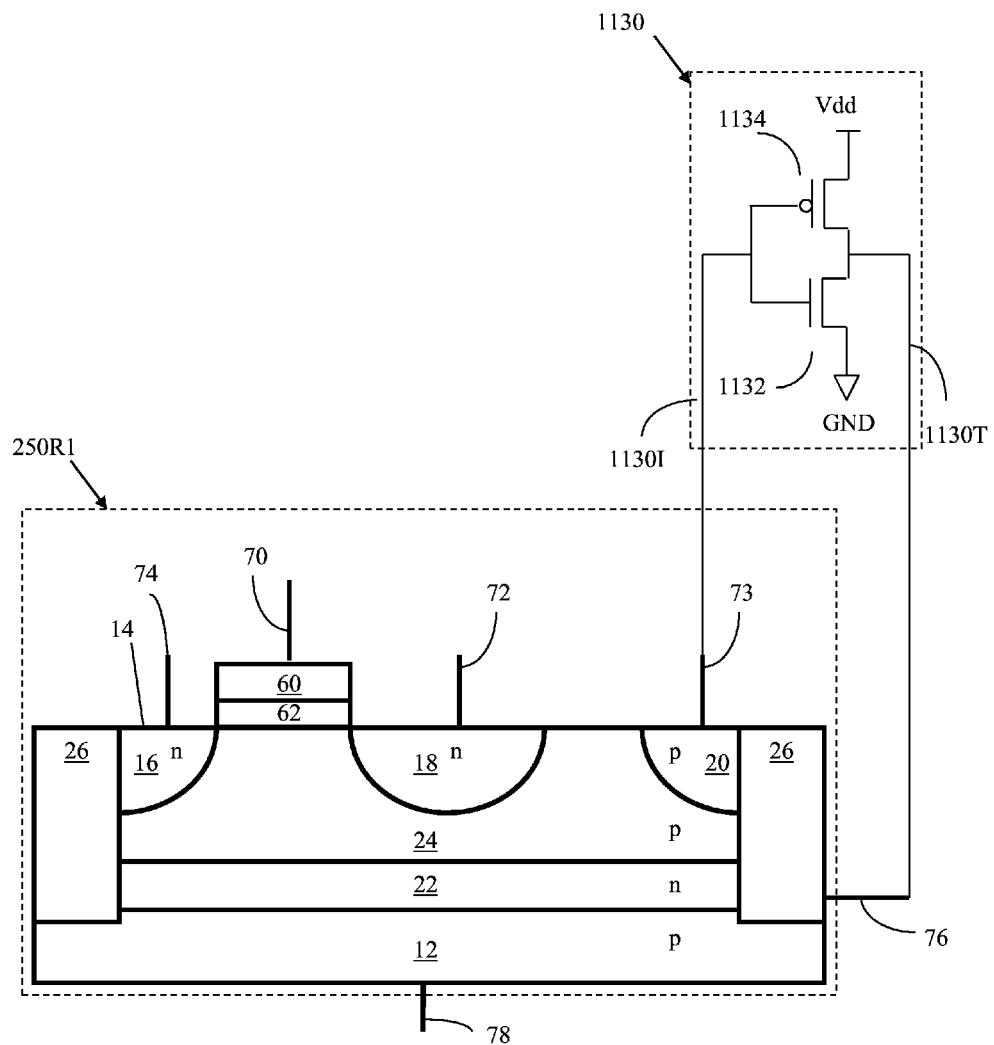
FIG. 32B shows another implementation of the algorithm of FIG. 31 through a CMOS inverter, comprising an NMOS transistor and a PMOS transistor according to an embodiment of the present invention.
Figure 32C:
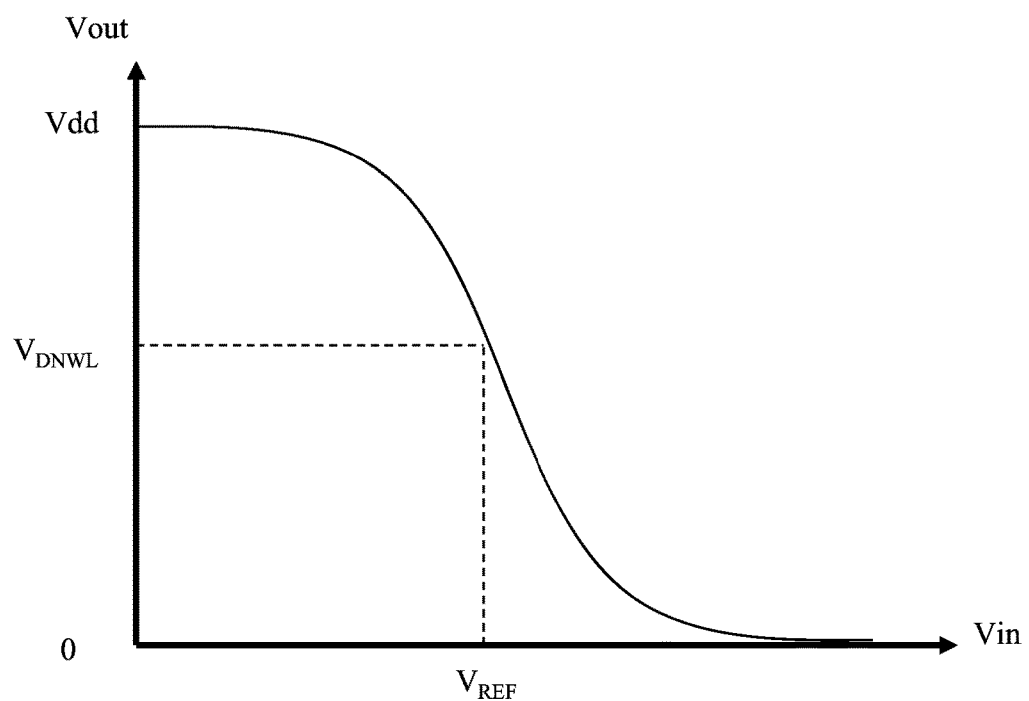
FIG. 32C is a graph illustrating the input voltage-output voltage relationship for the inverter of FIG. 32B.

FIG. 32B shows another implementation of the algorithm 100 through a CMOS inverter 1130, comprising NMOS transistor 1132 and PMOS transistor 1134. The input terminal 11301 of the inverter 1130 is connected to the sense region 20 of the cell 250R1, while the output voltage of the inverter is connected by output terminal 1130T to the BW terminal 76, $V_{DNWL}$. FIG. 32C illustrates the input voltage-output voltage relationship for the inverter 1130. If the floating body potential $V_{FB}$ is low, the output voltage $V_{DNWL}$ will increase and subsequently maintain the floating body potential $V_{FB}$. If the floating body potential $V_{FB}$ is high, the output voltage $V_{DNWL}$ will decrease and subsequently reduce the floating body potential $V_{FB}$.

Figure 32D:
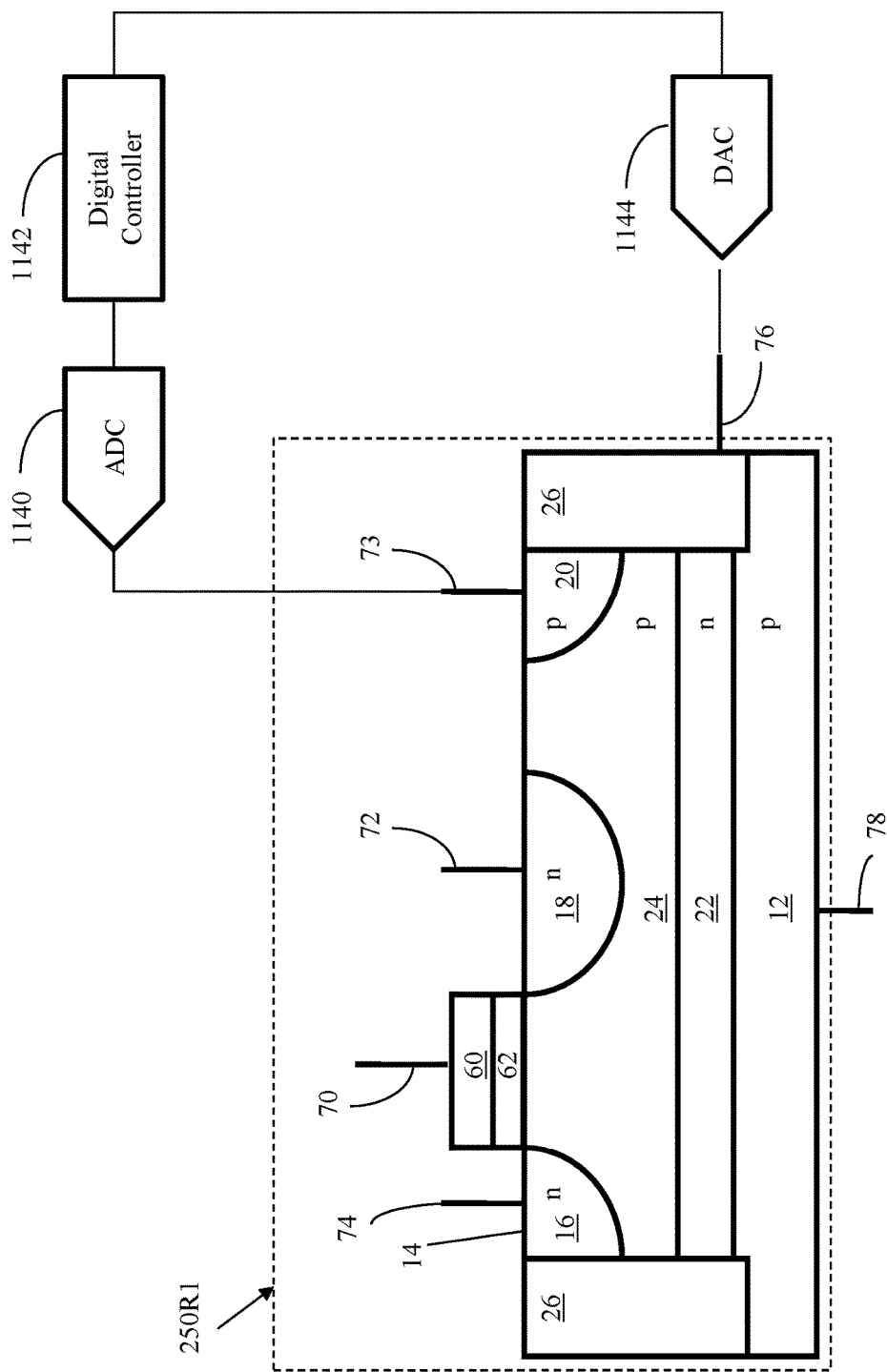
FIG. 32D schematically illustrates another implementation of the algorithm of FIG. 31 with a mixed-signal feedback loop according to an embodiment of the present invention.

FIG. 32D illustrates another implementation of the algorithm 100 with a mixed-signal feedback loop. The potential of the floating body region 24 $V_{FB}$ (connected to the sense region 20) is digitized by analog-to-digital converter (ADC) 1140 and sent into a digital controller block 1142. The digital controller 1142 then compares the potential of the floating body region 24 with a reference value $V_{REF}$ and drives the buried well terminal 76 $V_{DNWL}$ through a digital-to-analog converter (DAC) 1144.

Figure 32E:
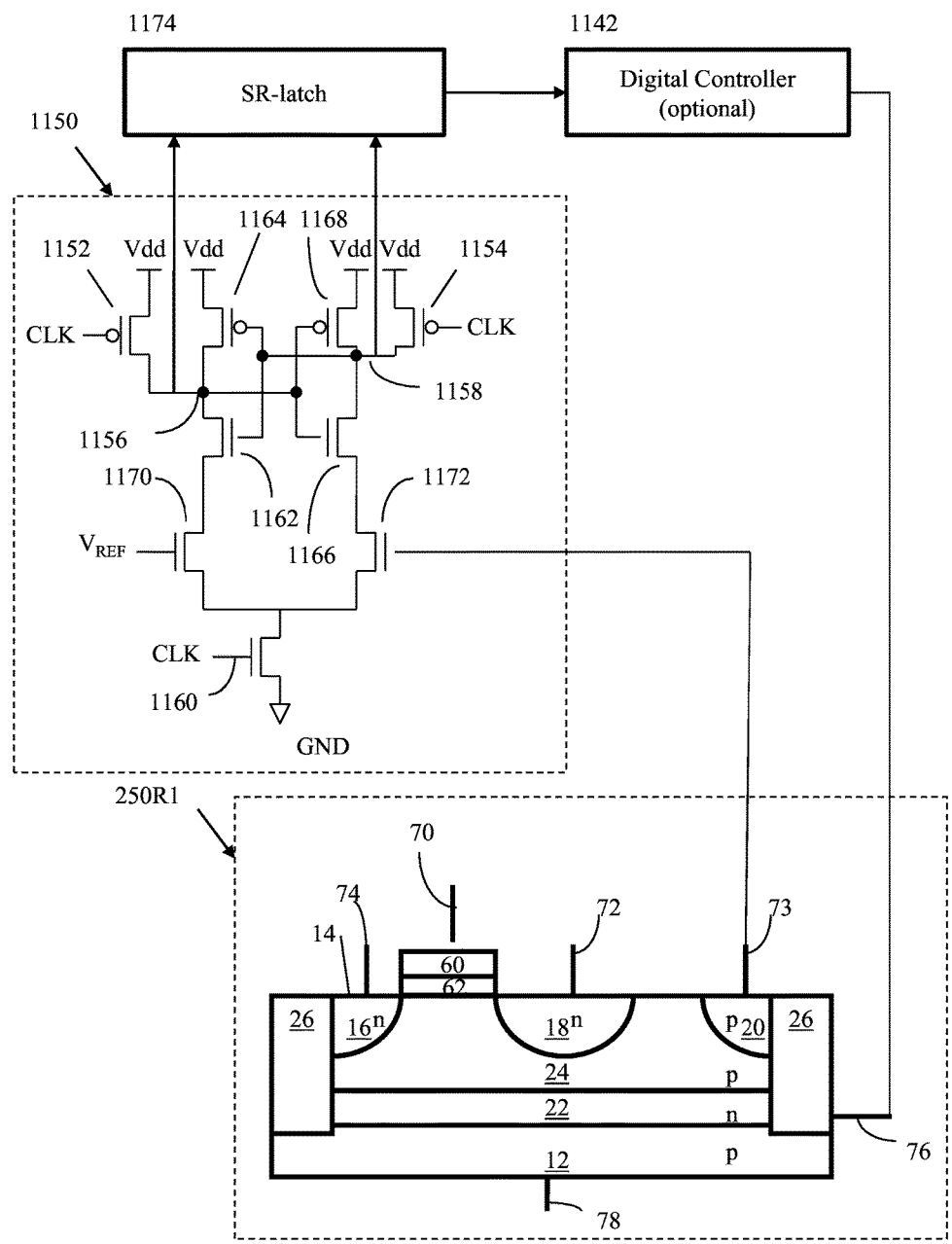
FIG. 32E schematically illustrates operation of a mixed-signal feedback loop according to an embodiment of the present invention.

FIG. 32E illustrates a schematic implementation of the mixed-signal feedback loop shown in FIG. 32D. A 1-bit comparator block 1150 is used to quantize the potential of the floating body region 24. The 1-bit comparator block 1150 is typically referred to in the art as a StrongArm comparator, for example described in "A 160 MHz, 32*b*, 0.5 W CMOS RISC micro-processor", Montanaro et al., IEEE J.

Solid-State Circuits, vol. 31, no. 11, pp. 1703-1714, November 1996 (hereafter referred to as "Montanaro"). Both the digital controller block 1142 and the DAC block 1144 may not be necessary provided the $V_{dd}$ and the GND signals of the StrongArm comparator block 1150 is used as the input signal to the buried well terminal 76, $V_{DNWL}$.

An example of the operation of the mixed-signal feedback loop illustrated in FIG. 32E is provided. When the clock signal CLK is low, the PMOS transistors 1152 and 1154 are switched on and pre-charge nodes 1156 and 1158 to $V_{dd}$. When the clock signal CLK switches to high, PMOS transistors 1152 and 1154 are now turned off, while NMOS transistor 1160 is on and supplies current to two cross-coupled inverters (formed by NMOS transistor 1162 and PMOS transistor 1164, and NMOS transistor 1166 and PMOS transistor 1168, respectively) through pseudo-differential pair transistors 1170 and 1172.

If the potential of the floating body region 24 $V_{FB}$ is higher than the reference value $V_{REF}$, then more current will flow through transistor 1172 than through transistor 1170 and therefore the potential of the node 1156 will decrease faster than the potential of the node 1158. Since node 1156 is now at a lower potential than node 1158, NMOS device 1162 conducts less current than NMOS device 1166, and PMOS device 1164 conducts more current than PMOS device 1168, reinforcing the growth of differential voltage between nodes 1156 and 1158. Eventually, node 1158 reaches $V_{dd}$ while node 1156 reaches ground GND.

If the potential of the floating body region 24 $V_{FB}$ is lower than the reference value $V_{REF}$, then more current flows through transistor 1170 than through transistor 1172. Eventually, node 1156 will reach $V_{dd}$ while node 1158 reaches ground GND.

Therefore, shortly after CLK signal transitions to high, the voltages at nodes 1156 and 1158 will result in a digital signal ($V_{dd}$ or GND), indicating whether potential of the floating body region 24 $V_{FB}$ is greater than or less than the reference voltage $V_{REF}$. When the CLK signal transitions to low, both nodes 1156 and 1158 are pre-charged to $V_{dd}$ again. To preserve the output state of the comparator during this time, an SR-latch 1174, for example, as described in "Foundations of Digital Logic Design", Langholz, G., pp. 339-344, 1998 (which is hereby incorporated herein, in its entirety, by reference thereto, and is referred to hereafter as "Langholz") may be used.

Figure 32F:
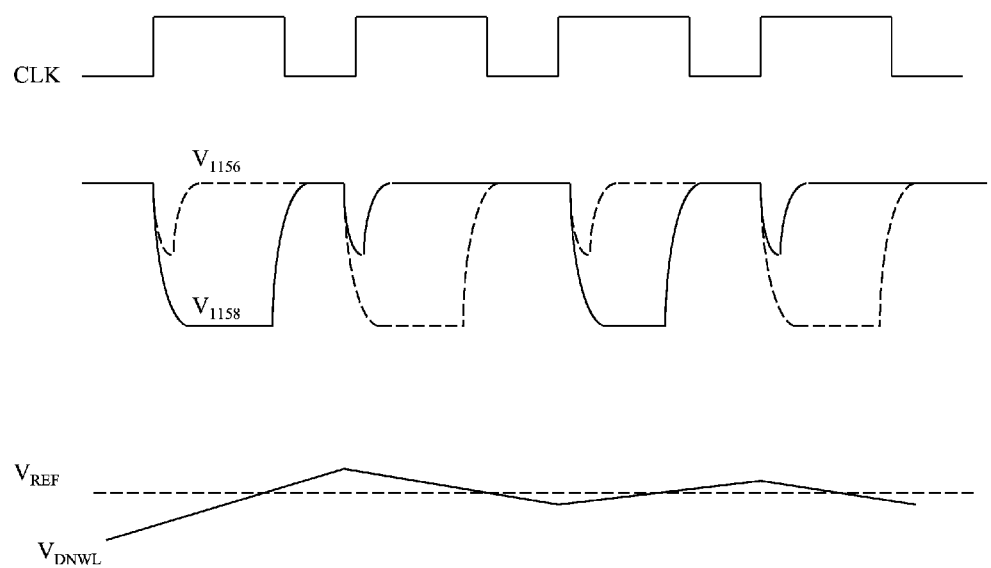
FIG. 32F illustrates simplified waveforms associated with the circuit operation described in FIG. 32E.

Simplified waveforms associated with the circuit operation described in FIG. 32E are shown in FIG. 32F. As can be seen from the waveforms, even without a digital controller block 1142 and DAC block 1144, the circuit may operate as a simple bang-bang controller: if the compactor detects that the potential of the floating body region 24 $V_{FB}$ is less than the reference potential $V_{REF}$, then it drives $V_{DNWL}$ to $V_{dd}$, which subsequently increases the potential of the floating body region 24 $V_{FB}$. On the next CLK cycle, the comparison is performed again, and if, as shown in FIG. 32F, the $V_{FB}$ has risen above $V_{REF}$, $V_{DNWL}$ remains at GND to reduce $V_{FB}$.

Such method of holding the state of a memory cell may result in lower power consumption. This is, for example, compared to dynamic random access memory (DRAM) refresh operation, which requires pre-charging the corresponding bit lines, followed by essentially read-then-write operation of the refreshed DRAM memory cell.

Reference voltage $V_{REF}$ may be generated in many different ways, for example using a band gap reference, a resistor string, a digital-to-analog converter, etc. Similarly alternate voltage generators of types known in the art may be used.

At high temperature, the power consumed during the holding operation increases due to the higher p-n junction leakage (e.g. formed between the floating body region 24 and the bit line region 16) and also due to the reduced impact ionization. The algorithm 100 shown in FIG. 31 may be employed to reduce the holding operation power consumption at high temperature. To maintain the states of the memory cells 50, 150, and 250, the reference voltage $V_{REF}$ needs to be higher than the $V_{TS}$ (see FIGS. 5A and 5B). Since $V_{TS}$ varies inversely with temperature, i.e. lower $V_{TS}$ is observed at high temperature, the reference voltage $V_{REF}$ may also be reduced. A band gap reference circuit may be constructed to yield a reference voltage $V_{REF}$ that varies inversely with temperature.

Figure 33:
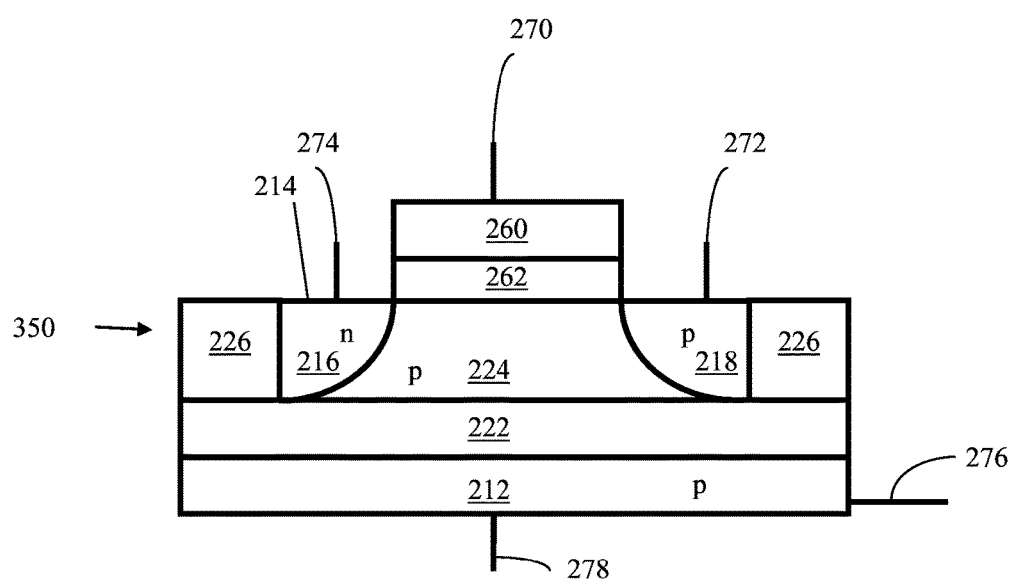
FIG. 33 is a schematic, cross-sectional illustration of memory cell fabricated on a silicon-on-insulator (SOI) substrate according to an embodiment of the present invention.

FIG. 33 is a schematic, cross-sectional illustration of memory cell 350 fabricated on a silicon-on-insulator (SOI) substrate. Memory cell 350 includes a SOI substrate 212 of a first conductivity type such as p-type, for example. Substrate 212 is typically made of silicon, but may additionally or alternatively comprise, for example, germanium, silicon germanium, gallium arsenide, carbon nanotubes, or other semiconductor materials. A buried insulator layer 222, such as buried oxide (BOX) layer, is provided above the substrate 212. The SOI substrate can be produced either by an oxygen ion implantation process or through a wafer bonding process. An overview of the SOI substrate fabrication is described for example in "Frontiers of silicon-on-insulator", Celler, G. K. and Cristoloveanu, S., J. App. Phys, vol. 93, no. 9, pp. 4955-4978, 2003 ("Celler and Cristoloveanu"), which is hereby incorporated herein, in its entirety, by reference thereto.

A floating body region 224 of the first conductivity type, such as p-type, for example, is bounded on top by bit line region 216, source line region 218, and insulating layer 262; on the sides by insulating layers 226; and on the bottom by buried insulator layer 222. Floating body 224 may be the portion of the original substrate 212 above buried insulator layer 222. Floating body 224 may have the same doping as substrate 212 in some embodiments or a different doping, if desired.

Insulating layers 226 (which may be, for example, shallow trench isolation (STI)), may be made of silicon oxide, for example, though other insulating materials may be used. Insulating layers 226 insulate cell 350 from neighboring cells 350 when multiple cells 350 are joined in an array to make a memory device.

A bit line region 216 having a second conductivity type, such as n-type, for example, is provided in floating body region 224 and is exposed at surface 14. Bit line region 216 may be formed by an implantation process formed on the material making up substrate 212, according to any implantation process known and typically used in the art. Alternatively, a solid state diffusion process could be used to form bit line region 216.

A source line region 218 having a first conductivity type, such as p-type, for example, is also provided in floating body region 224 and is exposed at surface 14. Source line region 218 may be formed by an implantation process formed on the material making up substrate 212, according to any implantation process known and typically used in the art. Alternatively, a solid state diffusion process could be used to form source line region 218. The source line region 218 has the same conductivity type as the floating body region 224, with the source line region 218 typically being more heavily doped than the floating body region 224.

A gate 260 is positioned in between the bit line region 216 and source line region 218 and above the floating body region 224. The gate 260 is insulated from floating body region 224 by insulating layer 262. Insulating layer 262 may be made of silicon oxide and/or other dielectric materials, including high-K dielectric materials, such as, but not limited to, tantalum peroxide, titanium oxide, zirconium oxide, hafnium oxide, and/or aluminum oxide. The gate 260 may be made of, for example, polysilicon material or metal gate electrode, such as tungsten, tantalum, titanium and/or their nitrides.

Memory cell 350 is asymmetric in that the conductivity type between the bit line region 216 and the source line region 218 is different. The conductivity type of the source line region 218 is the same as that of the floating body 224, and as a result, the source line region 218 may be used to sense the potential of the floating body 224.

Cell 350 includes several terminals: word line (WL) terminal 270 electrically connected to gate 260, bit line (BL) terminal 274 electrically connected to bit line region 216, source line (SL) terminal 272 electrically connected to source line region 218, and substrate terminal 278 electrically connected to substrate 212. The SL terminal 272 may not be shared across different cells 350 as it will electrically short floating body 224 region in multiple cells 350, hence precluding floating body 224 to be used as charge storage region. As a result, arrays comprising memory cells 350 are typically limited to one or two rows only.

The operation of memory cell 350 is similar to that of memory cell 250, except that a holding operation employing a back bias terminal does not apply due to the absence of back bias terminal on memory cell 350. As a result, periodic refresh operations may need to be performed on memory cell 350 to maintain the state of the floating body 224. The refresh operation on memory cell 350 may be performed by first reading the state of the floating body 224 by directly sensing the floating body 224 potential through the source line region 218. If the memory cell 350 is in logic-1 state, then a write logic-1 operation is performed on the corresponding cell 350. If the memory cell 350 is in logic-0 state, then a write logic-0 operation can be performed on the corresponding cell 350. Alternatively, if the memory cell 350 is in logic-0 state, no further write operation is needed on memory cell 350.

Figure 34A:
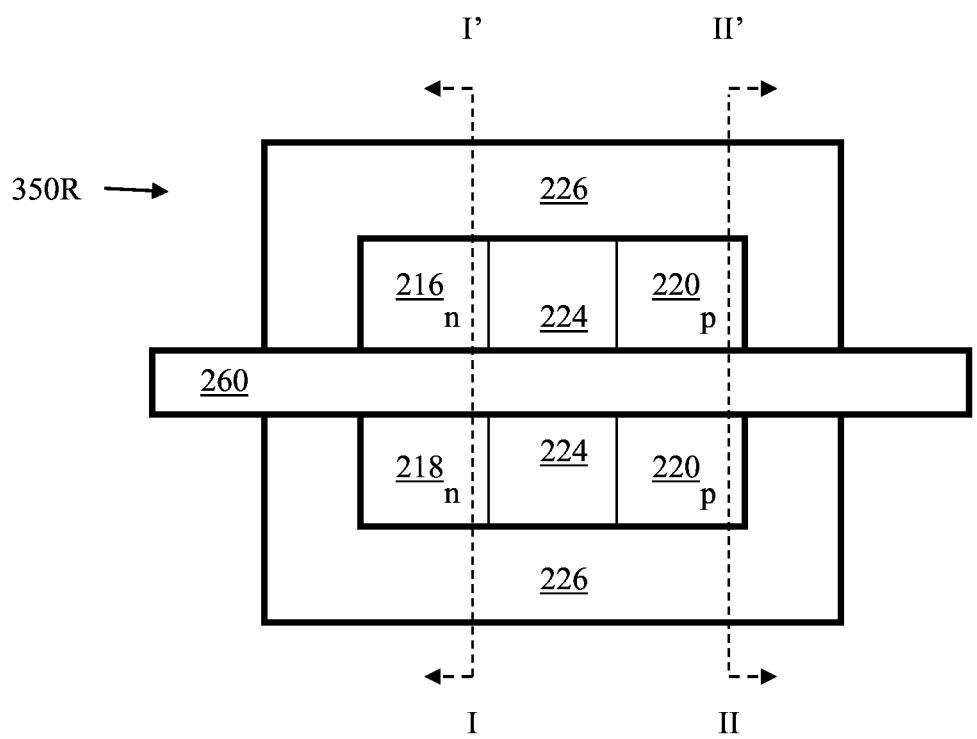
FIG. 34A is a schematic illustration of a top view of a memory cell, which provides an electrical connection to a floating body region through a sense region, according to an embodiment of the present invention.
Figure 34B:
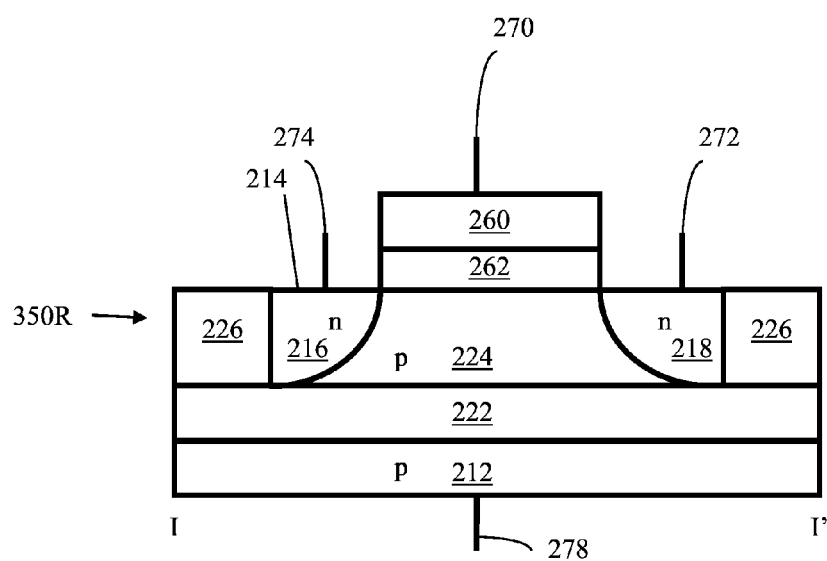
FIGS. 34B and 34C show cross-sectional views of the memory cell of FIG. 34A along the I-I' and II-II' cut lines, respectively.
Figure 34C:
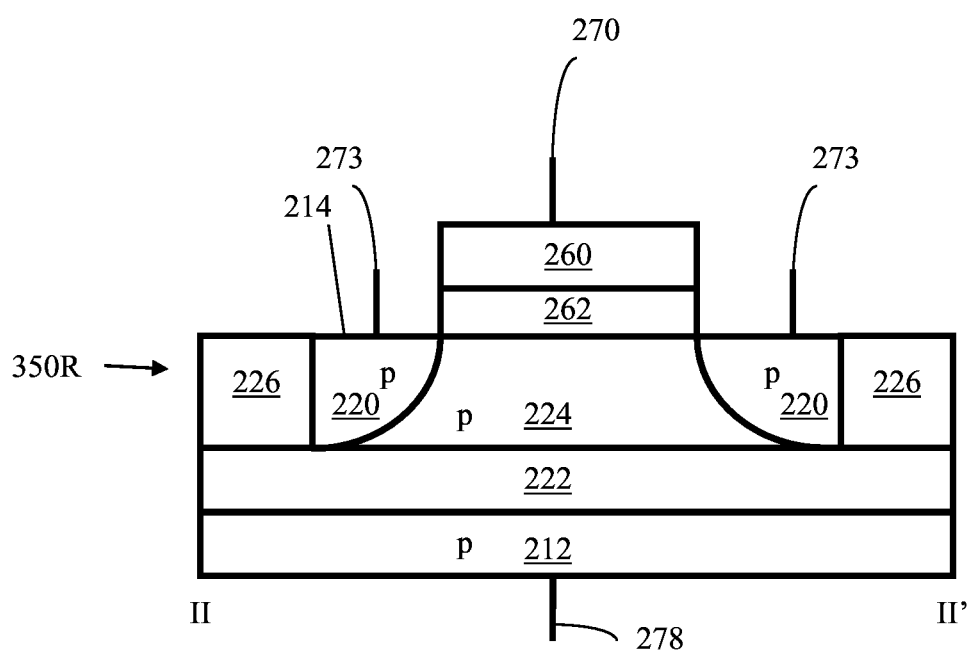

A reference cell 350R, which for example, can be used during a read operation, may also be constructed on an SOI substrate. FIG. 34A illustrates a schematic, top view of memory cell 350R, which also provides an electrical connection to the floating body region 224 through the sense region 220. The sense region 220 is now located adjacent to the region similar to a floating body memory cell constructed in an SOI substrate described for example by Okhonin. However, the sense region 220 is now electrically connected to the floating body region 224. FIGS. 34B and 34C show the cross-sectional views of memory cell 350R along the I-I' and II-II' cut lines, respectively.

Figure 35A:
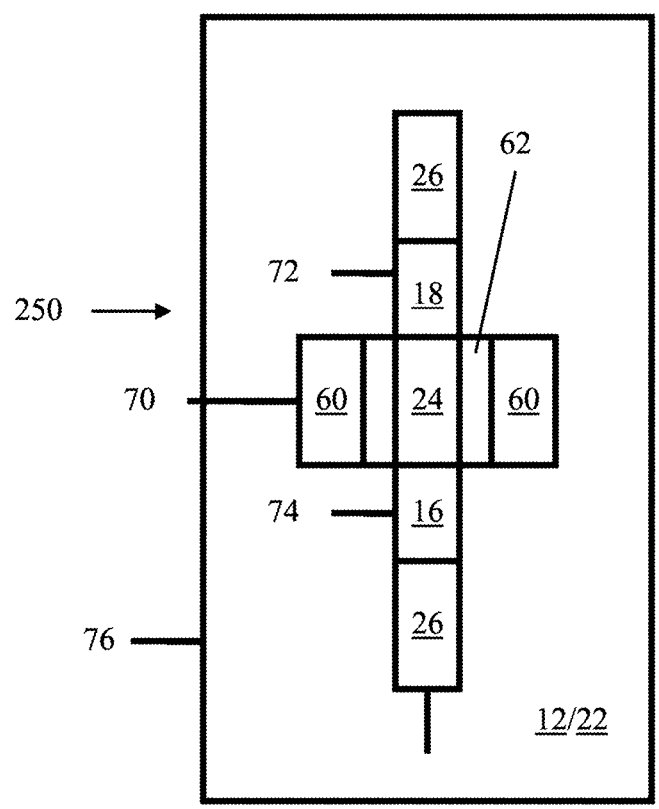
FIGS. 35A through 35C show alternative embodiments, according to the present invention, of a memory cell comprising a three-dimensional memory structure.
Figure 35B:
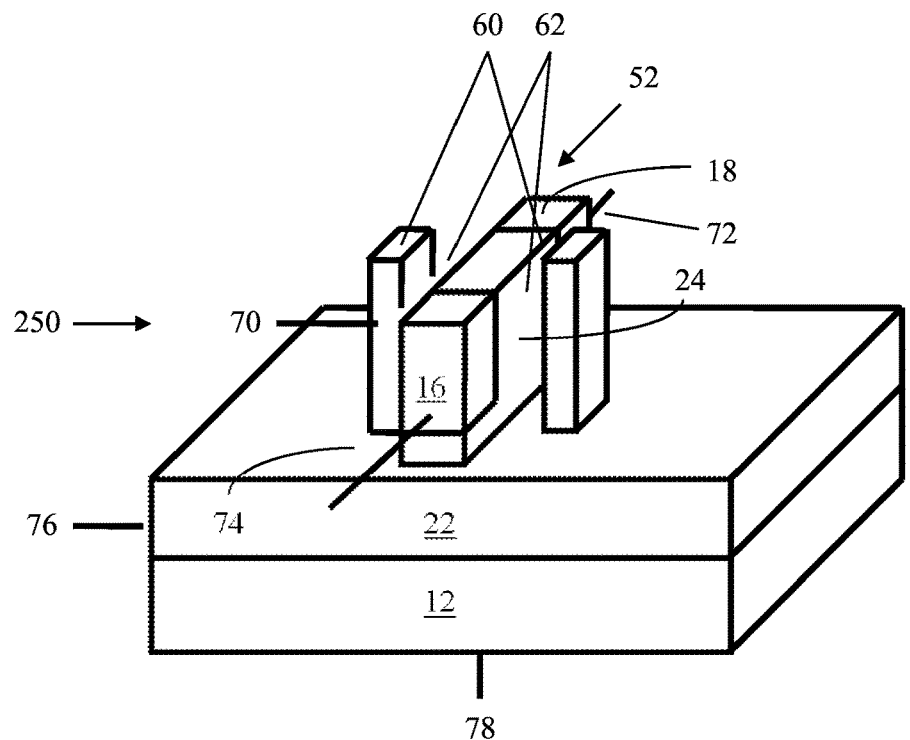
Figure 35C:
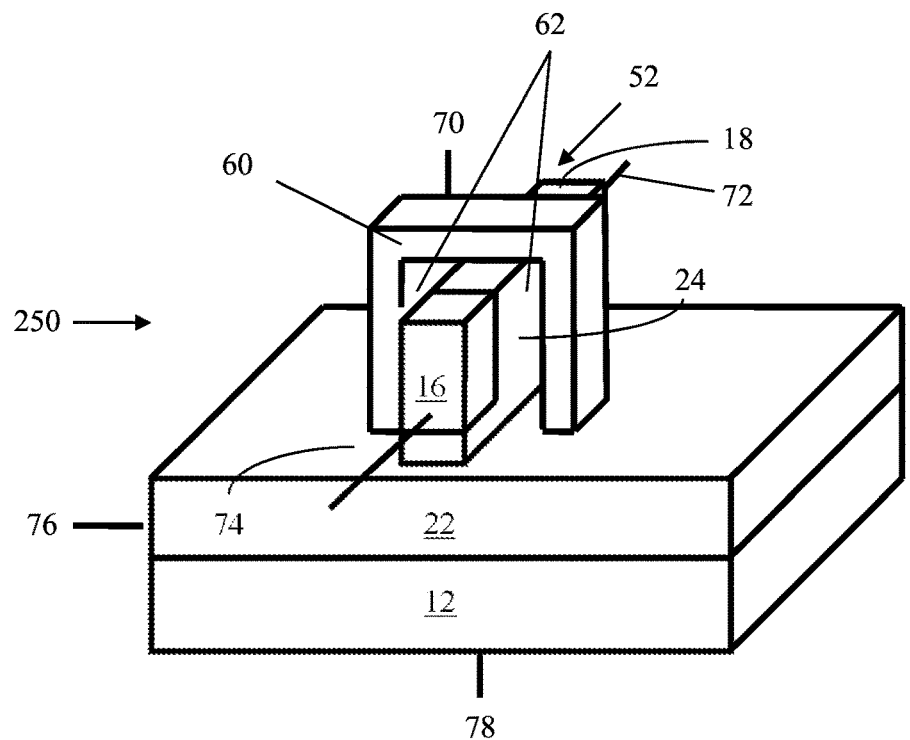

FIGS. 35A through 35C show alternative embodiments of memory cell 250, comprising a three-dimensional memory structure. In this embodiment, memory cell 250 has a fin structure 52 (see FIGS. 35B-35C) extending substantially perpendicular to, and above the top surface of the substrate 12. Fin structure 52 is conductive and may be built on buried well layer 22 or buried insulator 22. If fin structure 52 is built on buried well layer 22, it may be formed by an ion implantation process on the material of substrate 12 or grown epitaxially. Buried well layer or buried insulator layer 22 insulates the floating substrate region 24, which has a first conductivity type (such as p-type conductivity type), from the bulk substrate 12 having a first conductivity type (such as p-type conductivity type).

Fin structure 52 includes bit line region 16 of a second conductivity type (such as n-type conductivity type) and source line region 18 of a first conductivity type (such as p-type conductivity type). Bit line region 16 may be formed by an implantation process formed on the material making up substrate 12, according to any implantation process known and typically used in the art. Alternatively, a solid state diffusion process could be used to form bit line region 16.

A source line region 18 having a first conductivity type, such as p-type, for example, is also provided in floating body region 24. Source line region 18 may be formed by an implantation process formed on the material making up substrate 12, according to any implantation process known and typically used in the art. Alternatively, a solid state diffusion process could be used to form source line region 18. The source line region 18 has the same conductivity type as the floating body region 24, with the source line region 18 typically being more heavily doped than the floating body region 24.

Cell 250 further includes gates 60 on two opposite sides of the floating substrate region 24 as shown in FIG. 35B. Alternatively, gate 60 can enclose three sides of the floating substrate region 24 as shown in FIG. 35C. Gates 60 are insulated from floating body 24 by insulating layers 62. Gates 60 are positioned between the first and second regions 16, 18, adjacent to the floating body 24.

Memory cell 250 is asymmetric in that the conductivity type between the bit line region 16 and the source line region 18 is different. The conductivity type of the source line region 18 is the same as that of the floating body 24, and as a result, the source line region 18 may be used to sense the potential of the floating body 24.

Cell 250 includes several terminals: word line (WL) terminal 70 electrically connected to gate 60, bit line (BL) terminal 74 electrically connected to bit line region 16, source line (SL) terminal 72 electrically connected to source line region 18, buried well (BW) terminal 76 electrically connected to buried well layer 22, and substrate terminal 78 electrically connected to substrate 12. The SL terminal 72 may not be shared across different cells 250 as it will electrically short floating body 24 region in multiple cells 250, hence precluding floating body 24 to be used as charge storage region. As a result, arrays comprising of memory cell 250 are typically limited to one or two rows only.

Figure 36A:
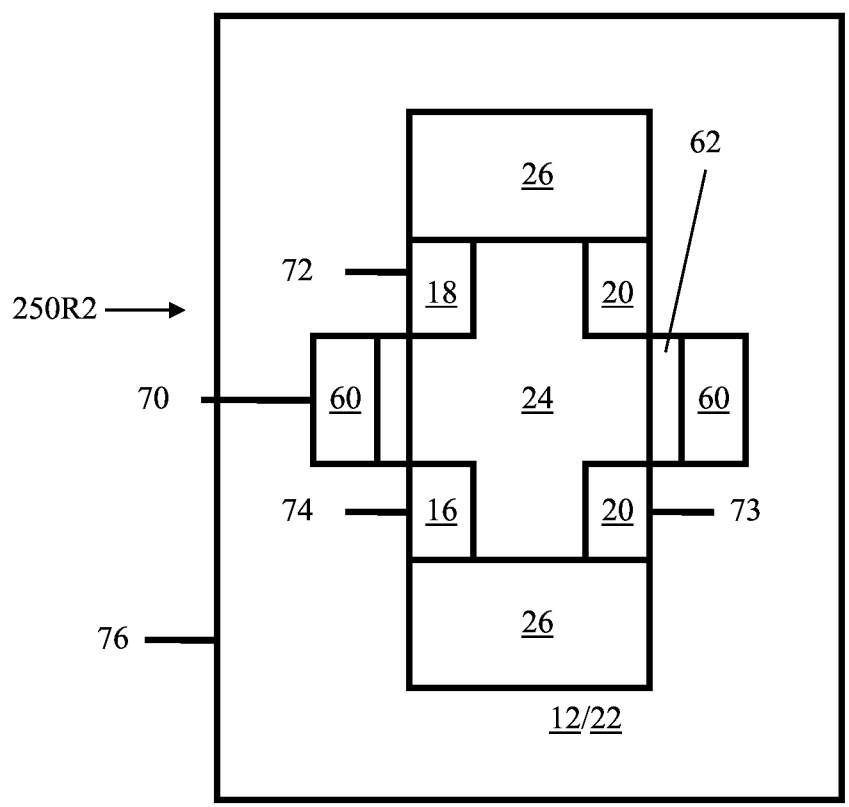
FIG. 36A through 36C show alternative embodiments, according to the present invention, of a memory cell having a fin structure.
Figure 36B:
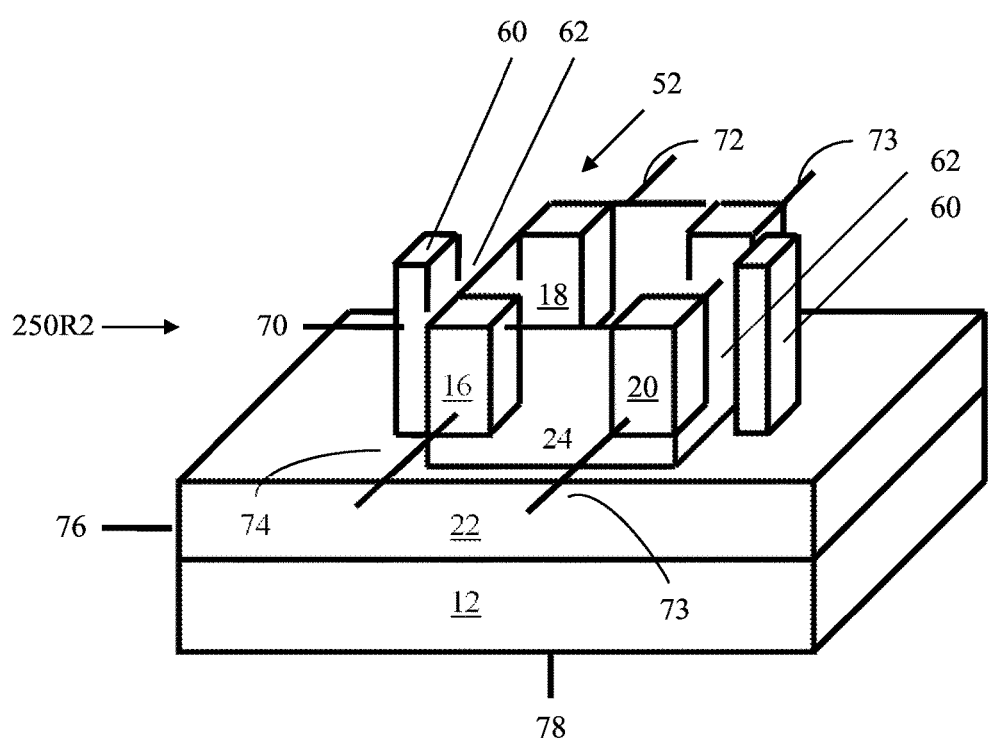
Figure 36C:
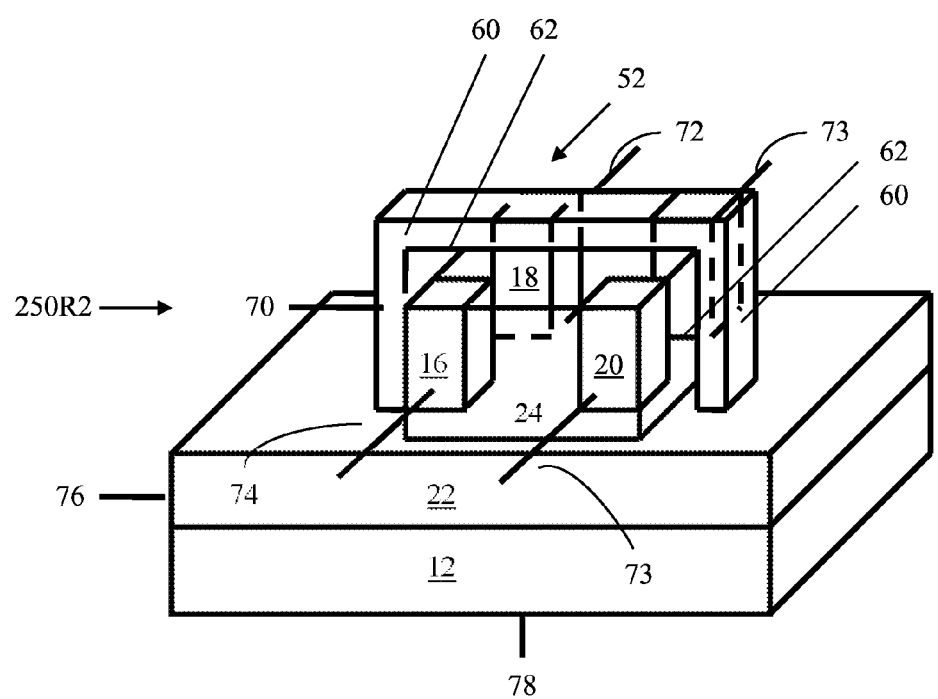

Similarly, three-dimensional embodiments of memory cells 50 and 150 and reference cells 250R1 and 250R2 may be constructed in a similar manner FIGS. 36A through 36C illustrate cell 250R2 having a fin structure 52 (see FIGS. 36B-36C) extending substantially perpendicular to, and above the top surface of the substrate 12. Fin structure 52 is conductive and may be built on buried well layer 22 or buried insulator 22. If fin structure 52 is built on buried well layer 22, it may be formed by an ion implantation process on the material of substrate 12 or grown epitaxially. Buried well layer or buried insulator layer 22 insulates the floating substrate region 24, which has a first conductivity type (such as p-type conductivity type), from the bulk substrate 12 having a first conductivity type (such as p-type conductivity type).

Fin structure 52 includes bit line region 16 of a second conductivity type (such as n-type conductivity type) and source line region 18 of a second conductivity type (such as n-type conductivity type). Bit line region 16 and source line region 18 may be formed by an implantation process formed on the material making up substrate 12, according to any implantation process known and typically used in the art. Alternatively, a solid state diffusion process could be used to form bit line region 16 and source line region 18.

Fin structure 52 also includes sense region 20 of a first conductivity type (such as p-type conductivity type). Sense region 20 may be formed by an implantation process formed on the material making up substrate 12, according to any implantation process known and typically used in the art. Alternatively, a solid state diffusion process could be used to form sense region 20. The sense region 20 is now electrically connected to the floating body region.

Another embodiment of a method to increase the read signal of floating body memory cells, such as memory cells 50, 150, and 250 according to the present invention, is to increase the amount of charge stored in the floating body region 24. To maintain or increase the amount of charge stored in the floating body 24, it may be necessary to increase the depth of the floating body 24. This may be accomplished by a deeper buried well region 22 as well as deeper insulator region 26. The depth of the insulator region 26 may be constrained by the etch process needed to form the trench, which later on forms the insulator region 26. A method of processing floating body memory cells (for example memory cells 50, 150, and 250 along with floating body memory cells described by Widjaja, Ranica, and Okhonin) with increased floating body 24 depths is described with reference to FIGS. 37A through 37G using memory cell 250 as an example. FIGS. 37A through 37G show schematic, cross-sectional views of memory cells 250 at various stages in the manufacturing process.

Figure 37A:
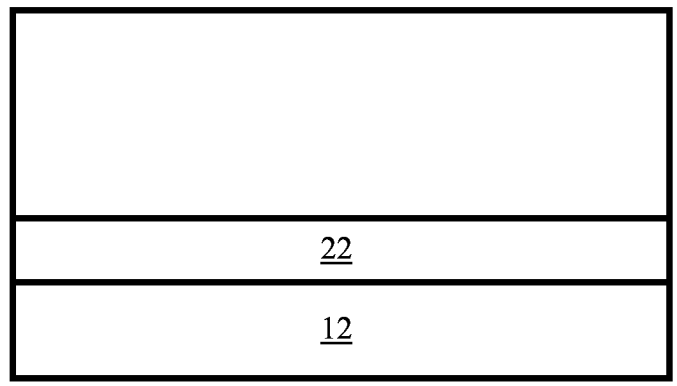
FIGS. 37A through 37G show schematic, cross-sectional views of memory cells at various stages in a manufacturing process according to an embodiment of the present invention.

FIG. 37A illustrates the early steps of the process. An ion implantation is performed to form the buried well region 22 in the substrate 12 of the memory cell.

Figure 37B:
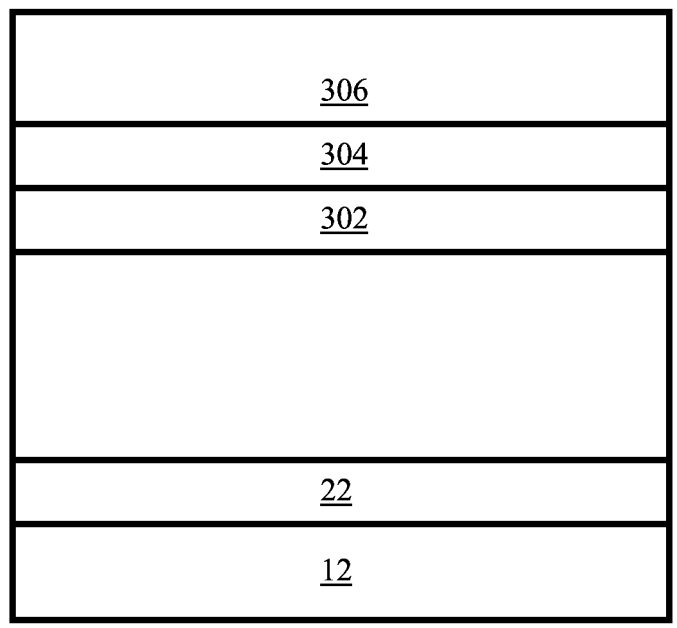

Referring to FIG. 37B, in an exemplary 130 nanometer (nm) process, a thin silicon oxide layer 302 with a thickness of about 100 A may be grown on the surface of substrate 12. This may be followed by a deposition of about 200 A of polysilicon layer 304. This in turn may be followed by deposition of about 1200 A silicon nitride layer 306. Other process geometries like, for example, 250 nm, 180 nm, 90 nm, 65 nm, etc., may be used. Similarly, other numbers of, thicknesses of, and combinations of protective layers 302, 304 and 306 may be used in respect to the change in process geometries and/or other factors.

Figure 37C:
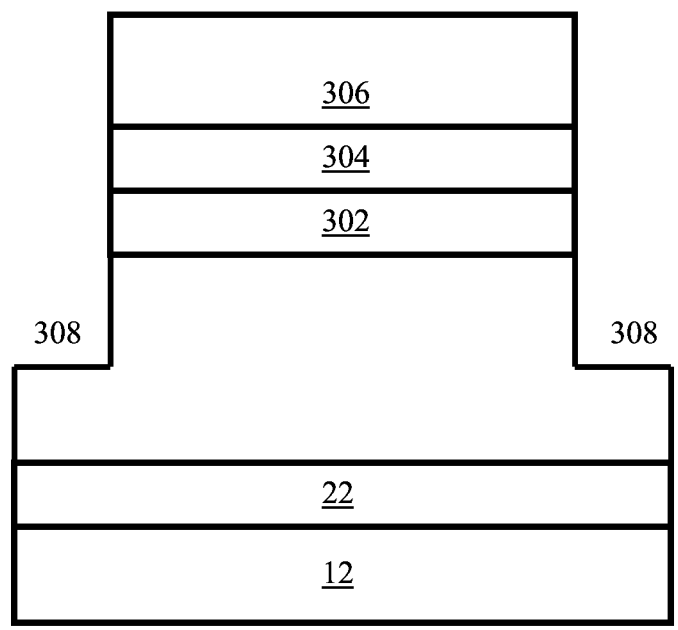

FIG. 37C illustrates a pattern opening the areas to become trench 308 is formed using a lithography process. Then the silicon oxide 302, polysilicon 304, silicon nitride 306 layers may be subsequently patterned using the lithography process and then may be etched, followed by a silicon etch process, creating trench 308. In an exemplary 130 nm process, the trench 208 depth may be about 1000 A. Other process geometries including, but not limited to 250 nm, 180 nm, 90 nm, 65 nm, etc., may be used. Similarly, other trench depths may be used.

Figure 37D:
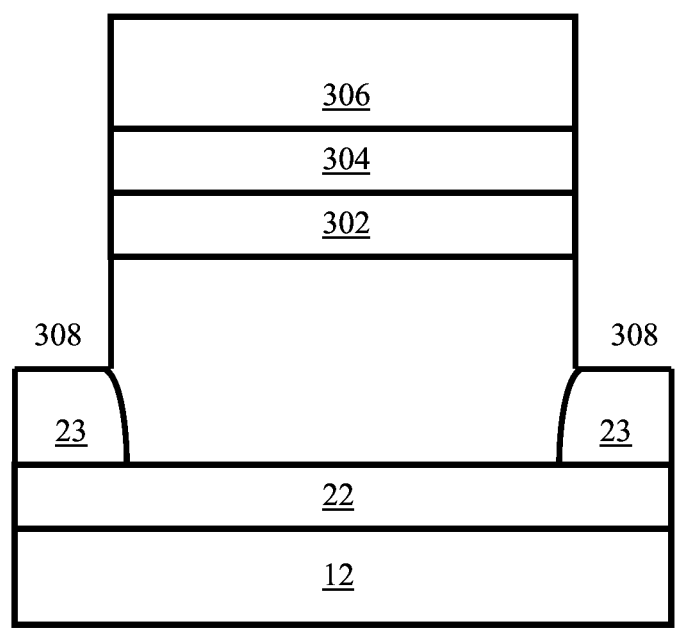

As shown in FIG. 37D, subsequent to the formation of trench 308, an ion implantation is performed to form a region 23 of a second conductivity type (e.g. n-type conductivity). Multiple ion implantations with different energies may be performed to extend the depth of the region 23.

Figure 37E:
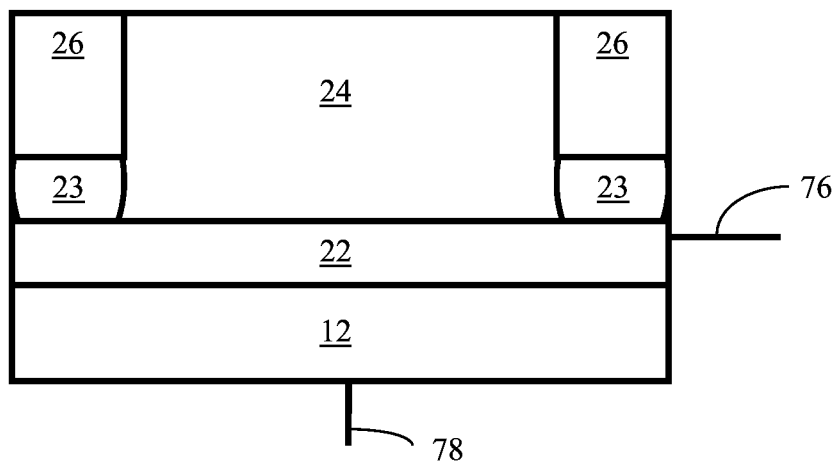

As shown in FIG. 37E, this may be followed by a silicon oxidation or silicon oxide deposition step, which will grow or deposit silicon oxide films in trench 308 which will become insulating layer 26. In an exemplary 130 nm process, about 2000 A silicon oxide may be grown or deposited.

The silicon nitride layer 306 and the polysilicon layer 304 may then be removed which may then be followed by a wet etch process to remove silicon oxide layer 302 (and a portion of the silicon oxide films of the insulator layer 26). Other process geometries including, but not limited to: 250 nm, 180 nm, 90 nm, 65 nm, etc., may be used. Similarly, other insulating layer materials, heights, and thicknesses as well as alternate sequences of processing steps may be used.

Figure 37F:
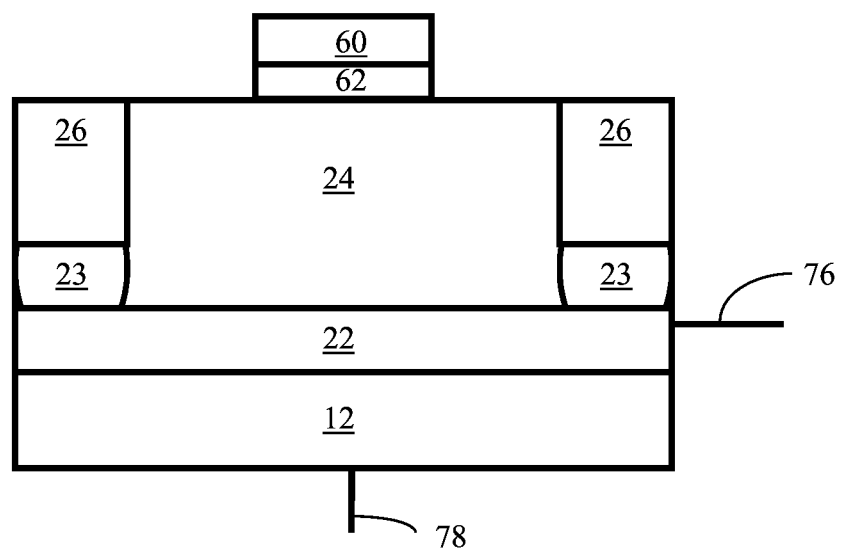

FIG. 37F shows results of a subsequent oxidation step to form the gate insulator 62 followed by polysilicon deposition to form the gate 60. The polysilicon gate 60 is subsequently patterned and etched.

Figure 37G:
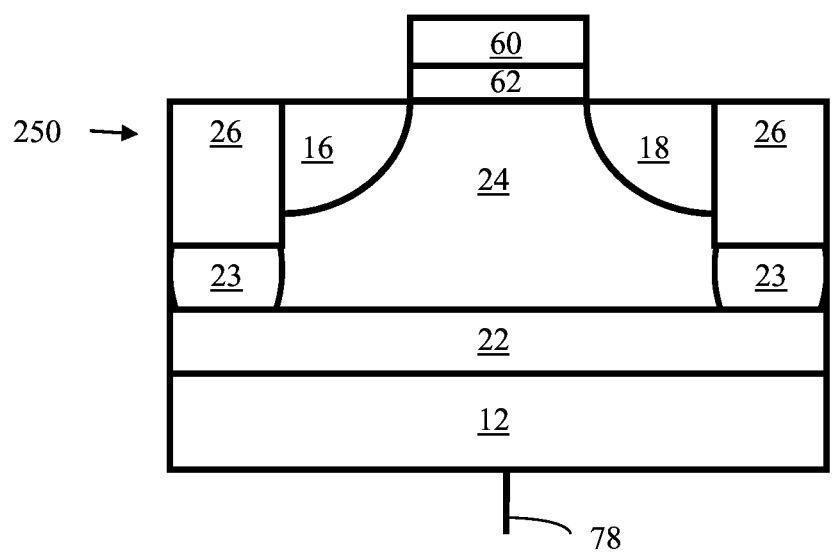

As shown in FIG. 37G, another ion implantation step may then be performed to form the bit line region 16 of a second conductivity type (e.g. n-type conductivity) and source line region 18, which is of a first conductivity type (e.g. p-type conductivity) in memory cell 250. This may then be followed by backend processing to form contact and metal layers (not shown in FIGS. 37A through 37G). In this and many subsequent figures, gate layer 60 and gate insulating layer 62 are shown flush with the edge of insulating layer 26. In some embodiments, gate layer 60 and gate insulating layer 62 may overlap insulating layer 26 to prevent any of the implant dopant for bit line region 16 and source line region 18 from inadvertently implanting between gate layer 60 and gate insulating layer 62 and the adjacent insulating layer 26.

Figure 38A:
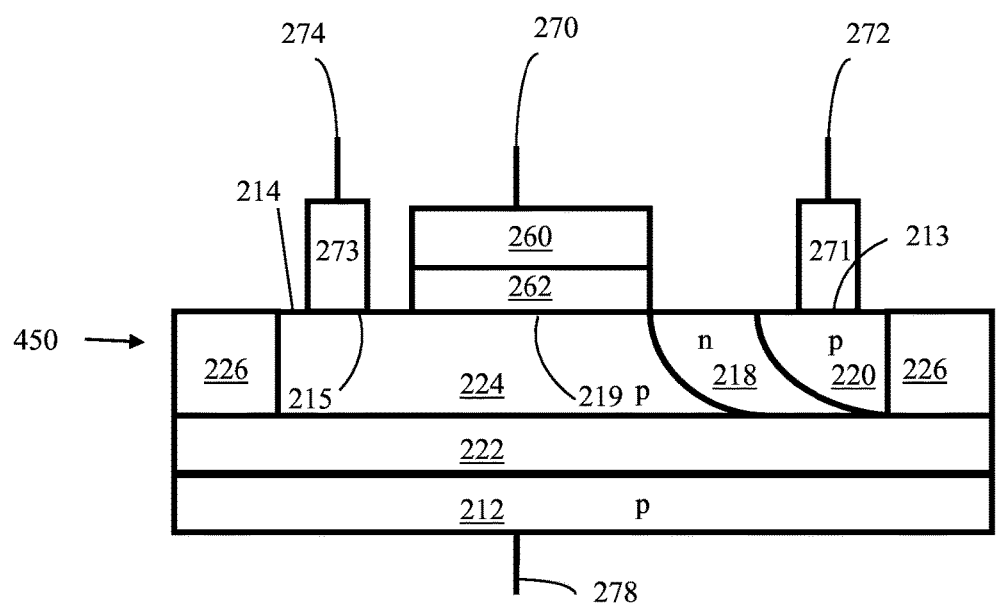
FIG. 38A illustrates a schematic, cross-sectional view of a memory cell according to another embodiment of the present invention.

FIG. 38A is a schematic, cross-sectional illustration of memory cell 450 fabricated on a silicon-on-insulator (SOI) substrate. Memory cell 450 includes a SOI substrate 212 of a first conductivity type such as p-type, for example. Substrate 212 is typically made of silicon, but may additionally or alternatively comprise, for example, germanium, silicon germanium, gallium arsenide, carbon nanotubes, or other semiconductor materials. A buried insulator layer 222, such as buried oxide (BOX) layer, is provided above the substrate 212. The SOI substrate can be produced either by oxygen ion implantation process or through wafer bonding process. An overview of the SOI substrate fabrication is described for example in Celler and Cristoloveanu, which is hereby incorporated herein, in its entirety, by reference thereto. A floating body region 224 of the first conductivity type, such as p-type, for example, is bounded on top by the surface 214, source line region 218, and insulating layer 262; on the sides by insulating layers 226 and source line region 218; and on the bottom by buried insulator layer 222. Floating body 224 may be the portion of the original substrate 212 above buried insulator layer 222. Floating body 224 may have the same doping as substrate 212 in some embodiments or a different doping, if desired.

Insulating layers 226 (which may be, for example, shallow trench isolation (STI)), may be made of silicon oxide, for example, though other insulating materials may be used. Insulating layers 226 insulate cell 450 from neighboring cells 450 when multiple cells 450 are joined in an array to make a memory device.

A region 218 having a second conductivity type, such as n-type, for example, is provided in floating body region 224 and is exposed at surface 214. Region 218 may be formed by an implantation process formed on the material making up substrate 212, according to any implantation process known and typically used in the art. Alternatively, a solid state diffusion process could be used to form region 218.

A source line region 220 having a first conductivity type, such as p-type, for example, is also provided in floating body region 224 and is exposed at surface 214. Source line region 220 may be formed by an implantation process formed on the material making up substrate 212, according to any implantation process known and typically used in the art. Alternatively, a solid state diffusion process could be used to form source line region 220. The source line region 220 has the same conductivity type as the floating body region 224, with the source line region 218 typically being more heavily doped than the floating body region 224.

The source line region 220 is electrically connected to source line (SL) terminal 272 through a conductive material 271. The conductive material 271 may be made of, for example, polysilicon material, or metal electrode, such as tungsten, aluminum, and/or copper. The conductive material 271 forms an ohmic contact 213 with the source line region 220.

The conductive material 273 forms a contact with the floating body region 224. The conductive material 73 may be made of, for example, metal electrode, such as tungsten or aluminum, or metal silicides, such as nickel silicide or platinum silicide. In contrast to the ohmic contact between conductive material 271 and source line region 220, conductive material 273 forms a Schottky contact 215 with the floating body region 224.

A gate 260 is positioned in between the conductive material 273 (and the Schottky contact 215) and region 218 and above the floating body region 224. The gate 260 is insulated from floating body region 224 by insulating layer 262. Insulating layer 262 may be made of silicon oxide and/or other dielectric materials, including high-K dielectric materials, such as, but not limited to, tantalum peroxide, titanium oxide, zirconium oxide, hafnium oxide, and/or aluminum oxide. The gate 260 may be made of, for example, polysilicon material or metal gate electrode, such as tungsten, tantalum, titanium and/or their nitrides.

Cell 450 includes several terminals: word line (WL) terminal 270 electrically connected to gate 260, bit line (BL) terminal 274 electrically connected to conductive material 273, source line (SL) terminal 272 electrically connected to source line region 220 (through the conductive material 271), and substrate terminal 278 electrically connected to substrate 212.

Figure 38B:
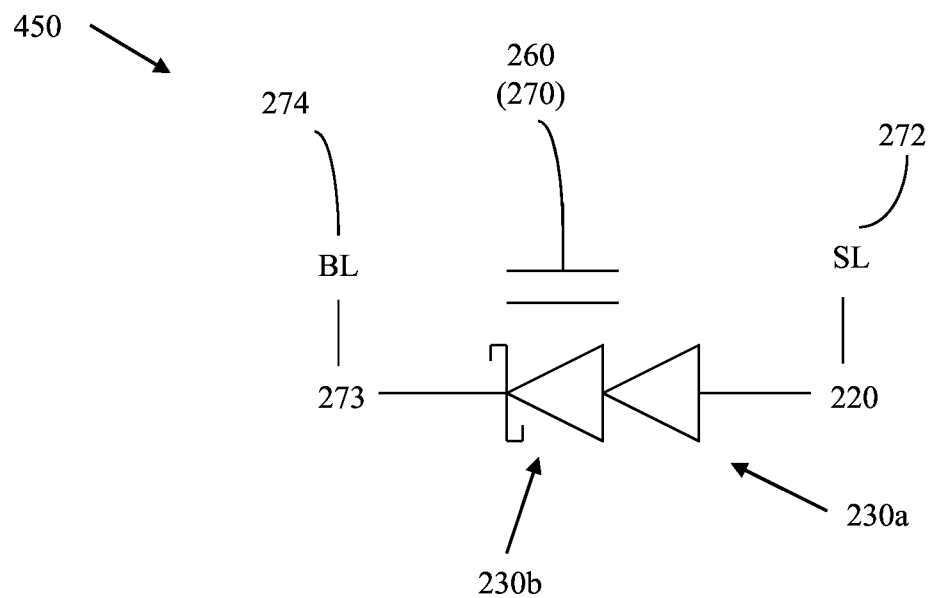
FIG. 38B illustrates an equivalent circuit representation of the memory cell of FIG. 38A.
Figure 38C:
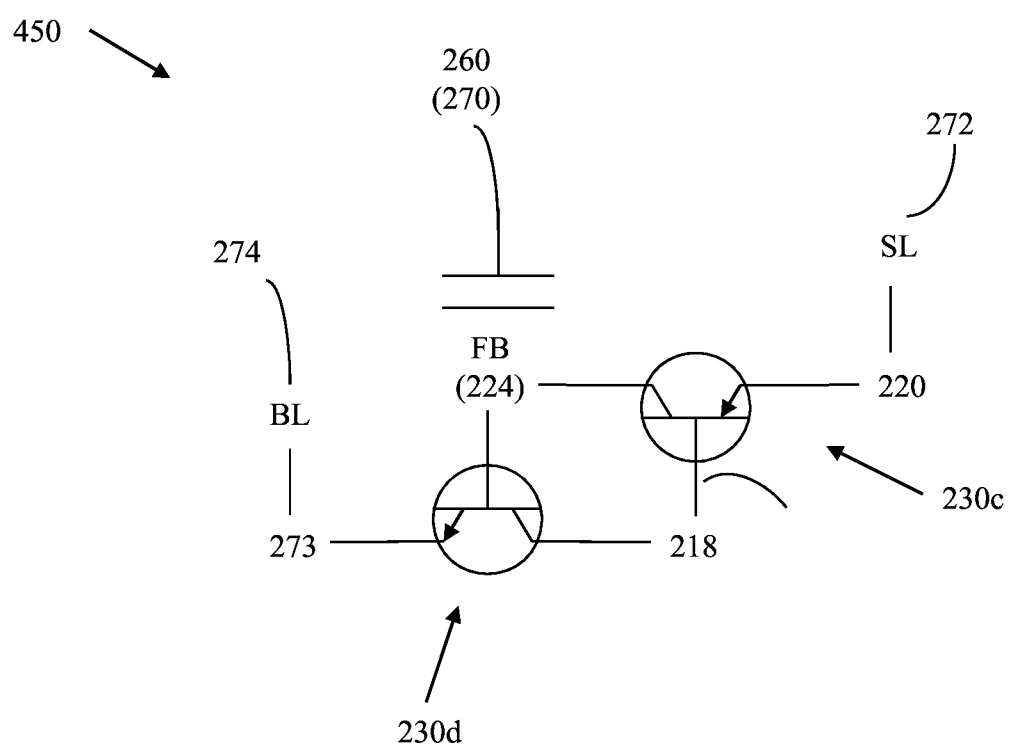
FIG. 38C illustrates another equivalent circuit representation of the memory cell of FIG. 38A.

FIGS. 38B and 38C show two equivalent schematic representation of memory cell 450. As shown in FIG. 38B, inherent in memory cell 450 are back-to-back p-n diode 230a, formed by source line region 220 and region 218, and Schottky diode 230b, formed by floating body 224 and conductive material 273. Another equivalent circuit representation is shown in FIG. 38C, showing the interconnected p-n-p bipolar device 230c (formed by source line region 220, region 218, and floating body 224) and n-p-m bipolar device 230d (formed by region 218, floating body 224, and the conductive material 273. The state of the memory cell 450 is stored in the floating region 224.

Figure 38D:
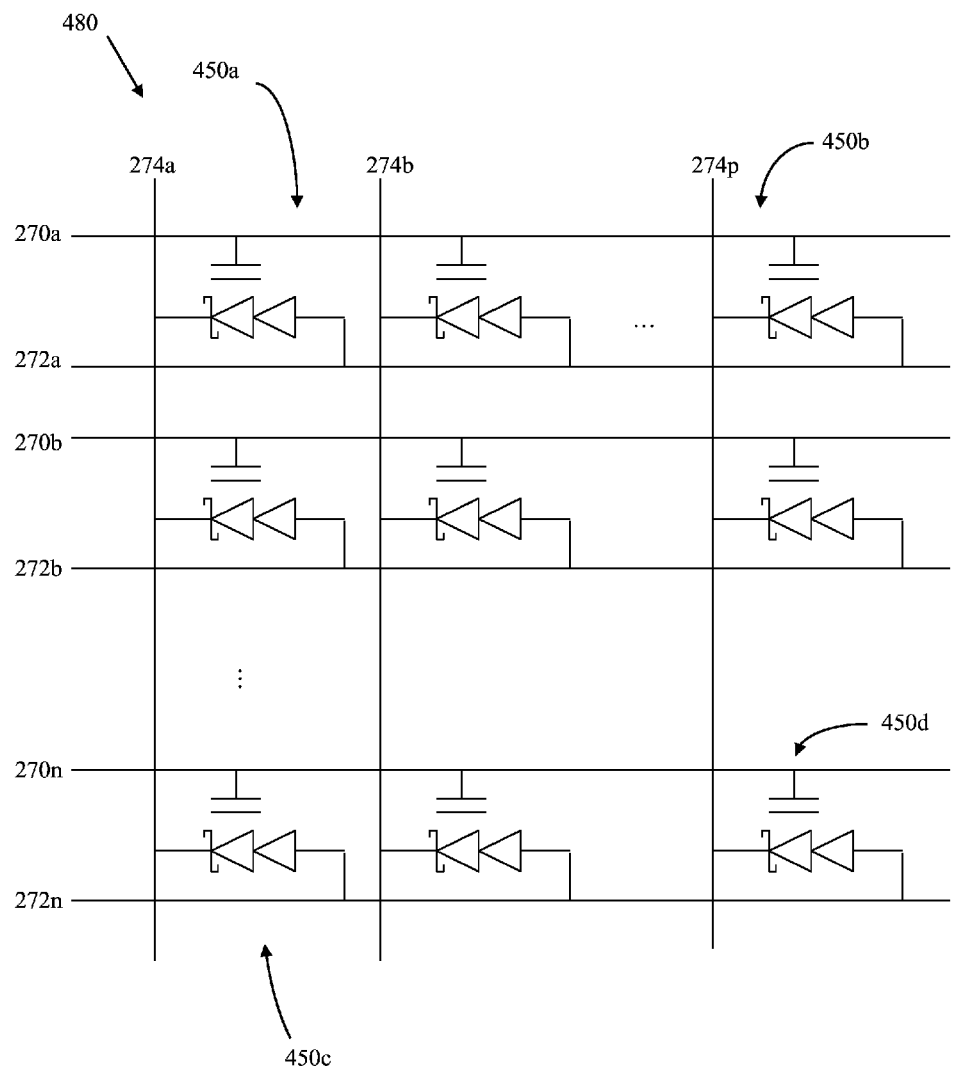
FIG. 38D schematically illustrates a memory array comprising memory cells according to an embodiment of the present invention.

FIG. 38D schematically illustrates a memory array 480 comprising of memory cells 450 according to an embodiment of the present invention. Present in FIG. 38D are word lines 270a, 270b, through 270n, bit lines 274a, 274b, through 274p, source line terminals 272a, 272b, through 272n, while a common substrate terminal 278 is not shown in FIG. 38D. Each of the word lines 270a, 270b, through 270n is associated with a single row of memory cells 450 and is coupled to the gate 260 of each memory cell 450 in that row. Each of the bit lines 274a through 274p is associated with a single column of memory cells 450 and is coupled to the conductive region 273 of each memory cell 450 in that column Each of the source lines 272a through 272n is associated with a single row of memory cells 450 and is coupled to the source line region 220 of each memory cell 450 in that row.

Several operations can be performed on memory cells 250 including: read, write logic-1 and write logic-0 operations. Examples of memory operations employing interconnected p-n-p and n-p-n bipolar devices, often referred to as silicon controlled rectifier (SCR), are given for example in "A novel capacitor-less DRAM cell using Thin Capacitively-Coupled Thyristor (TCCT)", Cho H.-J., et al., pp. 311-314, Tech Digest, 2005 International Electron Devices Meeting, December, 2005 ("Cho"); in U.S. Pat. No. 6,229,161 "Semiconductor Capacitively-Coupled NDR Device and Its Applications in High-Density High-Speed Memories and in Power Switches", Nemati F. and Plummer J. D. ("Nemati-1"); in U.S. Pat. No. 6,653,175 "Stability in Thyristor-Based Memory Device", Nemati F. et al. ("Nemati-2"), which are incorporated herein, in their entireties, by reference thereto.

Figure 39A:
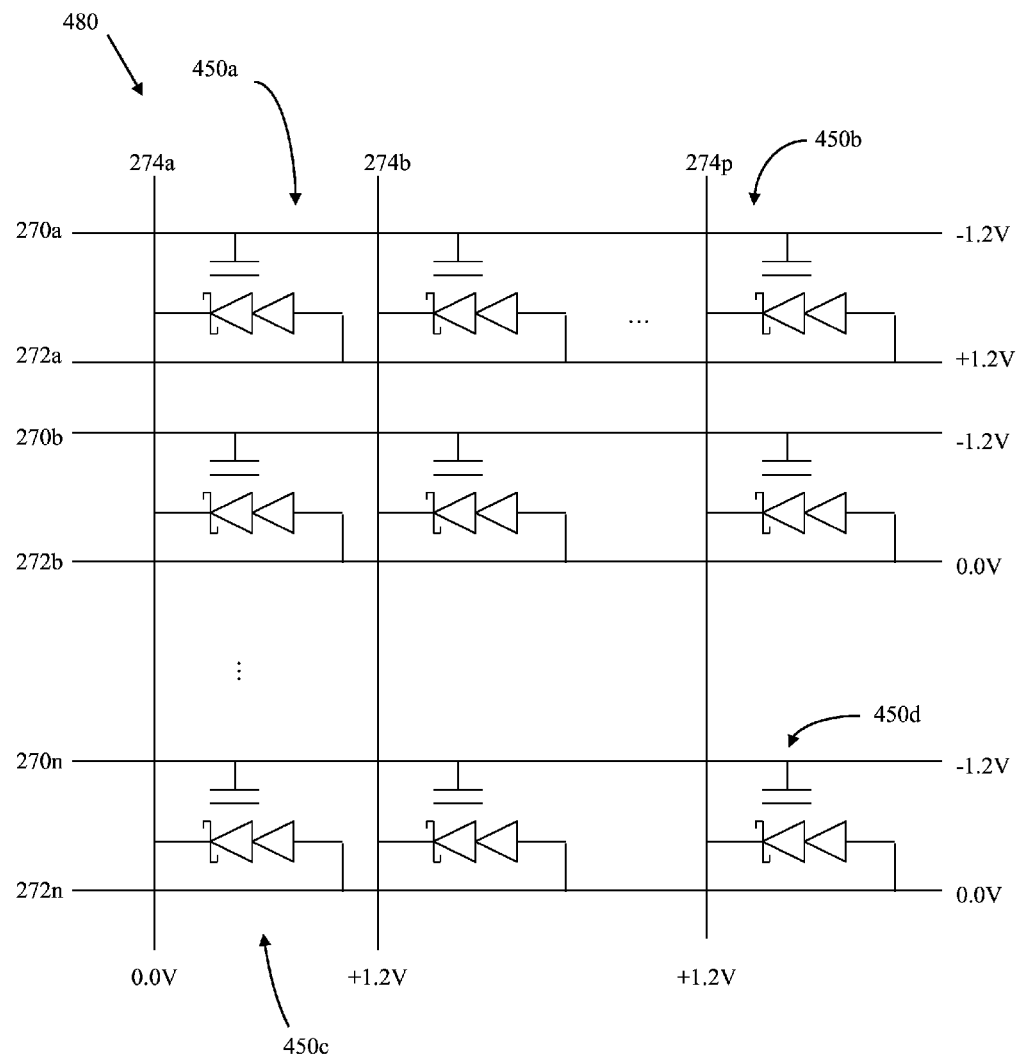
FIG. 39A schematically illustrates performance of a holding operation on a memory array according to an embodiment of the present invention.
Figure 39B:
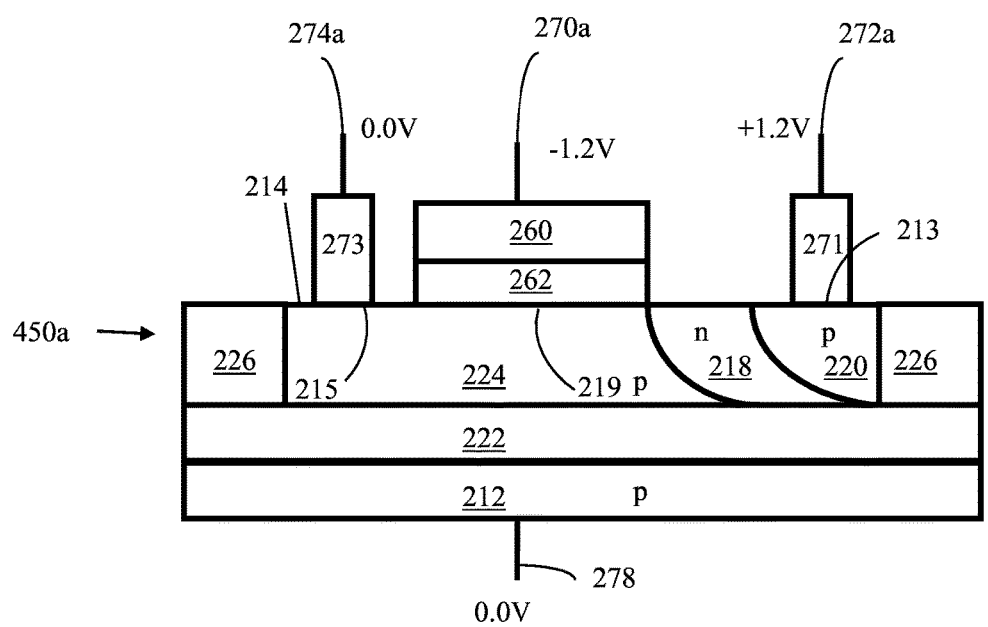
FIG. 39B schematically illustrates a cross-sectional view of a memory cell and shows exemplary bias conditions applied thereto for performing an alternative holding operation thereon, according to an embodiment of present invention.

FIG. 39A schematically illustrates bias conditions applied to the memory array 480 to perform a read operation, according to an embodiment of the present invention, while FIG. 39B schematically illustrates bias conditions applied on an exemplary selected memory cell 450a from array 480 in FIG. 39A. Any sensing scheme known in the art can be used with memory cell 450, including, for example, the sensing schemes disclosed by Ohsawa-1 and Ohsawa-2, which are each incorporated by reference herein in their entireties.

The read operation can be performed by applying the following bias conditions: a negative voltage is applied to the selected WL terminal 270a, zero voltage is applied to the selected BL terminal 274a, a positive voltage is applied to the selected SL terminal 272a, and zero voltage is applied to the substrate terminal 278. If the cell 450 is in a logic-1 state having holes in the floating body region 224, the intrinsic p-n-p-m SCR device will be turned on and a higher cell current is observed compared to when cell 450 is in a logic-0 state having no holes in the floating body region 224.

In one particular non-limiting embodiment, about −1.2 volts is applied to the selected word line terminal 270a, about 0.0 volts is applied to the selected bit line terminal 274a, about +1.2 volts is applied to selected SL terminal 272a, and about 0.0 volts is applied to substrate terminal 278. These voltage levels are exemplary only may vary from embodiment to embodiment. The voltage bias applied to the SL terminal 272a needs to be greater than the voltage bias applied to the BL terminal 274a, while the voltage applied to the WL terminal 270a needs to be kept low to avoid writing the selected memory cell 450a.

Figure 40A:
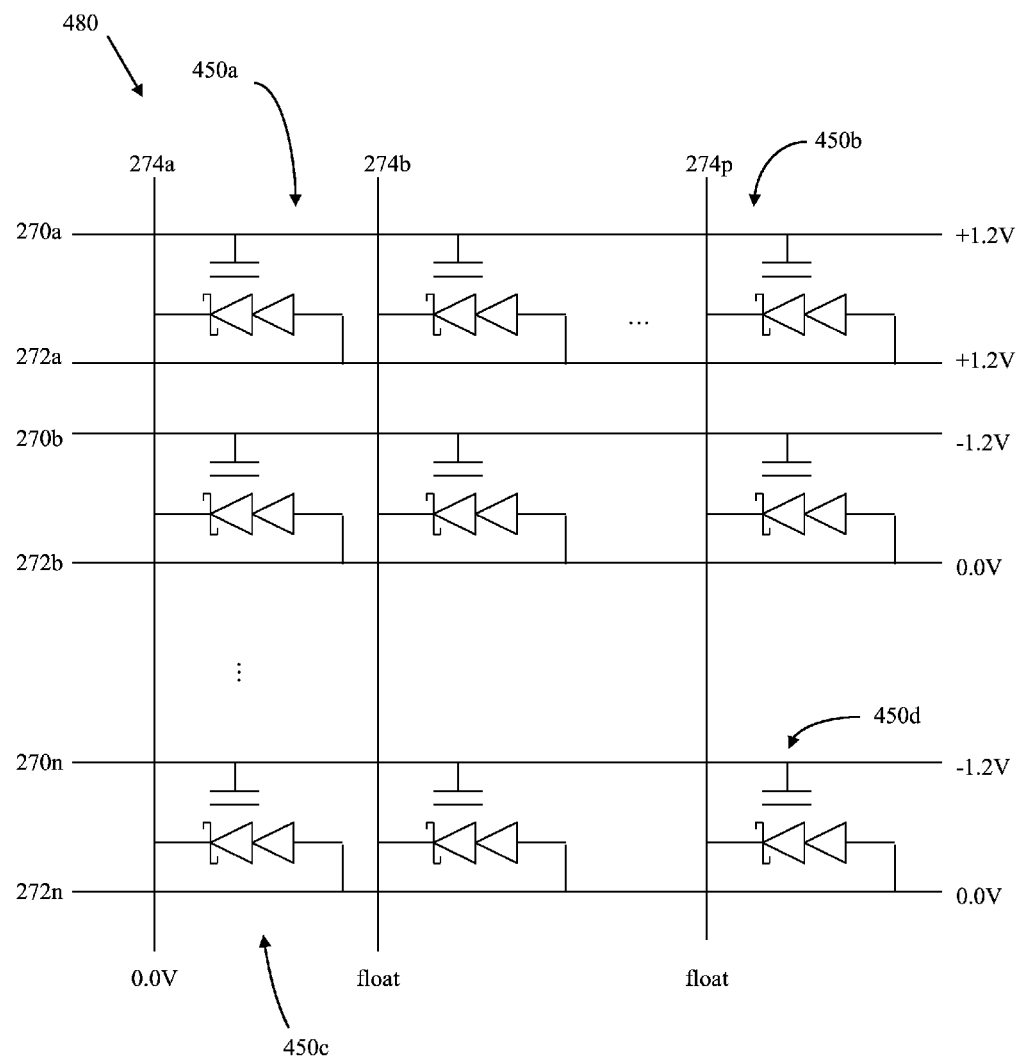
FIG. 40A schematically illustrates bias conditions applied on a memory array according to an embodiment of the present invention to perform a write logic-1 operation.
Figure 40B:
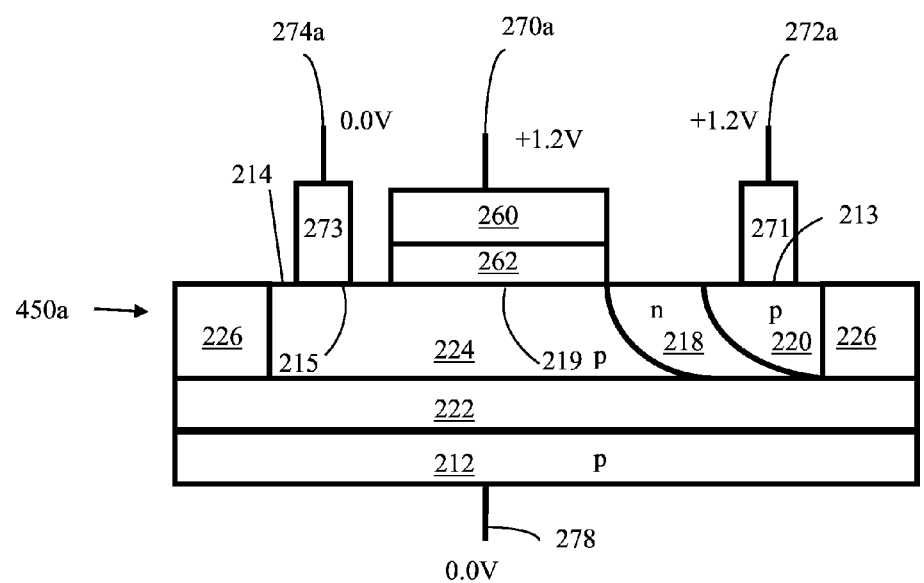
FIG. 40B is a schematic, cross-sectional illustration of a selected memory cell showing exemplary bias conditions that may be applied to the selected memory cell to perform a write logic-1 operation thereon, according to an embodiment of the present invention.

FIG. 40A schematically illustrates bias conditions applied to the memory array 480 to perform a write logic-1 operation according to an embodiment of the present invention, while FIG. 40B schematically illustrates bias conditions applied on an exemplary selected memory cell 450a from array 480 in FIG. 40A.

The write logic-1 operation can be performed by applying the following bias conditions: a positive voltage is applied to the selected WL terminal 270a, zero voltage is applied to the selected BL terminal 274a, a positive voltage is applied to the selected SL terminal 272a, while zero voltage is applied to the substrate terminal 278. The positive voltage applied to the WL terminal 270a will increase the potential of the floating body 224 through capacitive coupling and create a feedback process that turns the SCR device on. Once the SCR device of cell 450 is in conducting mode (i.e., has been "turned on") the SCR becomes "latched on" and the voltage applied to WL terminal 270 can be removed without affecting the "on" state of the SCR device.

In one particular non-limiting embodiment, a voltage of about 0.0 volts is applied to terminal 274a, a voltage of about +1.2 volts is applied to terminal 270a, about +1.2 volts is applied to terminal 272a, and about 0.0 volts is applied to substrate terminal 278. However, these voltage levels may vary, while maintaining the relative relationships between the voltages applied, as described above, e.g., the voltage applied to terminal 272 remains greater than the voltage applied to terminal 274 and a positive voltage applied to the WL terminal 270 to increase the potential of the floating body 224 through capacitive coupling.

Figure 41A:
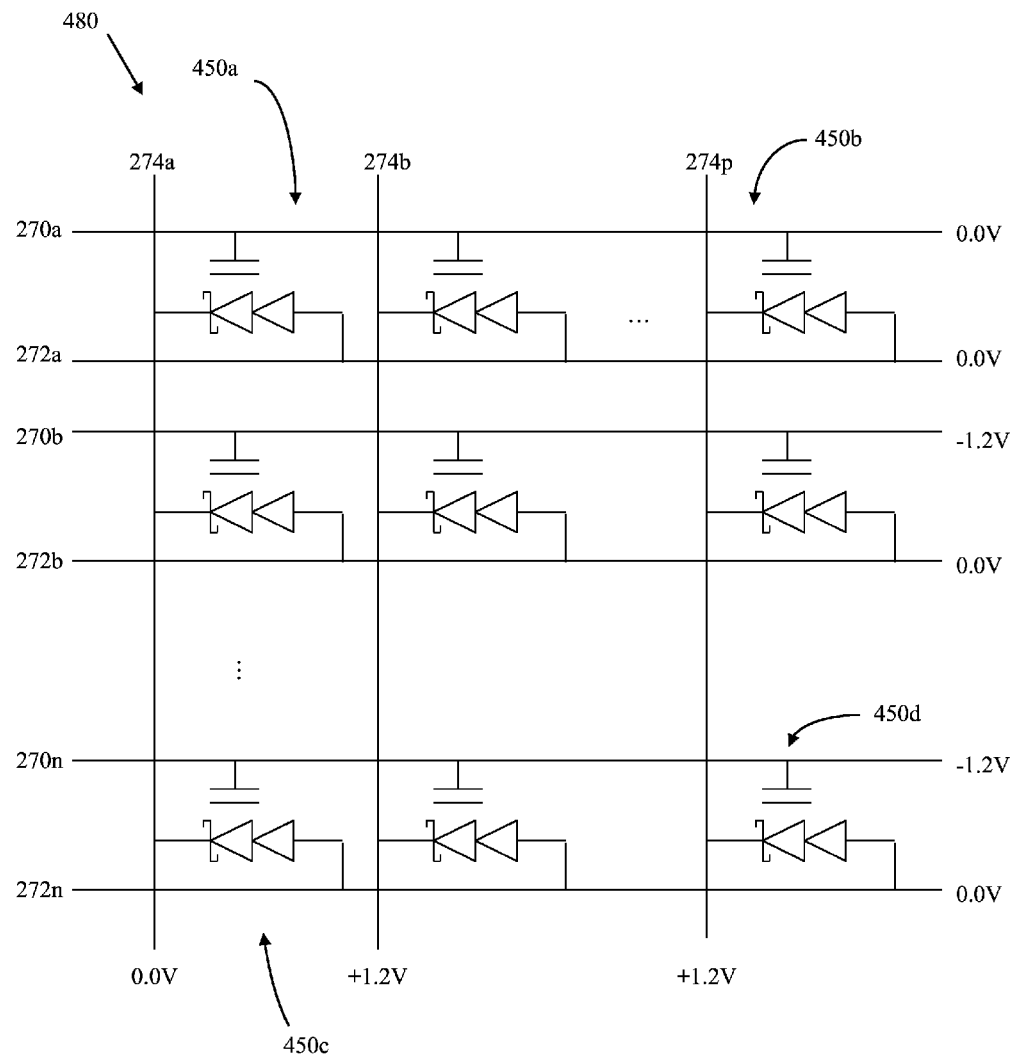
FIG. 41A schematically illustrates bias conditions applied on a memory array according to an embodiment of the present invention to perform a write logic-0 operation.
Figure 41B:
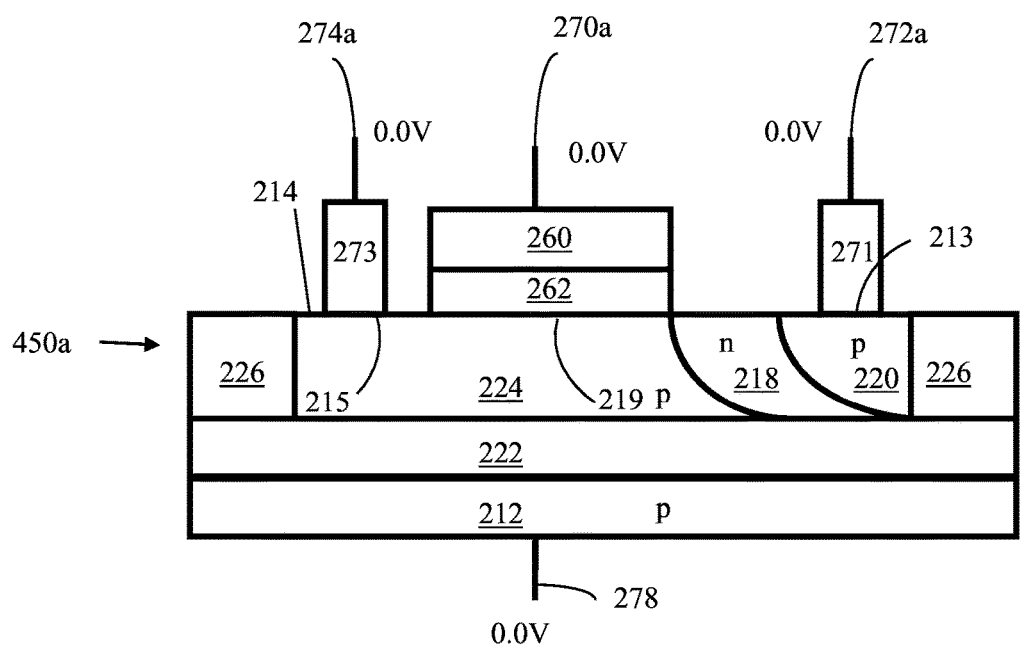
FIG. 41B is a schematic, cross-sectional illustration of a selected memory cell showing exemplary bias conditions that may be applied to the selected memory cell to perform a write logic-0 operation thereon, according to an embodiment of the present invention.

FIG. 41A schematically illustrates bias conditions applied to the memory array 480 to perform a write logic-0 operation according to an embodiment of the present invention, while FIG. 41B schematically illustrates bias conditions applied on an exemplary selected memory cell 450a from array 480 in FIG. 41A.

The write logic-0 operation can be performed by applying the following bias conditions: a positive voltage is applied to the selected WL terminal 270a, zero voltage is applied to the selected BL terminal 274a, zero voltage is applied to the selected SL terminal 272a, while zero voltage is applied to the substrate terminal 278. Under these conditions the voltage difference between anode and cathode, defined by the voltages at SL terminal 272 and BL terminal 274, will become too small to maintain the SCR device in conducting mode. As a result, the SCR device of cell 450 will be turned off.

In one particular non-limiting embodiment, a voltage of about 0.0 volts is applied to terminal 274a, a voltage of about +1.2 volts is applied to terminal 270a, and about 0.0 volts is applied to terminal 272a, while about 0.0 volts is applied to substrate terminal 278. However, these voltage levels may vary, while maintaining the relative relationships between the voltages applied, as described above, e.g., that the voltage difference between the SL terminal 272 and BL terminal 274 is low enough to maintain the SCR device in conducting mode.

Figure 42A:
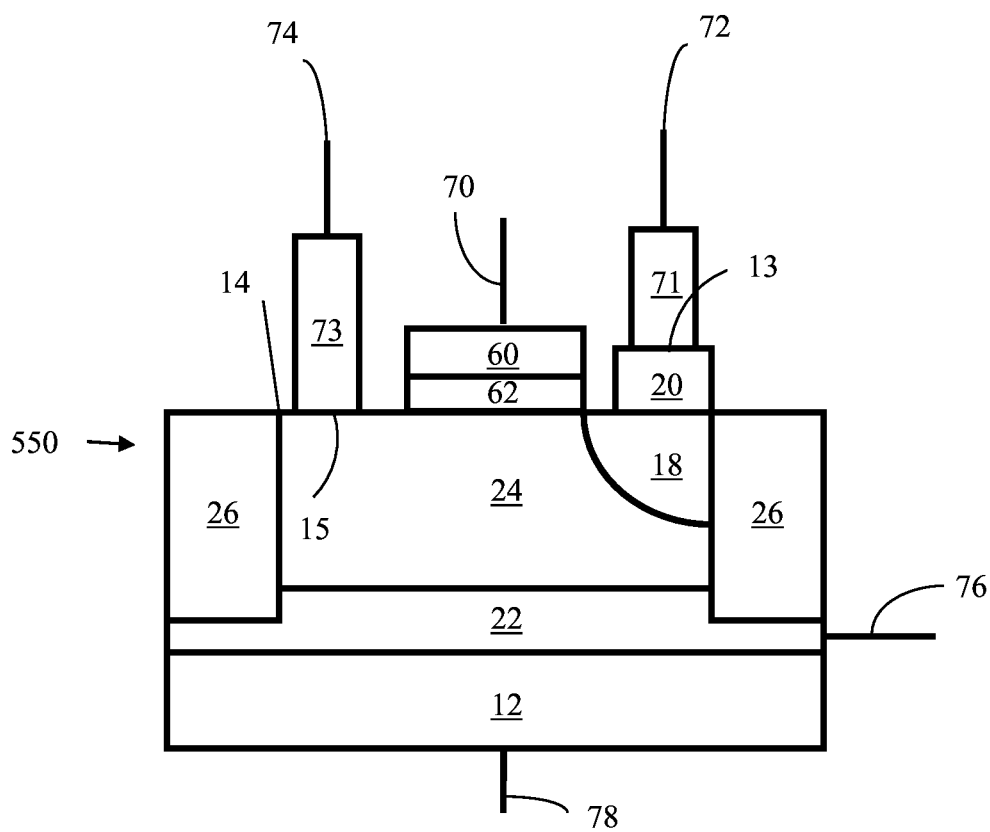
FIGS. 42A and 42B show cross sectional views of a memory cell according to another embodiment of the present invention, which incorporate Schottky contact, which comprise intrinsic silicon controlled rectifier (SCR) device.

FIG. 42A is a schematic, cross-sectional illustration another embodiment of memory cell 550 incorporating intrinsic p-n-p-m device fabricated on a bulk semiconductor substrate. Memory cell 550 includes a substrate 12 of a first conductivity type such as p-type, for example. Substrate 12 is typically made of silicon, but may additionally or alternatively comprise, for example, germanium, silicon germanium, gallium arsenide, carbon nanotubes, or other semiconductor materials.

A floating body region 24 of the first conductivity type, such as p-type, for example, is bounded on top by the surface 14, region 18, and insulating layer 62, on the sides by insulating layers 26, and on the bottom by buried layer 22. Floating body 24 may be the portion of the original substrate 12 above buried layer 22 if buried layer 22 is implanted. Alternatively, floating body 24 may be epitaxially grown. Depending on how buried layer 22 and floating body 24 are formed, floating body 24 may have the same doping as substrate 12 in some embodiments or a different doping, if desired in other embodiments.

Figure 42B:
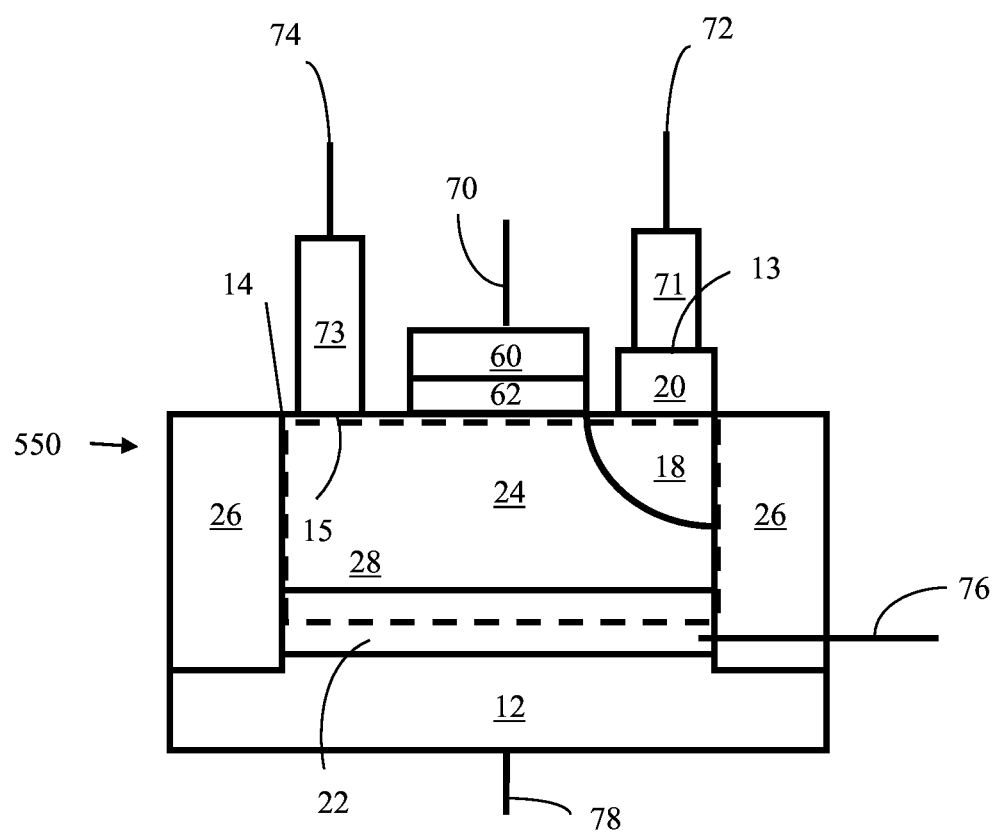

Insulating layers 26 (like, for example, shallow trench isolation (STI)), may be made of silicon oxide, for example, though other insulating materials may be used. Insulating layers 26 insulate cell 50 from neighboring cells 50 when multiple cells 50 are joined in an array to make a memory device. The bottom of insulating layer 26 may reside inside the buried region 22 allowing buried region 22 to be continuous as shown in FIG. 42A. Alternatively, the bottom of insulating layer 26 may reside below the buried region 22 as shown in the cross-sectional view of another embodiment of memory cell 550 in FIG. 42B. This requires a shallower insulating layer 28 (shown in dashed lines), which insulates the floating body region 24, but allows the buried layer 22 to be continuous in the perpendicular direction of the cross-sectional view shown in FIG. 42B. For simplicity, only memory cell 550 with continuous buried region 22 in all directions will be shown from hereon.

A region 18 having a second conductivity type, such as n-type, for example, is provided in floating body region 24, so as to bound a portion of the top of the floating body region in a manner discussed above, and is exposed at surface 14. Region 18 may be formed by an implantation process on the material making up substrate 12, according to any implantation process known and typically used in the art. Alternatively, a solid state diffusion process could be used to form region 18.

A source line region 20 having a first conductivity type, such as p-type, for example, is also provided above the surface 14. Source line region 20 may be formed by an epitaxial growth process, according to any epitaxial growth process known and typically used in the art, for example as described in "Low voltage/Sub-ns Operation Bulk Thyristor-SRAM (BT-RAM) Cell with Double Selective Epitaxy Emitters (DEE)", Sugizaki, T. et al., IEEE Symposium on VLSI Technology 2007, pp. 170-171, June 2007 ("Sugizaki"), which is incorporated herein, in its entirety, by reference thereto.

The source line region 20 is electrically connected to source line (SL) terminal 72 through a conductive material 71. The conductive material 71 may be made of, for example, polysilicon material, or metal electrode, such as tungsten, aluminum, and/or copper. The conductive material 71 forms an ohmic contact 13 with the source line region 18.

The conductive material 73 forms a contact with the floating body region 24. The conductive material 73 may be made of, for example, metal electrode, such as tungsten or aluminum, or metal silicides, such as nickel silicide or platinum silicide. In contrast to the ohmic contact between conductive material 71 and source line region 20, conductive material 73 forms a Schottky contact 15 with the floating body region 24.

A gate 60 is positioned in between the bit line region 16 and source line region 18 and above the floating body region 24. The gate 60 is insulated from floating body region 24 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of, for example, polysilicon material or metal gate electrode, such as tungsten, tantalum, titanium and their nitrides.

Cell 50 includes several terminals: word line (WL) terminal 70 electrically connected to gate 60, bit line (BL) terminal 74 electrically connected to bit line region 16, source line (SL) terminal 72 electrically connected to source line region 20, buried well (BW) terminal 76 electrically connected to buried layer 22, and substrate terminal 78 electrically connected to the substrate 12.

The read and write operations of the memory cell 550 is similar to those of memory cell 450. A holding operation may also be performed on memory cell 550 through the application of a positive voltage on the BW terminal 72, similar to the holding operation performed on memory cell 50 described in FIGS. 3A, 3B, 4A, and 4B; holding operation performed on memory cell 150 described in FIG. 17A; and holding operation performed on memory cell 250 described in FIG. 24A.

Alternatively, holding operation employing the intrinsic SCR device, formed by the substrate 12, buried well 22, floating body region 24, and conductive material 73 forming Schottky contact 15 with the floating body region 24, as described in FIGS. 5D and 5E, 17B, and 24B may also be performed on memory cell 550.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

For example, the first and second conductivity types may be reversed and the applied voltage polarities inverted while staying within the scope of the present invention.

While many different exemplary voltage levels were given for various operations and embodiments, these may vary from embodiment to embodiment while staying within the scope of the present invention.

The invention may be manufactured using any process technology at any process geometry or technology node and be within the scope of the invention. Further, it should be understood that the drawing figures are not drawn to scale for ease of understanding and clarity of presentation, and any combination of layer composition, thickness, doping level, materials, etc. may be used within the scope of the invention.

While exemplary embodiments typically showed a single memory array for the purpose of simplicity in explaining the operation of the various memory cells presented herein, a memory device employing the memory cells of the presentation may vary in many particulars in terms of architecture and organization while staying within the scope of the invention. Such embodiments may, without limitation, include features such as multiple memory arrays, segmentation of the various control lines with or without multiple levels of decoding, simultaneously performing multiple operations in multiple memory arrays or in the same arrays, employing many different voltage or current sensing circuits to perform read operations, using a variety of decoding schemes, using more than one type of memory cell, employing any sort of interface to communicate with other circuitry, and/or employing many different circuits known in the art to generate voltage or currents for use in performing the various operations on the memory array or arrays. Such circuits may without limitation include, for example, digital-to-analog converters (DACs), analog-to-digital converters (ADCs), operational amplifiers (Op Amps), comparators, voltage reference circuits, current mirrors, analog buffers, etc.

That which is claimed is:

1. An asymmetric bi-stable semiconductor memory cell comprising:
    a first bipolar device having a first floating base region, a first emitter, and a first collector; and
    a second bipolar device having a second floating base region, a second emitter, and a second collector,
    wherein said first floating base region and said second floating base region comprise a common floating base region and wherein said common floating base region comprises means for storing a charge or lack of charge as a volatile memory indicative of a state of the asymmetric semiconductor memory cell;
    wherein said first collector is common to said second collector;
    wherein at least one of said first bipolar device or second bipolar device maintains a state of said memory cell, and
    wherein performance characteristics of said first bipolar device are different from performance characteristics of said second bipolar device.

2. The asymmetric bi-stable semiconductor memory cell of claim 1, further comprising a gate positioned above said common floating base region.

3. The asymmetric bi-stable semiconductor memory cell of claim 2, further comprising:
    a substrate; and
    a buried layer buried in said substrate;
    wherein said buried layer comprises said first and second collectors; and
    wherein said substrate is separated from said common floating base region by said buried layer.

4. The asymmetric semiconductor memory cell of claim 3, further comprising:
    a word line terminal electrically connected to said gate;
    a bit line terminal electrically connected to said first emitter;
    a source line terminal electrically connected to said second emitter;
    a buried well terminal electrically connected to said buried layer; and
    a substrate terminal electrically connected to said substrate.

5. The asymmetric bi-stable semiconductor memory cell of claim 2, further comprising a gap region on a surface of said common floating base region, said gap region located between one of said first bipolar device or second bipolar device and said gate.

6. The asymmetric semiconductor memory cell of claim 2, further comprising an insulating layer insulating said gate from said common floating base region.

7. The asymmetric bi-stable semiconductor memory cell of claim 1, wherein
    said common floating base region has a first conductivity type selected from a p-type conductivity type and an n-type conductivity type;
    said first collector and said second collector have a second conductivity type selected from said p-type conductivity type and said n-type conductivity type, said second conductivity type being different from said first conductivity type; and
    a second region having said second conductivity type, said second region being separated from at least one of said first and second collectors by said common floating base region.

8. The asymmetric bi-stable semiconductor memory cell of claim 1, arranged in an array of said asymmetric bi-stable semiconductor memory cells comprising at least one row of said cells and a plurality of columns of said cells or at least one column of said cells and a plurality of rows of said cells.

9. The asymmetric bi-stable semiconductor memory cell of claim 1, wherein one of said first emitter or second emitter comprises an electrode electrically connected to said first floating base region and second floating base region, wherein said electrode forms a Schottky contact with said first floating base region and second floating base region.

10. The asymmetric bi-stable semiconductor memory cell of claim 1, wherein at least said first floating base region, said first emitter, said second floating base region and said second emitter are formed in a fin structure.

11. A semiconductor memory array comprising:
   a plurality of asymmetric bi-stable semiconductor memory cells arranged in a matrix of rows and columns, wherein each said asymmetric bi-stable semiconductor memory cell includes:
   a first bipolar device having a first floating base region, a first emitter, and a first collector; and
   a second bipolar device having a second floating base region, a second emitter, and a second collector,
   wherein a common floating base region comprises said first floating base region and said second floating base region and wherein said common floating base region comprises means for storing a charge or lack of charge as a volatile memory indicative of a state of the asymmetric semiconductor memory cell;
   wherein said first collector is common to said second collector;
   wherein at least one of said first bipolar device or second bipolar device maintains a state of said memory cell,
   wherein performance characteristics of said first bipolar device are different from performance characteristics of said second bipolar device; and
   wherein said first and second collectors are commonly connected to at least two of said memory cells.

12. The semiconductor memory array of claim 11, wherein each said asymmetric bi-stable semiconductor memory cell further comprises a gate positioned above said common floating base region.

13. The semiconductor memory array of claim 12, wherein each said asymmetric bi-stable semiconductor memory cell further comprises a gap region on a surface of said common floating base region, said gap region located between one of said first bipolar device or second bipolar device and said gate.

14. The semiconductor memory array of claim 11, further comprising:
   a substrate; and
   a buried layer buried in said substrate;
   wherein said buried layer includes said first and second collectors; and
   wherein said substrate is separated from said common floating base region by said buried layer.

15. The semiconductor memory array of claim 14, further comprising:
   a word line terminal electrically connected to said gates of a plurality of said asymmetric bi-stable semiconductor memory cells in a row;
   a bit line terminal electrically connected to said first emitters of a second plurality of said asymmetric bi-stable semiconductor memory cells in a column;
   a source line terminal electrically connected to said second emitters of said plurality of asymmetric bi-stable semiconductor memory cells in a row;
   a buried well terminal electrically connected to said buried layer of a third plurality of asymmetric bi-stable semiconductor memory cells; and
   a substrate terminal electrically connected to said substrate of a fourth plurality of asymmetric bi-stable semiconductor memory cells.

16. The semiconductor memory array of claim 12, wherein each said asymmetric bi-stable memory cell further comprises an insulating layer insulating said gate from said common floating base region.

17. The semiconductor memory array of claim 11, wherein
   said common floating base region has a first conductivity type selected from a p-type conductivity type and an n-type conductivity type;
   said first collector and said second collector have a second conductivity type selected from said p-type conductivity type and said n-type conductivity type, said second conductivity type being different from said first conductivity type; and
   a second region having said second conductivity type, said second region being separated from at least one of said first and second collectors by said common floating base region.

18. The semiconductor memory array of claim 11, wherein one of said first emitter or second emitter comprises an electrode electrically connected to said first floating base region and second floating base region, wherein said electrode forms a Schottky contact with said first floating base region and second floating base region.

19. The semiconductor memory array of claim 11, wherein at least said first floating base region, said first emitter, said second floating base region and said second emitter are formed in a fin structure.

* * * * *